US012745471B2

(12) United States Patent
Teranishi et al.

(10) Patent No.: US 12,745,471 B2
(45) Date of Patent: Sep. 22, 2026

(54) SOLID-STATE IMAGING DEVICE AND METHOD FOR PRODUCING SOLID-STATE IMAGING DEVICE

(71) Applicant: NATIONAL UNIVERSITY CORPORATION SHIZUOKA UNIVERSITY, Shizuoka (JP)

(72) Inventors: Nobukazu Teranishi, Hamamatsu (JP); Atsushi Ono, Hamamatsu (JP); Kazuma Hashimoto, Hamamatsu (JP); Takahito Yoshinaga, Hamamatsu (JP)

(73) Assignee: NATIONAL UNIVERSITY CORPORATION SHIZUOKA UNIVERSITY (JP)

( * ) Notice: Subject to any disclaimer, the term of this patent is extended or adjusted under 35 U.S.C. 154(b) by 441 days.

(21) Appl. No.: 18/262,763

(22) PCT Filed: Jan. 17, 2022

(86) PCT No.: PCT/JP2022/001396
§ 371 (c)(1),
(2) Date: Jul. 25, 2023

(87) PCT Pub. No.: WO2022/163405
PCT Pub. Date: Aug. 4, 2022

(65) Prior Publication Data

US 2024/0347569 A1 Oct. 17, 2024

(30) Foreign Application Priority Data

Jan. 26, 2021 (JP) ................................ 2021-010189

(51) Int. Cl.
*H10F 39/00* (2025.01)
*G02B 5/00* (2006.01)

(52) U.S. Cl.
CPC ......... *H10F 39/806* (2025.01); *H10F 39/024* (2025.01); *H10F 39/8067* (2025.01); *H10F 39/807* (2025.01); *G02B 5/008* (2013.01)

(58) Field of Classification Search
CPC ...... H10F 39/18; H10F 39/803; H10F 39/805; H10F 39/806; H10F 39/8067;
(Continued)

(56) References Cited

U.S. PATENT DOCUMENTS

2011/0220976 A1* 9/2011 Iida ...................... H10F 39/805 257/E31.001
2012/0319222 A1 12/2012 Ozawa et al. ............... 257/432
(Continued)

FOREIGN PATENT DOCUMENTS

JP 2005-072097 A 3/2005
JP 2011-114150 A 6/2011
(Continued)

OTHER PUBLICATIONS

Extended European Search Report dated May 13, 2025 for corresponding European Patent Application No. 22745628.2.
(Continued)

*Primary Examiner* — Matthew E Warren
(74) *Attorney, Agent, or Firm* — OSTROLENK FABER LLP

(57) ABSTRACT

Each pixel 8 constituting a solid-state imaging device 1 includes a light scattering unit 27 receiving incident light L1 and generating absorbed light L2 including scattered light, and a photoelectric conversion unit 26 receiving the absorbed light L2 from a light input surface **26*a* and generating a signal voltage corresponding to the received absorbed light L2. The light scattering unit 27 includes a plurality of metal structures 27*a* disposed with a predetermined cycle length. The light scattering unit 27** generates, as
(Continued)

the scattered light, diffracted light caused by plasmons corresponding to the incident light L1.

17 Claims, 70 Drawing Sheets

(58) Field of Classification Search
CPC ..... H10F 39/807; H10F 39/024; G02B 5/008; G02B 5/1804; G02B 5/1809
See application file for complete search history.

(56) References Cited

U.S. PATENT DOCUMENTS

| | | | | |
|---|---|---|---|---|
| 2018/0090531 | A1 | 3/2018 | Yokogawa | |
| 2021/0217911 | A1* | 7/2021 | Kim | H10F 77/143 |
| 2022/0004732 | A1* | 1/2022 | Hsieh | H10F 39/024 |

FOREIGN PATENT DOCUMENTS

| | | | | |
|---|---|---|---|---|
| JP | 2012-178457 | A | 9/2012 | |
| JP | 2013-229606 | A | 11/2013 | |
| JP | 2015-060855 | A | 3/2015 | |
| JP | 2017-108062 | A | 6/2017 | |
| JP | 2019159080 | A * | 9/2019 | H04N 25/70 |
| JP | 2020-013909 | A | 1/2020 | |
| JP | 6759805 | B2 * | 9/2020 | |
| KR | 20120025973 | A | 3/2012 | |
| KR | 20150008540 | A | 1/2015 | |
| KR | 20150013442 | A | 2/2015 | |
| WO | WO-0210815 | A2 * | 2/2002 | G02F 1/025 |
| WO | WO 2015/001987 | A1 | 1/2015 | |
| WO | WO 2016/063727 | A1 | 4/2016 | |
| WO | WO 2017/038542 | A1 | 3/2017 | |
| WO | WO-2017064845 | A1 * | 4/2017 | H10F 39/8063 |
| WO | WO 2018/030213 | A1 | 2/2018 | |
| WO | WO 2018/079296 | A1 | 5/2018 | |
| WO | WO 2020/144971 | A1 | 7/2020 | |
| WO | WO 2020/209107 | A1 | 10/2020 | |

OTHER PUBLICATIONS

International Search Report mailed Apr. 12, 2022 in corresponding International Patent Application No. PCT/JP2022/001396.
International Preliminary Report on Patentability (IPRP) mailed Jul. 27, 2023 in corresponding International Patent Application No. PCT/JP2022/001396.

* cited by examiner

Fig.12

| WAVELENGTH | SILICON(Si) | | SILICON OXIDE(SiO2) | | TUNGSTEN(W) | | SILVER(Ag) | | COPPER(Cu) | | ALUMINUM(Al) | | GOLD(Au) | |
|---|---|---|---|---|---|---|---|---|---|---|---|---|---|---|
| | REAL PART | IMAGINARY PART | REAL PART | IMAGINARY PART | REAL PART | IMAGINARY PART | REAL PART | IMAGINARY PART | REAL PART | IMAGINARY PART | REAL PART | IMAGINARY PART | REAL PART | IMAGINARY PART |
| nm | | | | | | | | | | | | | | |
| 800 | 3.68 | 5.41E-05 | 1.47 | 0.00 | 3.61 | 2.77 | 0.06 | 5.68 | 0.24 | 4.94 | 2.67 | 8.34 | 0.23 | 4.51 |
| 850 | 3.64 | 3.61E-05 | 1.47 | 0.00 | 3.44 | 2.84 | 0.07 | 6.08 | 0.24 | 5.33 | 2.52 | 8.01 | 0.23 | 4.88 |
| 900 | 3.61 | 2.17E-05 | 1.47 | 0.00 | 3.26 | 2.99 | 0.07 | 6.47 | 0.24 | 5.72 | 2.02 | 8.21 | 0.23 | 5.26 |
| 950 | 3.59 | 1.18E-05 | 1.47 | 0.00 | 3.12 | 3.20 | 0.08 | 6.87 | 0.25 | 6.10 | 1.68 | 8.71 | 0.24 | 5.62 |
| 1000 | 3.57 | 5.09E-05 | 1.47 | 0.00 | 3.03 | 3.47 | 0.09 | 7.25 | 0.25 | 6.48 | 1.48 | 9.28 | 0.26 | 5.98 |
| 1050 | 3.56 | 1.36E-05 | 1.47 | 0.00 | 3.01 | 3.73 | 0.09 | 7.65 | 0.27 | 6.85 | 1.37 | 9.85 | 0.27 | 6.34 |
| 1100 | 3.54 | 3.06E-05 | 1.47 | 0.00 | 3.06 | 3.97 | 0.09 | 8.06 | 0.28 | 7.22 | 1.31 | 10.43 | 0.29 | 6.69 |

| WAVELENGTH | PLATINUM(Pt) | | BISMUTH(Bi) | |
|---|---|---|---|---|
| nm | REAL PART | IMAGINARY PART | REAL PART | IMAGINARY PART |
| 1100 | 0.50 | 7.03 | 0.19 | 3.22 |
| 1100 | 0.60 | 8.38 | 0.20 | 4.06 |
| 1100 | 0.79 | 10.23 | 0.25 | 5.09 |
| 1100 | 0.79 | 10.23 | 0.37 | 6.56 |

Fig.14

| GROUP | CYCLE | ELEMENT | | COMPLEX REFRACTIVE INDEX N | REFERENCE SOURCE | REFLECTANCE WITH RESPECT TO SILICON | REAL NUMBER PORTION OF DIELECTRIC CONSTANT | IMAGINARY NUMBER PORTION OF DIELECTRIC CONSTANT |
|---|---|---|---|---|---|---|---|---|
| 1 | 2 | Li | LITHIUM | 0.2263+4.738i | Inagaki et al. 1976 | 0.91 | -22.3 | 2.1 |
| 4 | 4 | Ti | TITANIUM | 2.83342+3.7220i | Rakic et al. 1998 | 0.26 | -5.8 | 21.1 |
| 5 | 5 | Ta | TANTALUM | 0.8116+5.4065i | Werner et al. 2009 | 0.74 | -28.5 | 9.5 |
| 6 | 4 | Cr | CHROMIUM | 4.4038+4.2454i | Rakic et al. 1998 | 0.23 | 1.4 | 37.4 |
| 6 | 5 | Mo | MOLYBDENUM | 2.8696+4.2320i | Werner et al. 2009 | 0.31 | -9.7 | 24.3 |
| 6 | 6 | W | TUNGSTEN | 3.1424+3.1558i | Rakic et al. 1998 | 0.18 | -0.1 | 19.8 |
| 8 | 4 | Fe | IRON | 3.1717+4.5078i | Werner et al. 2009 | 0.31 | -10.3 | 28.6 |
| 8 | 6 | Os | OSMIUM | 2.1800+2.9060i | Nemoshkalenko et al. 2009 | 0.25 | -3.7 | 12.7 |
| 9 | 4 | Co | COBALT | 4.8272+5.2953i | Werner et al. 2009 | 0.30 | -4.7 | 51.1 |
| 10 | 4 | Ni | NICKEL | 2.7002+4.8428i | Rakic et al. 1998 | 0.38 | -16.2 | 26.2 |
| 10 | 5 | Pd | PALLADIUM | 2.3559+5.5929i | Rakic et al. 1998 | 0.49 | -25.7 | 26.4 |
| 11 | 4 | Cu | COPPER | 0.24380+6.0246i | Rakic et al. 1998 | 0.93 | -36.2 | 2.9 |
| 11 | 5 | Ag | SILVER | 0.078480+6.7315i | McPeak et al. 2015 | 0.98 | -45.3 | 1.1 |
| 11 | 6 | Au | GOLD | 0.24024+5.5482i | Rakic et al. 1998 | 0.92 | -30.7 | 2.7 |
| 13 | 3 | Al | ALUMINUM | 1.7313+8.5963i | Rakic et al. 1998 | 0.76 | -70.9 | 29.8 |
| 14 | 3 | Si | SILICON | 3.5950+0.0013689i | Green 2008 | | 12.9 | 0.0 |
| 14 | 4 | Ge | GERMANIUM | 4.5072+0.16992i | Rsoft 2020 | 0.01 | 20.3 | 1.5 |
| 15 | 6 | Bi | BISMUTH | 0.23292+4.7687i | Werner et al. 2009 | 0.91 | -22.7 | 2.2 |

*Fig.15*
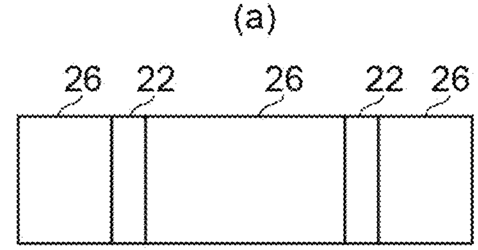
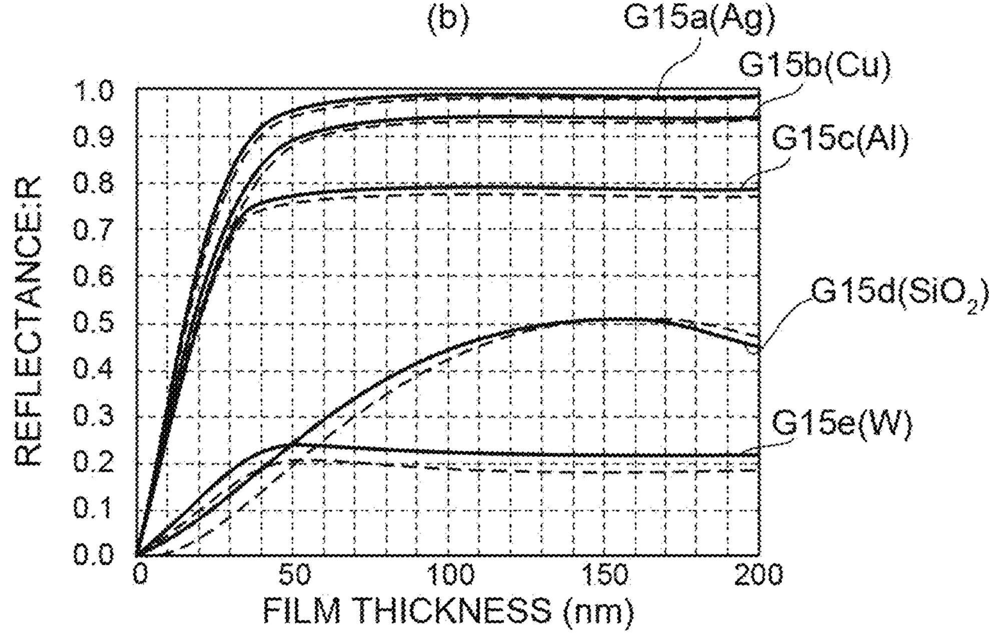
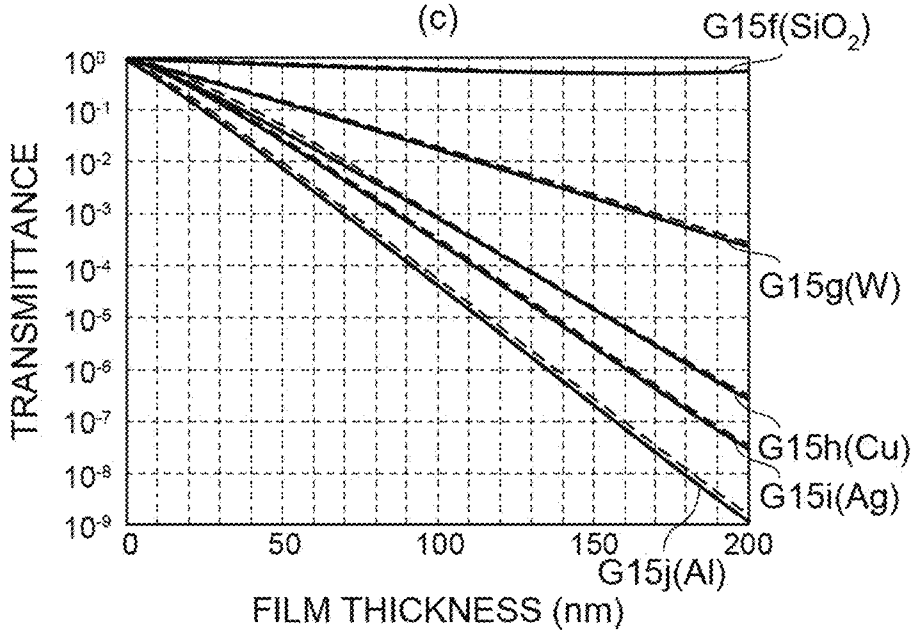

*Fig.17*
(a)
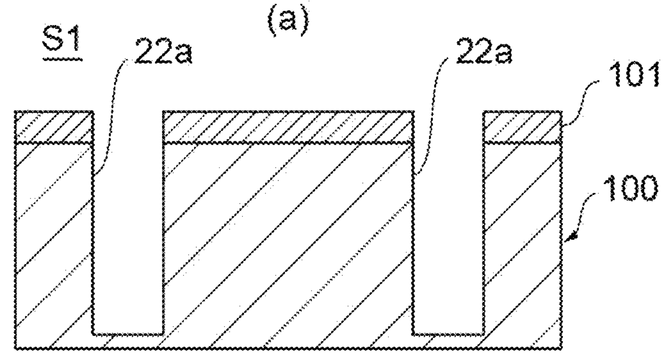
(b)
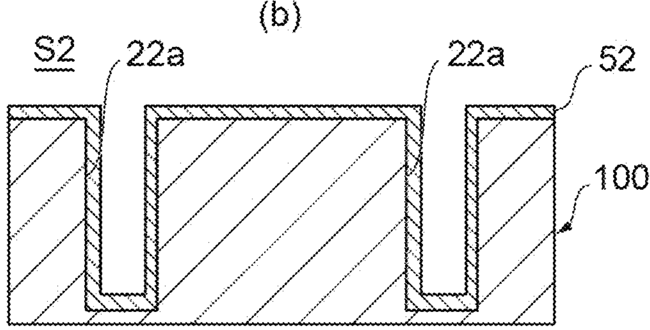
(c)
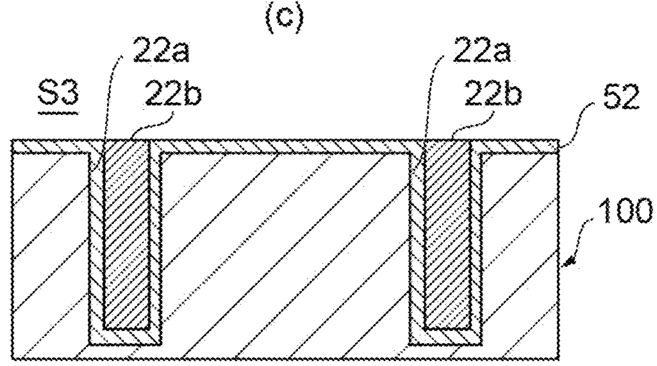
(d)
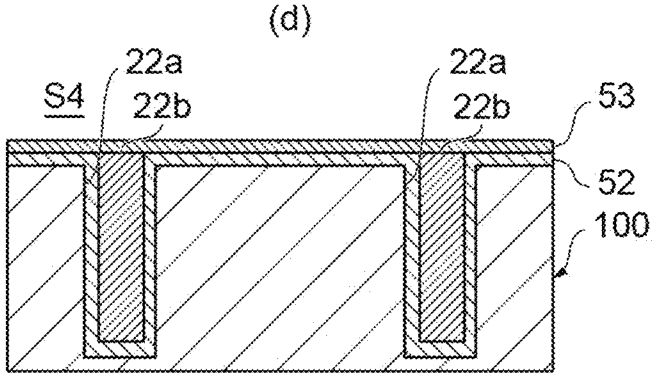

*Fig.20*
(a)
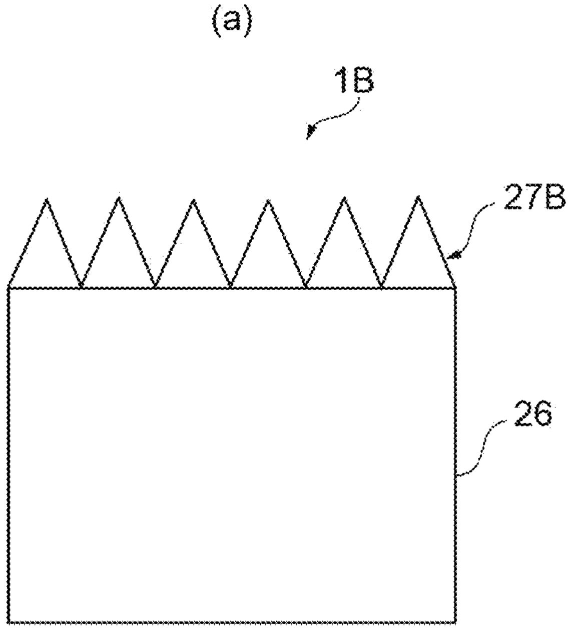
(b)
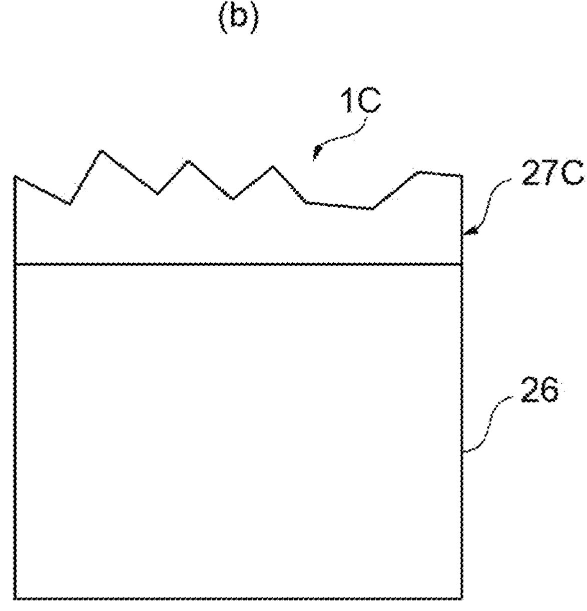

Fig.21
(a)
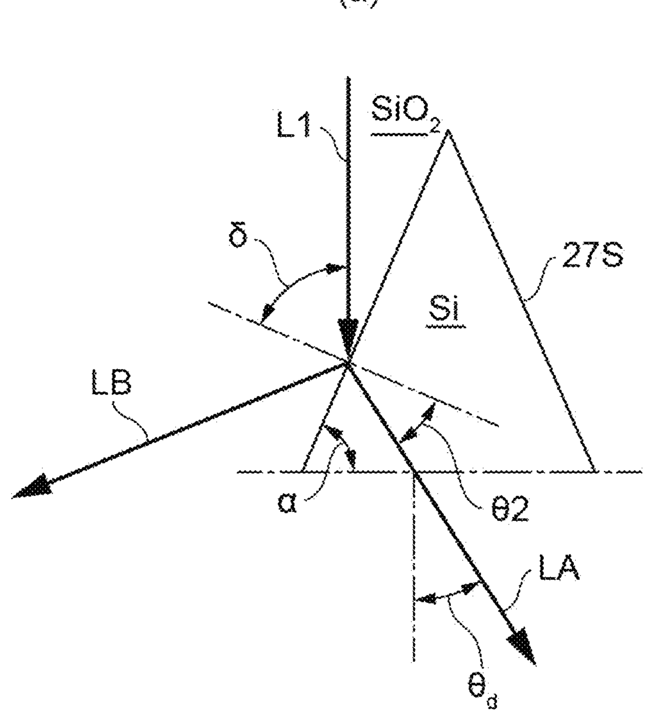
(b)
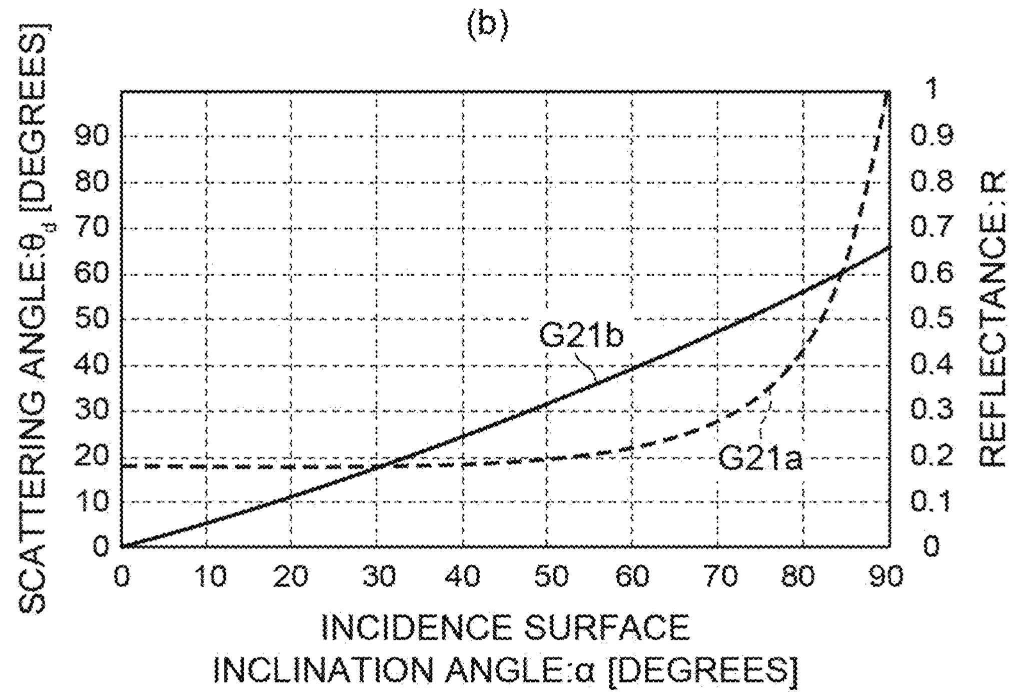

Fig.22
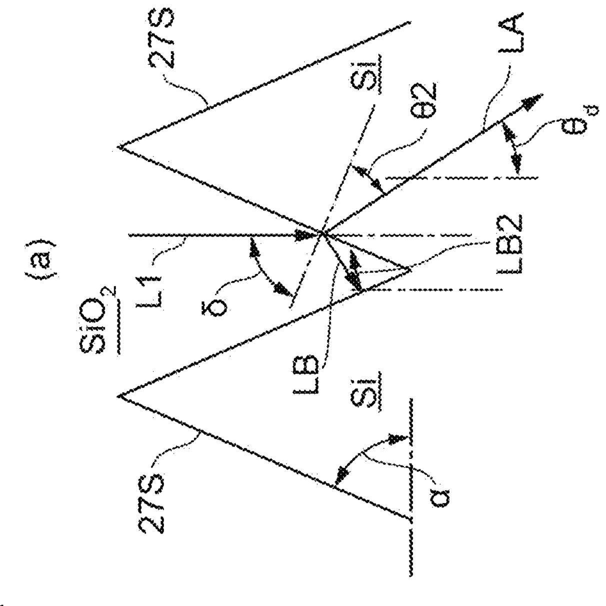
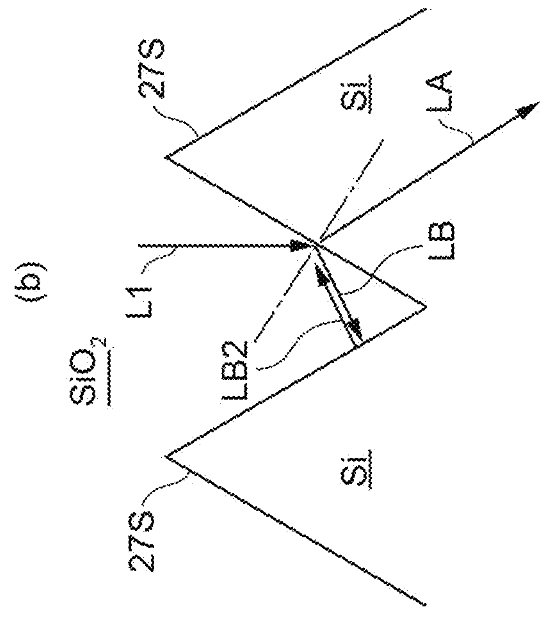
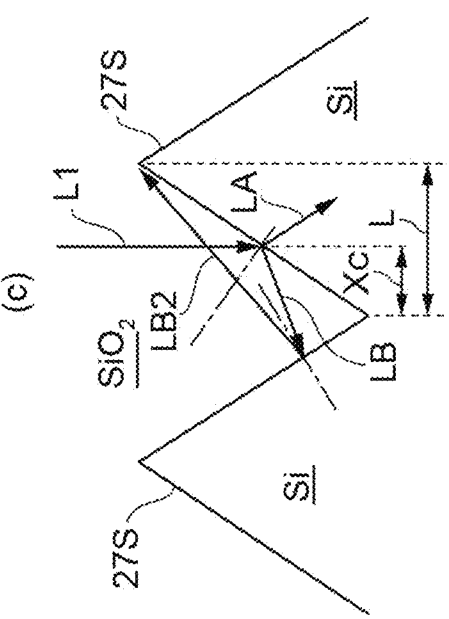
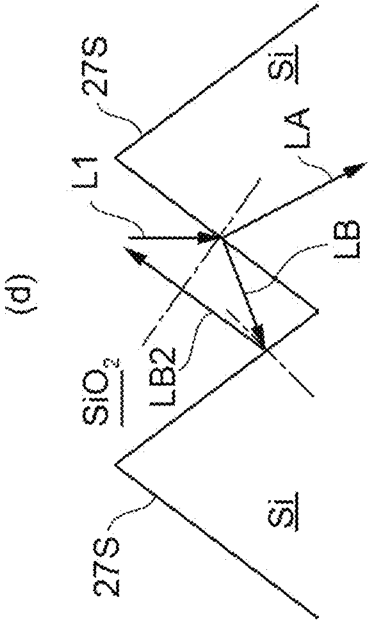

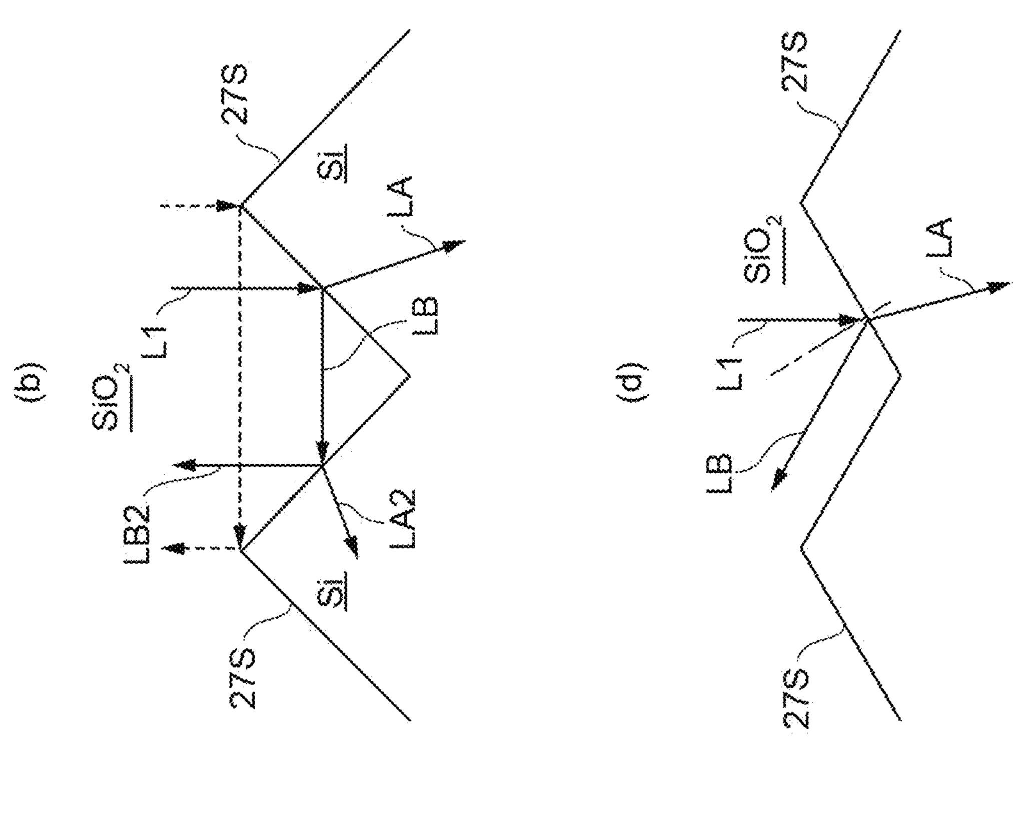
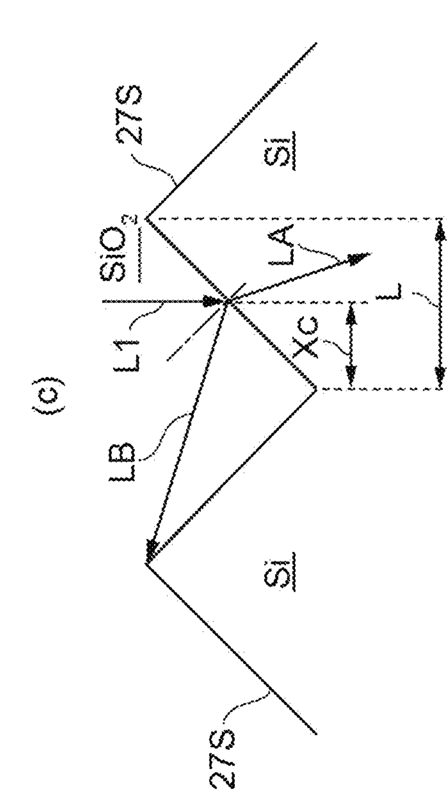
Fig.23
(a)

Fig.24
(a)
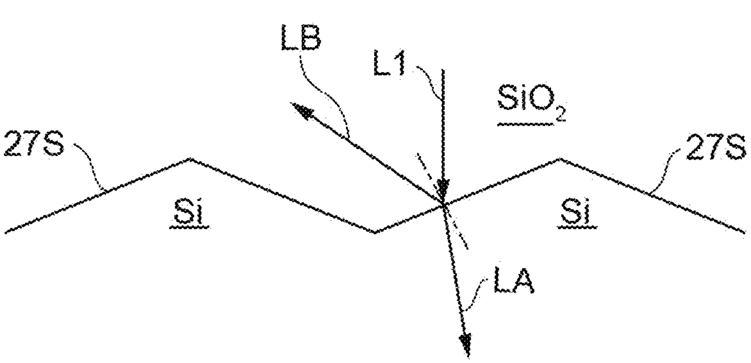
(b)
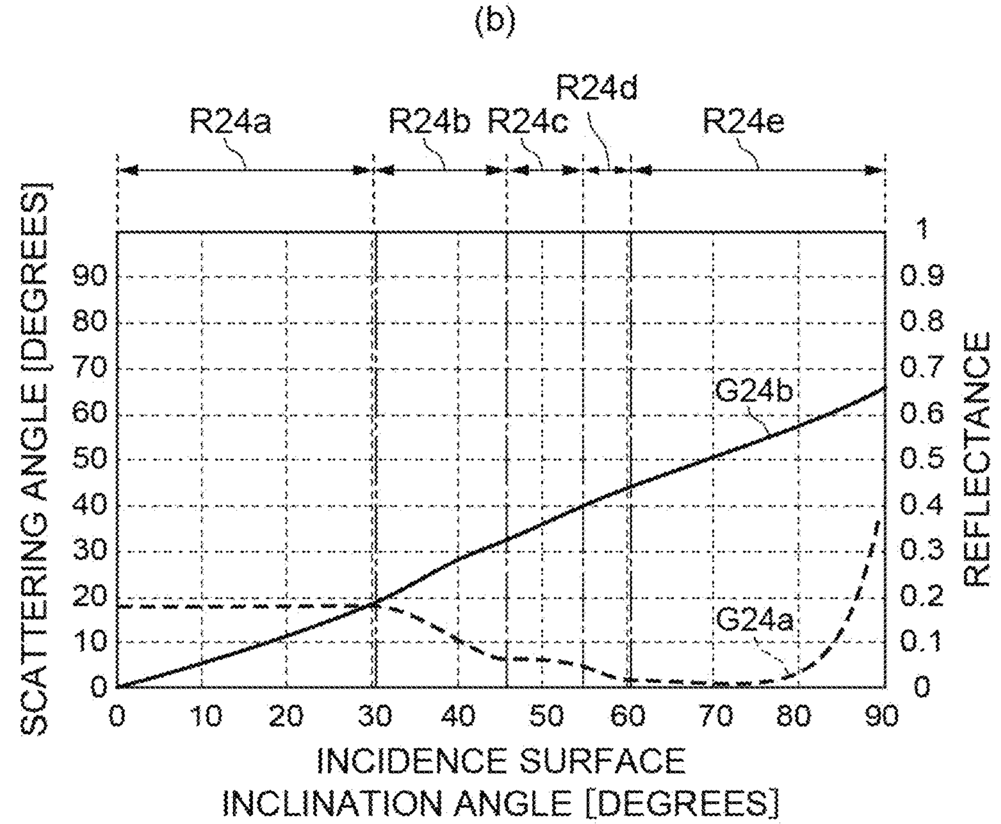

*Fig.25*
(a)
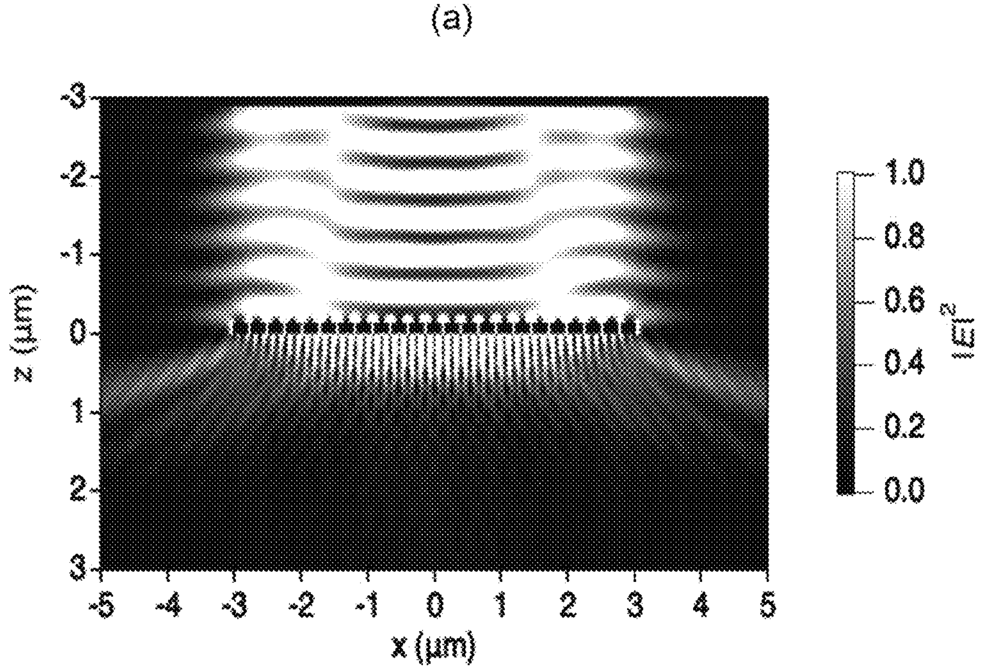
(b)
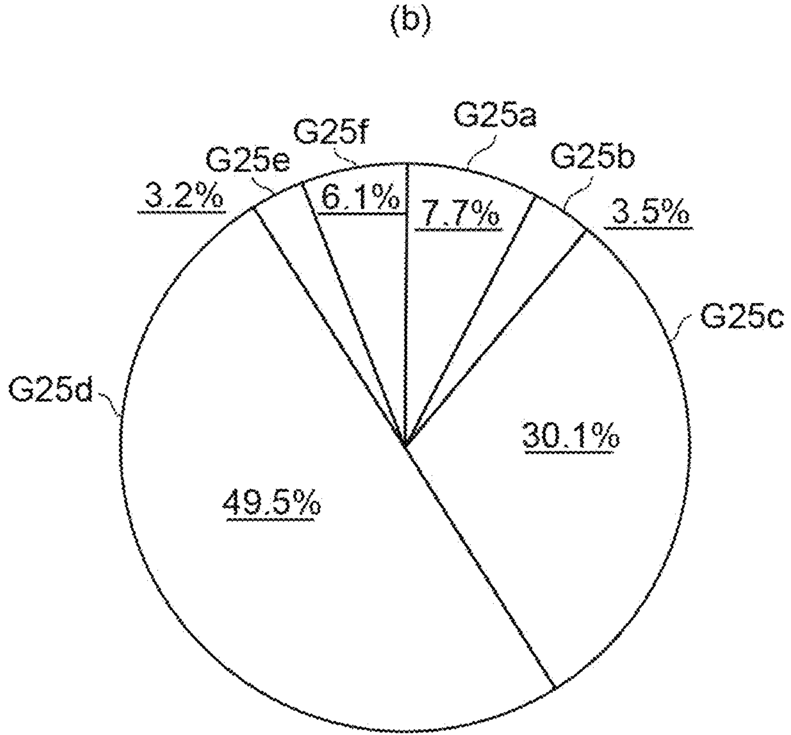

*Fig.26*
(a)
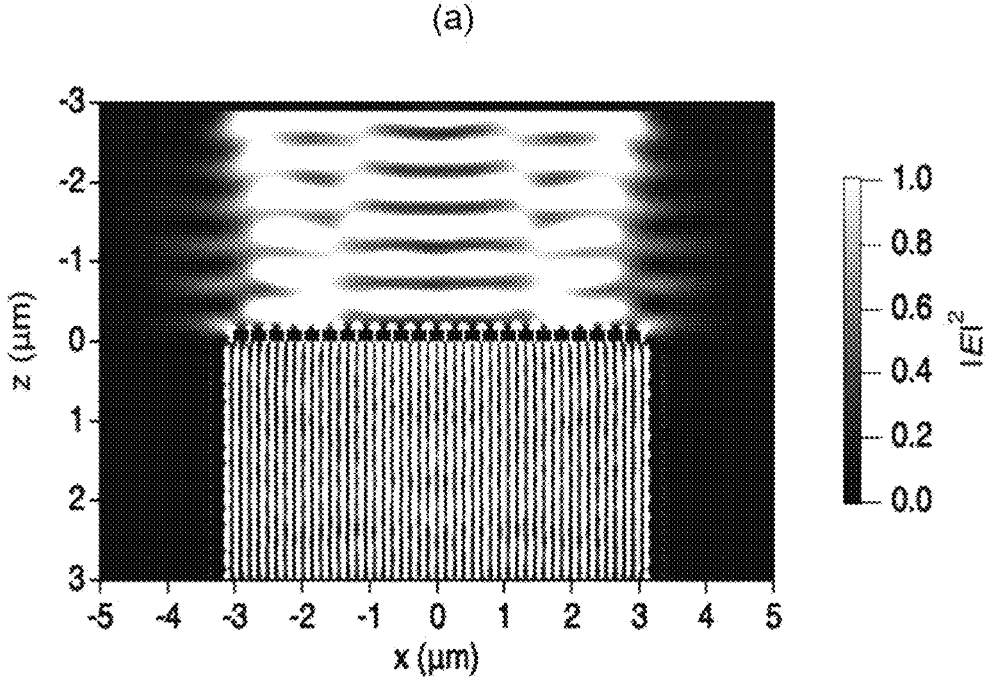
(b)
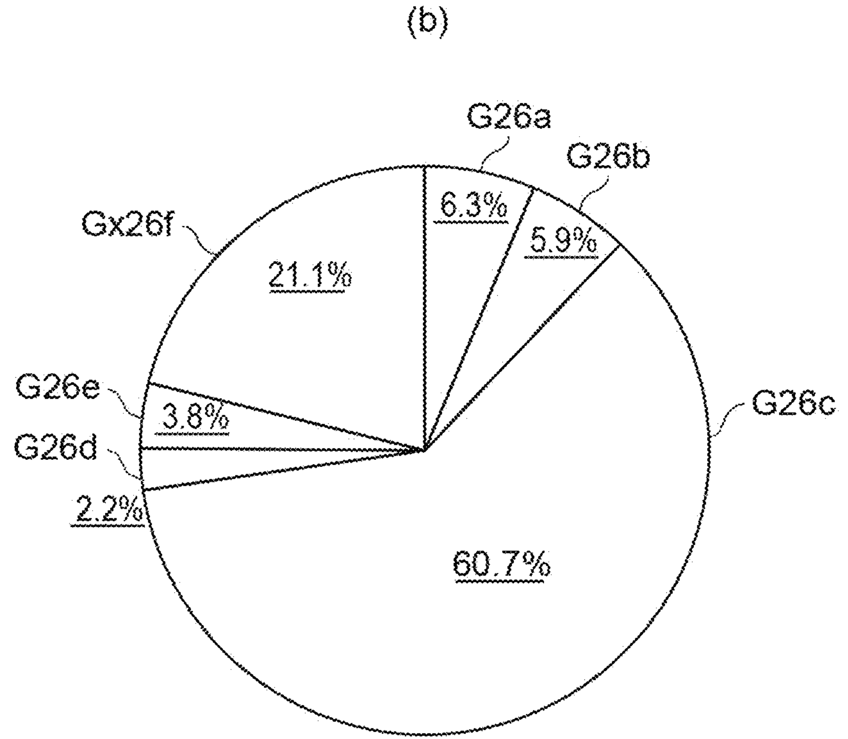

(a)

(b)

| | FIFTH EXAMINATION | SIXTH EXAMINATION | SEVENTH EXAMINATION | EIGHTH EXAMINATION |
|---|---|---|---|---|
| | ZERO DEGREES | FIVE DEGREES | ONE SCATTERING BODY | 23 SCATTERING BODIES |
| ZERO-ORDER REFLECTED LIGHT | 43.6 | 33.8 | 10.2 | 27.6 |
| SCATTERED REFLECTED LIGHT | 6.1 | 6.5 | 4.7 | 3.4 |
| TRANSMITTED LIGHT | 19.1 | 14.5 | 20.2 | 17.5 |
| LIGHT ABSORBED INTO TRENCH | 5.2 | 7.2 | 8.9 | 7.0 |
| LIGHT ABSORBED INTO SILVER | 4.0 | 2.9 | 12.1 | 12.3 |
| LIGHT ABSORBED INTO SILICON | 26.6 | 38.1 | 42.0 | 30.8 |
| TOTAL | 104.6 | 103.0 | 98.1 | 98.6 |

*Fig.32*
(a)
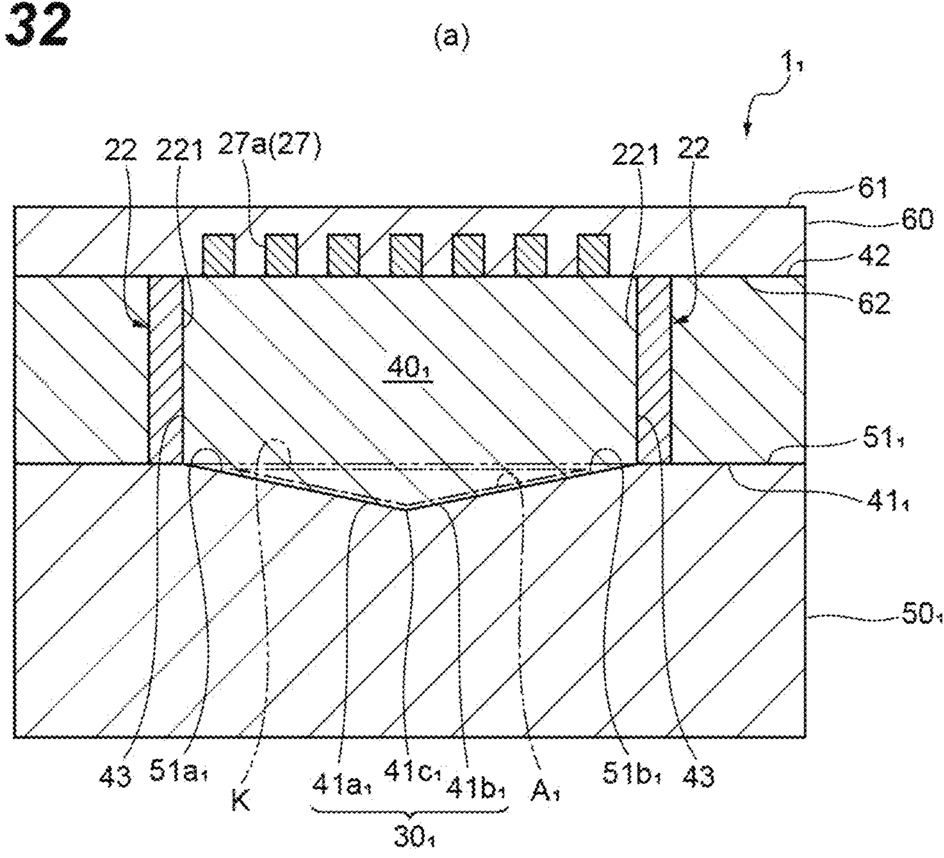
(b)
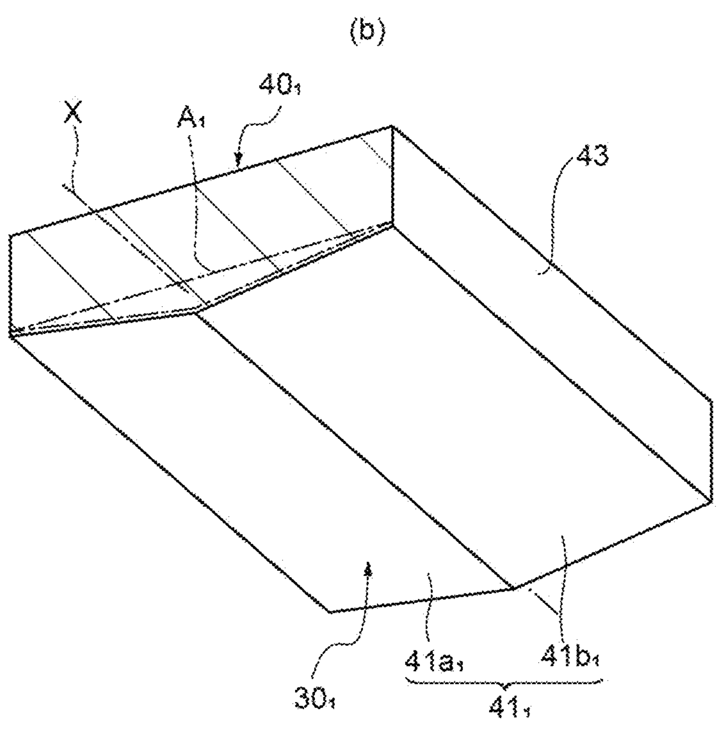

Fig.35
(a)
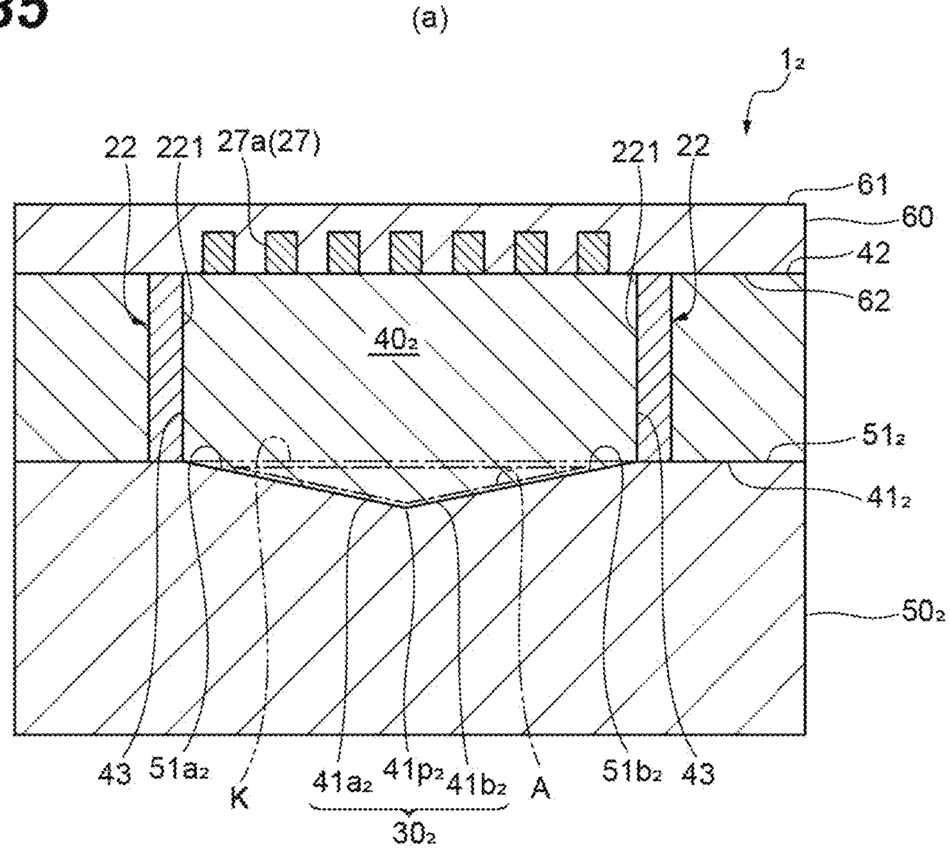
(b)
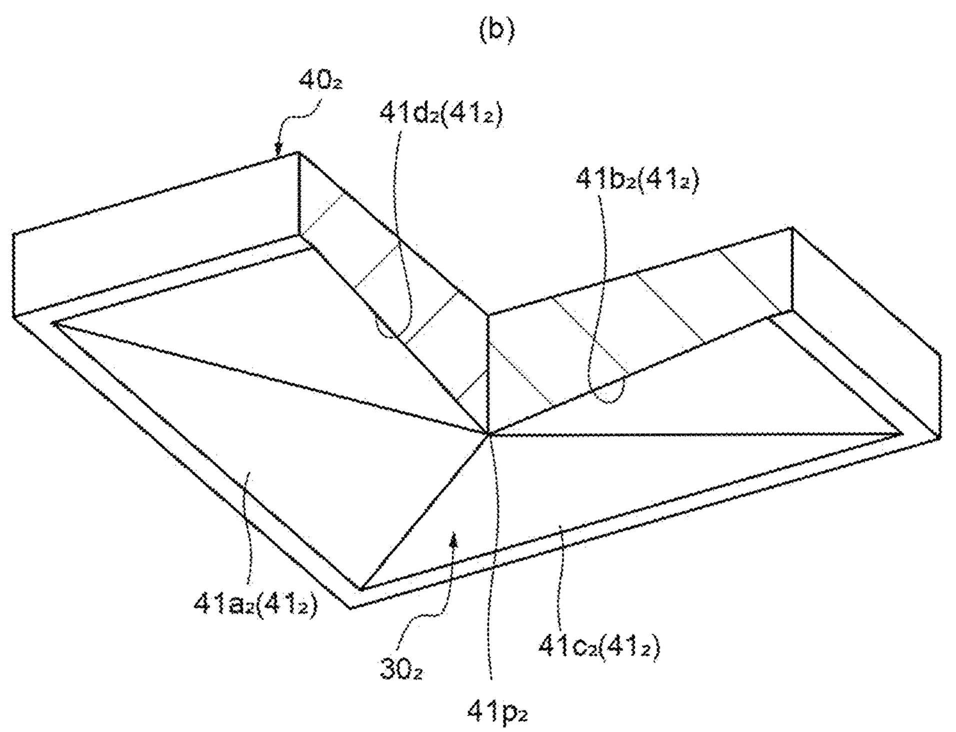

*Fig.36*
(a)
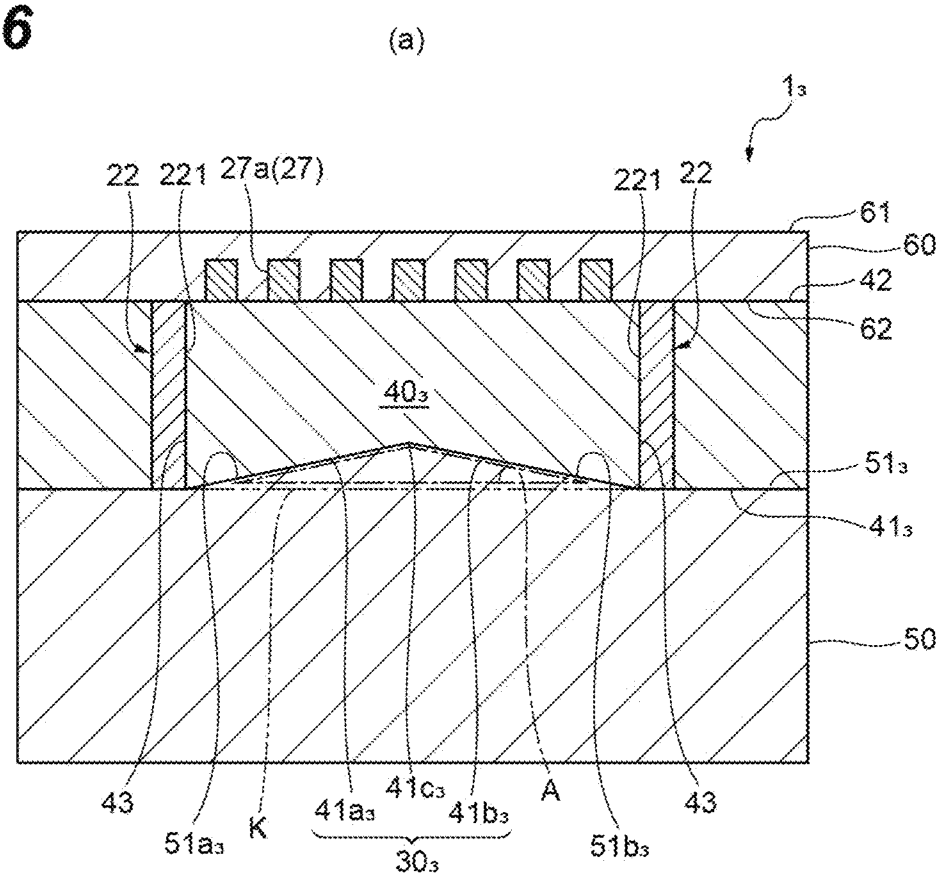
(b)
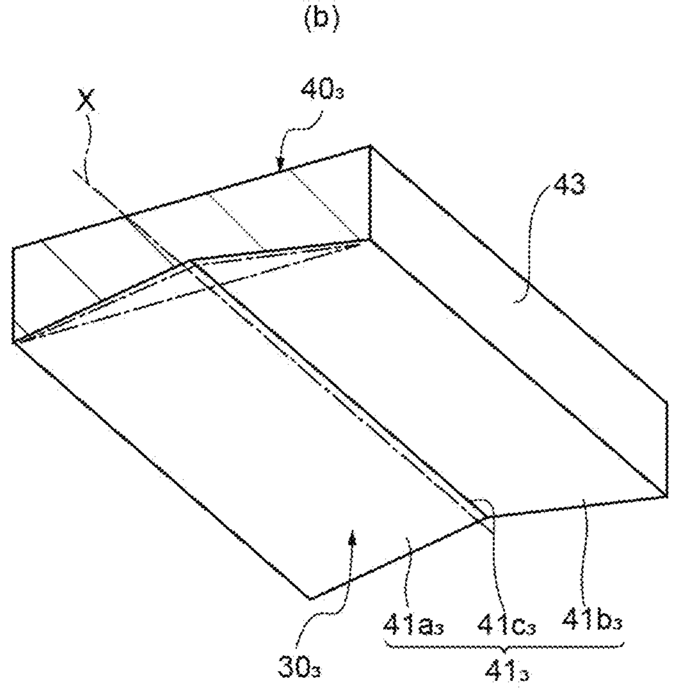

Fig.37
(a)
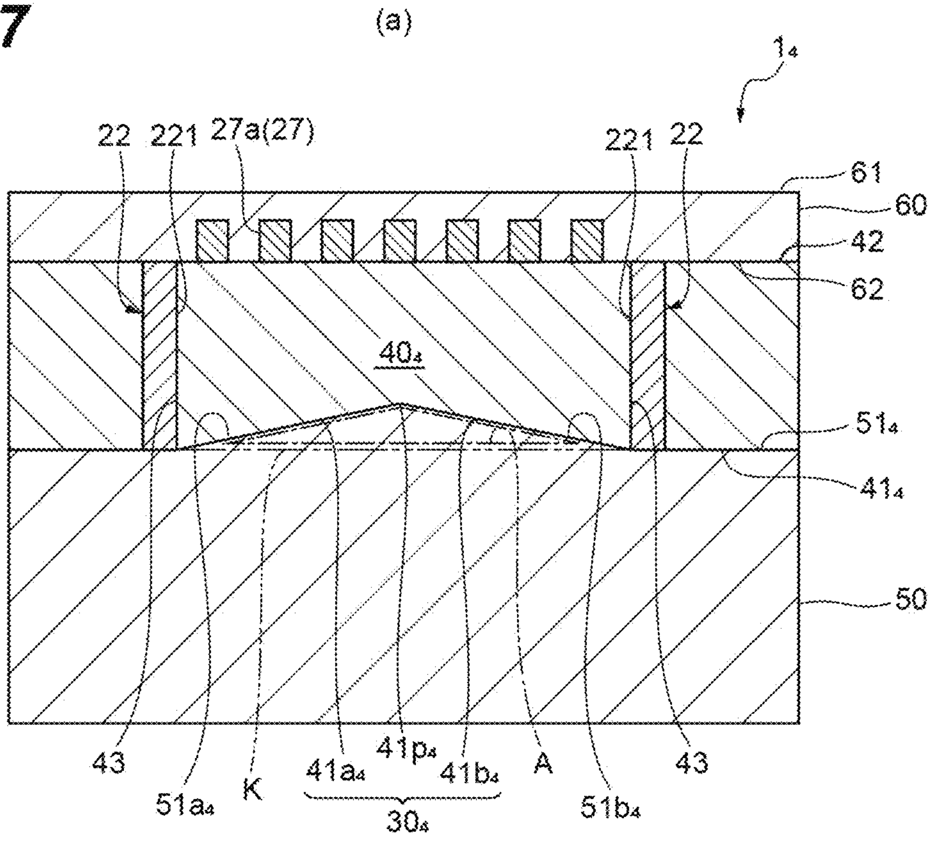
(b)
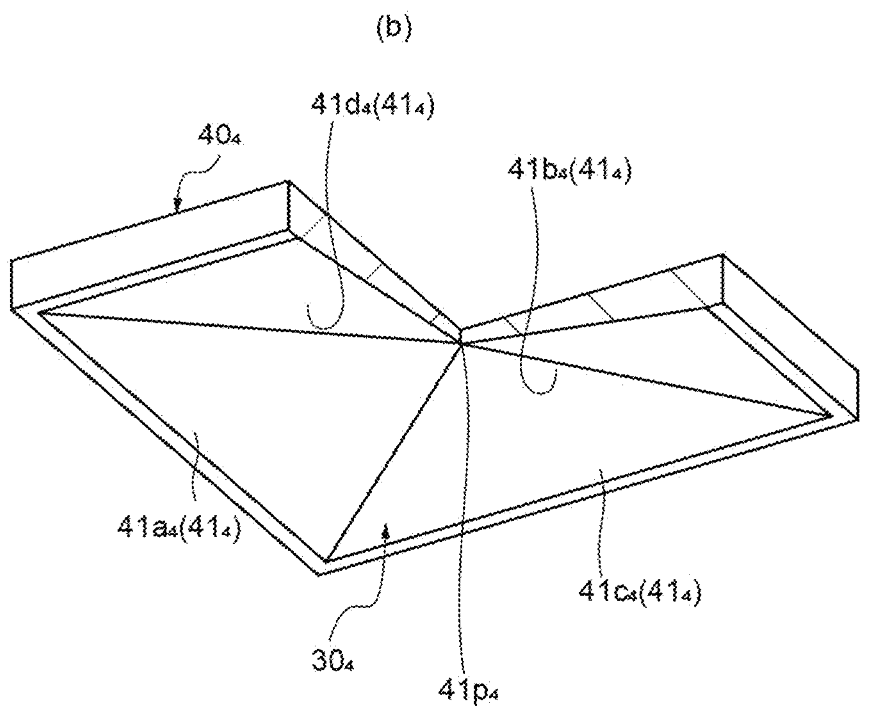

*Fig.38*
(a)
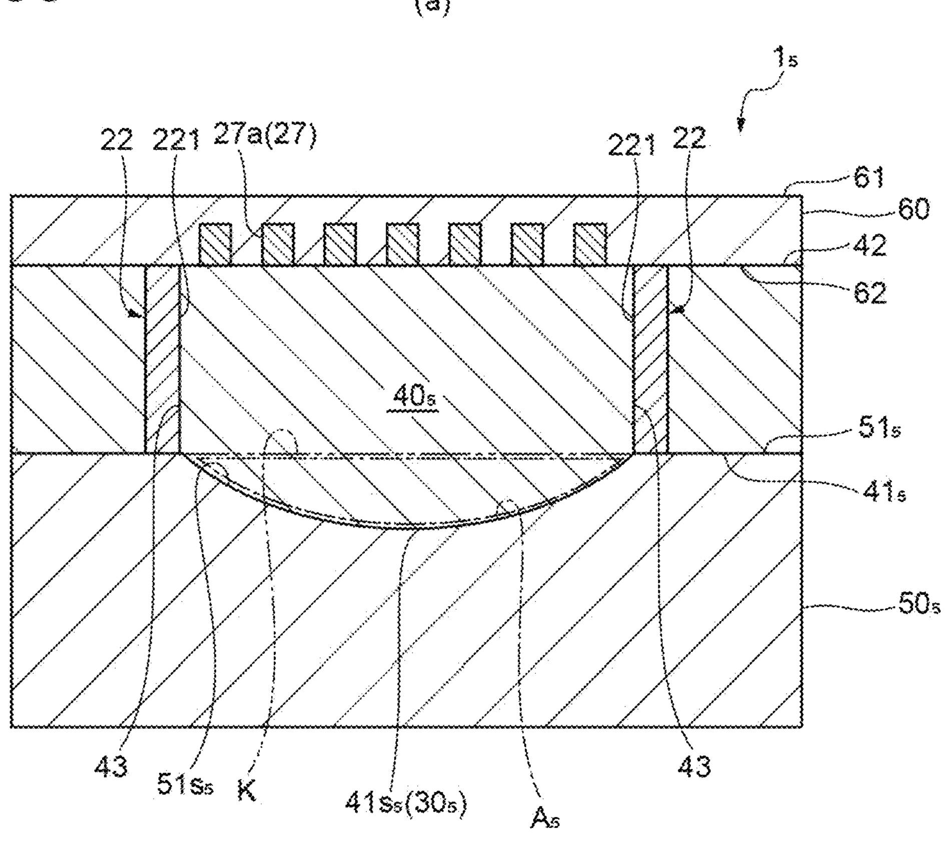
(b)
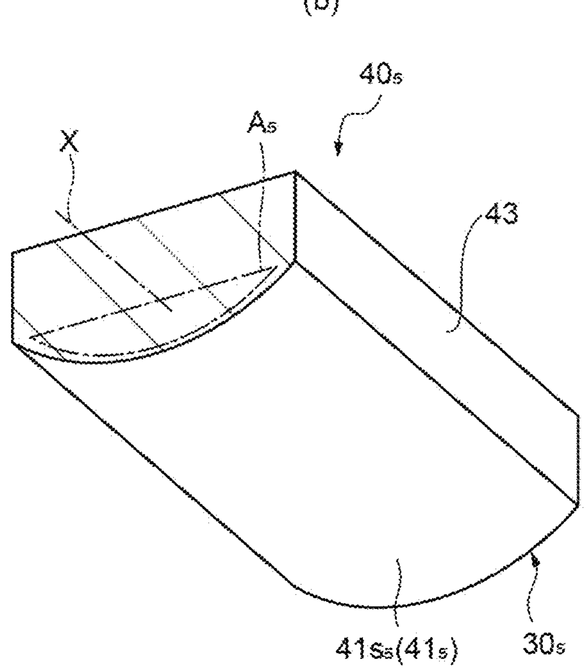

Fig.39
(a)
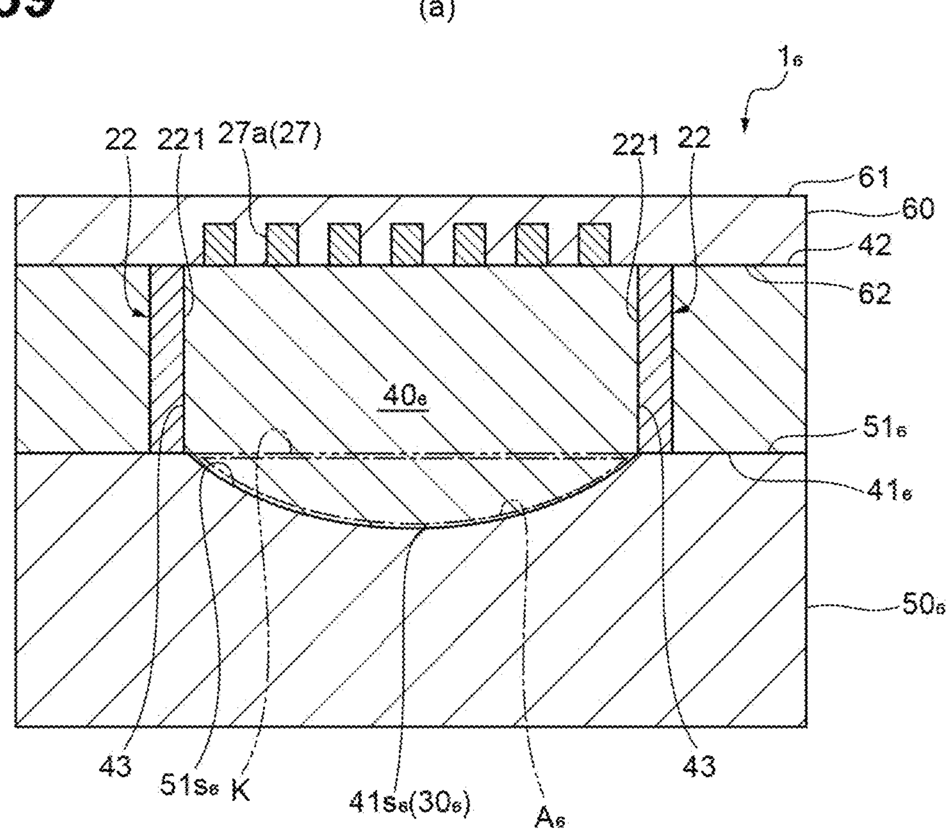
(b)
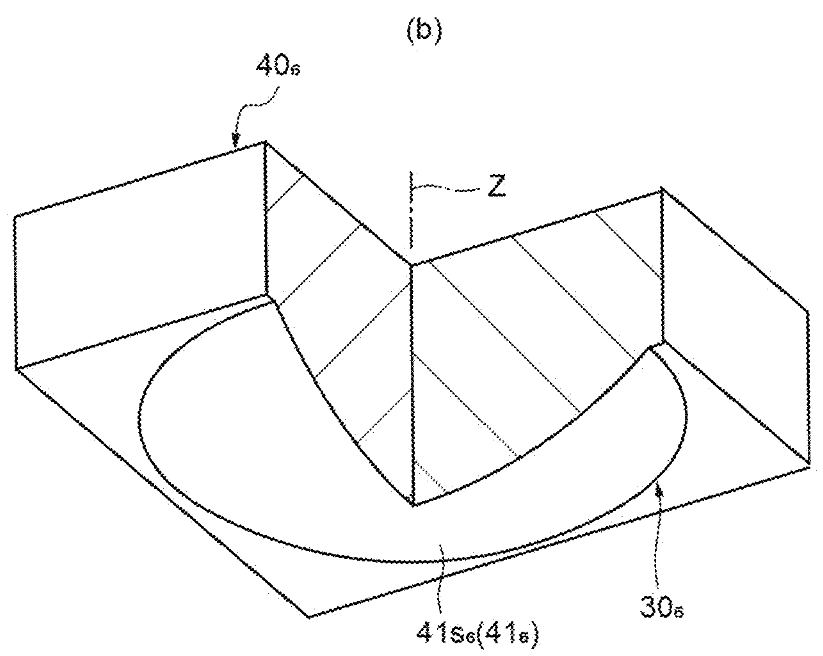

Fig.40
(a)
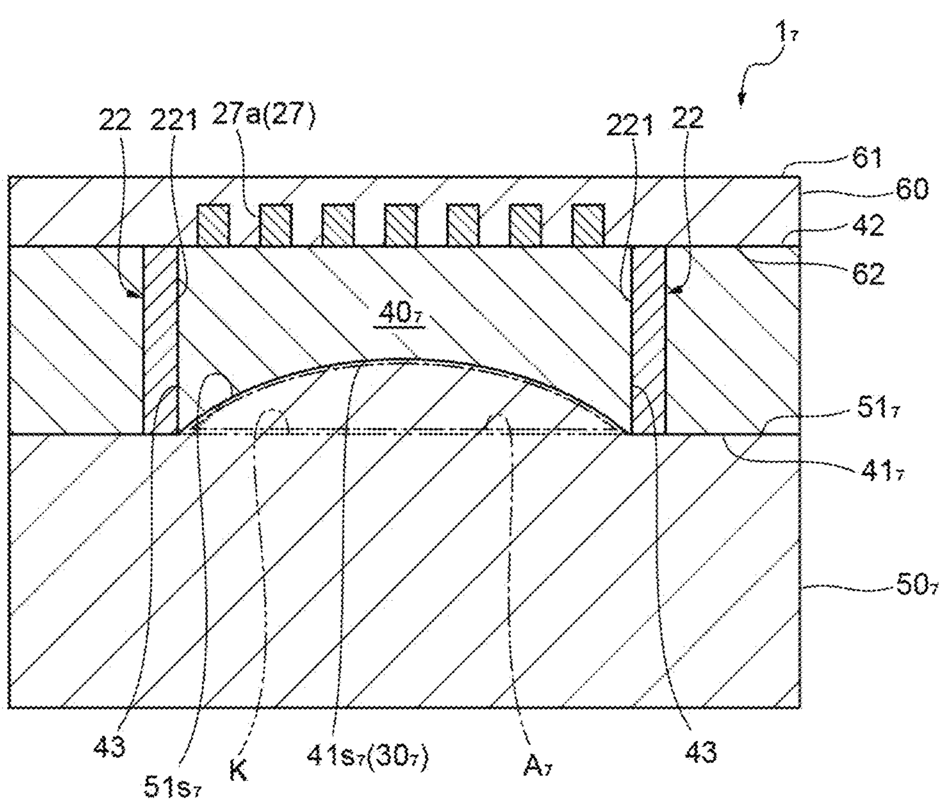
(b)
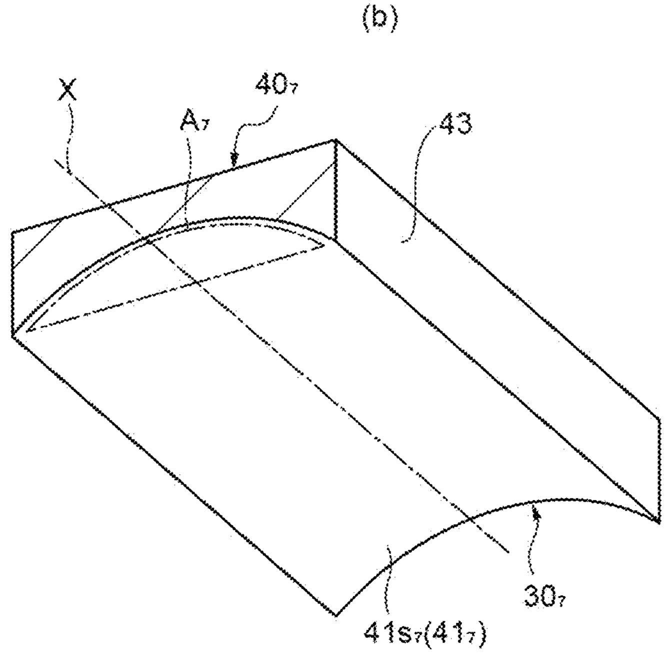

*Fig.41*
(a)
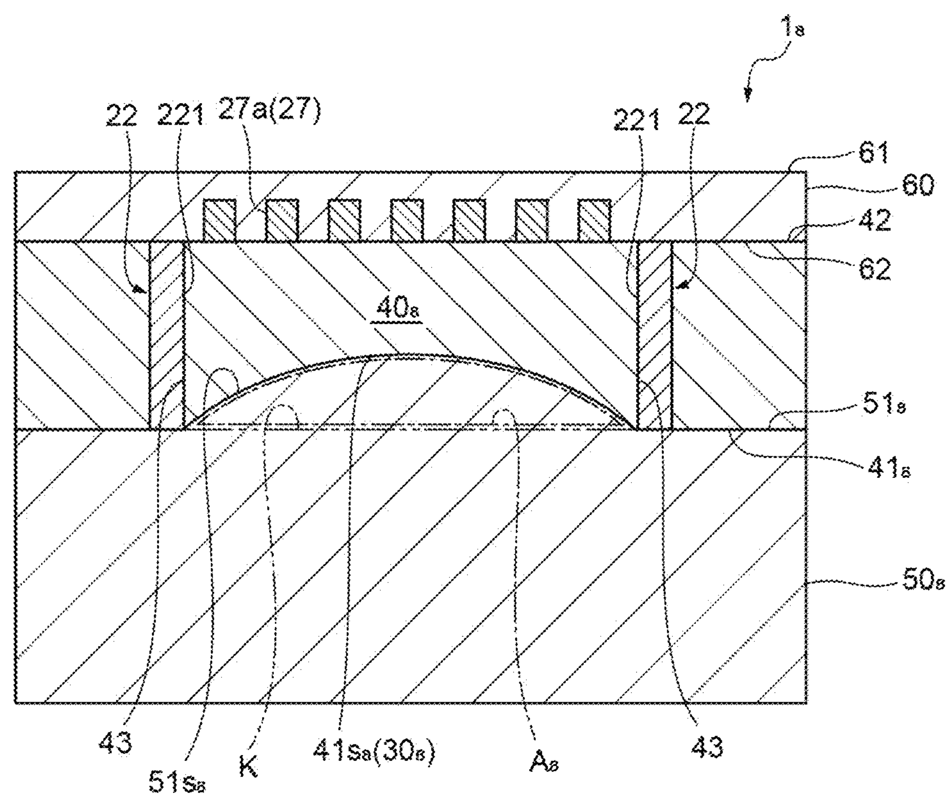
(b)
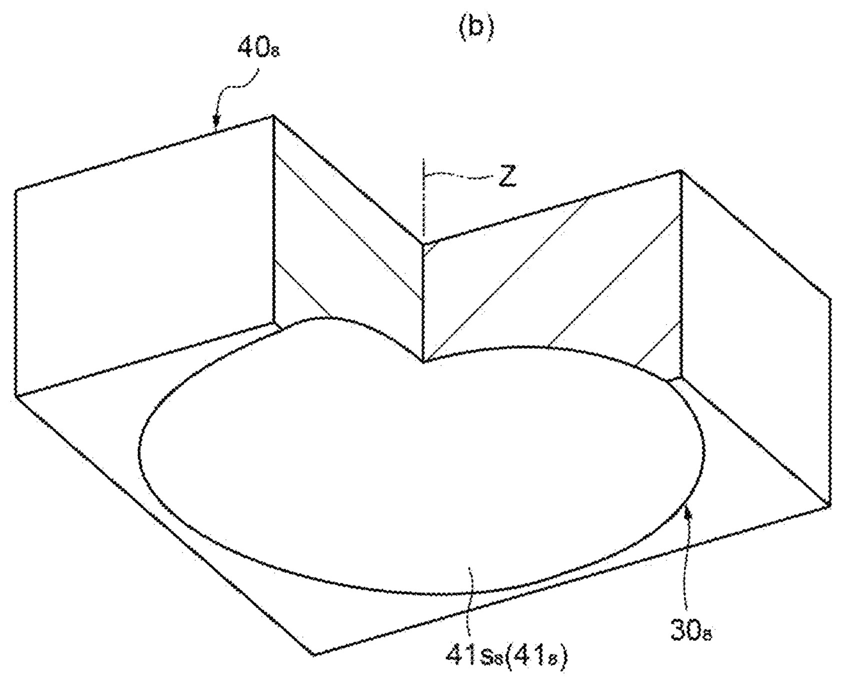

Fig.42
(a)
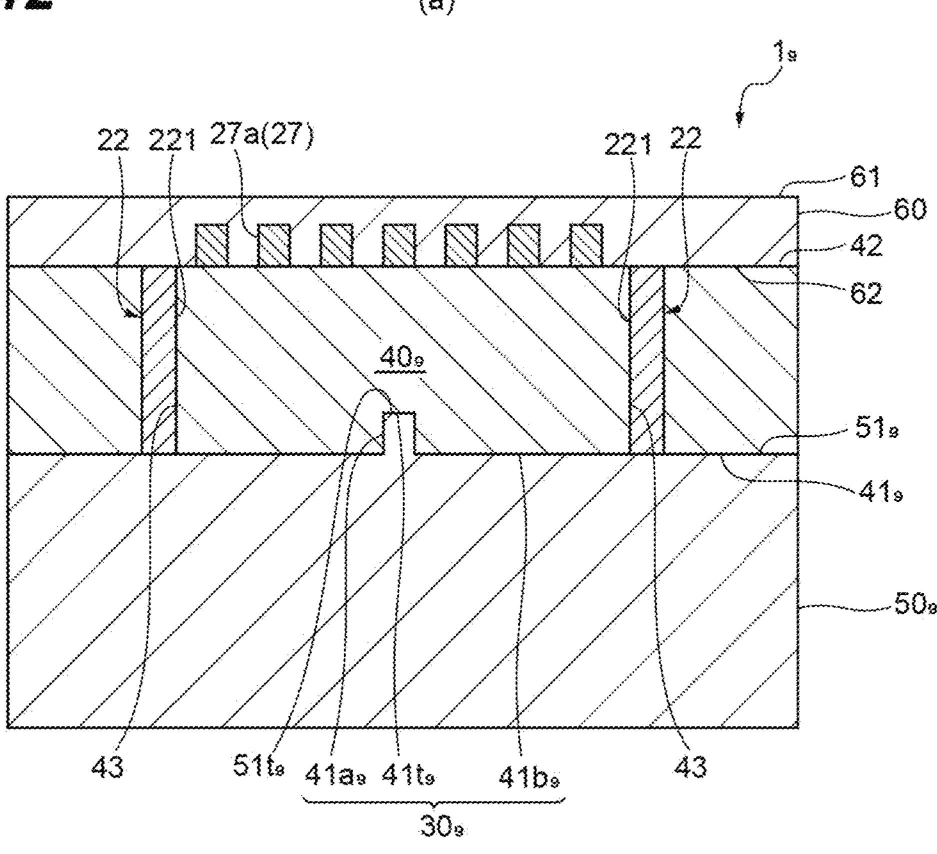
(b)
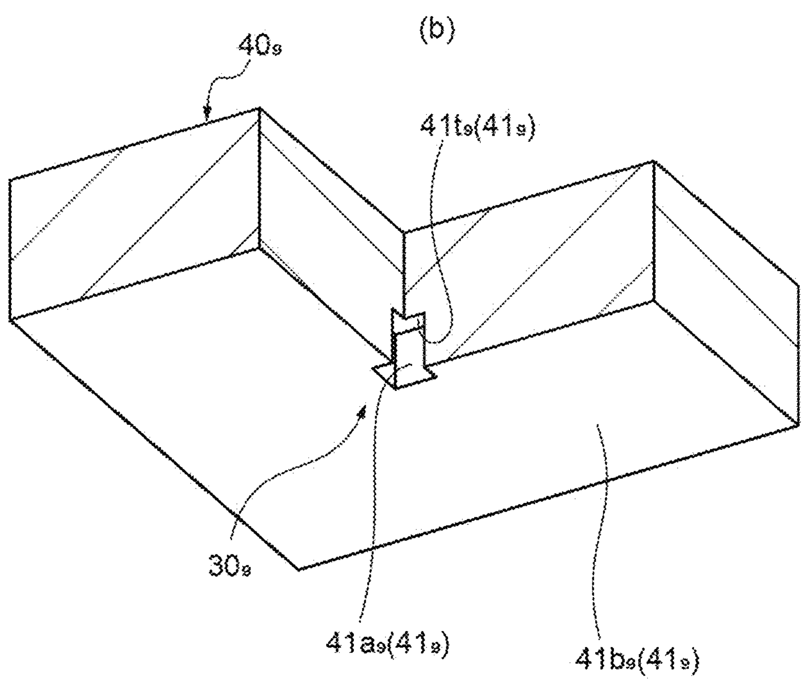

*Fig.44*
(a)
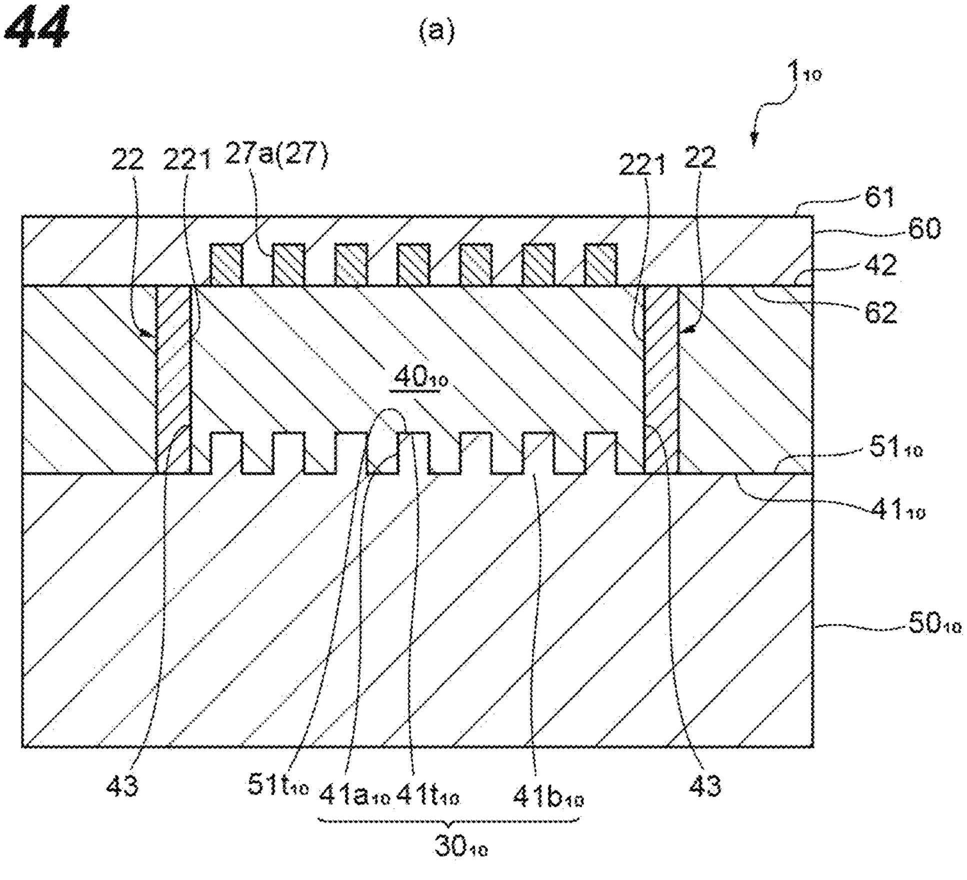
(b)
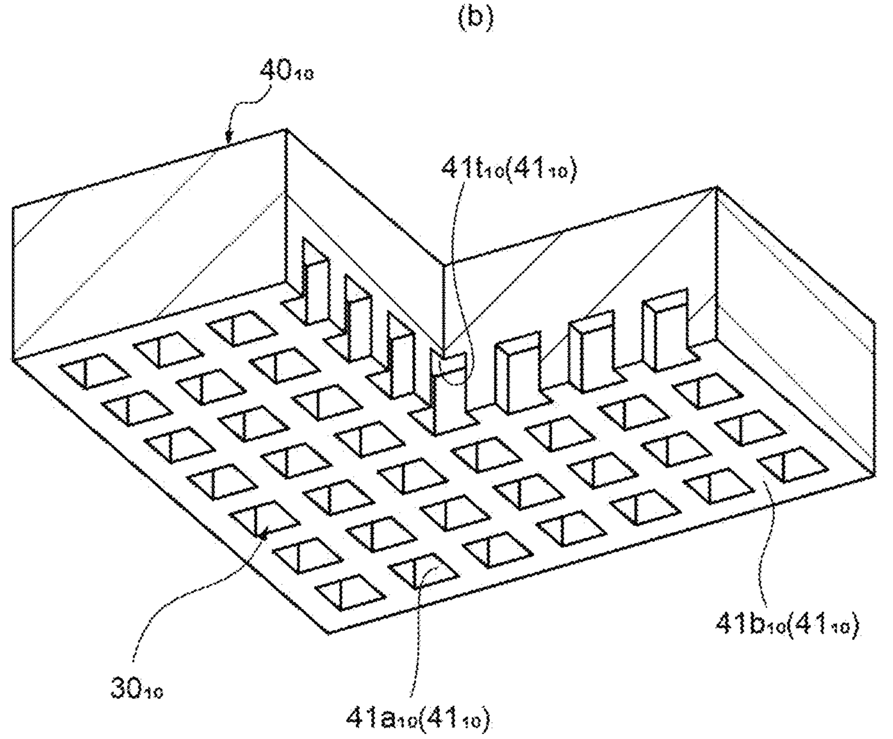

*Fig.45*
(a)
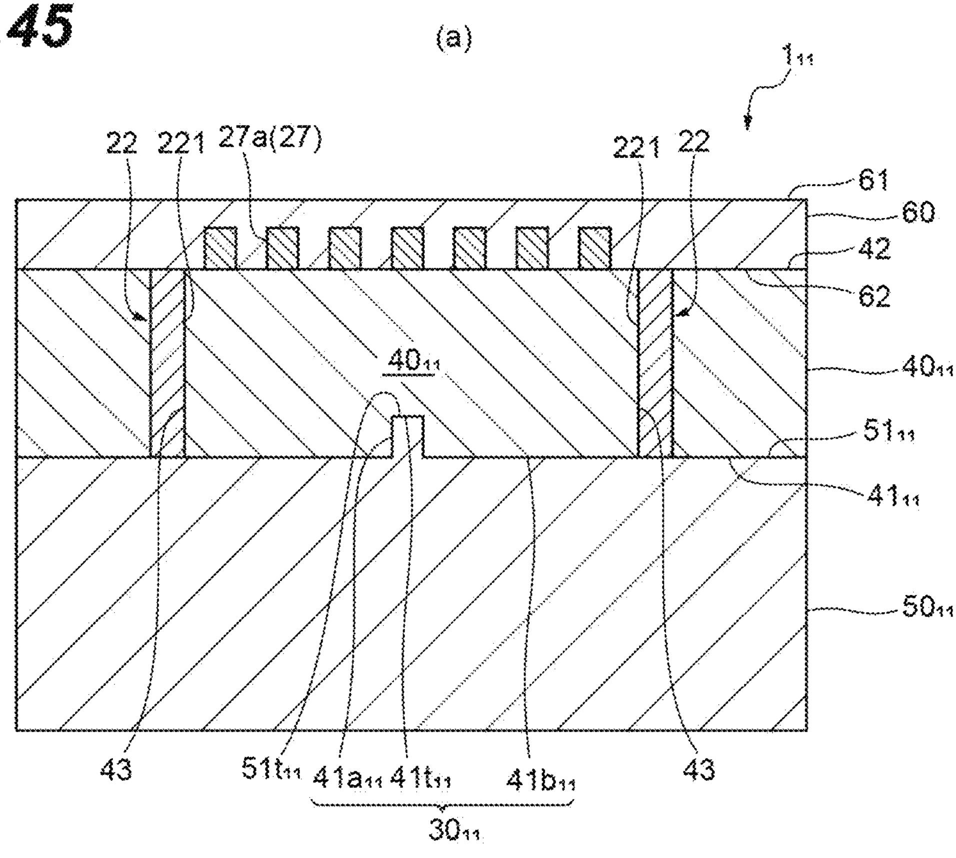
(b)
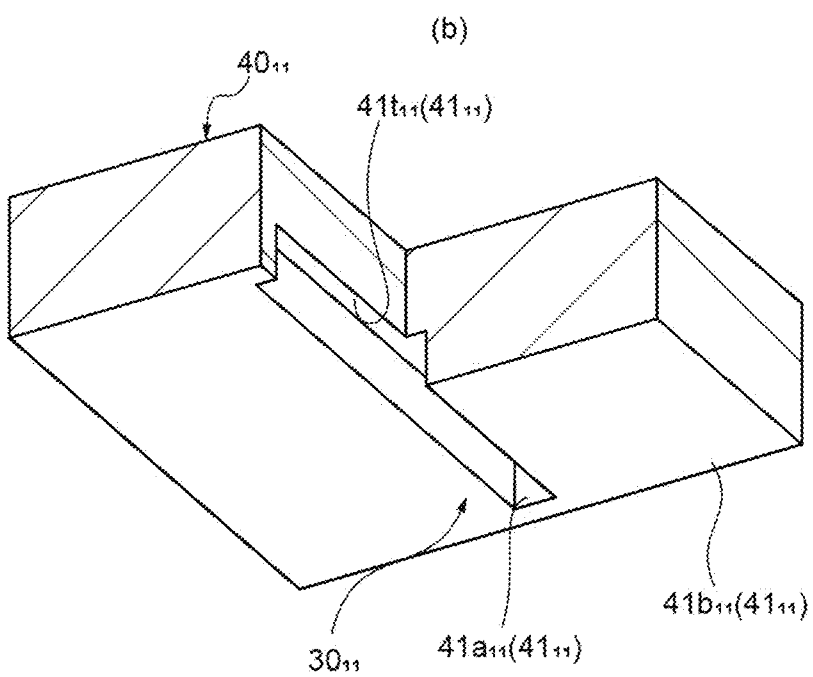

Fig.46
(a)
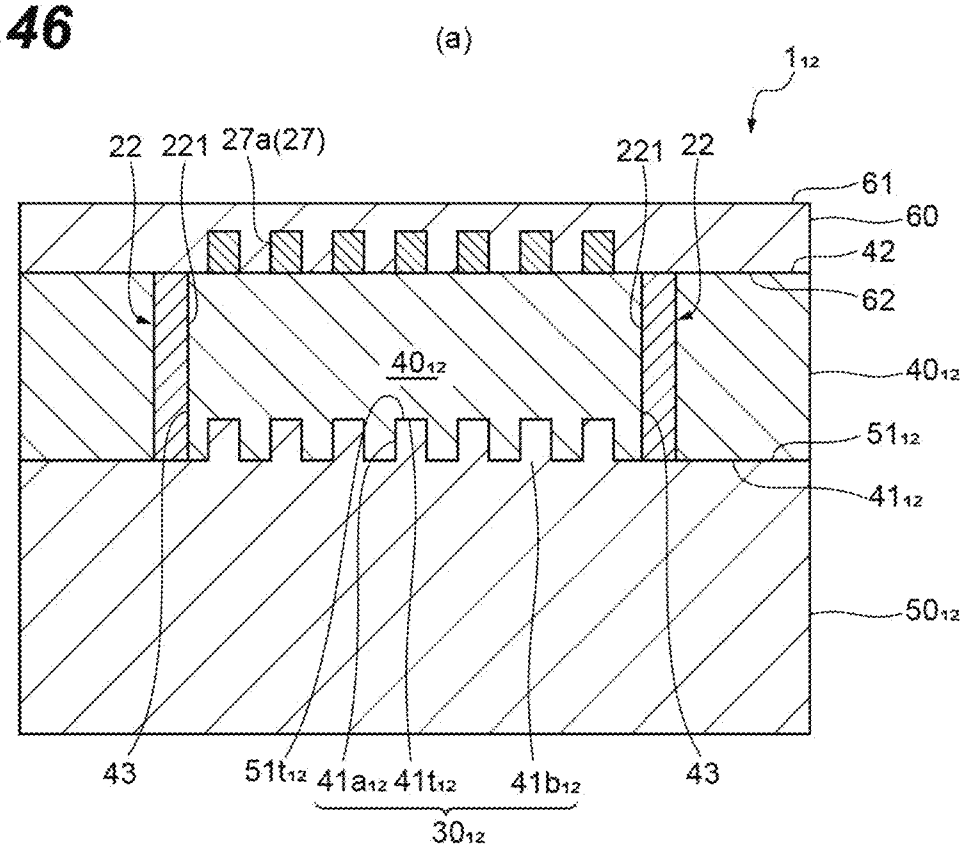
(b)
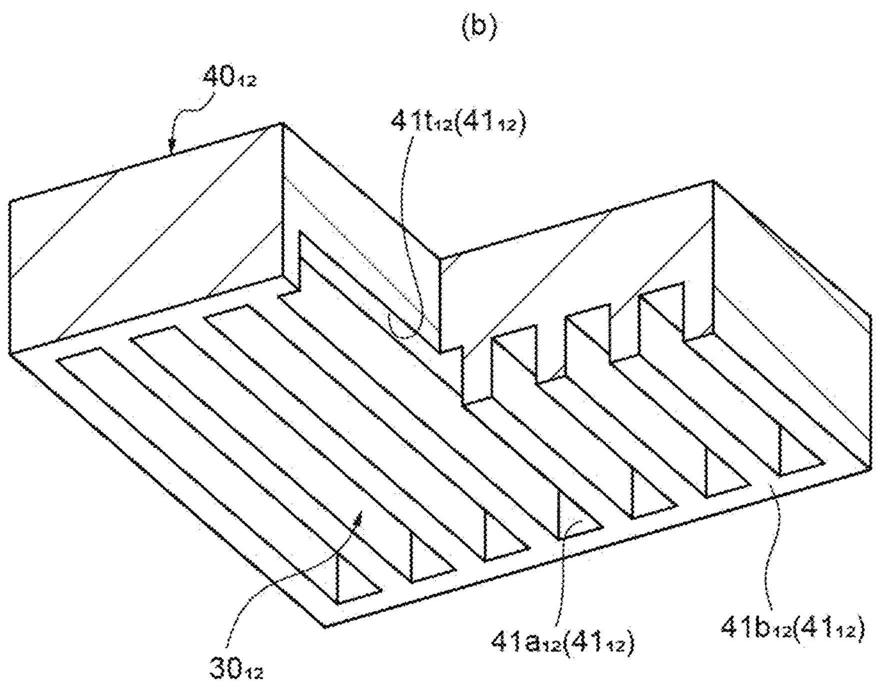

*Fig.47*
(a)
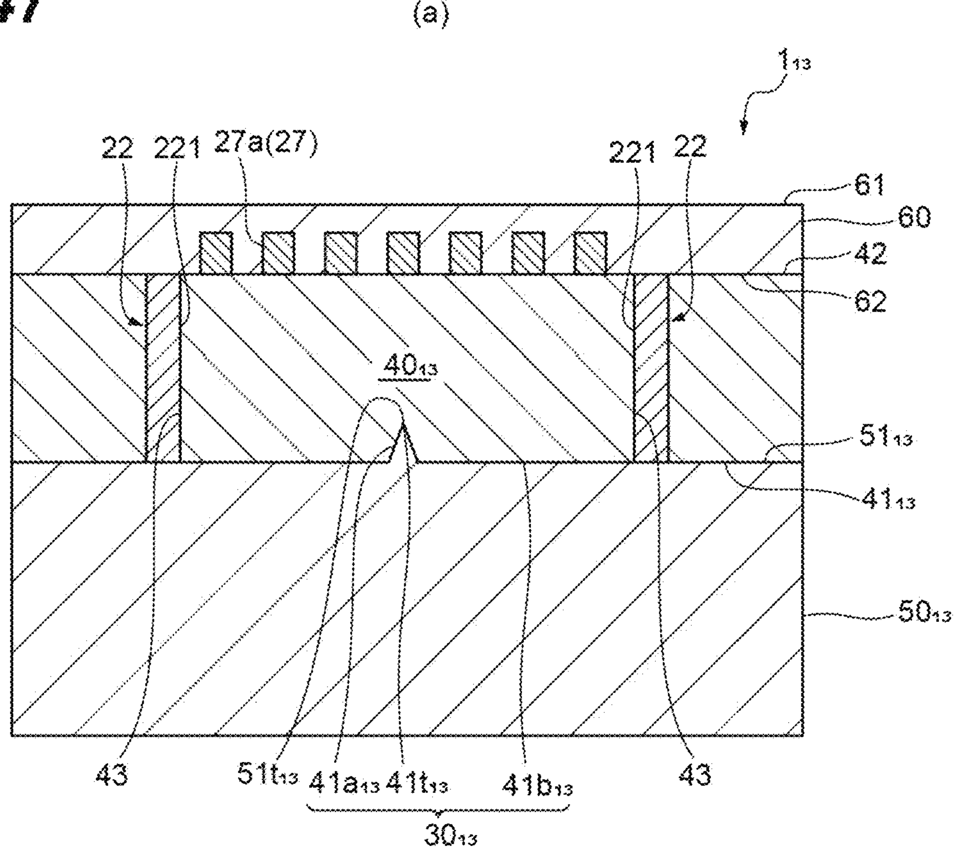
(b)
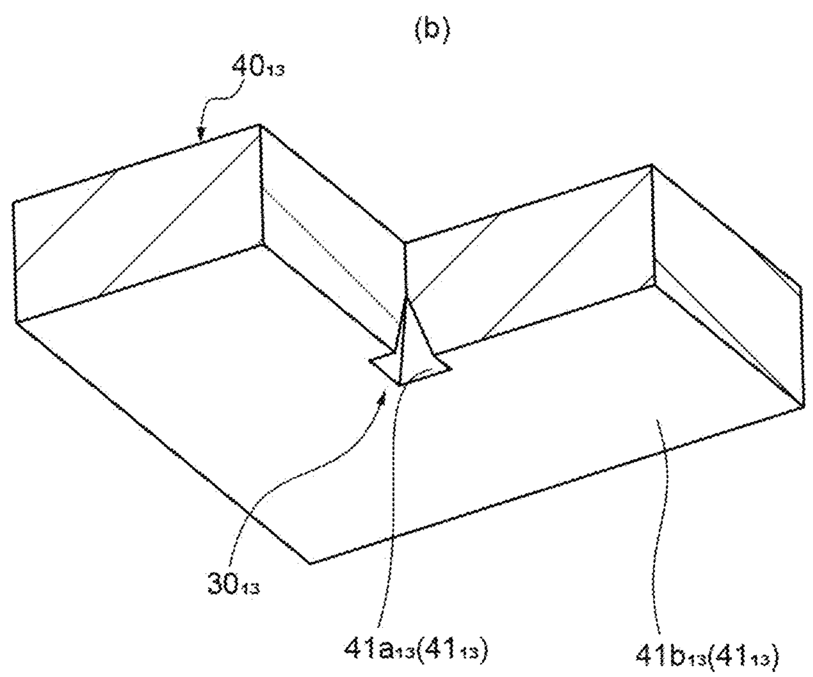

Fig.48
(a)
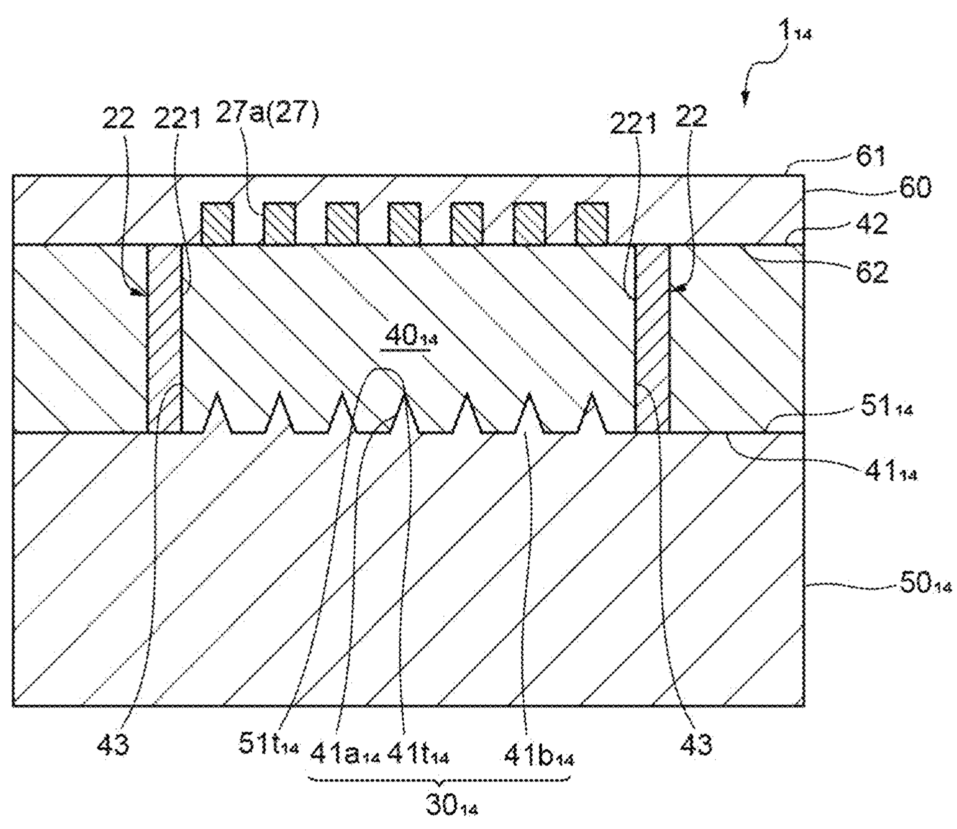
(b)
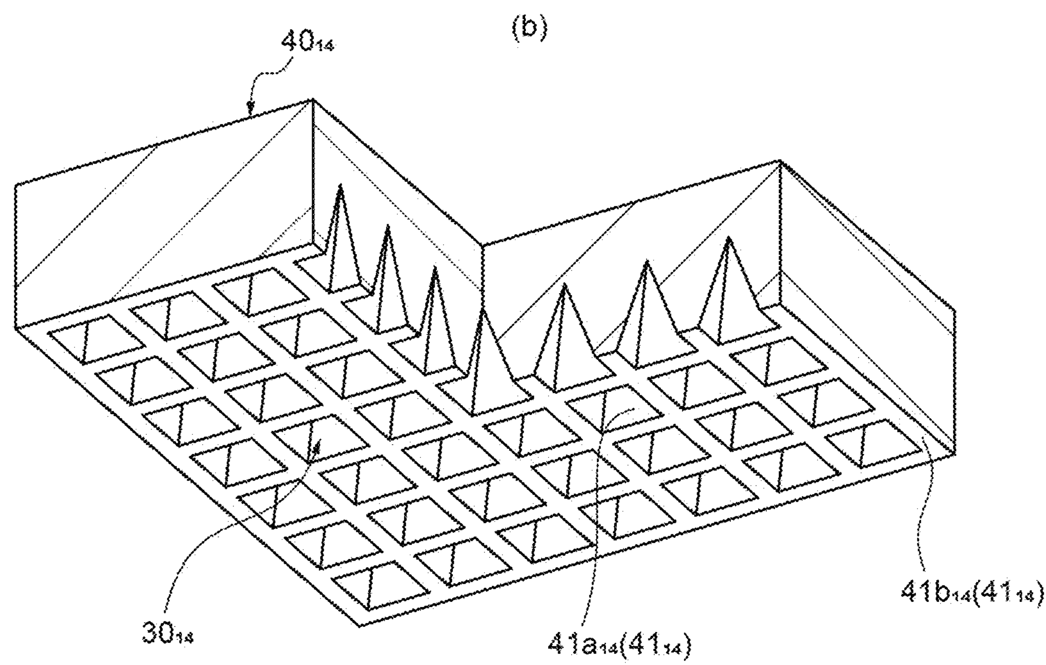

Fig.49
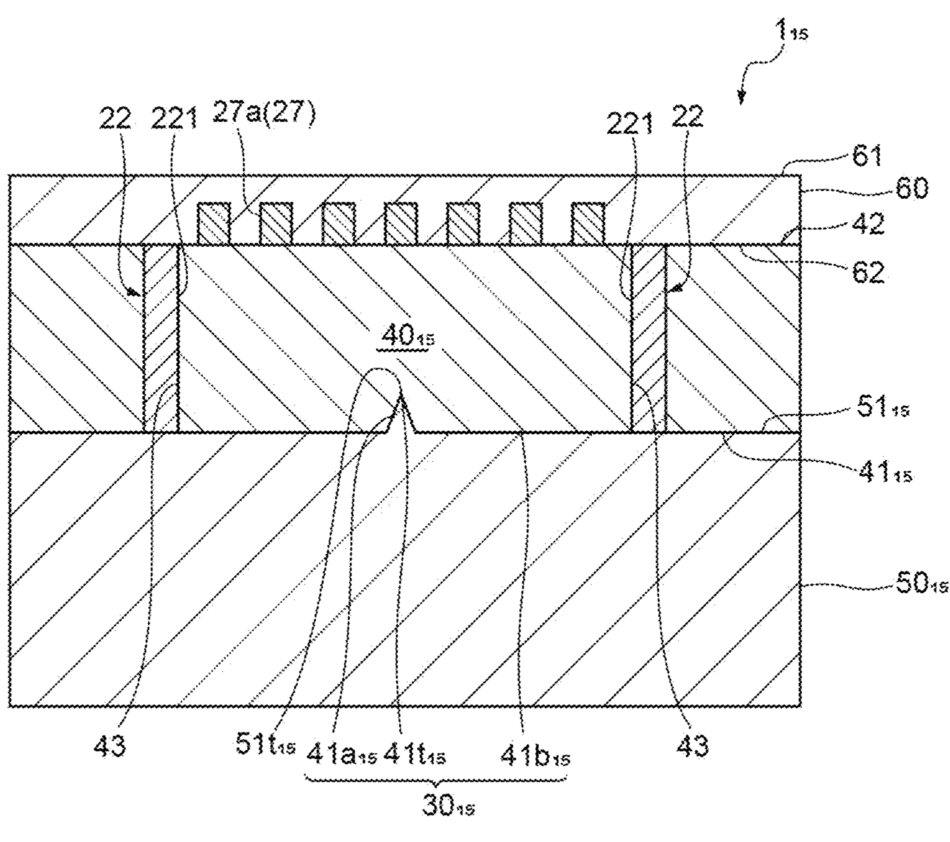
(b)
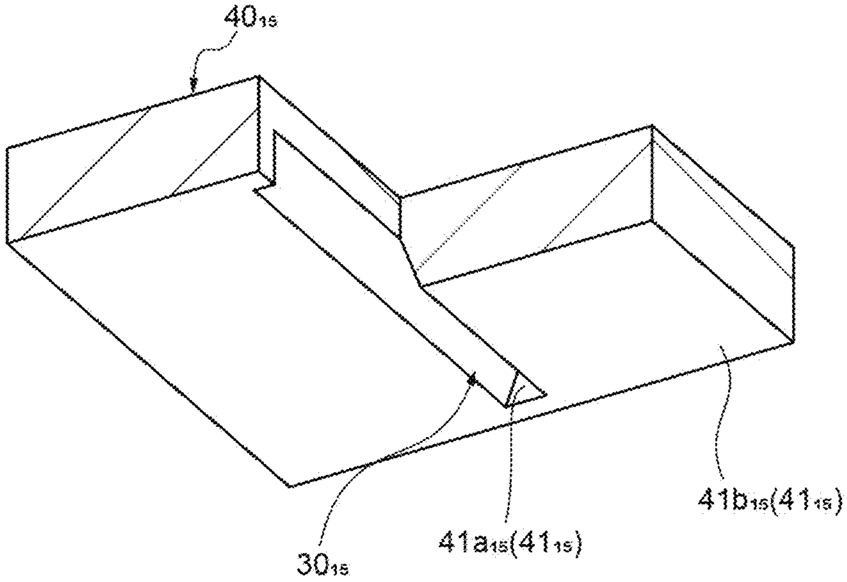

*Fig.50*
(a)
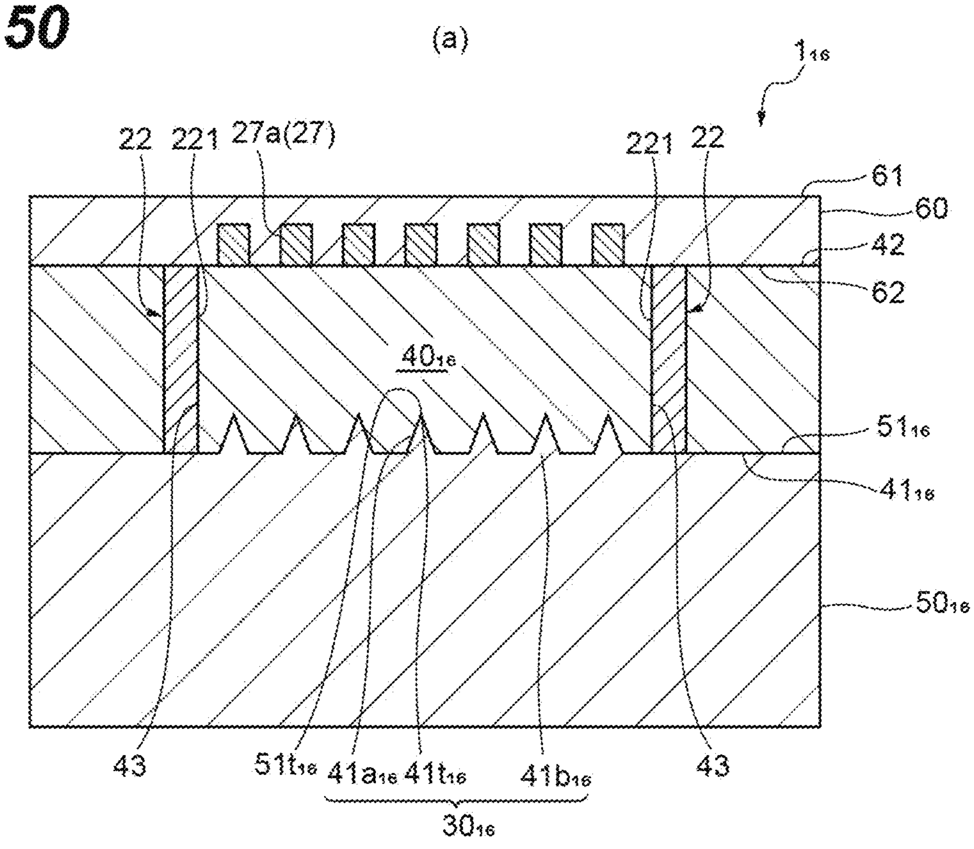
(b)
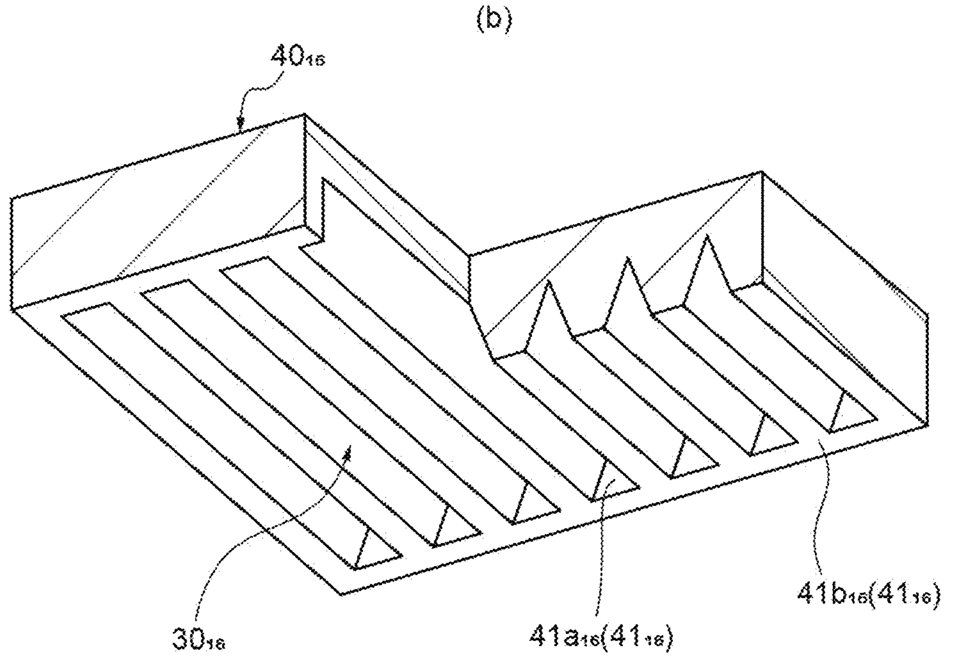

*Fig.51*
(a)
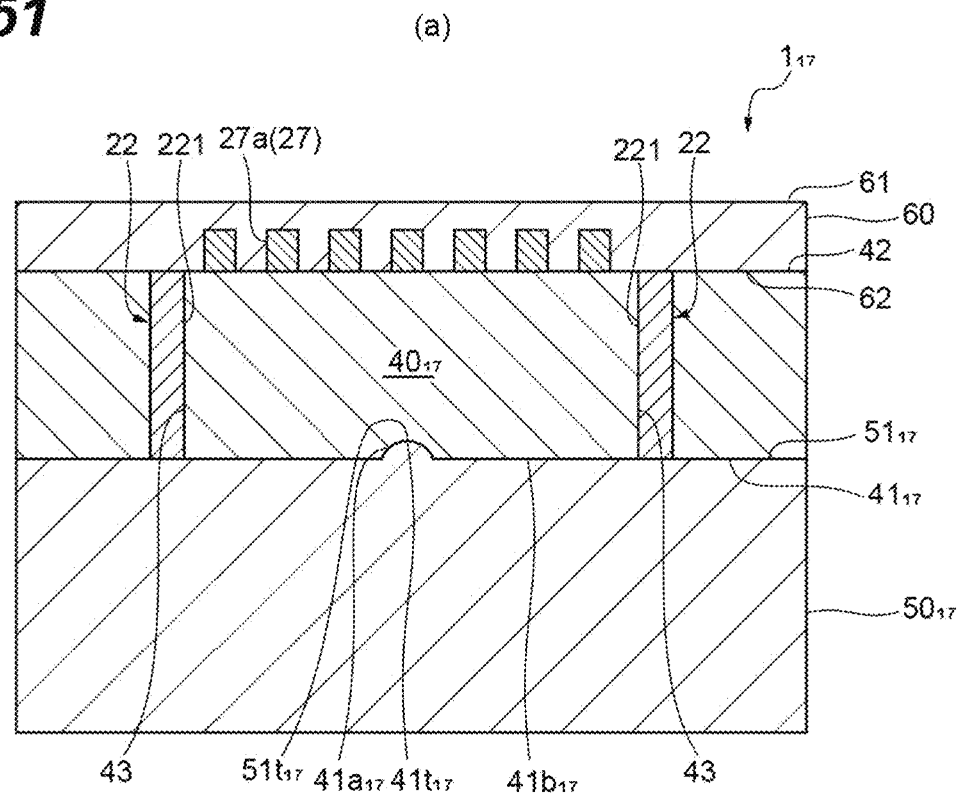
(b)
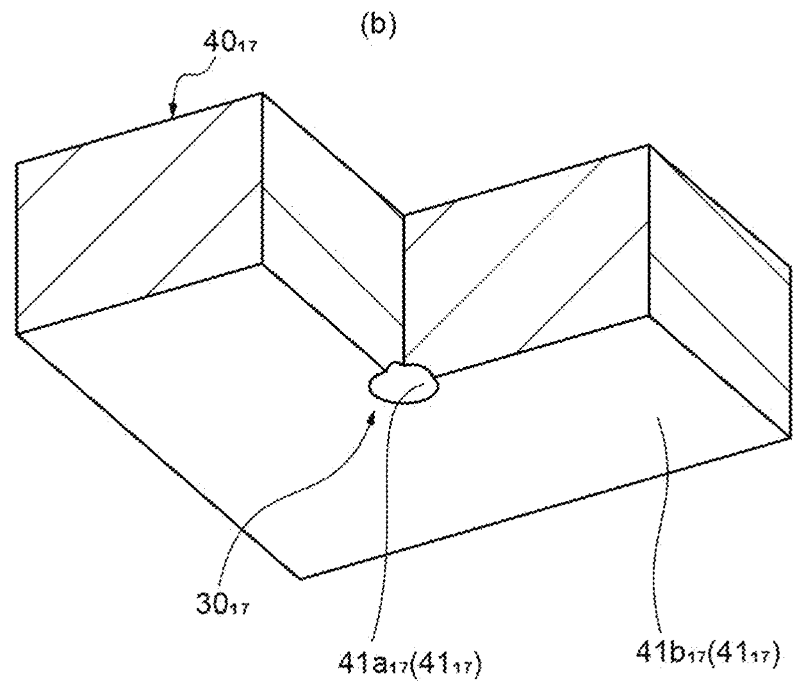

Fig.52
(a)
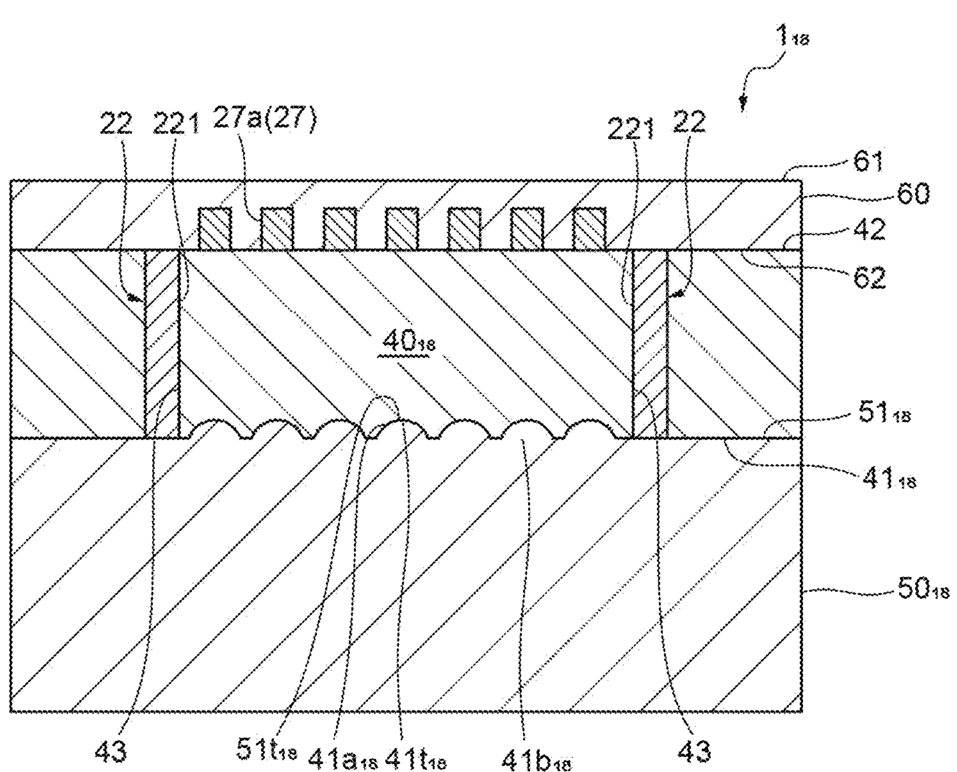
(b)
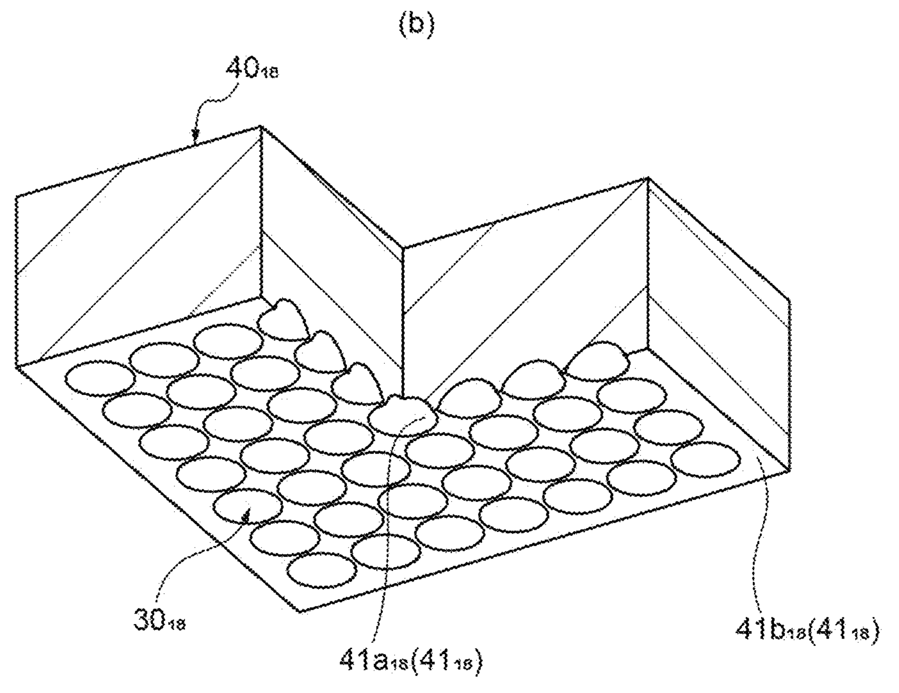

Fig.53
(a)
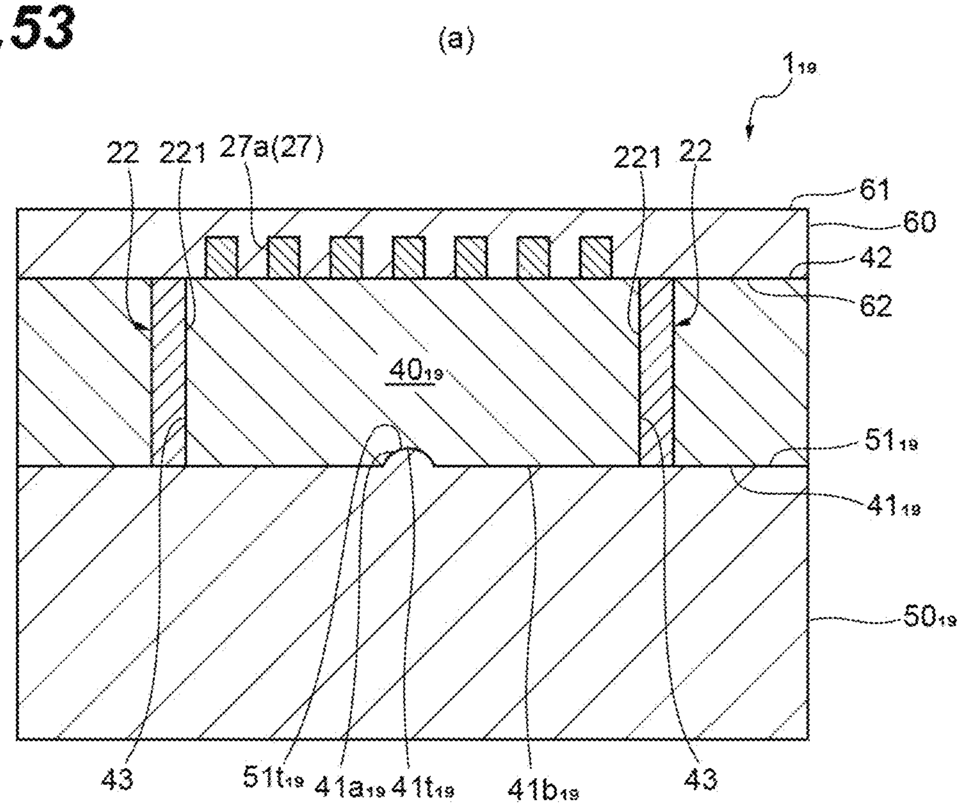
(b)
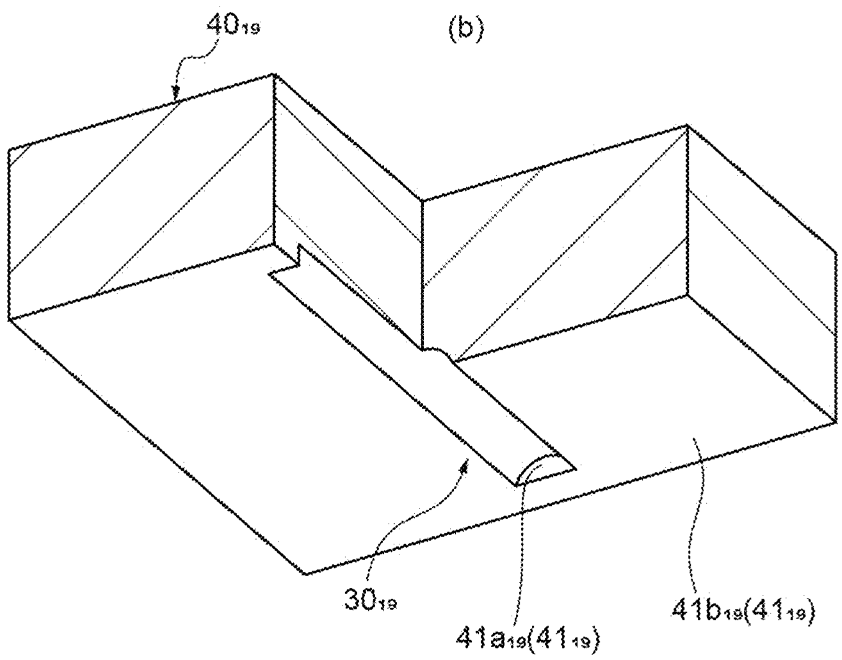

*Fig.54*
(a)
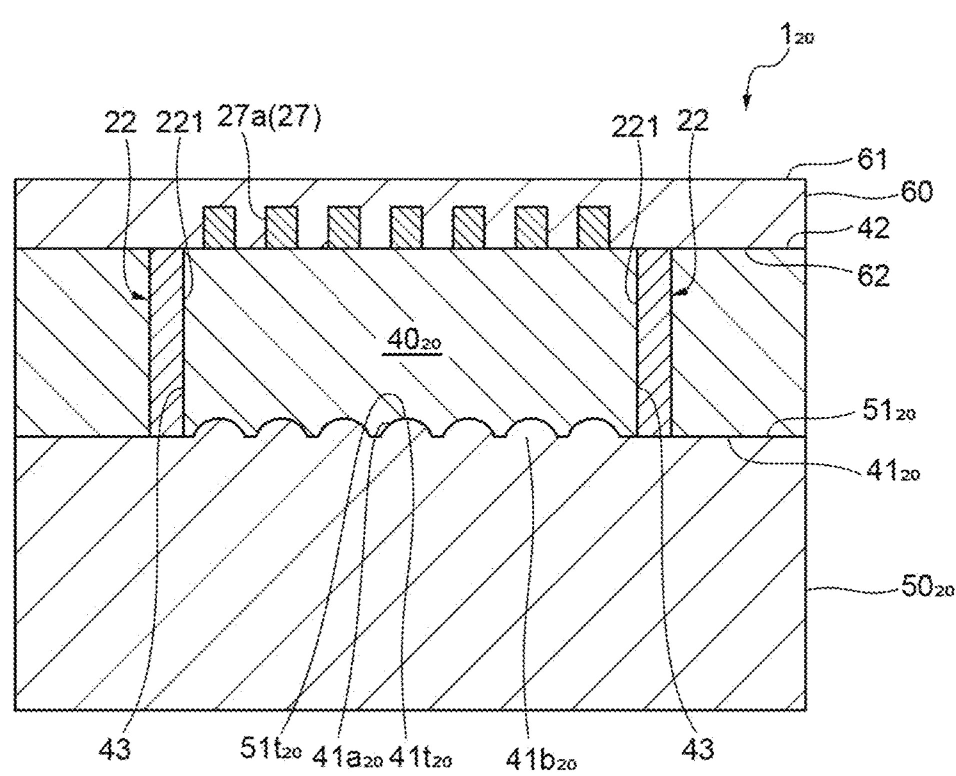
(b)
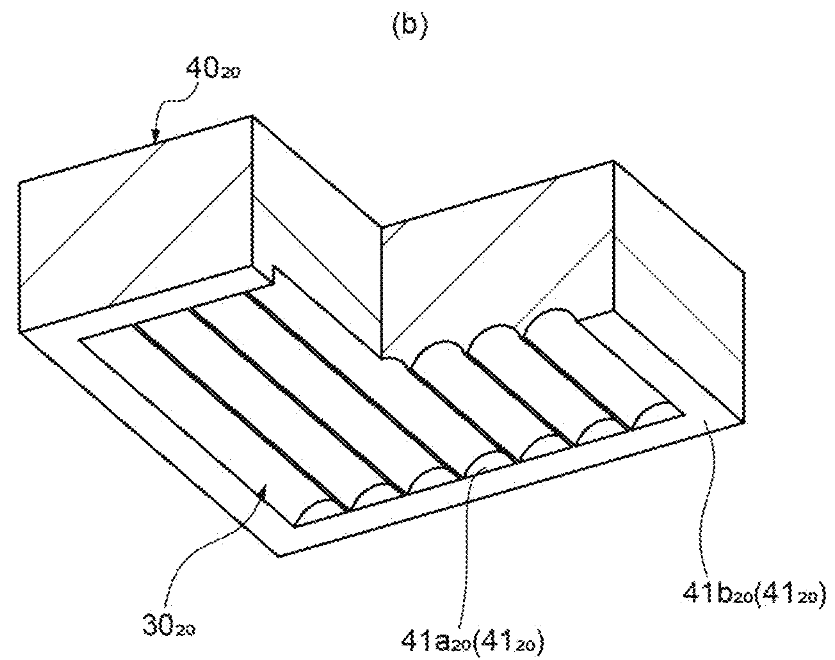

*Fig.55*
(a)
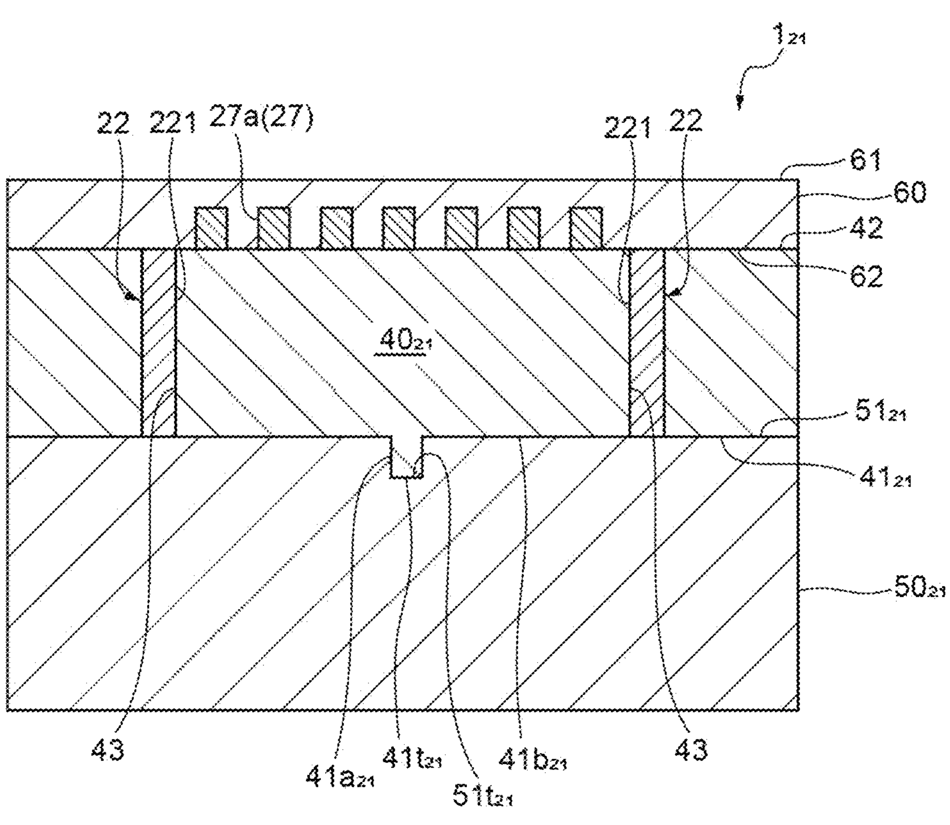
(b)
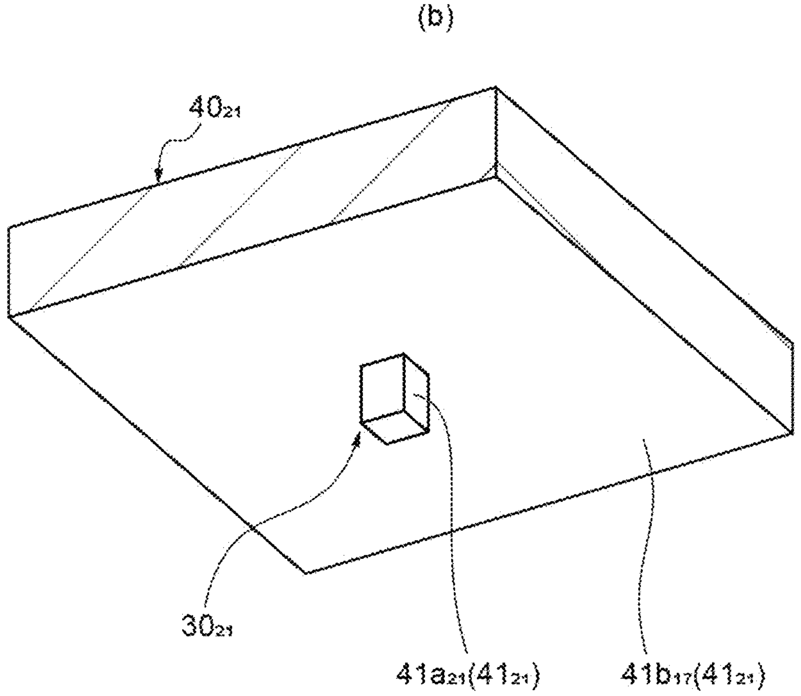

Fig.56
(a)
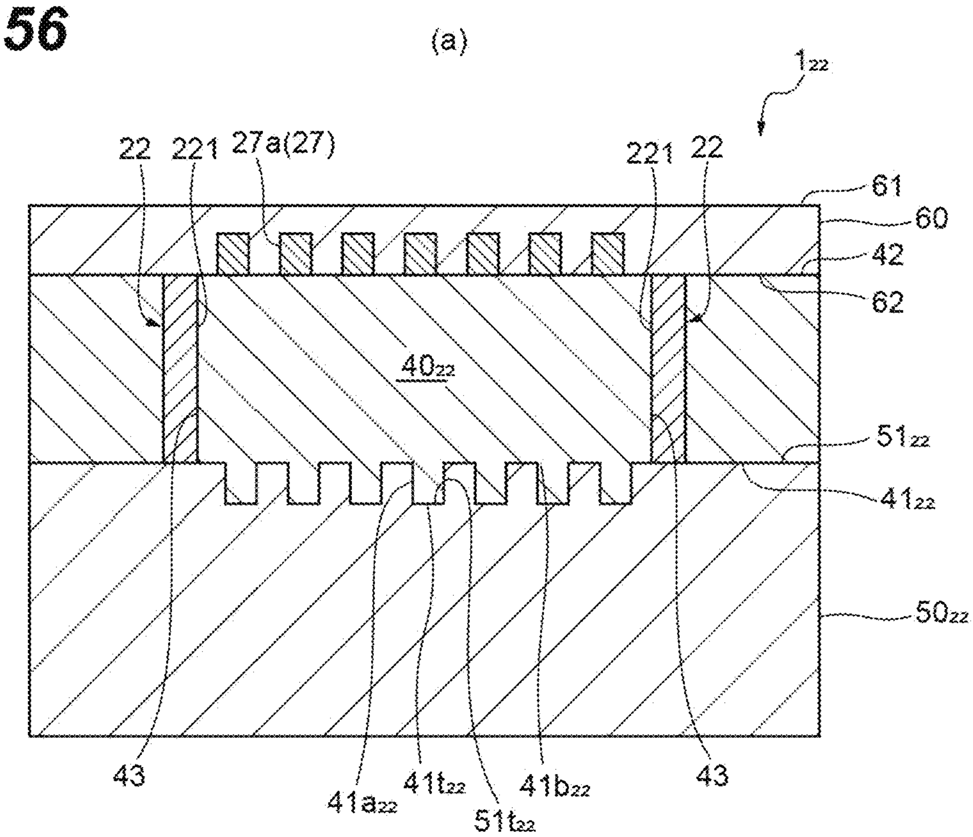
(b)
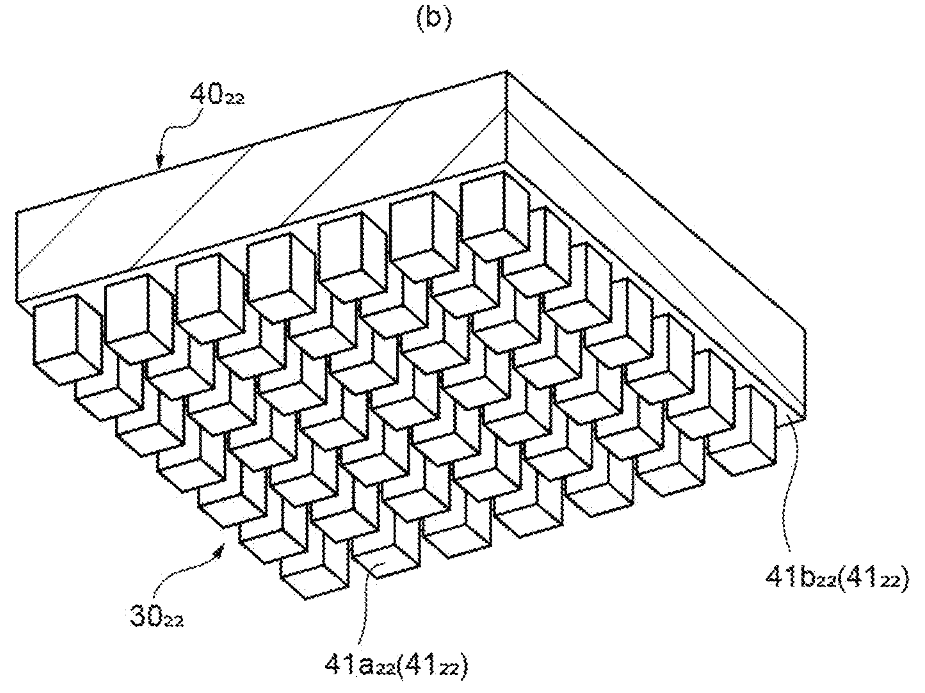

*Fig.57*
(a)
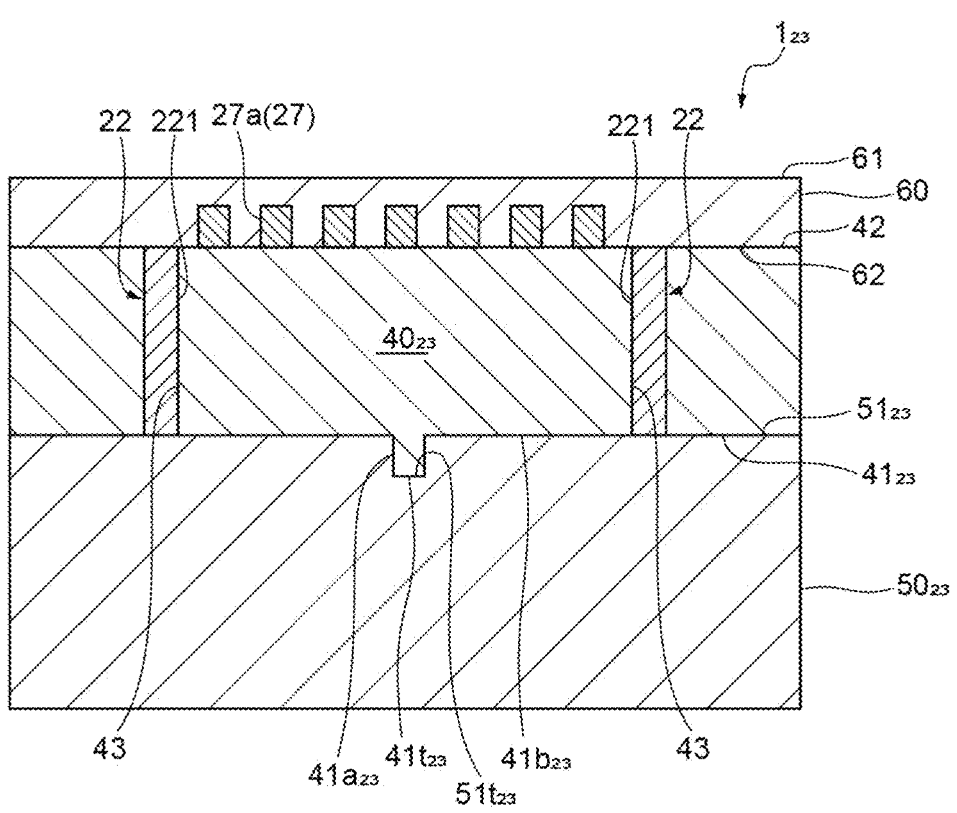
(b)
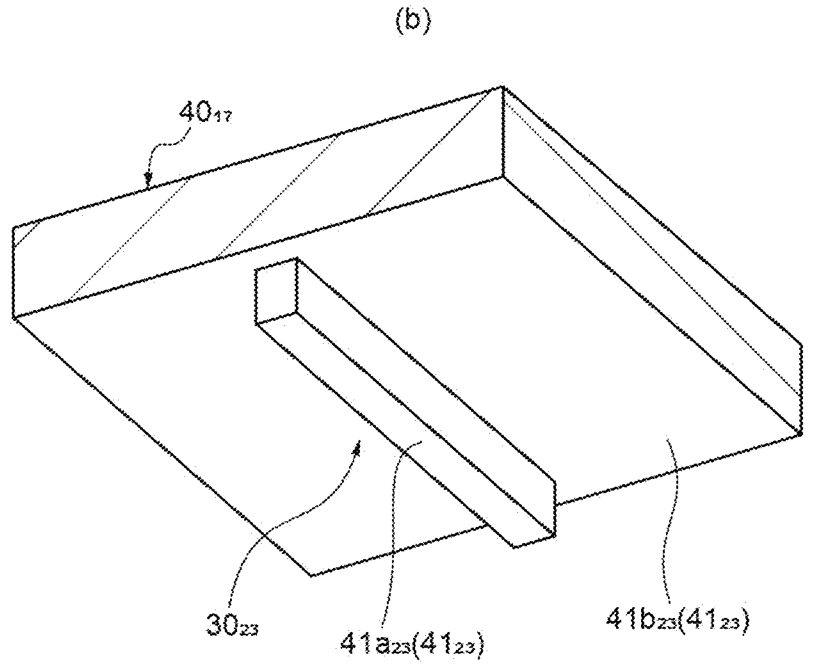

Fig.58
(a)
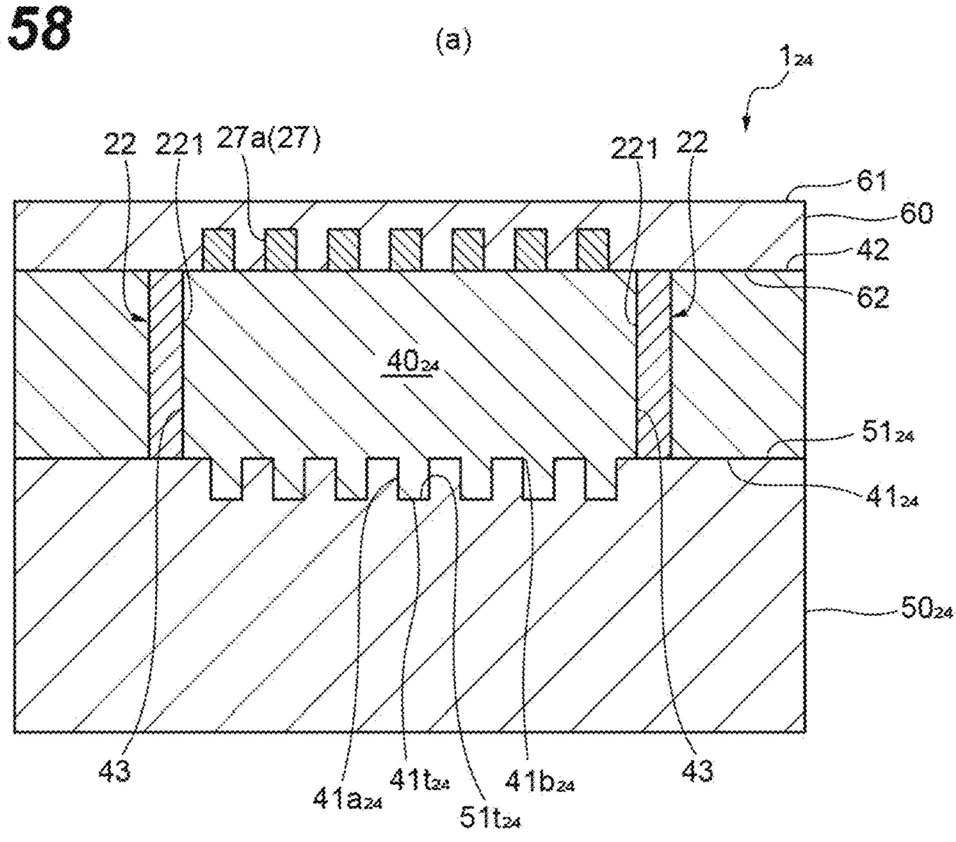
(b)
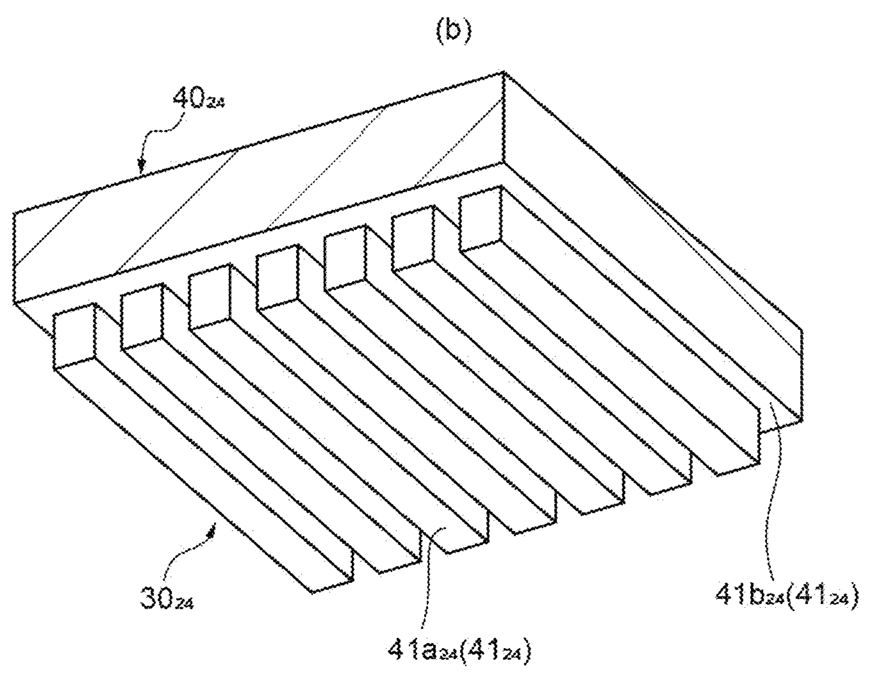

*Fig.59*
(a)
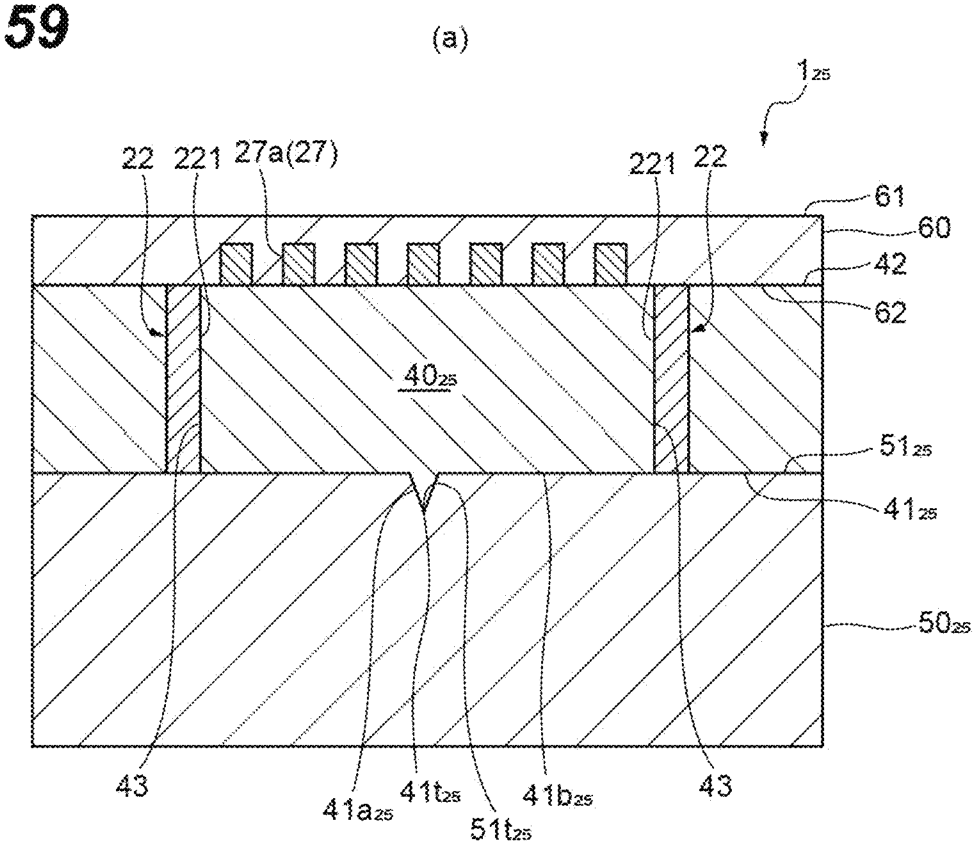
(b)
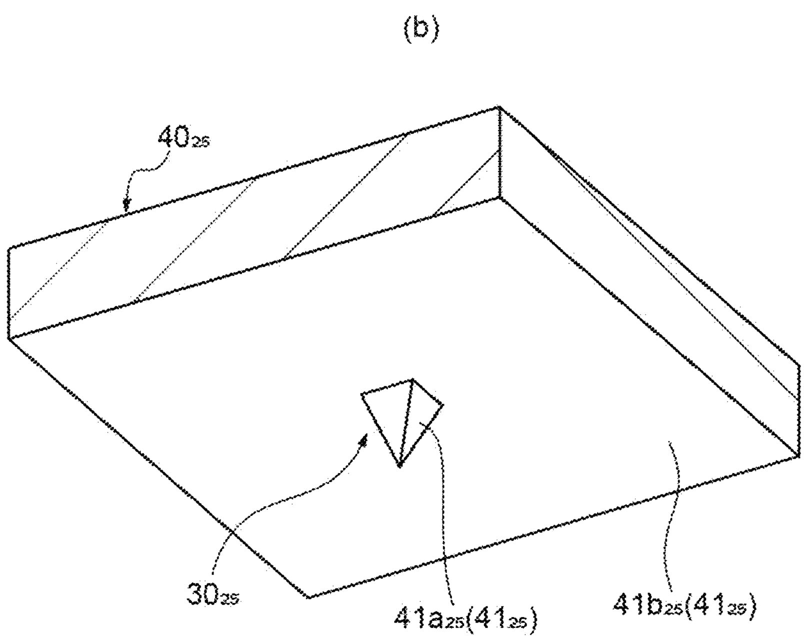

Fig.60
(a)
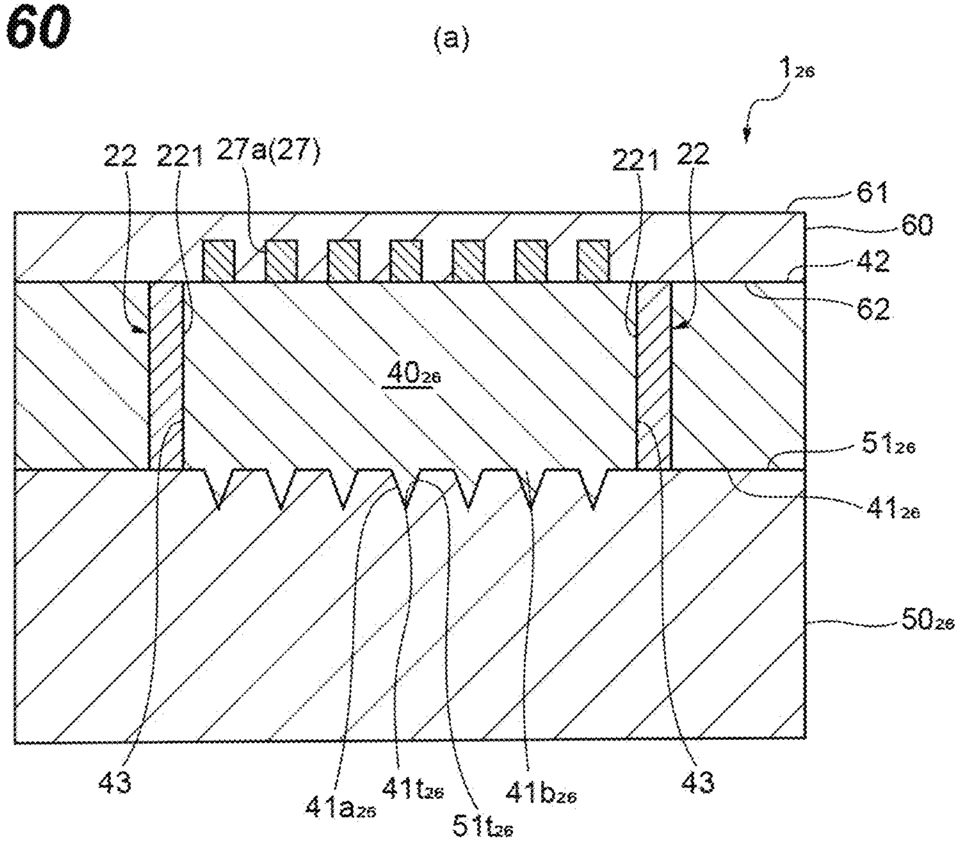
(b)
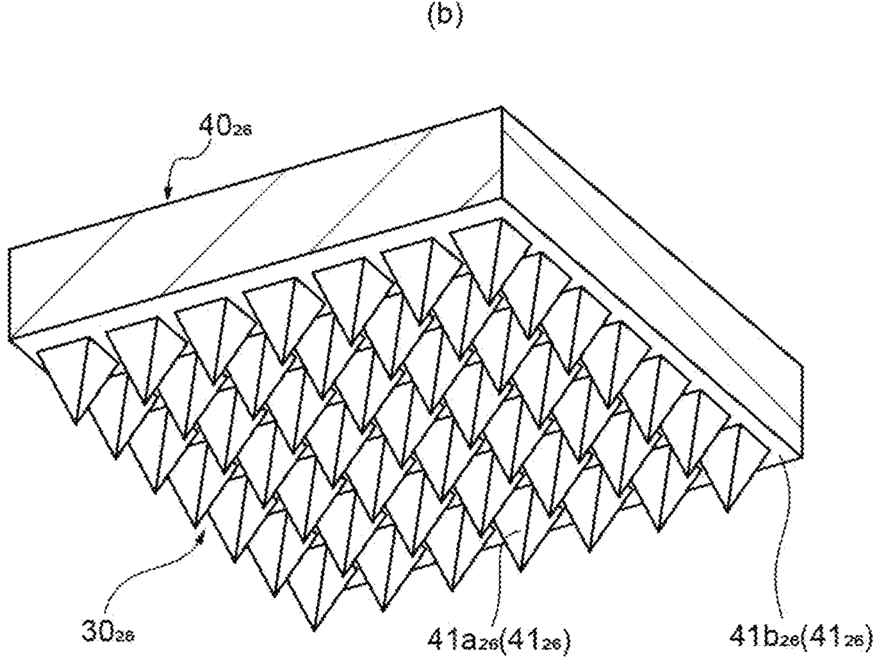

*Fig.61*
(a)
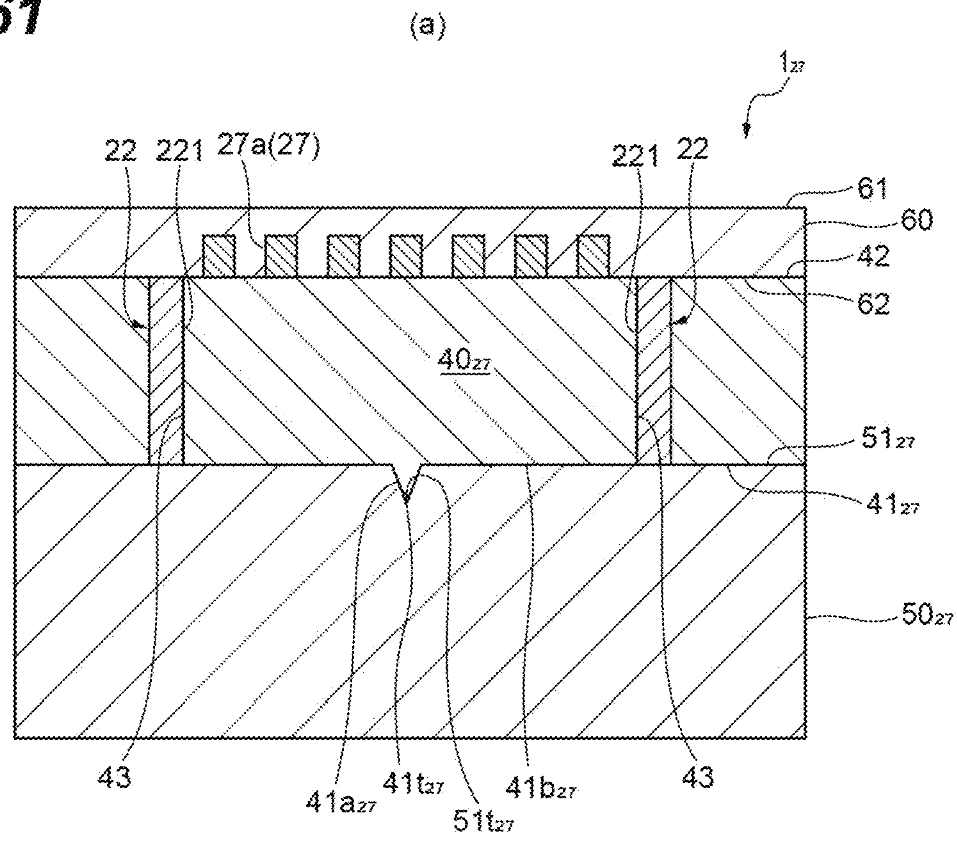
(b)
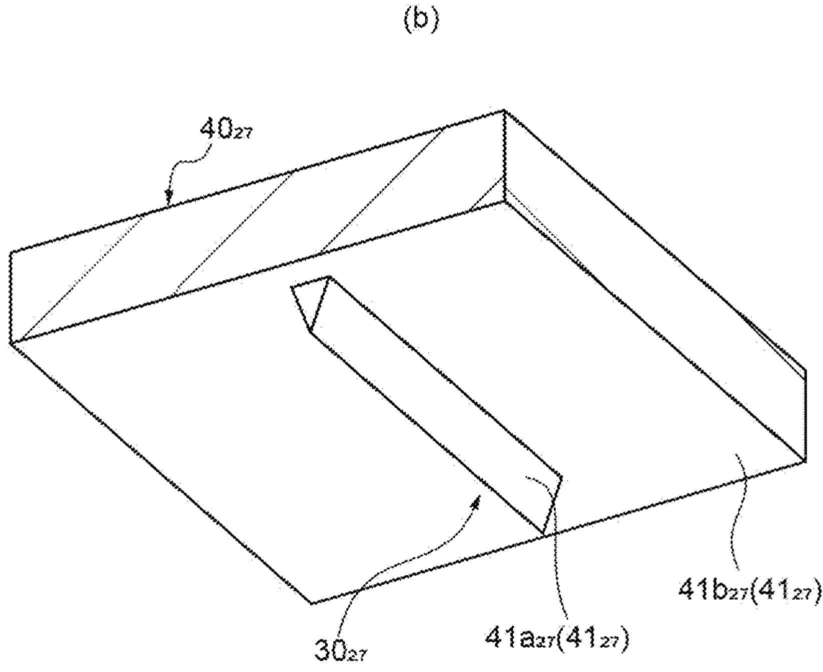

*Fig.62*
(a)
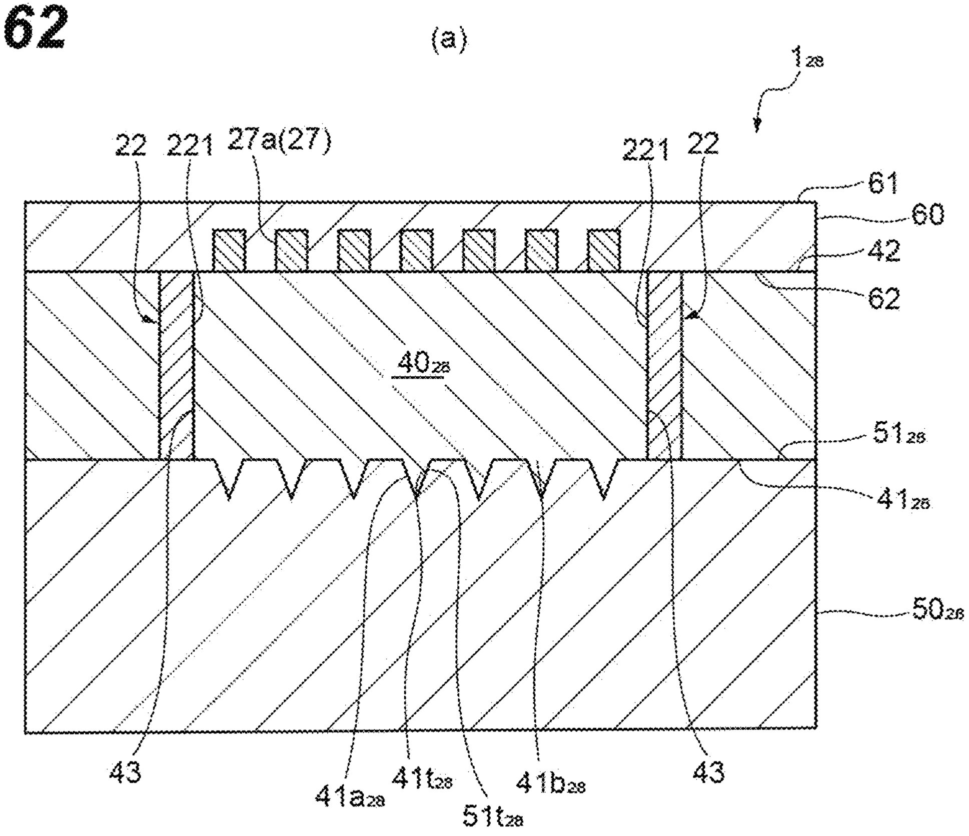
(b)
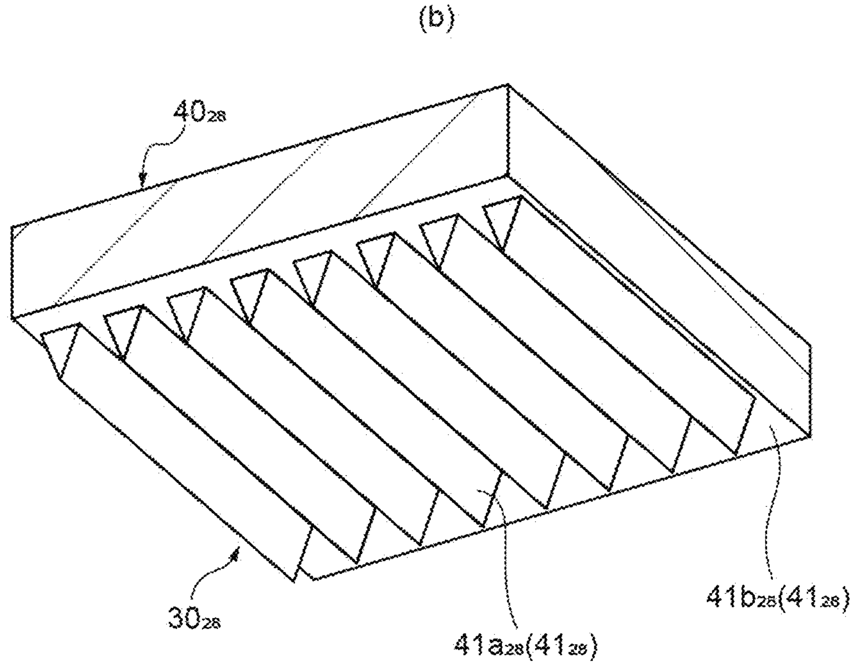

*Fig.63*
(a)
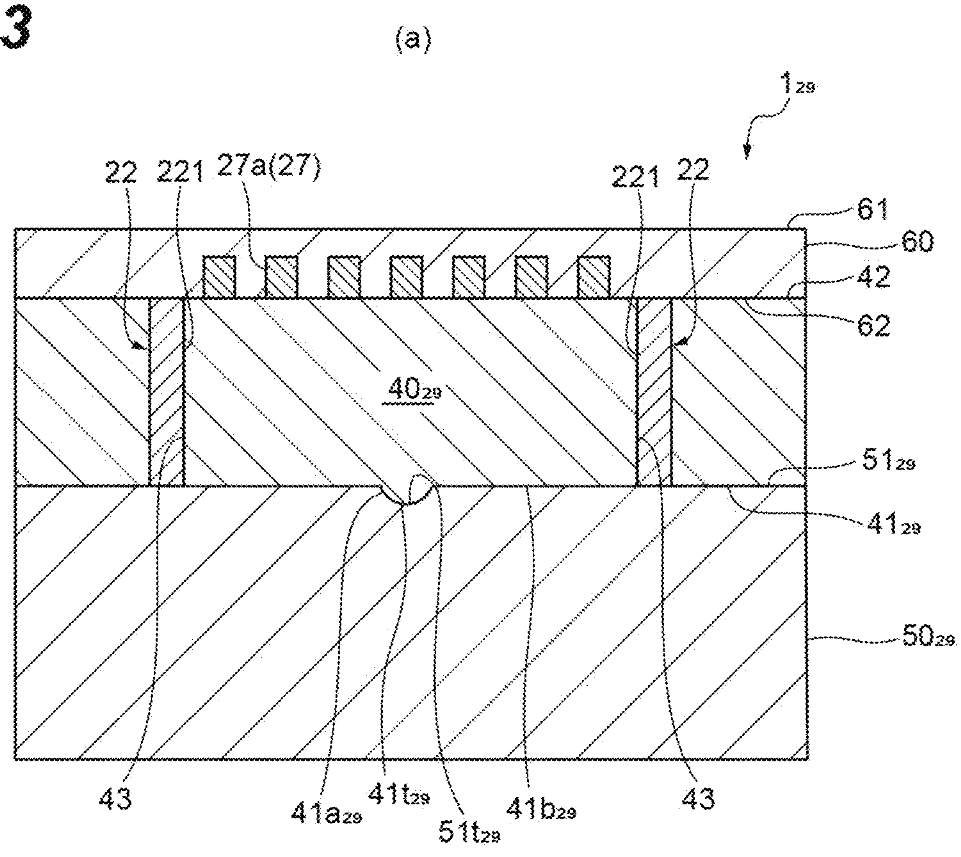
(b)
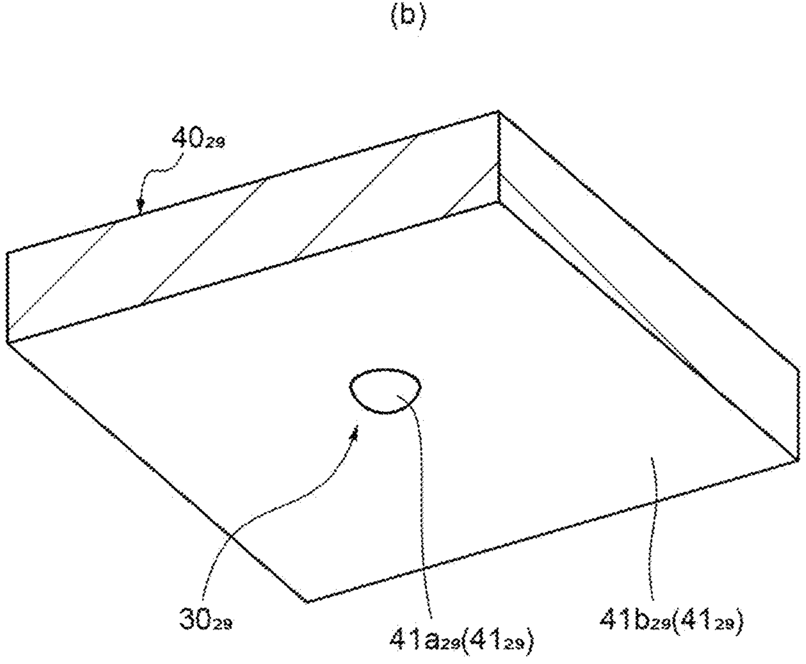

*Fig.64*
(a)
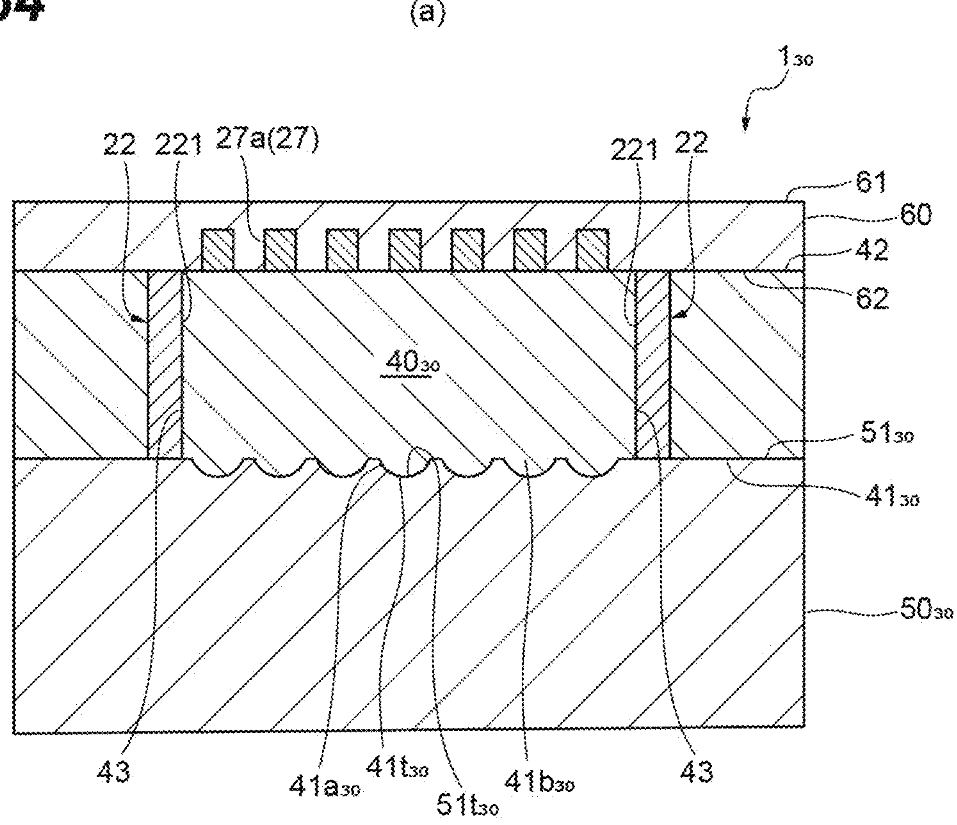
(b)
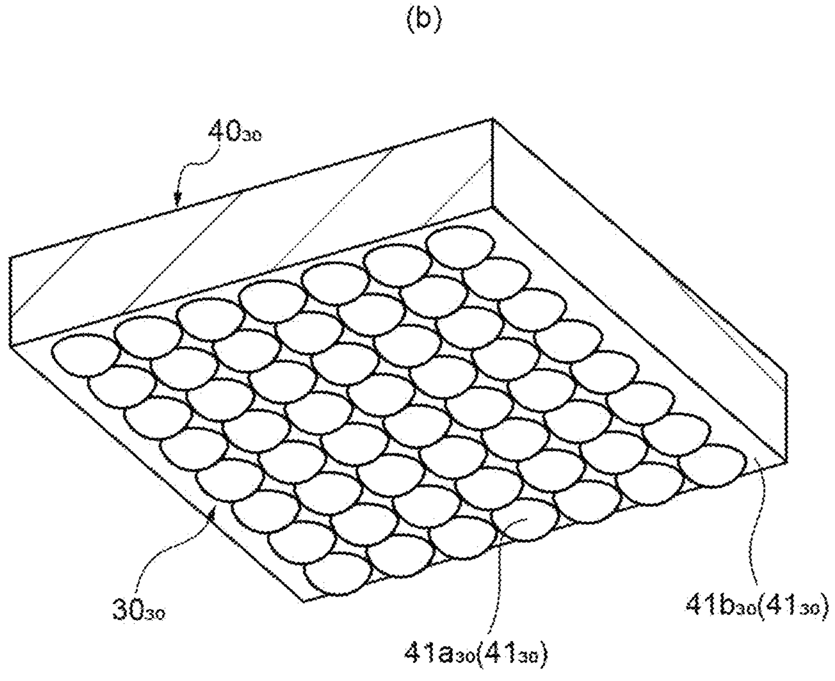

*Fig.65*
(a)
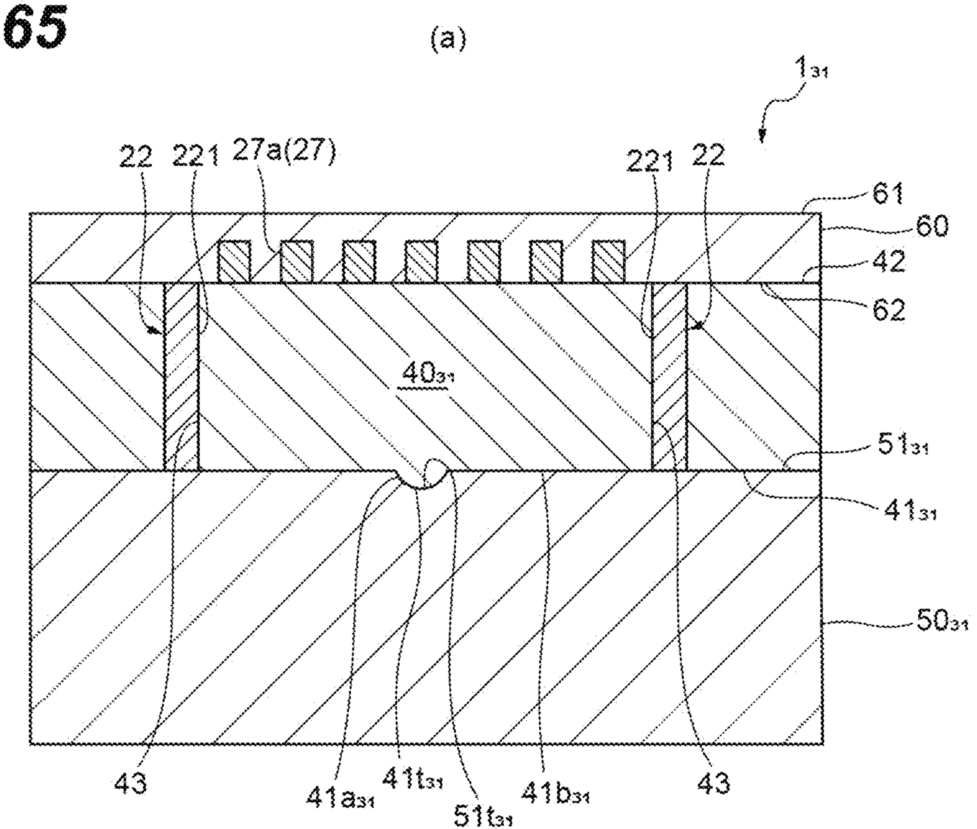
(b)
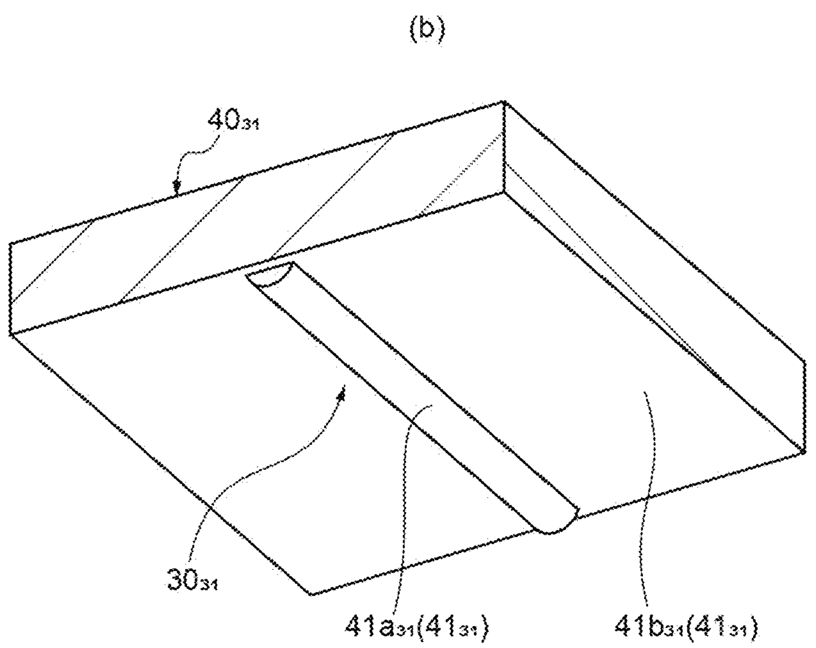

*Fig.66*
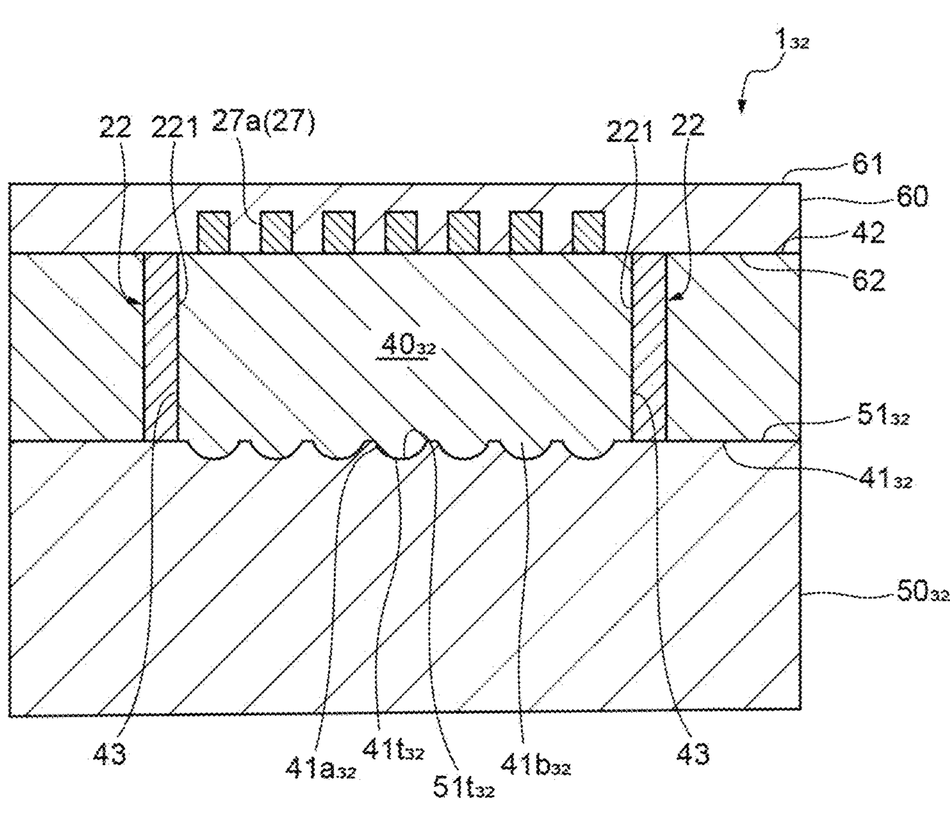
(b)
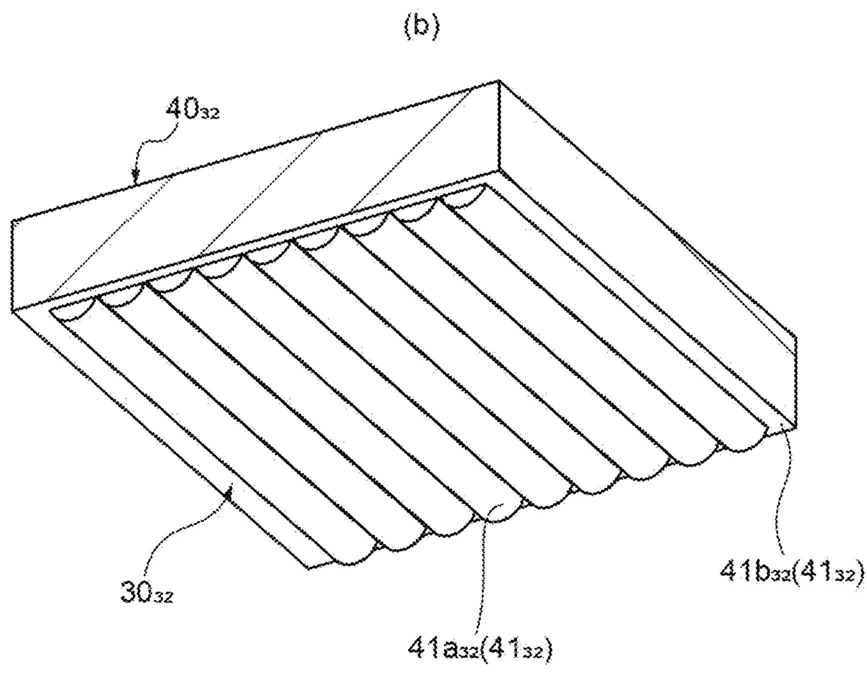

*Fig.67*
(a) (b)
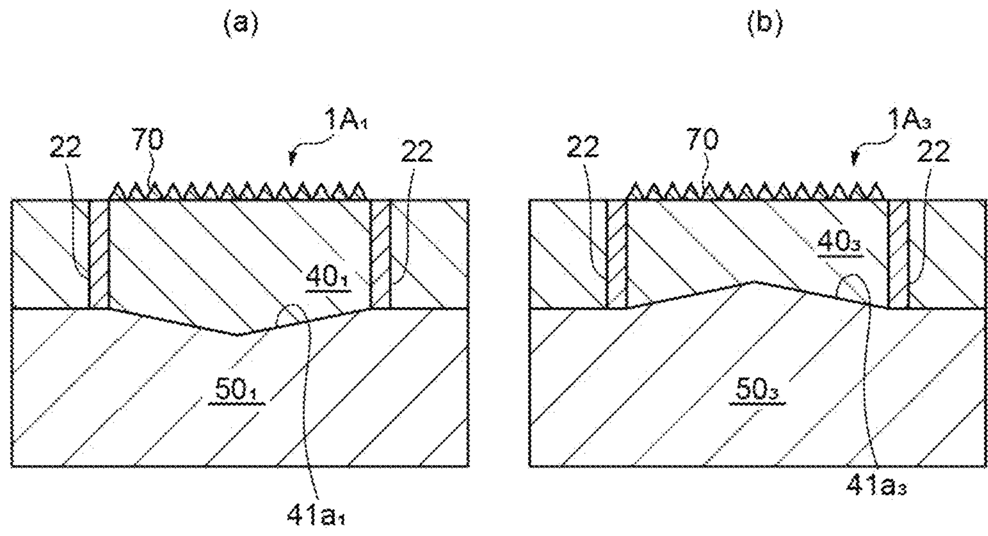
(c) (d)
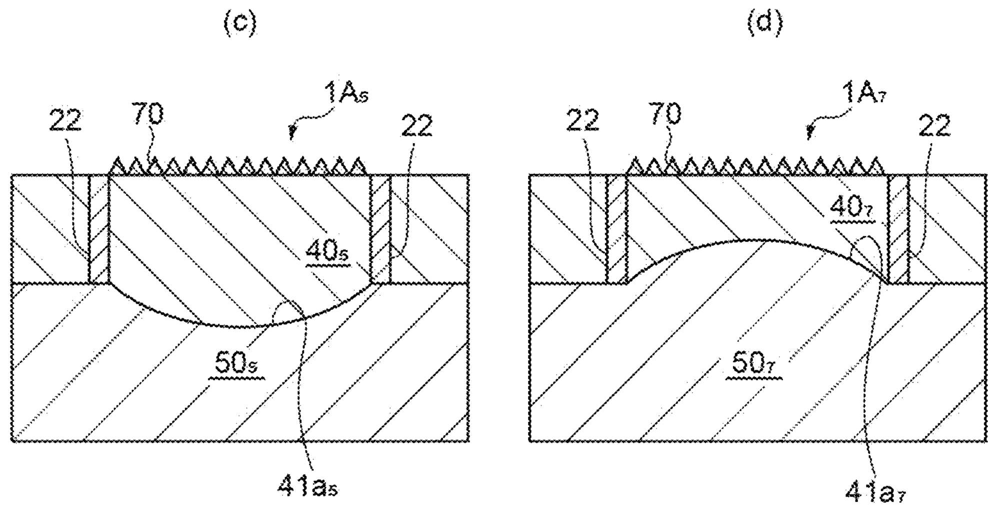

Fig.68
(a)
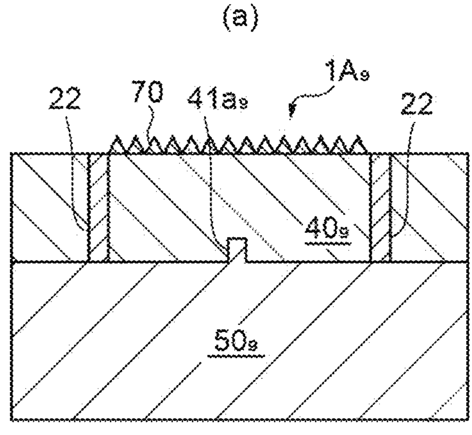
(b)
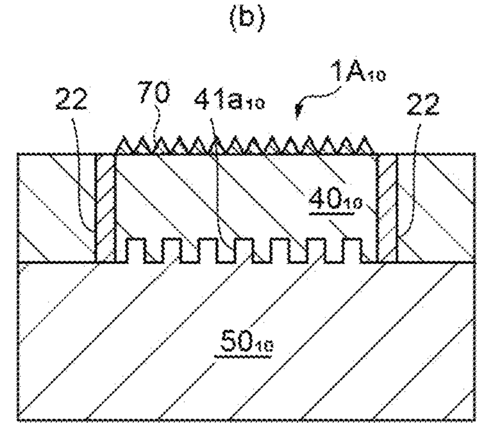
(c)
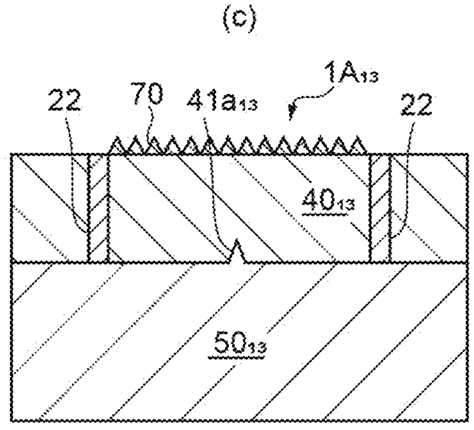
(d)
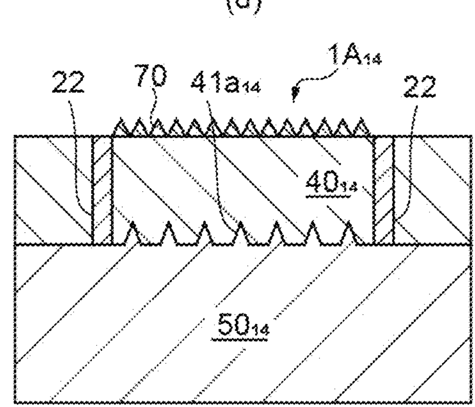
(e)
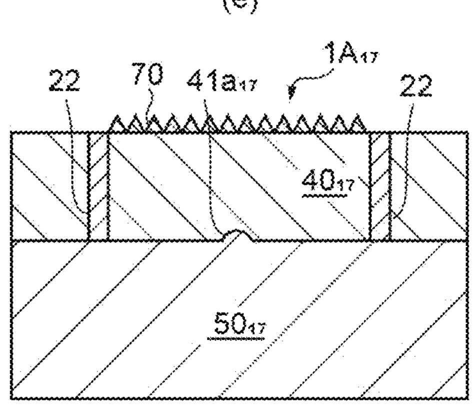
(f)
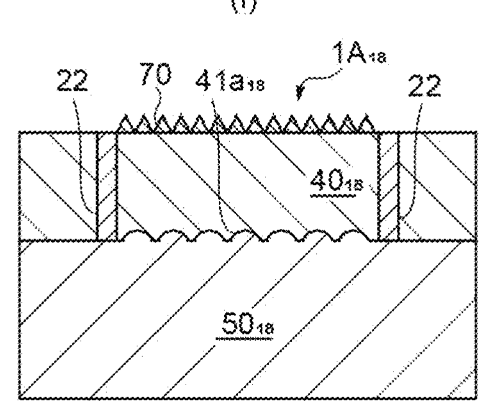

Fig.70
(a)
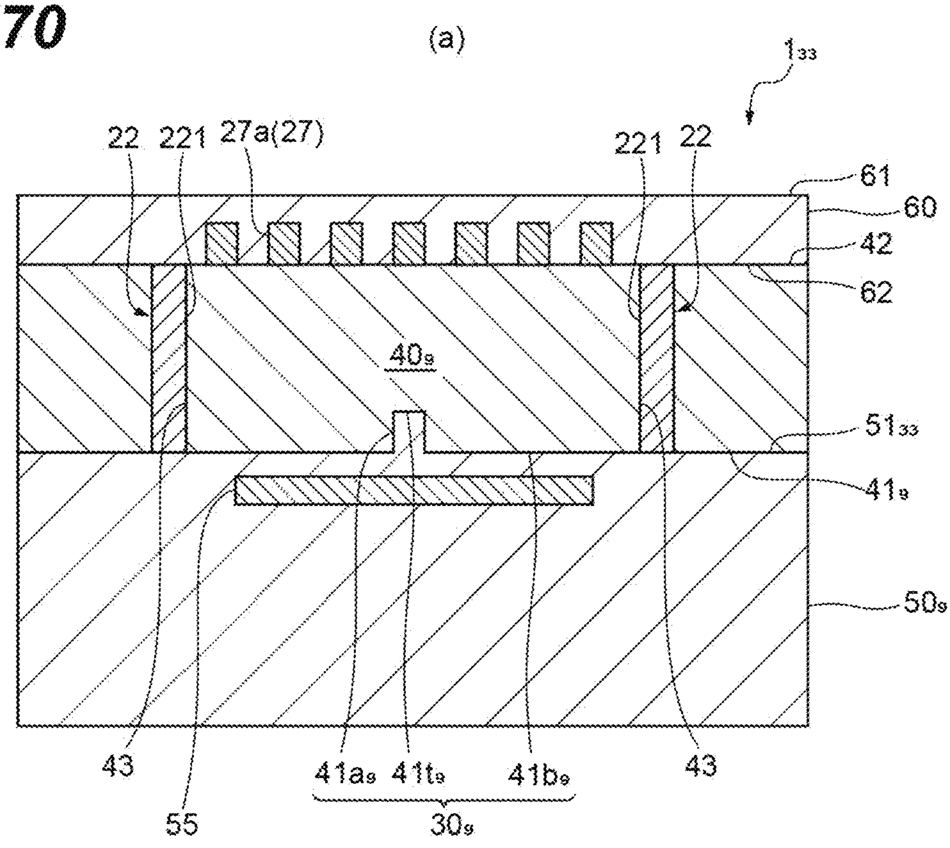
(b)
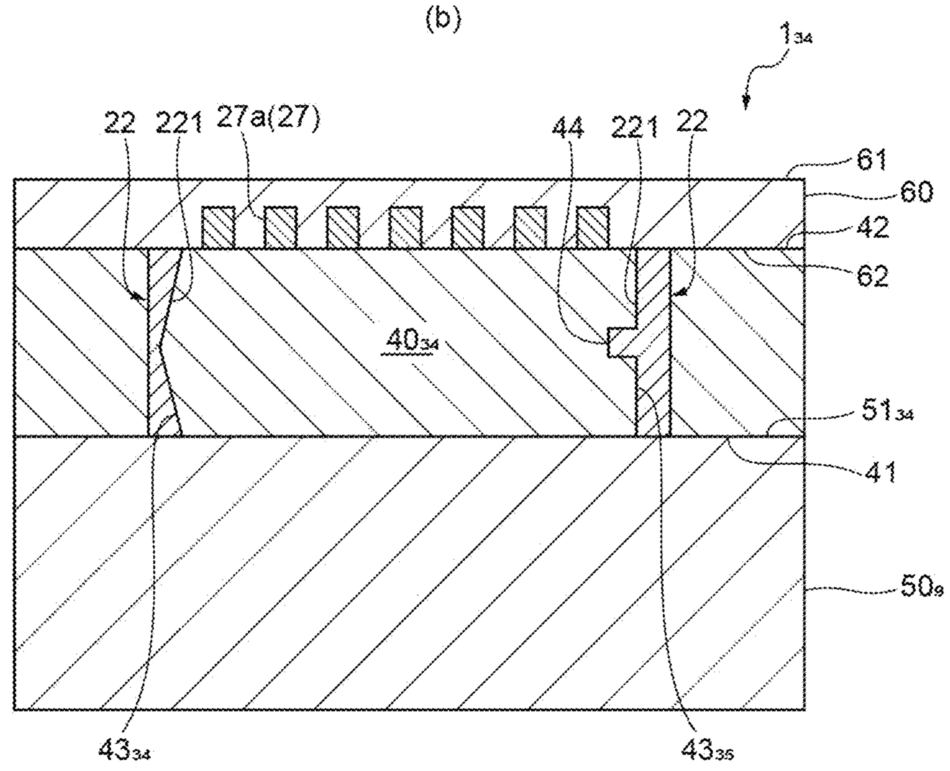

SOLID-STATE IMAGING DEVICE AND METHOD FOR PRODUCING SOLID-STATE IMAGING DEVICE

CROSS-REFERENCE TO RELATED APPLICATIONS

The present application is a 35 U.S.C. §§ 371 national stage application of International Application No. PCT/JP2022/001396 filed Jan. 17, 2022, which claims priority to Japanese Patent Application No. 2021-010189, filed Jan. 26, 2021, the contents of which are incorporated herein by reference.

TECHNICAL FIELD

The present invention relates to a solid-state imaging device and a method for producing a solid-state imaging device.

BACKGROUND ART

A CMOS image sensor includes a photodiode. In a CMOS image sensor, each pixel may also include a photodiode. In the technical field of CMOS image sensors, improvement in sensitivity of CMOS image sensors has been examined. Recently, in the technical field of photodiodes and CMOS image sensors, utilization of light in a near-infrared region with a wavelength from 800 nm to 1,100 nm has been brisk. Therefore, attention has been focused on improvement in sensitivity of the near-infrared region. For example, when an image sensor is used in a technology of monitoring, sensitivity can be improved by using light in the near-infrared region (which, hereinafter, will also be referred to as "near-infrared light") and visible light together. Near-infrared light cannot be detected by the human eye. Therefore, it can be used for monitoring of a hospital room, inputting a gesture and measuring a distance using Time-of-Flight (ToF), and the like. Thus, image sensors having near-infrared light as a detection target has a wide application range.

CITATION LIST

Patent Literature

[Patent Literature 1] Japanese Unexamined Patent Publication No. 2017-108062

[Patent Literature 2] PCT International Publication No. WO2018/079296

[Patent Literature 3] PCT International Publication No. WO2018/030213

[Patent Literature 4] Japanese Unexamined Patent Publication No. 2020-13909

Non-Patent Literature

[Non-Patent Literature 1] Itaru Oshiyama, Sozo Yokogawa, Harumi Ikeda, Yoshiki Ebiko, Tomoyuki Hirano, Takashi Oinoue, Suguru Saito, Yoshiya Hagimoto, and Hayato Iwamoto, "Near-infrared Sensitivity Enhancement of a Back-illuminated Complementary Metal Oxide Semiconductor Image Sensor with a Pyramid Surface for Diffraction Structure", ITE Technical Report, Vol. 41, No. 10, Institute of Image Information and Television Engineers, March 2018

SUMMARY OF INVENTION

Technical Problem

Image sensors may be constituted using silicon. FIG. 28 is a graph showing an optical characteristic of silicon. The horizontal axis indicates the wavelength of light. The vertical axis indicates the wavelength of absorbed light. In the following description, a wavelength of absorbed light will be referred to as "an absorption length". With reference to the graph G28 indicating an absorption characteristic, it can be ascertained that the absorption length drastically increases from visible light toward a near-infrared region. Therefore, in order to detect near-infrared light, there is a need to increase the thickness of a light absorption region constituted using silicon.

Regarding another optical characteristic of silicon, attenuation of a light intensity occurring due to absorption of light will be described as an example. FIG. 29 is a graph showing attenuation of a light intensity. The horizontal axis indicates the distance light has traveled inside silicon, in other words, the depth in silicon. The vertical axis indicates the light intensity. Each of the graphs G29*a* to G29*g* indicates a characteristic of each wavelength of light. The graph G29*a* indicates a characteristic when the wavelength of light is 800 nm. The graph G29*b* indicates a characteristic when the wavelength of light is 850 nm. The graph G29*c* indicates a characteristic when the wavelength of light is 900 nm. The graph G29*d* indicates a characteristic when the wavelength of light is 950 nm. The graph G29*e* indicates a characteristic when the wavelength of light is 1,000 nm. The graph G29*f* indicates a characteristic when the wavelength of light is 1,050 nm. For example, a detection target of an image sensor for inputting a gesture is light having a wavelength of 850 nm. With reference to the graph G29*b*, it can be ascertained that an absorption length of 12 μm is required to absorb ½ of light having a wavelength of 850 nm. As another example, a detection target of an image sensor expected for in-vehicle application is light having a wavelength of 950 nm. With reference to the graph G29*d*, it can be ascertained that an absorption length of 44 m is required to absorb ½ of light having a wavelength of 950 nm. As an absorptance of required light increases, an absorption length of silicon constituting a light absorption portion also becomes longer.

However, a sensor thickness of an image sensor generally used for visible light is approximately 3 μm. A pixel size of an image sensor for monitoring is approximately 3 μm as well. In consideration of dimensions of these image sensors, it must be said that the absorption length of silicon described above is large. Therefore, when near-infrared light becomes a detection target while silicon is employed, the thickness of silicon required for detection becomes a problem in design and production of an image sensor.

Hence, for example, Patent Literature 1 and Non-Patent Literature 1 disclose technologies aiming at resolving the problem described above. The sensors in Patent Literature 1 and Non-Patent Literature 1 include a light scattering unit employing a pyramidal structure on a light incidence surface. A traveling direction of light incident on the sensor is changed by the light scattering unit. Specifically, the traveling direction of light is changed to a direction inclined with respect to a thickness direction of a silicon layer. By changing the traveling direction, a distance contributing to absorption of light can be practically extended without increasing the thickness of the silicon layer.

A light absorption portion constituted using silicon may include an isolation wall portion. An isolation wall curbs crosstalk between pixels. Further extension of the distance contributing to absorption of light is also examined by imparting a function of reflecting light to the isolation wall portion.

For example, Patent Literature 1 discloses a technology related to a deep trench insulator (which, hereinafter, will also be referred to as "DTI"). A DIT is obtained by embedding a metal such as tungsten (W) or aluminum (Al) into a trench by a CVD method. Although it is not illustrated in the diagrams of Patent Literature 1, optical components such as a color filter and a micro-lens are disposed on a negative charge retention film. The optical components play a role of colorization and light concentration. The DTI does not allow light to be transmitted therethrough. As a result, light which is generated by the light scattering unit and travels obliquely forward is not transmitted through adjacent pixels. The DTI curbs occurrence of crosstalk by preventing diffusion of signal electrons to adjacent pixels. The DTI reflects light. As a result, a distance contributing to absorption of light in silicon can be practically extended. Therefore, sensitivity can be improved.

For example, Patent Literature 2 discloses an element structure having a light scattering unit and a trench (refer to FIGS. 25 and 28 in Patent Literature 2). In Patent Literature 2, several materials embedded in the trench are described as an example. The materials embedded in the trench form a core. In Patent Literature 2, regarding the materials, tungsten, tantalum, copper, aluminum, silver, and the like are described as an example. These metal materials do not allow visible light and near-infrared light to be transmitted therethrough. Patent Literature 2 discloses a structure thinly covering an area around the core with a dielectric having silicon oxide or silicon nitride as a main component. Patent Literature 2 describes advantages when silicon is adopted as the core by calculating an interference of a multilayer film when silicon is adopted as the core. Patent Literature 2 also points out operation in which sensitivity deteriorates in a structure having a dielectric. According to a structure having a dielectric, since a part of visible light and near-infrared light is absorbed due to physical properties of metals constituting the core, sensitivity deteriorates to the extent thereof. Patent Literature 2 is negative regarding using a metal material as a material to be embedded in the trench. In Patent Literature 2, regarding a material to be embedded in the trench, for example, materials having amorphous silicon, polysilicon, or single-crystal silicon as a main component are also described as an example.

Patent Literature 3 discloses a solid-state imaging device using a structure color filter. In the solid-state imaging device of Patent Literature 3, light which has diffracted inside a light receiving element 101 constituting a unit pixel 103 is prevented from being transmitted through to an adjacent pixel 103. As a result, occurrence of crosstalk between adjacent pixels is prevented. However, the structure color filter does not function as a light scattering unit. The structure color filter functions as an optical filter. In this case, it is desirable that occurrence of scattering in the structure color filter be small. The solid-state imaging device of Patent Literature 3 has a metal trench structure. In Patent Literature 3, regarding a material of the metal trench structure, for example, at least one metal selected from the group consisting of tungsten, titanium, copper, aluminum, and an alloy thereof is described as an example.

In the technical field of imaging elements, it is desired to further enhance the efficiency of photoelectric conversion of near-infrared light than that in an imaging element employing the constitution described above. The present invention provides a solid-state imaging device in which efficiency of photoelectric conversion of near-infrared light can be further improved, and a method for producing a solid-state imaging device.

Solution to Problem

A first aspect of the present invention is a solid-state imaging device including a plurality of pixels. Each of the pixels includes a light scattering unit receiving incident light and generating absorbed light including scattered light, and a photoelectric conversion unit receiving the absorbed light from a light input surface and generating a signal voltage corresponding to the received absorbed light. The light scattering unit includes a plurality of metal structures disposed with a predetermined cycle length and generates, as the scattered light, diffracted light caused by plasmons corresponding to the incident light.

In the solid-state imaging device, incident light is diffracted by the light scattering unit including a plurality of metal structures. Diffraction of light by the light scattering unit including a plurality of metal structures is caused by a plasmon phenomenon. Generation of diffracted light can be controlled by the cycle length defining disposition of the plurality of metal structures. Therefore, since a desired scattering angle can be obtained, an optical path length determined from a wavelength of incident light and light absorption characteristics of the photoelectric conversion unit can be secured. As a result, it is possible to further enhance the efficiency of photoelectric conversion of near-infrared light.

According to the solid-state imaging device of the first aspect, the cycle length of the plurality of metal structures may be a variable P. A real part of a refractive index of the photoelectric conversion unit may be a variable n. A wavelength of the incident light may be a variable λ. A variable l may be 1 or 2. The variable P, the variable n, the variable λ, and the variable l may satisfy Expression (1).

[Math. 1]

$$\sin^{-1}\left(\frac{\ell\cdot\lambda}{n\cdot P}\right)<90^{\circ} \quad (1)$$

According to this constitution, a proportion of zero-order diffracted light traveling straight forward in a thickness direction of the photoelectric conversion unit decreases. A proportion of diffracted light of an order traveling forward in an oblique direction with respect to the thickness direction of the photoelectric conversion unit increases. As a result, a quantity of diffracted light in the photoelectric conversion unit can be set in a desired form. Moreover, a distance contributing to absorption of light can also be in a desired form. Therefore, it is possible to further enhance the efficiency of photoelectric conversion of near-infrared light.

According to the solid-state imaging device of the first aspect, the plurality of metal structures may constitute first cyclic structures in a first direction, and second cyclic structures in a second direction intersecting the first direction. According to this constitution, a form of incident light or a form of diffraction targeted by the first cyclic structures can differ from a form of incident light or a form of diffraction targeted by the second cyclic structures.

According to the solid-state imaging device of the first aspect, a cycle length of the first cyclic structures may differ from a cycle length of the second cyclic structures. According to this constitution as well, a form of incident light or a form of diffraction targeted by the first cyclic structures can differ from a form of incident light or a form of diffraction targeted by the second cyclic structures.

The solid-state imaging device of the first aspect may further include a charge retention film disposed between the light scattering unit and the photoelectric conversion unit. According to this constitution as well, it is possible to further enhance the efficiency of photoelectric conversion of near-infrared light. Moreover, it is also possible to curb generation of a dark current.

According to the solid-state imaging device of the first aspect, a high-concentration impurity layer may be provided on the light input surface of the photoelectric conversion unit. According to this constitution as well, it is possible to further enhance the efficiency of photoelectric conversion of near-infrared light. Moreover, it is also possible to curb generation of a dark current.

According to the solid-state imaging device of the first aspect, the plurality of metal structures may be formed of a material selected from the group consisting of silver, aluminum, gold, copper, and titanium nitride. According to this constitution, it is possible to obtain a solid-state imaging device including metal structures formed of a material selected from the group consisting of silver, aluminum, gold, copper, and titanium nitride.

According to the solid-state imaging device of the first aspect, the plurality of metal structures may be formed of a material selected from the group consisting of a material including silver as a main component, a material including aluminum as a main component, a material including gold as a main component, a material including copper as a main component, and a material including titanium nitride as a main component. According to this constitution, it is possible to obtain a solid-state imaging device including metal structures formed of a material selected from the group consisting of a material including silver as a main component, a material including aluminum as a main component, a material including gold as a main component, a material including copper as a main component, and a material including titanium nitride as a main component.

The solid-state imaging device of the first aspect may further include a first isolation wall portion provided between the pixels adjacent to each other. The first isolation wall portion may include a trench and a light reflecting portion embedded in the trench. The light reflecting portion may be formed of a material in which a real part ($n_2$) of a refractive index and an imaginary part ($k_2$) of the refractive index with a wavelength of the incident light in a range of 800 nm to 1,100 nm satisfy Expression (2). According to this constitution, diffracted light can be favorably reflected in the first isolation wall portion. As a result, it is possible to further enhance the efficiency of photoelectric conversion of near-infrared light.

[Math. 2]

$$k_2 \geq 6.31n_2 + 1.03 \tag{2}$$

According to the solid-state imaging device of the first aspect, the light reflecting portion may be formed of a material selected from the group consisting of silver, copper, gold, platinum, and bismuth. These materials satisfy Expression (2) at a wavelength of 950 nm. According to this constitution, it is possible to obtain a solid-state imaging device including a light reflecting portion formed of a material selected from the group consisting of silver, copper, gold, platinum, and bismuth.

According to the solid-state imaging device of the first aspect, the light reflecting portion may be formed of a material selected from the group consisting of a material including silver as a main component, a material including copper as a main component, a material including gold as a main component, a material including platinum as a main component, and a material including bismuth as a main component. According to this constitution, it is possible to obtain a solid-state imaging device including a light reflecting portion formed of a material selected from the group consisting of a material including silver as a main component, a material including copper as a main component, a material including gold as a main component, a material including platinum as a main component, and a material including bismuth as a main component.

According to the solid-state imaging device of the first aspect, a width of the trench may be 45 nm or wider. The light reflecting portion may be formed of silver or a material including silver as a main component. According to this constitution, it is possible to obtain a first isolation wall portion which can favorably reflect diffracted light.

According to the solid-state imaging device of the first aspect, a width of the trench may be 50 nm or wider. The light reflecting portion may be formed of copper or a material including copper as a main component. According to this constitution as well, it is possible to obtain a first isolation wall portion which can favorably reflect diffracted light.

According to the solid-state imaging device of the first aspect, a width of the trench may be 60 nm or wider. The light reflecting portion may be formed of gold or a material including gold as a main component. According to this constitution as well, it is possible to obtain a first isolation wall portion which can favorably reflect diffracted light.

According to the solid-state imaging device of the first aspect, a width of the trench may be 30 nm or wider. The light reflecting portion may be formed of platinum or a material including platinum as a main component. According to this constitution as well, it is possible to obtain a first isolation wall portion which can favorably reflect diffracted light.

According to the solid-state imaging device of the first aspect, a width of the trench may be 70 nm or wider. The light reflecting portion may be formed of bismuth or a material including bismuth as a main component. According to this constitution as well, it is possible to obtain a first isolation wall portion which can favorably reflect diffracted light.

The solid-state imaging device of the first aspect may further include a first isolation wall portion provided between the pixels adjacent to each other. The first isolation wall portion may include a trench and a light reflecting portion embedded in the trench. A width of the trench may be 35 nm or wider. The light reflecting portion may be formed of aluminum or a material including aluminum as a main component. According to this constitution as well, it is possible to obtain a first isolation wall portion which can favorably reflect diffracted light.

According to the solid-state imaging device of the first aspect, the first isolation wall portion may further include a negative charge retention film provided between a wall surface of the trench and the light reflecting portion. According to this constitution, it is possible to curb generation of a dark current in an interface of the trench.

According to the solid-state imaging device of the first aspect, the negative charge retention film may be formed of aluminum oxide. According to this constitution, it is possible to obtain a solid-state imaging device including a negative charge retention film formed of aluminum oxide.

According to the solid-state imaging device of the first aspect, the negative charge retention film may be formed of silicon nitride. According to this constitution, it is possible to obtain a solid-state imaging device including a negative charge retention film formed of silicon nitride.

The solid-state imaging device of the first aspect may further include a first isolation wall portion provided between the pixels adjacent to each other and including a trench and a light reflecting portion embedded in the trench, and a second isolation wall portion adjacent to the first isolation wall portion with the photoelectric conversion unit sandwiched therebetween and including a trench and a light reflecting portion embedded in the trench. A distance from the light reflecting portion of the first isolation wall portion to the light reflecting portion of the second isolation wall portion may be a variable $W_{PD}$. The cycle length of the plurality of metal structures may be a variable P. The number of cycles of the plurality of metal structures, that is, the number of the plurality of metal structures may be a variable M. A width of each of the plurality of metal structures may be a variable $W_{metal}$. The variable $W_{PD}$, the variable P, and the variable $W_{metal}$ may satisfy Expression (3). A variable j may be zero or a positive integer. According to this constitution, an interference field in which standing waves are present between the first isolation wall portion and the second isolation wall portion can be formed. A degree of interference can be strengthened by satisfying Expression (3). As a result, it is possible to further enhance the efficiency of photoelectric conversion of near-infrared light.

[Math. 3]

$$W_{PD} = P(M + j - 1) + W_{metal} \pm P/4 \qquad (3)$$

The symbol ± indicates upper and lower limits for $W_{PD}$.

According to the solid-state imaging device of the first aspect, when a distance from the plurality of metal structures to the light reflecting portion of the first isolation wall portion is a variable $X_L$ and a distance from the plurality of metal structures to the light reflecting portion of the second isolation wall portion is a variable $X_R$, the variable $X_L$ and the variable $X_R$ may be equivalent to each other. According to this constitution as well, the degree of interference can be further strengthened. As a result, it is possible to further enhance the efficiency of photoelectric conversion of near-infrared light.

The solid-state imaging device of the first aspect may further include a first isolation wall portion provided between the pixels adjacent to each other and including a trench and a light reflecting portion embedded in the trench, and a second isolation wall portion adjacent to the first isolation wall portion with the photoelectric conversion unit sandwiched therebetween and including a trench and a light reflecting portion embedded in the trench. A distance from the light reflecting portion of the first isolation wall portion to the light reflecting portion of the second isolation wall portion may be a variable $W_{PD}$. The cycle length of the plurality of metal structures may be a variable P. The number of cycles of the plurality of metal structures, that is, the number of the plurality of metal structures may be a variable M. The variable $W_{PD}$, the variable P, and the variable M may satisfy Expression (4). A variable j may be zero or a positive integer. According to this constitution as well, an interference field in which standing waves are present between the first isolation wall portion and the second isolation wall portion can be formed. Further, the degree of interference can be strengthened by satisfying Expression (4). As a result, it is possible to further enhance the efficiency of photoelectric conversion of near-infrared light.

[Math. 4]

$$W_{PD} = P(M - 1 + j) + 200 \pm P/4 \text{ (units: nm)} \qquad (4)$$

A solid-state imaging device according to a second aspect of the present invention includes a plurality of pixels, and a first isolation wall portion provided between the pixels adjacent to each other. Each of the pixels includes a photoelectric conversion unit receiving absorbed light from a light input surface and generating a signal voltage corresponding to the received absorbed light. The first isolation wall portion includes a trench and a light reflecting portion embedded in the trench. The light reflecting portion is formed of a material in which a real part ($n_2$) of a refractive index and an imaginary part ($k_2$) of the refractive index with a wavelength of incident light incident on the pixel in a range of 800 nm to 1,100 nm satisfy Expression (5). According to this constitution, diffracted light can be favorably reflected in the first isolation wall portion. As a result, it is possible to further enhance the efficiency of photoelectric conversion of near-infrared light.

[Math. 5]

$$k_2 \geq 6.31 n_2 + 1.03 \qquad (5)$$

According to the solid-state imaging device of the second aspect, the light reflecting portion may be formed of a material selected from the group consisting of silver, copper, gold, platinum, and bismuth. According to this constitution, it is possible to obtain a solid-state imaging device including a light reflecting portion formed of a material selected from the group consisting of silver, copper, gold, platinum, and bismuth.

According to the solid-state imaging device of the second aspect, the light reflecting portion may be formed of a material selected from the group consisting of a material including silver as a main component, a material including copper as a main component, a material including gold as a main component, a material including platinum as a main component, and a material including bismuth as a main component. According to this constitution, it is possible to obtain a solid-state imaging device including a light reflecting portion formed of a material selected from the group consisting of a material including silver as a main component, a material including copper as a main component, a material including gold as a main component, a material including platinum as a main component, and a material including bismuth as a main component.

According to the solid-state imaging device of the second aspect, a width of the trench may be 45 nm or wider. The light reflecting portion may be formed of silver or a material including silver as a main component. According to this constitution, it is possible to obtain a first isolation wall portion which can favorably reflect diffracted light.

According to the solid-state imaging device of the second aspect, a width of the trench may be 50 nm or wider. The light reflecting portion may be formed of copper or a material including copper as a main component. According to this constitution as well, it is possible to obtain a first isolation wall portion which can favorably reflect diffracted light.

According to the solid-state imaging device of the second aspect, a width of the trench may be 60 nm or wider. The light reflecting portion may be formed of gold or a material including gold as a main component. According to this constitution as well, it is possible to obtain a first isolation wall portion which can favorably reflect diffracted light.

According to the solid-state imaging device of the second aspect, a width of the trench may be 30 nm or wider. The light reflecting portion may be formed of platinum or a material including platinum as a main component. According to this constitution as well, it is possible to obtain a first isolation wall portion which can favorably reflect diffracted light.

According to the solid-state imaging device of the second aspect, a width of the trench may be 70 nm or wider. The light reflecting portion may be formed of bismuth or a material including bismuth as a main component. According to this constitution as well, it is possible to obtain a first isolation wall portion which can favorably reflect diffracted light.

According to the solid-state imaging device of the second aspect, the first isolation wall portion may further include a negative charge retention film provided between a wall surface of the trench and the light reflecting portion. According to this constitution, it is possible to curb generation of a dark current in an interface of the trench.

According to the solid-state imaging device of the second aspect, the negative charge retention film may be formed of aluminum oxide. According to this constitution, it is possible to obtain a solid-state imaging device including a negative charge retention film formed of aluminum oxide.

According to the solid-state imaging device of the second aspect, the negative charge retention film may be formed of silicon nitride. According to this constitution, it is possible to obtain a solid-state imaging device including a negative charge retention film formed of silicon nitride.

The solid-state imaging device of the second aspect may further include a light scattering unit receiving incident light and generating the absorbed light including scattered light, and a second isolation wall portion adjacent to the first isolation wall portion with the photoelectric conversion unit sandwiched therebetween. The light scattering unit may include a plurality of metal structures disposed with a predetermined cycle length. A distance from the light reflecting portion of the first isolation wall portion to the light reflecting portion of the second isolation wall portion may be a variable $W_{PD}$. The cycle length of the plurality of metal structures may be a variable P. The number of cycles of the plurality of metal structures, that is, the number of the plurality of metal structures may be a variable M. A width of each of the plurality of metal structures may be a variable $W_{metal}$. The variable $W_{PD}$, the variable P, and the variable $W_{metal}$ may satisfy Expression (6). A variable j may be zero or a positive integer. According to this constitution, an interference field in which standing waves are present between the first isolation wall portion and the second isolation wall portion can be formed. Further, the degree of interference can be strengthened by satisfying Expression (6). As a result, it is possible to further enhance the efficiency of photoelectric conversion of near-infrared light.

[Math. 6]

$$W_{PD} = P(M + j - 1) + W_{metal} \pm P/4 \tag{6}$$

According to the solid-state imaging device of the second aspect, when a distance from the plurality of metal structures to the light reflecting portion of the first isolation wall portion is a variable $X_L$ and a distance from the plurality of metal structures to the light reflecting portion of the second isolation wall portion is a variable $X_R$, the variable $X_L$ and the variable $X_R$ may be equivalent to each other. According to this constitution as well, the degree of interference can be further strengthened. As a result, it is possible to further enhance the efficiency of photoelectric conversion of near-infrared light.

The solid-state imaging device of the second aspect may further include a light scattering unit receiving incident light and generating the absorbed light including scattered light, and a second isolation wall portion adjacent to the first isolation wall portion with the photoelectric conversion unit sandwiched therebetween. The light scattering unit may include a plurality of metal structures disposed with a predetermined cycle length. A distance from the first isolation wall portion to the second isolation wall portion may be a variable $W_{PD}$. The cycle length of the plurality of metal structures may be a variable P. The number of cycles of the plurality of metal structures, that is, the number of the plurality of metal structures may be a variable M. The variable $W_{PD}$, the variable P, and the variable M may satisfy Expression (7). A variable j may be zero or a positive integer. According to this constitution as well, an interference field in which standing waves are present between the first isolation wall portion and the second isolation wall portion can be formed. The degree of interference can be strengthened by satisfying Expression (7). As a result, it is possible to further enhance the efficiency of photoelectric conversion of near-infrared light.

[Math. 7]

$$W_{PD} = P(M - 1 + j) + 200 \pm P/4 \ (\text{units: nm}) \tag{7}$$

The solid-state imaging device of the second aspect may further include a light scattering unit receiving incident light and generating the absorbed light including scattered light, and a second isolation wall portion adjacent to the first isolation wall portion with the photoelectric conversion unit sandwiched therebetween. A distance from the light reflecting portion of the first isolation wall portion to the light reflecting portion of the second isolation wall portion may be a variable $W_{PD}$. A real part of a refractive index of the photoelectric conversion unit may be a variable $n_{Si}$. A wavenumber of the incident light may be a variable $k_0$. An angle of diffraction occurring in the incident light due to the light scattering unit may be a variable $\theta_d$. A variable m may be a natural number. The variable $W_{PD}$, the variable $n_{Si}$, the variable $k_0$, the variable $\theta_d$, and the variable m may satisfy Expression (8). According to this constitution as well, an interference field in which standing waves are present between the first isolation wall portion and the second isolation wall portion can be formed. Further, the degree of interference can be strengthened by satisfying Expression (8). As a result, it is possible to further enhance the efficiency of photoelectric conversion of near-infrared light.

[Math. 8]

$$W_{PD} = \frac{2\pi}{n_{Si} \times k_0 \times \sin\theta_d} \times m + 200 \pm \frac{\pi}{2 \times n_{Si} \times k_0 \times \sin\theta_d} \text{ (nm)} \quad (8)$$

A solid-state imaging device according to a third aspect of the present invention includes a plurality of pixels, and a first isolation wall portion provided between the pixels adjacent to each other. Each of the pixels includes a photoelectric conversion unit receiving absorbed light from a light input surface and generating a signal voltage corresponding to the received absorbed light. The first isolation wall portion includes a trench and a light reflecting portion embedded in the trench. A width of the trench is 35 nm or wider. The light reflecting portion is formed of aluminum or a material including aluminum as a main component. According to this constitution as well, it is possible to obtain a first isolation wall portion which can favorably reflect diffracted light.

The solid-state imaging device according to the third aspect may further include a light scattering unit receiving incident light and generating the absorbed light including scattered light, and a second isolation wall portion adjacent to the first isolation wall portion with the photoelectric conversion unit sandwiched therebetween. The light scattering unit may include a plurality of metal structures disposed with a predetermined cycle length. A distance from the light reflecting portion of the first isolation wall portion to the light reflecting portion of the second isolation wall portion may be a variable $W_{PD}$. The cycle length of the plurality of metal structures may be a variable P. The number of cycles of the plurality of metal structures, that is, the number of the plurality of metal structures may be a variable M. A width of each of the plurality of metal structures may be a variable $W_{metal}$. The variable $W_{PD}$, the variable P, and the variable $W_{metal}$ may satisfy Expression (9). A variable j may be zero or a positive integer. According to this constitution as well, an interference field in which standing waves are present between the first isolation wall portion and the second isolation wall portion can be formed. Further, the degree of interference can be strengthened by satisfying Expression (9). As a result, it is possible to further enhance the efficiency of photoelectric conversion of near-infrared light.

[Math. 9]

$$W_{PD} = P(M + j - 1) + W_{metal} \pm P/4 \quad (9)$$

The solid-state imaging device according to the third aspect may further include a light scattering unit receiving incident light and generating the absorbed light including scattered light, and a second isolation wall portion adjacent to the first isolation wall portion with the photoelectric conversion unit sandwiched therebetween. A distance from the light reflecting portion of the first isolation wall portion to the light reflecting portion of the second isolation wall portion may be a variable $W_{PD}$. A real part of a refractive index of the photoelectric conversion unit may be a variable $n_{Si}$. A wavenumber of the incident light may be a variable $k_0$. An angle of diffraction occurring in the incident light due to the light scattering unit may be a variable $\theta_d$. A variable m may be a natural number. The variable $W_{PD}$, the variable $n_{Si}$, the variable $k_0$, the variable $\theta_d$, and the variable m may satisfy Expression (10). According to this constitution as well, an interference field in which standing waves are present between the first isolation wall portion and the second isolation wall portion can be formed. The degree of interference can be strengthened by satisfying Expression (10). As a result, it is possible to further enhance the efficiency of photoelectric conversion of near-infrared light.

[Math. 10]

$$W_{PD} = \frac{2\pi}{n_{Si} \times k_0 \times \sin\theta_d} \times m + 200 \pm \frac{\pi}{2 \times n_{Si} \times k_0 \times \sin\theta_d} \text{ (units: nm)} \quad (10)$$

A fourth aspect of the present invention is a method for producing a solid-state imaging device having a plurality of pixels, and a first isolation wall portion provided between the pixels adjacent to each other and including a trench and a light reflecting portion embedded in the trench. The method for producing a solid-state imaging device includes a step of forming a trench, and a step of forming a light reflecting portion in the trench. In the step of forming a light reflecting portion, a material in which a real part ($n_2$) of a refractive index and an imaginary part ($k_2$) of the refractive index with a wavelength of incident light in a range of 800 nm to 1,100 nm satisfy Expression (11) is provided in the trench by an atomic layer deposition method.

[Math. 11]

$$k_2 \geq 6.31 n_2 + 1.03 \quad (11)$$

According to the method for producing a solid-state imaging device, a first isolation wall portion favorably reflecting diffracted light can be formed. As a result, it is possible to produce a solid-state imaging device in which efficiency of photoelectric conversion of near-infrared light is further enhanced.

In the method for producing a solid-state imaging device according to the fourth aspect, the light reflecting portion may be formed by an atomic layer deposition method using source gas including silver. The source gas including silver may be triethylphosphine (6,6,7,7,8,8,8-heptafluoro-2,2-dimethyl-3,5-octanedionate) silver(I). According to this method, it is possible to form a light reflecting portion constituted using silver.

In the method for producing a solid-state imaging device according to the fourth aspect, in the step of forming a light reflecting portion, the light reflecting portion may be formed by an atomic layer deposition method using source gas including copper. The source gas including copper may be bis(2,2,6,6-tetramethyl-3,5-heptanedionate) copper(II) or bis(6,6,7,7,8,8,8-heptafluoro-2,2-dimethyl-3,5-octanedionate) copper(II). According to this method, it is possible to form a light reflecting portion constituted using copper.

In the method for producing a solid-state imaging device according to the fourth aspect, in the step of forming a light reflecting portion, the light reflecting portion may be formed by an atomic layer deposition method using source gas including gold. The source gas including gold may be trimethyl(trimethylphosphine) gold(III). According to this method, it is possible to form a light reflecting portion constituted using gold.

In the method for producing a solid-state imaging device according to the fourth aspect, in the step of forming a light reflecting portion, the light reflecting portion may be formed by an atomic layer deposition method using source gas including aluminum. The source gas including aluminum may be trimethyl aluminum, tris(2,2,6,6-tetramethyl-3,5-heptanedionate) aluminum, or triethyl aluminum. According to this method, it is possible to form a light reflecting portion constituted using aluminum.

In the method for producing a solid-state imaging device according to the fourth aspect, in the step of forming a light reflecting portion, the light reflecting portion may be formed by an atomic layer deposition method using source gas including bismuth. The source gas including bismuth may be a material selected from the group consisting of triphenyl bismuth, tris(2,2,6,6-tetramethyl-3,5-heptanedionate) bismuth, bis(acetate-O)triphenyl bismuth, tris(2-methoxyphenyl)bismuthine, tris(tert-butyloxy) bismuth, tris(1,1,2-trimethylpropyloxy) bismuth, and tris(1,1-diisopropyl-2-methylpropyloxy) bismuth. According to this method, it is possible to form a light reflecting portion constituted using bismuth.

In the method for producing a solid-state imaging device according to the fourth aspect, in the step of forming a light reflecting portion, the light reflecting portion may be formed by an atomic layer deposition method using source gas including platinum. The source gas including platinum may be (trimethyl)methylcyclopentadienyl platinum (IV). According to this method, it is possible to form a light reflecting portion constituted using platinum.

The photoelectric conversion unit included in the foregoing solid-state imaging device may include a photoelectric conversion main surface including the light input surface, and a photoelectric conversion back surface on a side opposite to the photoelectric conversion main surface. A light direction changing unit changing a traveling direction of the absorbed light may be provided on the photoelectric conversion back surface. The light direction changing unit may change the traveling direction of the absorbed light such that an angle of the absorbed light based on a reference axis after the traveling direction has been changed differs from an angle of the absorbed light based on the reference axis before the traveling direction is changed.

A solid-state imaging device according to a fifth aspect of the present invention includes a plurality of pixels including a photoelectric conversion unit generating a signal voltage corresponding to absorbed light, and an isolation wall portion including a trench and a light reflecting portion embedded in the trench and provided between the pixels adjacent to each other. The photoelectric conversion unit includes a photoelectric conversion main surface including a light input surface receiving incident light, and a photoelectric conversion back surface on a side opposite to the photoelectric conversion main surface. A light direction changing unit is provided on the photoelectric conversion back surface. The light direction changing unit changes a traveling direction of the absorbed light such that an angle of the absorbed light based on a reference axis after the traveling direction has been changed differs from an angle of the absorbed light based on the reference axis before the traveling direction is changed.

According to the foregoing solid-state imaging device, a normal line of absorbed light on the light input surface after the traveling direction has been changed may be adopted as a reference axis, and an angle based on the reference axis may correspond to an angle based on a normal line of absorbed light on the light input surface before the traveling direction is changed. Here, the angle is an absolute value of the angle with respect to the reference axis.

According to the foregoing solid-state imaging device, the light direction changing unit may be inclined with respect to a reference axis based on the normal line and reflect the received light.

According to the foregoing solid-state imaging device, a wiring unit may come into contact with the photoelectric conversion back surface.

According to the foregoing solid-state imaging device, the light direction changing unit may include a reflecting portion provided in the wiring unit.

According to the foregoing solid-state imaging device, the light direction changing unit may include at least one light direction changer protruding based on the photoelectric conversion back surface or hollow based on the photoelectric conversion back surface.

According to the foregoing solid-state imaging device, a height of the light direction changer protruding based on the photoelectric conversion back surface or a depth of the light direction changer hollow based on the photoelectric conversion back surface corresponds to a wavelength of the absorbed light based on a refractive index of the photoelectric conversion unit.

According to the foregoing solid-state imaging device, the height of the light direction changer based on the photoelectric conversion back surface may be larger than a length corresponding to 1/10 of the wavelength of the absorbed light based on the refractive index of the photoelectric conversion unit.

According to the foregoing solid-state imaging device, the height of the light direction changer based on the photoelectric conversion back surface may be smaller than a length corresponding to five times the wavelength of the absorbed light based on the refractive index of the photoelectric conversion unit.

According to the foregoing solid-state imaging device, the light direction changer may include a flat surface.

According to the foregoing solid-state imaging device, a cross-sectional shape of the light direction changer may include a rectangular part.

According to the foregoing solid-state imaging device, the light direction changer may have a rectangular parallelepiped shape constituted of the flat surface.

According to the foregoing solid-state imaging device, a cross section of the light direction changer may have a triangular shape.

According to the foregoing solid-state imaging device, the light direction changer may have a quadrangular pyramidal shape constituted of the flat surface.

According to the foregoing solid-state imaging device, the light direction changer may have a triangular prismatic shape constituted of the flat surface.

According to the foregoing solid-state imaging device, the light direction changer may include a curved surface.

According to the foregoing solid-state imaging device, a cross section of the light direction changer may have a shape including an oval part.

According to the foregoing solid-state imaging device, the light direction changer may have a rotor shape realized by rotating a cross section including an oval part around an axis.

According to the foregoing solid-state imaging device, the light direction changer may have a swept body shape realized by extending a cross section including an oval part along an axis.

According to the foregoing solid-state imaging device, the light direction changing unit may be constituted of a plurality of the light direction changers disposed in a first direction and a plurality of the light direction changers disposed in a second direction intersecting the first direction in a grating shape in a plan view.

According to the foregoing solid-state imaging device, the light direction changing unit may be constituted of the light direction changer extending in a first direction and a plurality of the light direction changers disposed in a second direction intersecting the first direction in a stripe shape in a plan view.

The photoelectric conversion unit of the foregoing solid-state imaging device may include a first photoelectric conversion interface including the light input surface, and a second photoelectric conversion interface that is an interface different from the first photoelectric conversion interface and changes a traveling direction of the absorbed light received from the light input surface. The absorbed light may travel forward into the photoelectric conversion unit from the light input surface at a first angle. The absorbed light whose traveling direction is changed in the second photoelectric conversion interface may be incident on the light input surface at a second angle. The second photoelectric conversion interface may change the traveling direction of the absorbed light such that the second angle differs from the first angle.

According to the foregoing solid-state imaging device, the second photoelectric conversion interface may be a boundary surface with respect to a wiring unit provided on the photoelectric conversion back surface on a side opposite to the first photoelectric conversion interface.

The second photoelectric conversion interface may be a boundary surface with respect to a trench provided in a manner of intersecting the first photoelectric conversion interface.

Advantageous Effects of Invention

According to the present invention, a solid-state imaging device in which efficiency of photoelectric conversion of near-infrared light can be further improved, and a method for producing a solid-state imaging device are provided.

BRIEF DESCRIPTION OF DRAWINGS

FIG. 12 is a table listing refractive indices of various kinds of materials.

FIG. 14 is a table listing complex refractive indices, reference sources, a reflectance in a relationship with respect to silicon, real number portions of a dielectric constant, and imaginary number portions of the dielectric constant of various kinds of materials.

FIG. 15(*a*) is a schematic view of an analysis model for examination. FIG. 15(*b*) is a graph showing a relationship between a film thickness and the reflectance. FIG. 15(*c*) is a graph showing a relationship between the film thickness and a transmittance.

FIGS. 17(*a*), 17(*b*), 17(*c*), and 17(*d*) are views illustrating main steps of a method for producing a solid-state imaging device.

FIG. 20(*a*) is a view illustrating a light scattering unit having a pyramidal shape. FIG. 20(*b*) is a view illustrating a light scattering unit having a randomly uneven shape.

FIG. 21(*a*) is a view illustrating a model used for a first examination. FIG. 21(*b*) is a graph showing results of the first examination.

FIGS. 22(*a*), 22(*b*), 22(*c*), and 22(*d*) are views schematically illustrating conditions used for a second examination.

FIGS. 23(*a*), 23(*b*), 23(*c*), and 23(*d*) are views schematically illustrating conditions used for the second examination.

FIG. 24(*a*) is a view schematically illustrating a condition used for the second examination. FIG. 24(*b*) is a graph showing results of the second examination.

FIG. 25(*a*) is a contour diagram showing results of simulation of a diffraction mode utilizing plasmons in a solid-state imaging device including no DTI. FIG. 25(*b*) is a pie chart showing the result of simulation of the diffraction mode utilizing plasmons in the solid-state imaging device including no DTI.

FIG. 26(*a*) is a contour diagram showing results of simulation of the diffraction mode utilizing plasmons in a solid-state imaging device including a DTI. FIG. 26(*b*) is a pie chart showing the result of simulation of the diffraction mode utilizing plasmons in the solid-state imaging device including a DTI.

FIG. 30(*b*) is a table listing results of the fifth examination, a sixth examination, a seventh examination, and an eighth examination.

FIG. 32(*a*) is a cross-sectional view illustrating a structure of a solid-state imaging device of a second embodiment. FIG. 32(*b*) is a perspective view illustrating a wiring layer side interface of a photoelectric conversion layer included in the solid-state imaging device.

FIG. 35(*a*) is a cross-sectional view illustrating a structure of a solid-state imaging device of a Modification Example 1 of the second embodiment. FIG. 35(*b*) is a perspective view illustrating a wiring layer side interface of a photoelectric conversion layer included in the solid-state imaging device.

FIG. 36(*a*) is a cross-sectional view illustrating a structure of a solid-state imaging device of Modification Example 2 of the second embodiment. FIG. 36(*b*) is a perspective view illustrating a wiring layer side interface of a photoelectric conversion layer included in the solid-state imaging device.

FIG. 37(*a*) is a cross-sectional view illustrating a structure of a solid-state imaging device of Modification Example 3 of the second embodiment. FIG. 37(*b*) is a perspective view illustrating a wiring layer side interface of a photoelectric conversion layer included in the solid-state imaging device.

FIG. 38(*a*) is a cross-sectional view illustrating a structure of a solid-state imaging device of Modification Example 4 of the second embodiment. FIG. 38(*b*) is a perspective view illustrating a wiring layer side interface of a photoelectric conversion layer included in the solid-state imaging device.

FIG. 39(*a*) is a cross-sectional view illustrating a structure of a solid-state imaging device of Modification Example 5 of the second embodiment. FIG. 39(*b*) is a perspective view illustrating a wiring layer side interface of a photoelectric conversion layer included in the solid-state imaging device.

FIG. 40(*a*) is a cross-sectional view illustrating a structure of a solid-state imaging device of Modification Example 6 of the second embodiment. FIG. 40(*b*) is a perspective view illustrating a wiring layer side interface of a photoelectric conversion layer included in the solid-state imaging device.

FIG. 41(*a*) is a cross-sectional view illustrating a structure of a solid-state imaging device of Modification Example 7 of the second embodiment. FIG. 41(*b*) is a perspective view illustrating a wiring layer side interface of a photoelectric conversion layer included in the solid-state imaging device.

FIG. 42(*a*) is a cross-sectional view illustrating a structure of a solid-state imaging device of a third embodiment. FIG. 42(*b*) is a perspective view illustrating a wiring layer side interface of a photoelectric conversion layer included in the solid-state imaging device.

FIG. 44(*a*) is a cross-sectional view illustrating a structure of a solid-state imaging device of a Modification Example 1 of the third embodiment. FIG. 44(*b*) is a perspective view illustrating a wiring layer side interface of a photoelectric conversion layer included in the solid-state imaging device.

FIG. 45(*a*) is a cross-sectional view illustrating a structure of a solid-state imaging device of Modification Example 2 of the third embodiment. FIG. 45(*b*) is a perspective view illustrating a wiring layer side interface of a photoelectric conversion layer included in the solid-state imaging device.

FIG. 46(*a*) is a cross-sectional view illustrating a structure of a solid-state imaging device of Modification Example 3 of the third embodiment. FIG. 46(*b*) is a perspective view illustrating a wiring layer side interface of a photoelectric conversion layer included in the solid-state imaging device.

FIG. 47(*a*) is a cross-sectional view illustrating a structure of a solid-state imaging device of Modification Example 4 of the third embodiment. FIG. 47(*b*) is a perspective view illustrating a wiring layer side interface of a photoelectric conversion layer included in the solid-state imaging device.

FIG. 48(*a*) is a cross-sectional view illustrating a structure of a solid-state imaging device of Modification Example 5 of the third embodiment. FIG. 48(*b*) is a perspective view illustrating a wiring layer side interface of a photoelectric conversion layer included in the solid-state imaging device.

FIG. 49(*a*) is a cross-sectional view illustrating a structure of a solid-state imaging device of Modification Example 6 of the third embodiment. FIG. 49(*b*) is a perspective view illustrating a wiring layer side interface of a photoelectric conversion layer included in the solid-state imaging device.

FIG. 50(*a*) is a cross-sectional view illustrating a structure of a solid-state imaging device of Modification Example 7 of the third embodiment. FIG. 50(*b*) is a perspective view illustrating a wiring layer side interface of a photoelectric conversion layer included in the solid-state imaging device.

FIG. 51(*a*) is a cross-sectional view illustrating a structure of a solid-state imaging device of Modification Example 8 of the third embodiment. FIG. 51(*b*) is a perspective view illustrating a wiring layer side interface of a photoelectric conversion layer included in the solid-state imaging device.

FIG. 52(*a*) is a cross-sectional view illustrating a structure of a solid-state imaging device of Modification Example 9 of the third embodiment. FIG. 52(*b*) is a perspective view illustrating a wiring layer side interface of a photoelectric conversion layer included in the solid-state imaging device.

FIG. 53(*a*) is a cross-sectional view illustrating a structure of a solid-state imaging device of a Modification Example 10 of the third embodiment. FIG. 53(*b*) is a perspective view illustrating a wiring layer side interface of a photoelectric conversion layer included in the solid-state imaging device.

FIG. 54(*a*) is a cross-sectional view illustrating a structure of a solid-state imaging device of a Modification Example 11 of the third embodiment. FIG. 54(*b*) is a perspective view illustrating a wiring layer side interface of a photoelectric conversion layer included in the solid-state imaging device.

FIG. 55(*a*) is a cross-sectional view illustrating a structure of a solid-state imaging device of a Modification Example 12 of the third embodiment. FIG. 55(*b*) is a perspective view illustrating a wiring layer side interface of a photoelectric conversion layer included in the solid-state imaging device.

FIG. 56(*a*) is a cross-sectional view illustrating a structure of a solid-state imaging device of a Modification Example 13 of the third embodiment. FIG. 56(*b*) is a perspective view illustrating a wiring layer side interface of a photoelectric conversion layer included in the solid-state imaging device.

FIG. 57(*a*) is a cross-sectional view illustrating a structure of a solid-state imaging device of a Modification Example 14 of the third embodiment. FIG. 57(*b*) is a perspective view illustrating a wiring layer side interface of a photoelectric conversion layer included in the solid-state imaging device.

FIG. 58(*a*) is a cross-sectional view illustrating a structure of a solid-state imaging device of a Modification Example 15 of the third embodiment. FIG. 58(*b*) is a perspective view illustrating a wiring layer side interface of a photoelectric conversion layer included in the solid-state imaging device.

FIG. 59(*a*) is a cross-sectional view illustrating a structure of a solid-state imaging device of a Modification Example 16 of the third embodiment. FIG. 59(*b*) is a perspective view illustrating a wiring layer side interface of a photoelectric conversion layer included in the solid-state imaging device.

FIG. 60(*a*) is a cross-sectional view illustrating a structure of a solid-state imaging device of a Modification Example 17 of the third embodiment. FIG. 60(*b*) is a perspective view illustrating a wiring layer side interface of a photoelectric conversion layer included in the solid-state imaging device.

FIG. 61(*a*) is a cross-sectional view illustrating a structure of a solid-state imaging device of a Modification Example 18 of the third embodiment. FIG. 61(*b*) is a perspective view illustrating a wiring layer side interface of a photoelectric conversion layer included in the solid-state imaging device.

FIG. 62(*a*) is a cross-sectional view illustrating a structure of a solid-state imaging device of a Modification Example 19 of the third embodiment. FIG. 62(*b*) is a perspective view illustrating a wiring layer side interface of a photoelectric conversion layer included in the solid-state imaging device.

FIG. 63(*a*) is a cross-sectional view illustrating a structure of a solid-state imaging device of Modification Example 20 of the third embodiment. FIG. 63(*b*) is a perspective view illustrating a wiring layer side interface of a photoelectric conversion layer included in the solid-state imaging device.

FIG. 64(*a*) is a cross-sectional view illustrating a structure of a solid-state imaging device of Modification Example 21 of the third embodiment. FIG. 64(*b*) is a perspective view illustrating a wiring layer side interface of a photoelectric conversion layer included in the solid-state imaging device.

FIG. 65(*a*) is a cross-sectional view illustrating a structure of a solid-state imaging device of Modification Example 22 of the third embodiment. FIG. 65(*b*) is a perspective view illustrating a wiring layer side interface 4 of a photoelectric conversion layer included in the solid-state imaging device.

FIG. 66(*a*) is a cross-sectional view illustrating a structure of a solid-state imaging device of Modification Example 23 of the third embodiment. FIG. 66(*b*) is a perspective view illustrating a wiring layer side interface of a photoelectric conversion layer included in the solid-state imaging device.

FIGS. 67(*a*), 67(*b*), 67(*c*), and 67(*d*) are cross-sectional views illustrating alternative modification examples of the solid-state imaging devices of the second embodiment and modification examples of the second embodiment.

FIGS. 68(*a*), 68(*b*), 68(*c*), 68(*d*), 68(*e*), and 68(*f*) are cross-sectional views illustrating alternative modification examples of the solid-state imaging device of the third embodiment.

FIG. 70(*a*) is a cross-sectional view illustrating an alternative modification example of the solid-state imaging device of the third embodiment. FIG. 70(*b*) is a cross-sectional view illustrating a structure of a solid-state imaging device of a fourth embodiment.

DESCRIPTION OF EMBODIMENTS

Hereinafter, embodiments of the present invention will be described in detail with reference to the accompanying drawings. In description of the drawings, the same reference signs are applied to the same elements, and duplicate description thereof will be omitted.

The following description relates to improvement in sensitivity of a photodiode or a CMOS image sensor in which each pixel includes a photodiode. Particularly, the following description relates to improvement in sensitivity of a near-infrared region.

Figure 1:
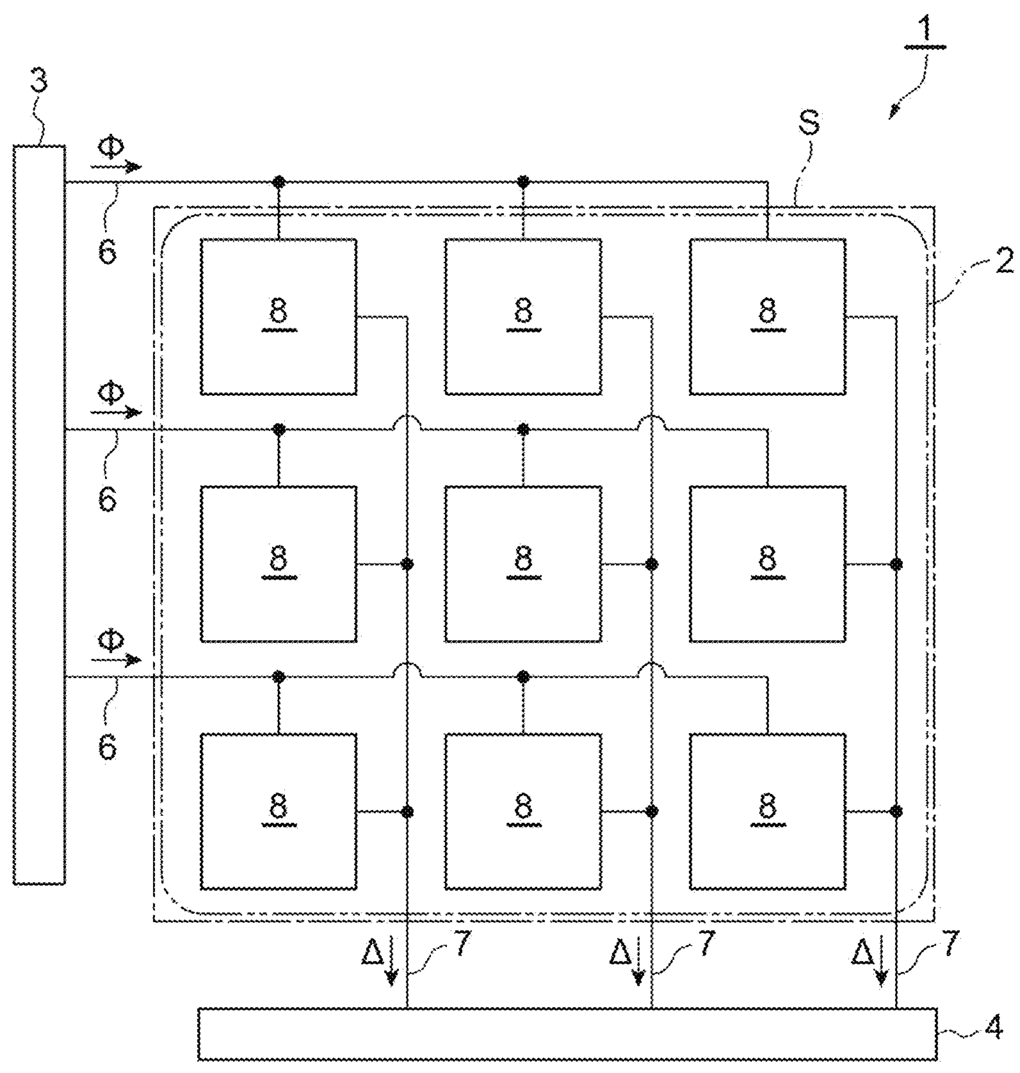
FIG. 1 is a view schematically illustrating a constitution of a solid-state imaging device according to an embodiment.

As illustrated in FIG. 1, a solid-state imaging device 1 of the present embodiment is a so-called back-illuminated image sensor. The solid-state imaging device 1 may receive light from an opposite side. An opposite side indicates a side of a support substrate 11, which will be described below. The solid-state imaging device 1 has a pixel unit 2, a pixel control unit 3, a signal processing unit 4, a plurality of horizontal control lines 6, and a plurality of vertical signal lines 7. The pixel unit 2, the pixel control unit 3, the signal processing unit 4, and the like are provided on a sensor substrate 12, which will be described below. The sensor substrate 12 is attached to the support substrate 11. The sensor substrate 12, which is a silicon wafer having the pixel unit 2 formed therein, is thin. Therefore, the sensor substrate 12 cannot retain a mechanical strength. The support substrate 11 imparts a mechanical strength to the solid-state imaging device 1. The pixel unit 2 is provided in a part corresponding to a light receiving region S of the sensor substrate 12. The pixel unit 2 has a plurality of pixels 8 disposed in a two-dimensional shape. The pixels 8 output a signal voltage corresponding to incident light to the vertical signal lines 7. The pixel control unit 3 is connected to each of the pixels 8 via the horizontal control lines 6. The pixel control unit 3 outputs a control signal $\phi$ for controlling operation of the pixels 8. The signal processing unit 4 is connected to each of the pixels 8 via the vertical signal lines 7. The signal processing unit 4 receives a signal voltage $\Delta$ output by the pixels 8. The signal processing unit 4 generates an image signal from the signal voltage $\Delta$ output from the pixels 8.

Figure 2:
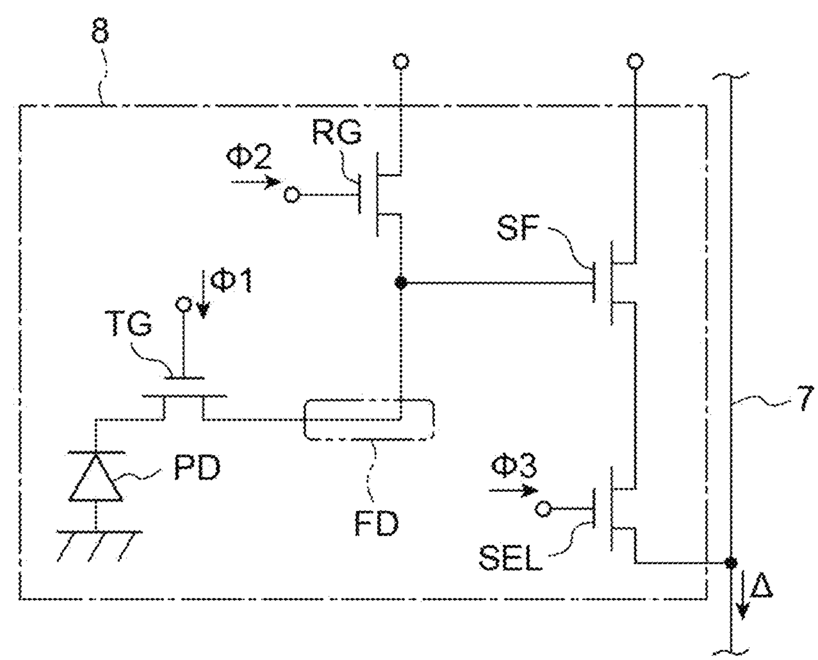
FIG. 2 is a view illustrating an electrical constitution of a pixel.

FIG. 2 is a view illustrating an electrical constitution of the pixel 8. The pixel 8 is a so-called four-transistor CMOS image sensor. The pixel 8 of the present embodiment is an N-channel type. A signal of the pixel 8 is carried by signal electrons. The pixel 8 may be a P-channel type.

The pixel 8 has a photodiode PD, a floating diffusion layer FD, a transfer gate TG, a reset transistor RG, a source follower transistor SF, and a selection transistor SEL.

The photodiode PD is a PN junction type. The photodiode PD generates signal electrons as carriers. Further, the photodiode PD stores generated signal electrons.

Each of the transfer gate TG, the reset transistor RG, the source follower transistor SF, and the selection transistor SEL is a field effect transistor.

A source of the transfer gate TG is connected to the photodiode PD. A drain of the transfer gate TG is connected to the floating diffusion layer FD. A gate of the transfer gate TG is connected to the horizontal control lines 6. The transfer gate TG receives a control signal $\phi$1 from the horizontal control lines 6. The transfer gate TG controls transfer of signal electrons from the photodiode PD to the floating diffusion layer FD on the basis of the control signal $\phi$1.

The floating diffusion layer FD is connected to the drain of the transfer gate TG. Namely, the floating diffusion layer FD is connected to the photodiode PD via the transfer gate TG. The floating diffusion layer FD converts signal electrons into a signal voltage. The floating diffusion layer FD is connected to a source of the reset transistor RG. The floating diffusion layer FD is also connected to a gate of the source follower transistor SF.

The source of the reset transistor RG is connected to the floating diffusion layer FD. A drain of the reset transistor RG is connected to a reset drain. A gate of the reset transistor RG is connected to the horizontal control lines 6. The reset transistor RG receives a control signal $\phi$2 from the horizontal control lines 6. The reset transistor RG resets an electric potential of the floating diffusion layer FD on the basis of the control signal φ2.

A source of the source follower transistor SF is connected to the selection transistor SEL. A drain of source follower transistor SF is connected to an analog power source. The gate of the source follower transistor SF is connected to the horizontal control lines 6. The source follower transistor SF outputs a signal voltage corresponding to a voltage input to the gate via the selection transistor SEL.

A source of the selection transistor SEL is connected to the vertical signal lines 7. A drain of the selection transistor SEL is connected to the source of the source follower transistor SF. A gate of the selection transistor SEL is connected to the horizontal control lines 6. The selection transistor SEL outputs the signal voltage Δ to the vertical signal lines 7 on the basis of a control signal φ3.

Figure 3:
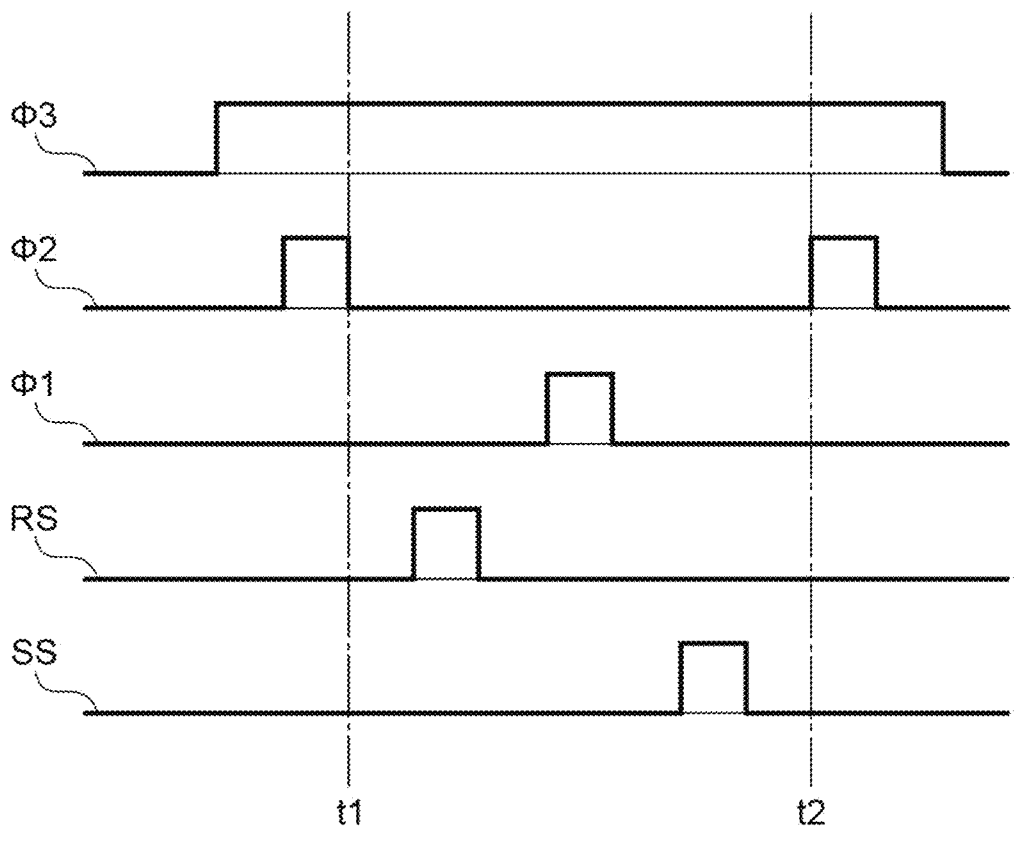
FIG. 3 is an example of control signals provided to the pixel.

FIG. 3 is a view showing control signals φ1, φ2, φ3, RS, and SS output by the pixel control unit 3. FIG. 3 shows timings of the control signals φ1, φ2, φ3, RS, and SS during a reading period of an nth row. In the following description, "(H)" indicates that a signal is high (High), namely, a signal is turned on. "(L)" indicates that a signal is low (Low), namely, a signal is turned off.

The pixel control unit 3 outputs the control signal φ3(H). As a result, the row which has received the control signal φ3 is selected. Subsequently, the pixel control unit 3 outputs the control signal φ2(H) only for a predetermined period. As a result, a reset drain voltage is output to the floating diffusion layer FD. Subsequently, the pixel control unit 3 outputs the control signal RS(H) only for a predetermined period. As a result, a reset level is sampled. Next, the pixel control unit 3 outputs the control signal φ1(H) only for a predetermined period. As a result, signal electrons are transferred from the photodiode PD to the floating diffusion layer FD. Next, the pixel control unit 3 outputs the control signal SS(H) only for a predetermined period. As a result, a signal level caused by signal electrons stored in the floating diffusion layer FD is sampled at the timing of the control signal SS(H). Next, the pixel control unit 3 outputs the control signal φ2(H) again only for a predetermined period. As a result, the reset drain voltage is output to the floating diffusion layer FD. The electric potential of the floating diffusion layer FD is reset. The pixel control unit 3 outputs the control signal φ3(L). As a result, reading of the nth row ends. Thereafter, the pixel control unit 3 outputs the control signal φ3(H) to the next n+1th row.

In the signal processing unit 4, a difference between a sampled signal level and a reset level is made. The difference between a sampled signal level and a reset level is correlated double sampling. According to the correlated double sampling, noise can be reduced. According to the correlated double sampling, an offset can be removed. The difference between a sampled signal level and a reset level is treated as a signal component. This signal component is converted into a digital value from an analog value. Further, a component which has been converted into a digital value is output to the outside of the solid-state imaging device 1.

Figure 4:
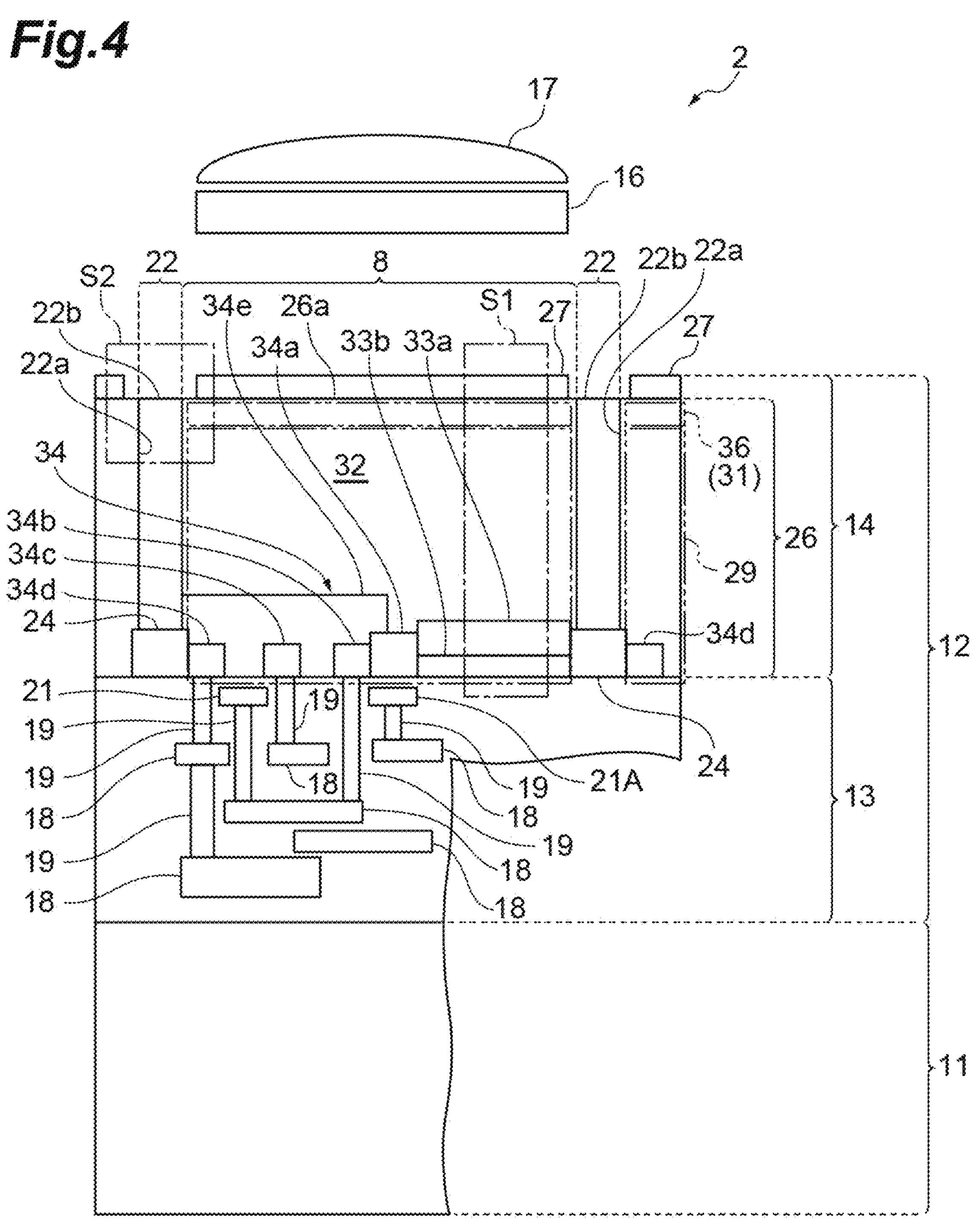
FIG. 4 is a view illustrating a structure of the pixel.

FIG. 4 schematically illustrates a cross section of the pixel unit 2. The pixel unit 2 is formed on the sensor substrate 12. The sensor substrate 12 has a wiring region 13 and an element region 14. A surface of the sensor substrate 12 on the wiring region 13 side is bonded to the support substrate 11. In addition, a color filter 16 and a micro-lens 17 are disposed on the pixel unit 2. The color filter 16 plays a role of colorization. The micro-lens 17 plays a role of light concentration.

The wiring region 13 has a plurality of wirings 18, a plurality of vias 19, and gates 21 and 21A. The wirings 18 are formed of copper or aluminum. The vias 19 electrically connect the wirings 18 to each other. The vias 19 electrically connect the wirings 18 to the gates 21 and 21A formed of polysilicon. The wiring region 13 also has an insulating film (not illustrated) covering the wirings 18 and the vias 19.

The element region 14 has the pixel 8 and DTIs 22.

The pixel 8 has a photoelectric conversion unit 26 and a light scattering unit 27. The photoelectric conversion unit 26 generates a signal voltage corresponding to absorbed light L2 received from a light input surface 26*a*. The light scattering unit 27 is provided on the light input surface 26*a* of photoelectric conversion unit 26. The light input surface 26*a* is also a main surface of a pinning region 36, which will be described below. The light scattering unit 27 receives incident light L1 (refer to FIG. 5) and generates the absorbed light L2 (refer to FIG. 5) output to the photoelectric conversion unit 26.

The photoelectric conversion unit 26 has a first region 29 and a second region 31.

The first region 29 has a base portion 32, a charge storage unit 33*a*, a photodiode pinning layer 33*b*, and a reading unit 34. The base portion 32 is a P type and constitutes the light input surface 26*a*. The absorbed light L2 is absorbed in the base portion 32. As a result, signal electrons are generated. The charge storage unit 33*a* and the photodiode pinning layer 33*b* are provided between the base portion 32 and the wiring region 13. In other words, the charge storage unit 33*a* is provided in the vicinity of a surface on the wiring region 13 side. The charge storage unit 33*a* constitutes a PN junction diode in cooperation with the P type base portion 32 and the photodiode pinning layer 33*b*. The photodiode pinning layer 33*b* (P+ type) is provided between the charge storage unit 33*a* and the wiring region 13. The photodiode pinning layer 33*b* prevents generation of a dark current from an interface level of a silicon surface. The photodiode pinning layer 33*b* comes into contact with a channel stop region 24. The electric potential of the photodiode pinning layer 33*b* is the same as the electric potential of the channel stop region 24.

The reading unit 34 has a threshold adjustment region 34*a*, N+ type regions 34*b*, 34*c*, and 34*d*, and a P type well 34*e*.

The threshold adjustment region 34*a* comes into contact with the charge storage unit 33*a* and the photodiode pinning layer 33*b*. The threshold adjustment region 34*a* constitutes the transfer gate TG in cooperation with the gate 21A. The N+ type region 34*b* comes into contact with the threshold adjustment region 34*a*. The N+ type region 34*b* constitutes the floating diffusion layer FD. In other words, the N+ type region 34*b* is provided on a side opposite to the photodiode PD of the threshold adjustment region 34*a*. Namely, the threshold adjustment region 34*a* is provided between the charge storage unit 33*a* and the floating diffusion layer FD. The P type well 34*e* is adjacent to the charge storage unit 33*a*. In other words, the P type well 34*e* is adjacent to the charge storage unit 33*a* via the threshold adjustment region 34*a*.

The N+ type region 34*c* is adjacent to the N+ type region 34*b* with a channel region, which is formed by the P type well 34*e*, sandwiched therebetween. Signal electrons stored in the charge storage unit 33*a* are read in the N+ type region 34*b* via the threshold adjustment region 34*a* constituting the transfer gate TG. The N+ type region 34*b* is the floating diffusion layer FD. Read signal electrons are converted into a voltage signal in the floating diffusion layer FD. The N+ type region 34*d* is adjacent to the N+ type region 34*c* with a channel region, which is formed by the P type well 34*e*, sandwiched therebetween. The N+ type region 34*d*, the N+ type region 34*c*, and the gate 21 constitute the source follower transistor SF. The channel stop region 24 comes into contact with the N+ type region 34*d*. Although it is not illustrated, the reset transistor RG and the selection transistor SEL are provided.

The P type well 34*e* includes the floating diffusion layer FD, the reset transistor RG, the source follower transistor SF, and the selection transistor SEL. The P type well 34*e* prevents inflow of signal electrons from the P type base portion 32. The P type well 34*e* controls thresholds of the reset transistor RG, the source follower transistor SF, and the selection transistor SEL.

Figure 5:
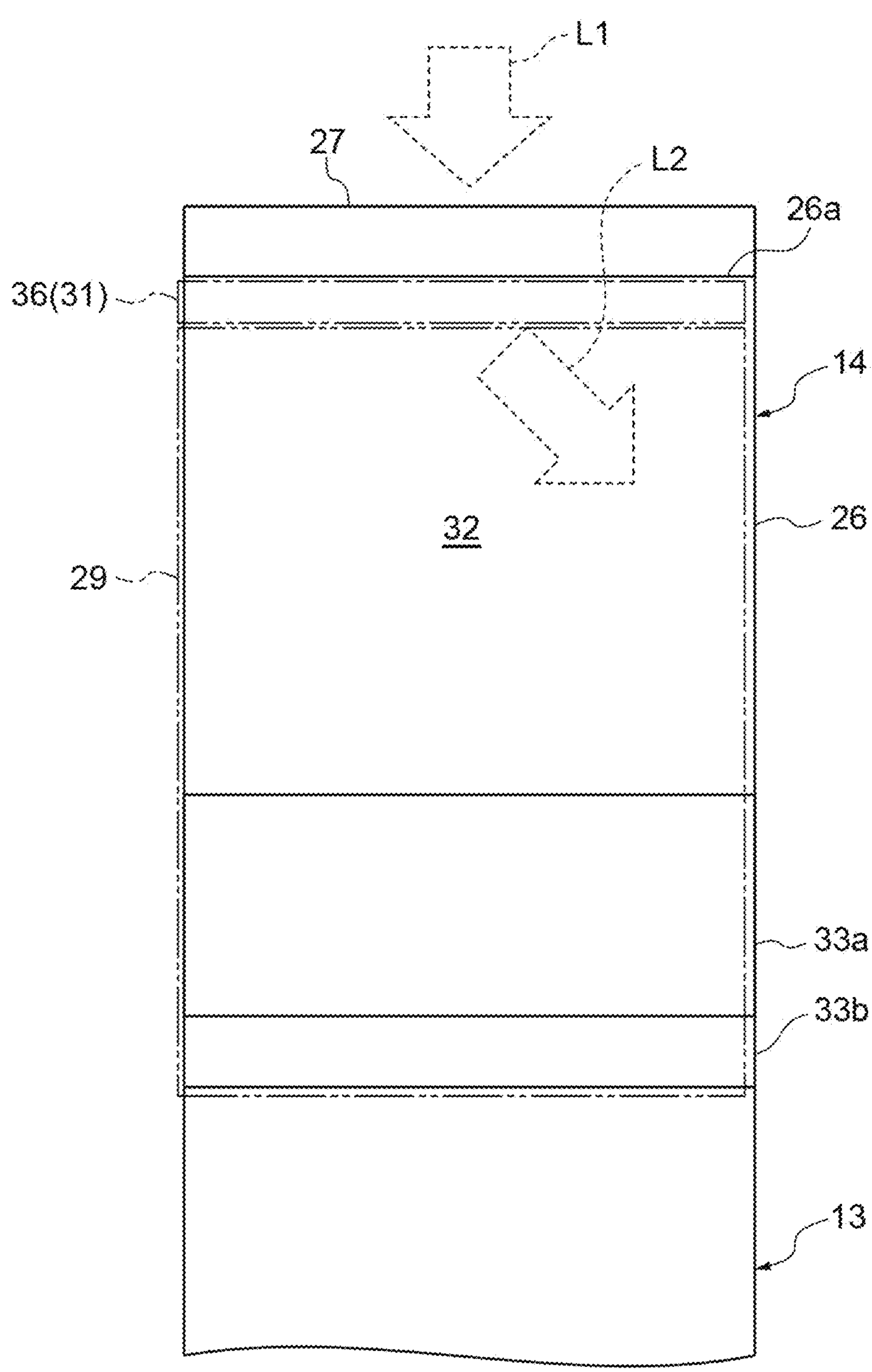
FIG. 5 is an enlarged view illustrating an area in the vicinity (S1) of a light input surface that is a part of FIG. 4.

FIG. 5 is an enlarged view of a region S1 in FIG. 4. As illustrated in FIG. 5, the photoelectric conversion unit 26 further has the pinning region 36 formed in the second region 31.

The pinning region 36 (high-concentration impurity layer) is provided on an incidence side of the base portion 32. In other words, the pinning region 36 is provided on a surface of the base portion 32 opposite to the wiring region 13 side. A thickness of the pinning region 36 is 3 nm or larger. The thickness of the pinning region 36 is 100 nm or smaller. The pinning region 36 has a high acceptor concentration. The pinning region 36 is neutralized. The pinning region 36 retains positive holes. The pinning region 36 curbs generation of a dark current. The pinning region 36 will be described in more detail.

In the solid-state imaging device 1 of the present embodiment, a region generating signal electrons caused by absorption of light (photoelectric conversion unit) includes regions exhibiting a function of curbing generation of a dark current (the second region 31 and the pinning region 36). Therefore, a layer and a film interrupting the absorbed light L2 output from the light scattering unit 27 to the photoelectric conversion unit 26 are not practically present between the light scattering unit 27 and the photoelectric conversion unit 26.

The sensors will be described as the N-channel type. A signal caused by the incident light L1 will be described such that it is carried by signal electrons. The pinning region 36 is the P type.

The pinning region 36 is the P+ type and is a pinning layer formed on a surface on the incidence side. The pinning region 36 has a high acceptor concentration. The positive holes having a concentration of $1\times10^{17}$ $cm^{-3}$ or higher are present in the vicinity of the light input surface 26*a* of the pinning region 36 at all times. A dark current is generated due to the interface level present on the light input surface 26*a* of the photoelectric conversion unit 26 on the incidence side. These positive holes curb generation of this dark current.

The pinning region 36 satisfies at least a first condition. It is more favorable when the pinning region 36 satisfies a second condition and a third condition.

The first condition is that the pinning region 36 performs neutralization by accumulating the positive holes on the light input surface 26*a* on the incidence side. According to the first condition, generation of a dark current on the light input surface 26*a* can be curbed. When a plurality of bandgap levels are included as in a $Si/SiO_2$ interface, electrons of a valence band are excited to a conductor via the bandgap levels. As a result, a dark current is generated. A value of a dark current is indicated by Expression (12) based on a Schockley-Read-Hall model.

[Math. 12]

$$U = \sigma v_{th} N_t (pn - n_i^2)/(n + p + 2n_i \cosh((E_t - E_i)/kT)) \quad (12)$$

Each of parameters constituting Expression (12) is as follows.

U: recombination rate $\sigma=\sigma_n=\sigma_p$: capture cross-sectional areas of electrons and positive holes with respect to bandgap levels $v_{th}$: thermal motion velocity $N_t$: bandgap level density n: electron density of conduction band p: positive hole density of valence band $n_i$: intrinsic carrier density k: Boltzmann constant T: absolute temperature A positive recombination rate indicates recombination. A negative recombination rate indicates a generation rate of a dark current. When the $Si/SiO_2$ interface is depleted, n, $p<<n_i$ is established. According to this condition, Expression (12) to Expression (13) can be obtained.

[Math. 13]

$$U_{dep} = \sigma v_{th} N_t (-n_i^2)/(2n_i \cosh((E_t - E_i)/kT)) \quad (13)$$

When $E_t=E_i$, a recombination rate $U_{dep}$ when the $Si/SiO_2$ interface is depleted becomes the largest. Therefore, Expression (13) and Expression (14) can be obtained.

[Math. 14]

$$U_{dep} \doteqdot -\sigma v_{th} N_t n_j \quad (14)$$

According to this constitution, a large dark current is generated. In contrast, when the positive hole concentration in the vicinity of the interface is large, that is, when $p>>n_i>>n$, and when the bandgap level contributing most to generation of a dark current is $E_t=E_i$, Expression (12) to Expression (15) can be obtained.

[Math. 15]

$$U_{pinning} \doteqdot \sigma v_{th} N_t n_i^2/p \quad (15)$$

Expression (16) indicates a ratio between when the interface is depleted and when the positive holes are accumulated.

[Math. 16]

$$U_{dep}/U_{pinning} = n_i/p \quad (16)$$

In Expression (16), $n_i$ is $1.45\times10^{10}$ $cm^{-3}$. For example, when $p=10^{17}$ $cm^{-3}$, a dark current is reduced to $10^{-7}$ times.

The second condition is that the life-span of minority carriers is prolonged. Minority carriers indicate electrons. In other words, the second condition is that electrons of generated electron-positive hole pairs quickly pass through the P type photoelectric conversion unit 26 and the electrons arrive at the charge storage unit 33*a*.

The life-span of minority carriers is affected by the number of crystal defects included in the pinning region 36. Specifically, if the number of crystal defects included in the pinning region 36 is reduced, the life-span of minority carriers is prolonged. A crystal defect is likely to occur when the concentration of impurities included in the pinning region 36 is high and a high-concentration region is large. This is because the size of atoms of impurities differs from the size of atoms of silicon.

The pinning region 36 is provided by ion implantation. The amount of implanted ions corresponds to an integral of the concentration of impurities and the distribution of impurities. Regarding an ion implantation amount capable of curbing occurrence of a crystal defect, $3\times10^{15}$ $cm^{-2}$ or smaller is indicated.

In ion implantation, energy is brought into silicon at the same time as impurities are introduced into the silicon. The energy brought into silicon also causes a crystal defect. A crystal defect can be recovered by annealing treatment performed after ion implantation. However, a crystal defect does not completely disappear even by annealing treatment.

Formation of the pinning region 36 is performed after formation of the wiring region 13 ends. An annealing method is limited to a laser annealing method or the like. Therefore, there is a need to reduce occurrence of a crystal defect caused by ion implantation. The energy brought into silicon by ion implantation is proportional to the amount of impurities. The energy brought into silicon by ion implantation is also proportional to the intensity of energy. Regarding a condition for curbing occurrence of a crystal defect, it is indicated that the product of the amount of impurities and energy be $5\times10^{15}$ $keV\cdot cm^{-2}$ or smaller.

The third condition is that electrons of electron-positive hole pairs generated by photoelectric conversion quickly arrive at the charge storage unit 33*a*. Electrons pass through the P type base portion 32 and then arrive at the charge storage unit 33*a*. Such operation occurs when electrons move due to drift motion caused by an electric potential gradient.

The P type base portion 32 is depleted. Similarly, a part of the pinning region 36 on the base portion 32 side having a low concentration of impurities is depleted. A sufficient electric field can be obtained in the depleted region. In order to curb generation of a dark current, the positive holes are accumulated in an area of the pinning region 36 in the vicinity of the light input surface 26*a*. An area in the vicinity of the light input surface 26*a* is neutralized. A difference in concentration of impurities smoothens movement of electrons in a non-depleted region.

The pinning region 36 has a distribution of the concentration of impurities. As the acceptor concentration increases, a difference in energy between a fermi level and a valence band end decreases. The concentration of impurities (acceptors) is reduced in a direction of the base portion 32 from the surface on the incidence side in the pinning region 36. According to such a distribution of the concentration of impurities, even when there is a part in which the positive holes are accumulated in the pinning region 36, signal electrons quickly move to the base portion 32 due to drift.

Such a distribution of the concentration of impurities is obtained by ion implantation. Specifically, it is obtained by setting a peak position of the distribution of the concentration of impurities on the light input surface 26*a*. The peak position of the distribution of the concentration of impurities may be set in an oxide film provided on the light input surface 26*a*. According to such setting of a peak position, a distribution of the concentration of impurities in which the concentration of impurities is monotonously reduced from the light input surface 26*a* toward the base portion 32 is formed.

The distribution of the concentration of impurities can also be realized by another condition. Ion implantation is performed with low energy such as 0.2 keV. As a result, the peak position in the distribution of the concentration of impurities is approximately 0.5 nm. If an element having such a distribution is annealed, the peak almost disappears. As a result, a distribution of the concentration of impurities in which the concentration of impurities is monotonously reduced from the surface on the incidence side toward the base portion 32 can be obtained. It is preferable that injected energy be 1 keV or lower, for example. According to the method of using low-energy ion implantation, no oxide film is formed. As a result, the method of using low-energy ion implantation has an advantage that there is no trouble of removing an oxide film after ion implantation. Hereinafter, a technique of forming the pinning region 36 by low-energy ion implantation will be mainly described.

(Light Scattering Unit)

The inventors have earnestly examined a way of further improving sensitivity of the image sensors described in Patent Literature 1 and the like. As a result, the inventors have found out that insufficient light scattering in a light scattering unit is one of main causes of insufficient improvement in sensitivity. Examination results of characteristics of a scattering layer having a pyramidal shape or a scattering layer having a randomly uneven shape will be described in detail in sections of a first examination and a second examination in the latter stage.

Figure 6:
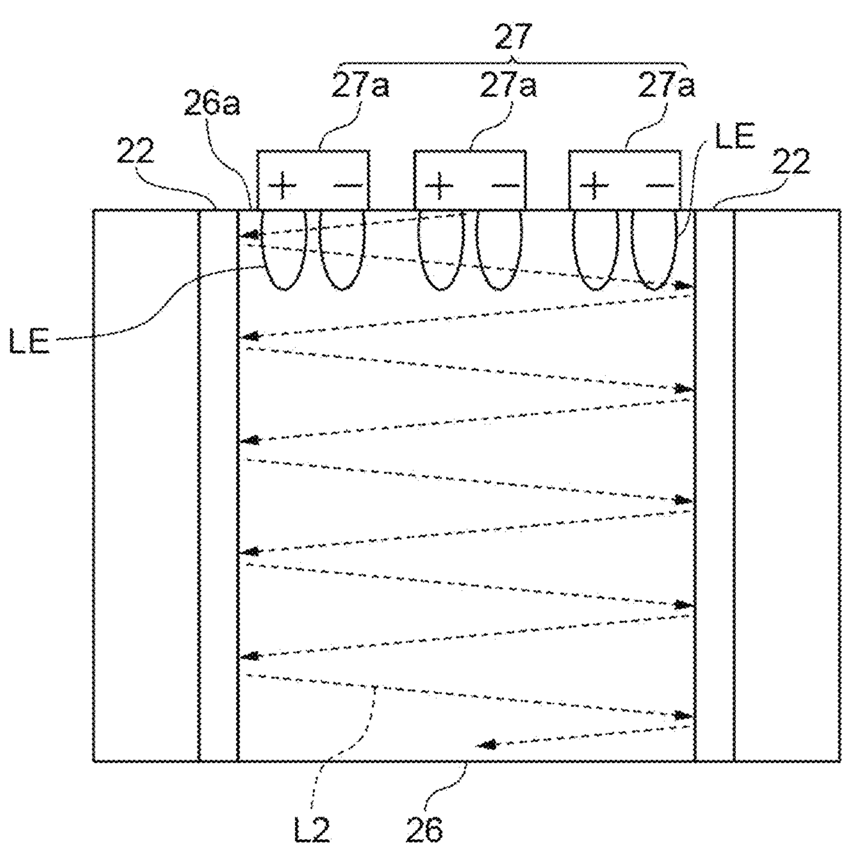
FIG. 6 is a view schematically illustrating operation of a light scattering unit and a DTI.

The inventors have come up with the structure illustrated in FIG. 6 as a light scattering structure for sufficiently scattering light. The structure illustrated in FIG. 6 scatters the incident light L1 by means of diffraction using plasmons. Expression (17) indicates a relationship between variables related to a light scattering structure. A light scattering structure is constituted of a plurality of metal structures 27*a*. The plurality of metal structures 27*a* are disposed in accordance with a certain cycle. The light scattering structure is a cyclic structure. In the light scattering structure, it is regarded as diffracted light generated due to plasmons. Diffracted light is generated by satisfying a condition that a scattering angle $\theta_d$ is smaller than 90 degrees in Expression (17). In other words, when the scattering angle $\theta d$ is 90 degrees or smaller, it is in a diffraction mode. In the diffraction mode, propagating light is generated in silicon. When $\theta_d$ is larger than 90 degrees, it is in a locally enhanced field mode.

[Math. 17]

$$\sin^{-1}\left(\frac{\ell\cdot\lambda}{n_{Si}\cdot P}\right) < 90^\circ \quad (17)$$

P (nm): cycle length of plurality of metal structures

λ (nm): wavelength of incident light $n_{Si}$: real part of refractive index of silicon l: 1 or 2

Diffracted light generated by a normal diffraction phenomenon includes zero-order light which travels straight forward without being diffracted. In diffracted light, first-order light and second-order light are generated from that having a smaller diffraction angle (scattering angle $\theta_d$). First, the light scattering unit 27 is required to reduce the proportion of the zero-order light. Second, the light scattering unit 27 is required to increase the diffraction angle (scattering angle $\theta_d$) of the first-order light occupying a large proportion in the diffracted light. Third, the light scattering unit 27 is required to reduce a reflectance. In Expression (17), l=1 indicates a range in which the first-order light can be used as scattered light. When l=2, it indicates a range in which the second-order light can be used as scattered light. When the second-order light is also used as scattered light, an average scattering angle between the first-order light and the second-order light subjected to intensity weighting becomes smaller than that in the case of only the first-order light. However, the cycle length of the metal structures may be two times. As a result, there is an advantage that the degree of fine processing is relaxed. A normal diffraction phenomenon is not appropriate for utilization as the light scattering unit 27. This is because a normal diffraction phenomenon has a large ratio of the zero-order light and a large reflectance.

In the diffraction mode utilizing plasmons, diffracted light is generated due to oscillation of an electric dipole induced in lower portions (silicon side) of the metal structures 27*a*. It is assumed that diffracted light is radiated from the center of oscillation of the electric dipole.

The light scattering unit 27 is a metal film formed on a surface of the pinning region 36. The light scattering unit 27 comes into direct contact with the pinning region 36. The light scattering unit 27 is formed of a material selected from the group consisting of silver, aluminum, gold, copper, and titanium nitride. The light scattering unit 27 may be formed of a material selected from the group consisting of a material including silver as a main component, a material including aluminum as a main component, a material including gold as a main component, a material including copper as a main component, and a material including titanium nitride as a main component. A thickness of the light scattering unit 27 is 10 nm or larger. The thickness of the light scattering unit 27 is 30 nm or smaller.

The light scattering unit 27 is isolated with respect to the light scattering unit 27 of another pixel 8 adjacent to the pixel 8. This isolation denotes that plasmons generated in one light scattering unit 27 do not move to another light scattering unit 27 adjacent thereto. In other words, gaps are provided between boundary portions of the pixels 8. Movement of plasmons generated in one light scattering unit 27 to another light scattering unit 27 adjacent thereto is also referred to as interference of plasmons. According to this gaps, interference of plasmons can be curbed between the pixels 8.

The light scattering unit 27 generates scattered light generated by plasmons. The presence of gaps reduces the area of the light scattering unit 27. The solid-state imaging device 1 has the micro-lens 17 (refer to FIG. 4). The micro-lens 17 is provided on the light scattering unit 27. According to the micro-lens 17, the incident light L1 can be concentrated in the light scattering unit 27. As a result, deterioration in sensitivity can be prevented.

The light scattering unit 27 may include an uneven structure. The uneven structure includes a plurality of metal structures 27*a* (plurality of projecting portions). The metal structures 27*a* protrude from the light input surface 26*a*.

The light scattering unit 27 may employ various structures which can generate diffracted light generated by plasmons. The light scattering unit 27 may include cyclic structures. Regarding cyclic structures, for example, a plurality of spheroidal structures may be adopted. Regarding cyclic structures, for example, a plurality of pillar structures may be adopted. Such structures can be classified into a pattern structure and a fine particle structure.

Regarding a pattern structure, for example, there are a diffraction grating, a hole array, a disk array, a slit array, an antenna array, and a bull's-eye array as an example. For example, the diffraction grating may be a one-dimensional array structure on a stripe. For example, the diffraction grating may be a two-dimensional array structure having a square grating shape. For example, the diffraction grating may be a two-dimensional array structure having a triangular grating shape. In the hole array, the hole shape may be a circular shape, a rectangular shape, or a triangular shape. In the disk array, the disk shape may be a circular plate shape, a rectangular shape, a triangular shape, or a hemispherical shape. In the slit array, the slit shape may have a one-dimensional structure, a cruciform structure, or an asterisk structure. In the slit array, the structures may be arrayed in a square grating shape or a triangular grating shape. In the antenna array, a particle pair-type structure, a rod pair-type structure, or a bowtie-type structure may be adopted. In the bull's-eye array, structures including openings and uneven structures having a concentric circle shape may be arrayed in a square grating shape or a triangular grating shape.

Regarding a fine particle structure, there are fine particles formed of a metal material as an example. For example, regarding a metal material, aluminum, silver, gold, copper, and the like may be employed. Regarding the shape of fine particles, there are spherical nanoparticles, metal nanoshells, metal nanorods, and metal nanowires as an example. A fine particle structure utilizes localized surface plasmon resonance. When spherical nanoparticles are employed as a fine particle structure, a gap mode acting between particles is applied. As a result, near-infrared resonance can be obtained. Diameters of spherical nanoparticles and nanoshells may be 10 nm or longer. The diameters of spherical nanoparticles and nanoshells may be 1 μm or shorter. Diameters of nanorods and nanowires may be 10 nm or longer. The diameter of nanorods and nanowires may be 300 nm or shorter. Lengths of nanorods and nanowires may be 50 nm or longer. The lengths of nanorods and nanowires may be 10 μm or shorter. Regarding a material forming a fine particle structure, there are nitride-based nanoparticles such as TiN, and high-refractive index nanoparticles such as Si utilizing Mie scattering as an example. These fine particle structures may be formed using a chemical synthesis method, a sputtering method, or a vacuum deposition method. According to the vacuum deposition method, an island-shaped film having a grain structure can be formed.

It is desirable that the cycle length of the structures utilizing surface plasmon resonance based on cycle properties be 100 nm or longer and be equal to or shorter than the wavelength. In the structures utilizing surface plasmon resonance based on the gap mode, it is desirable that the distance between metals such as particle pairs be equal to or shorter than the wavelength. For example, it is desirable that the distance between metals be 1 nm or longer. It is more desirable that the distance between metals be 100 nm or shorter. The structures may be formed by excimer laser lithography, electron beam lithography, a focused ion-beam processing technology, or the like.

(DTI)

Further examination by the inventors has led to identification of a factor for further improvement in sensitivity. Sensitivity improvement is insufficient, and occurrence of crosstalk is caused by the constitution of the DTIs 22.

The DTIs 22 are provided between the pixels 8 adjacent to each other. Each of the DTIs 22 has a deep trench 22*a* and a light reflecting portion 22*b*. The deep trench 22*a* is provided on the incidence side. The light reflecting portion 22*b* is formed of a metal material embedded in the deep trench 22*a*. The channel stop region 24 is provided on the wiring region 13 side. The charge storage unit 33*a*, the floating diffusion layer FD, and the like are provided in a region sandwiched between the deep trenches 22*a*. The deep trench 22*a* curbs optical crosstalk between the pixels 8. The deep trench 22*a* curbs crosstalk due to diffusion of signal electrons. The channel stop region 24 electrically isolates the pixels 8 from each other. More specifically, the channel stop region 24 electrically isolates the charge storage unit 33*a* and the N+ type region 34*d* from each other.

Figure 7:
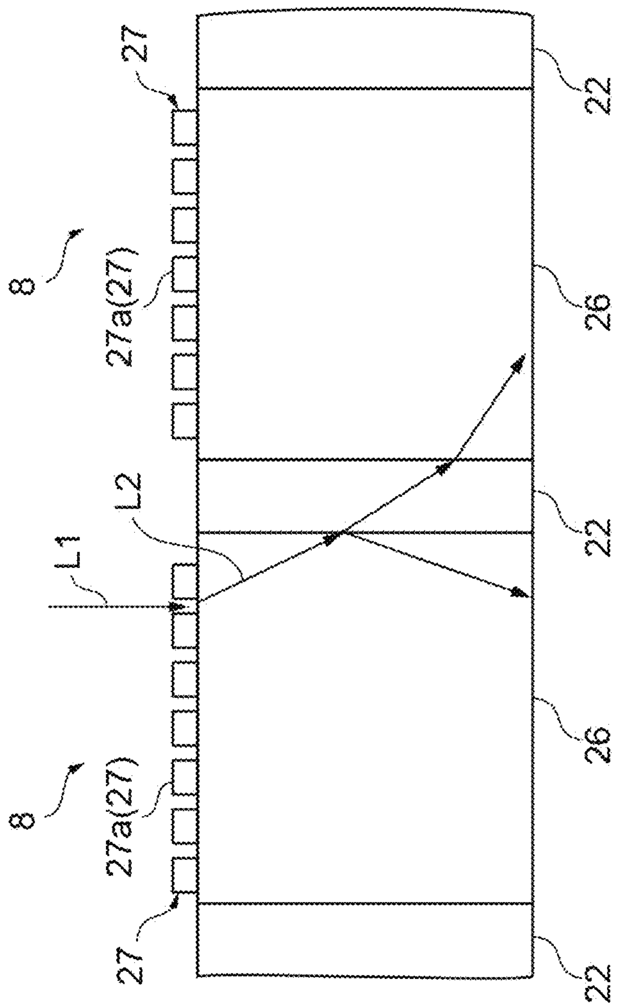
FIG. 7 is a view schematically illustrating operation of the DTI.

As illustrated in FIG. 7, the DTI 22 optically separates the pixels 8 adjacent to each other. Therefore, it is desirable that the DTI 22 ideally reflect all light and do not allow all light to transmitted therethrough. When light reflection properties and light shielding properties of the DTI 22 are not sufficient, the DTI 22 cannot sufficiently reflect light. As a result, a part of light is transmitted through the DTI 22. Light which has leaked into the adjacent pixel 8 will cause crosstalk.

Figure 8:
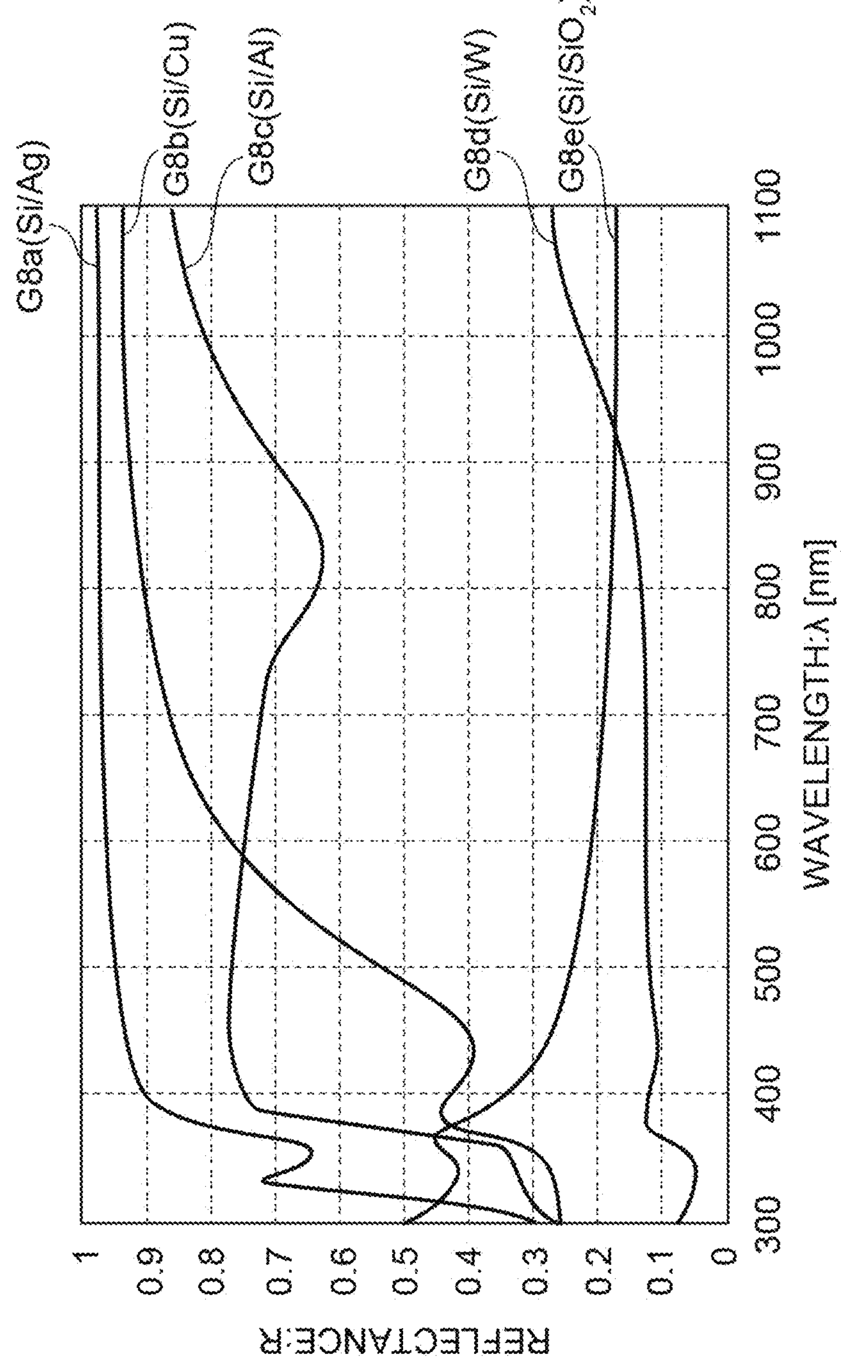
FIG. 8 is a graph showing a reflectance when light is vertically incident on a second member from a first member.

FIG. 8 shows calculation values of the reflectance when light is vertically incident on a second member from a first member. The first member is constituted of silicon. The second member is constituted of any one of silver (Ag: graph G8*a*), copper (Cu: graph G8*b*), aluminum (Al: graph G8*c*), silicon oxide ($SiO_2$: graph G8*d*), and tungsten (W: graph G8*e*). The horizontal axis indicates the wavelength of light in a vacuum state. The vertical axis indicates the reflectance. For example, the wavelength of light used in a ToF method is 850 nm or 940 nm. Image sensors in the related art are constituted of silicon oxide (graph G8*d*) or tungsten (graph G8*e*). In such a case, it can be ascertained that the reflectance is 20% or less.

In order to improve the sensitivity, light is required to pass through a P type base body a plurality of times. The light which has passed through the P type base body is incident on the DTI 22. The incident light is reflected by the DTI 22. The light passes through the P type base body again. By repeating passing through this P type base body and reflection by the DTI 22, an optical path length L contributing to absorption of light is extended. If the number of times of reflection in the DTI 22 increases, the optical path length L is further extended. In order to increase the number of times of reflection in the DTI 22, it is important to increase a reflectance R of the DTI 22.

For example, a case in which the DTI 22 completely reflects light is assumed. When light is completely reflected, it can be expressed as reflectance R=1. When it is assumed that reflectance R=1 has been established, the optical path length L can be indicated by Expression (18). According to Expression (18), it can be ascertained that the optical path length L is proportional to the number k of times of reflection.

[Math. 18]

$$L = \frac{W_0}{\sin\theta_d} + \frac{W_{PD}}{\sin\theta_d}k \tag{18}$$

$\theta_d$: scattering angle $W_{PD}$ (nm): distance from light reflecting portion 22*b* of first DTI 22 to light reflecting portion 22*b* of second DTI 22 (distance between trenches, width of P type base body)

Figure 9:
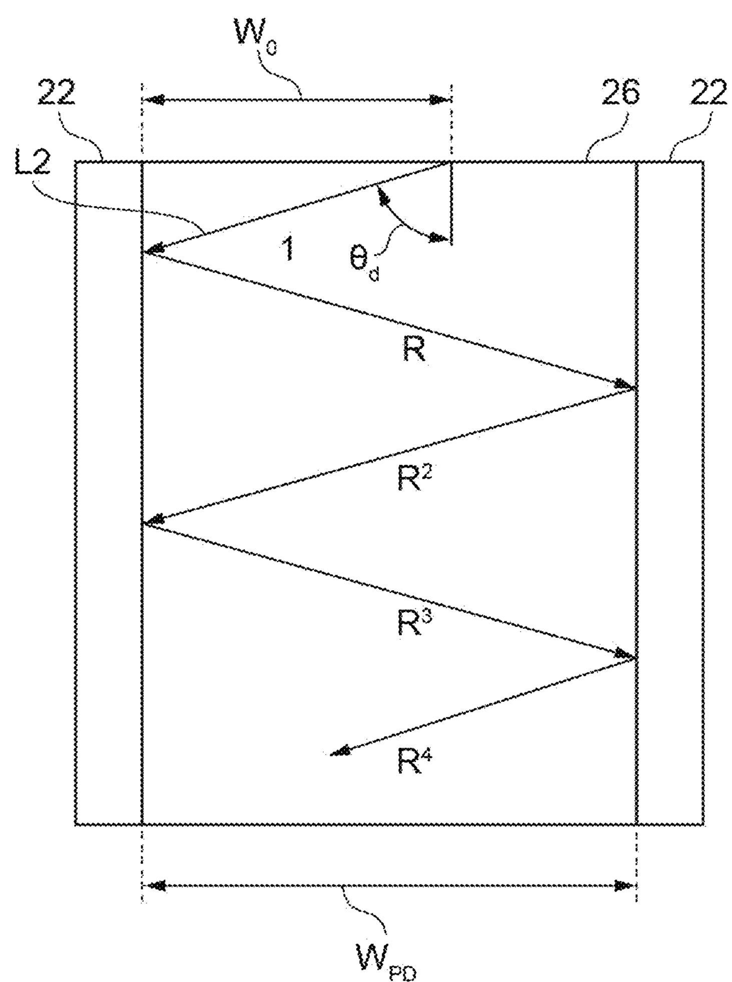
FIG. 9 is a view schematically illustrating a situation in which light attenuates every time light is reflected by the DTI.

$W_0$ (nm): distance between incidence position and DTI 22 of first reflection k (times): number of times of reflection Next, a case in which the reflectance is smaller than 1 will be described. According to the case in which the reflectance is smaller than 1, the optical path length L can be indicated by Expression (19). An effective optical path length L is shortened in accordance with the amount of attenuation due to reflection. According to Expression (19), attenuation of reflected light with respect to the number k of times of reflection can be indicated by a geometric progression. FIG. 9 schematically illustrates a situation in which light attenuates every time it is reflected with the reflectance R.

[Math. 19]

$$L = \frac{W_0}{\sin\theta_d} + \frac{W_{PD}R}{\sin\theta_d}\frac{1-R^{k+1}}{1-R} \tag{19}$$

$\theta_d$: scattering angle $W_{PD}$ (nm): distance from light reflecting portion 22*b* of first DTI 22 to light reflecting portion 22*b* of second DTI 22 (distance between trenches, width of P type base body)

Figure 10:
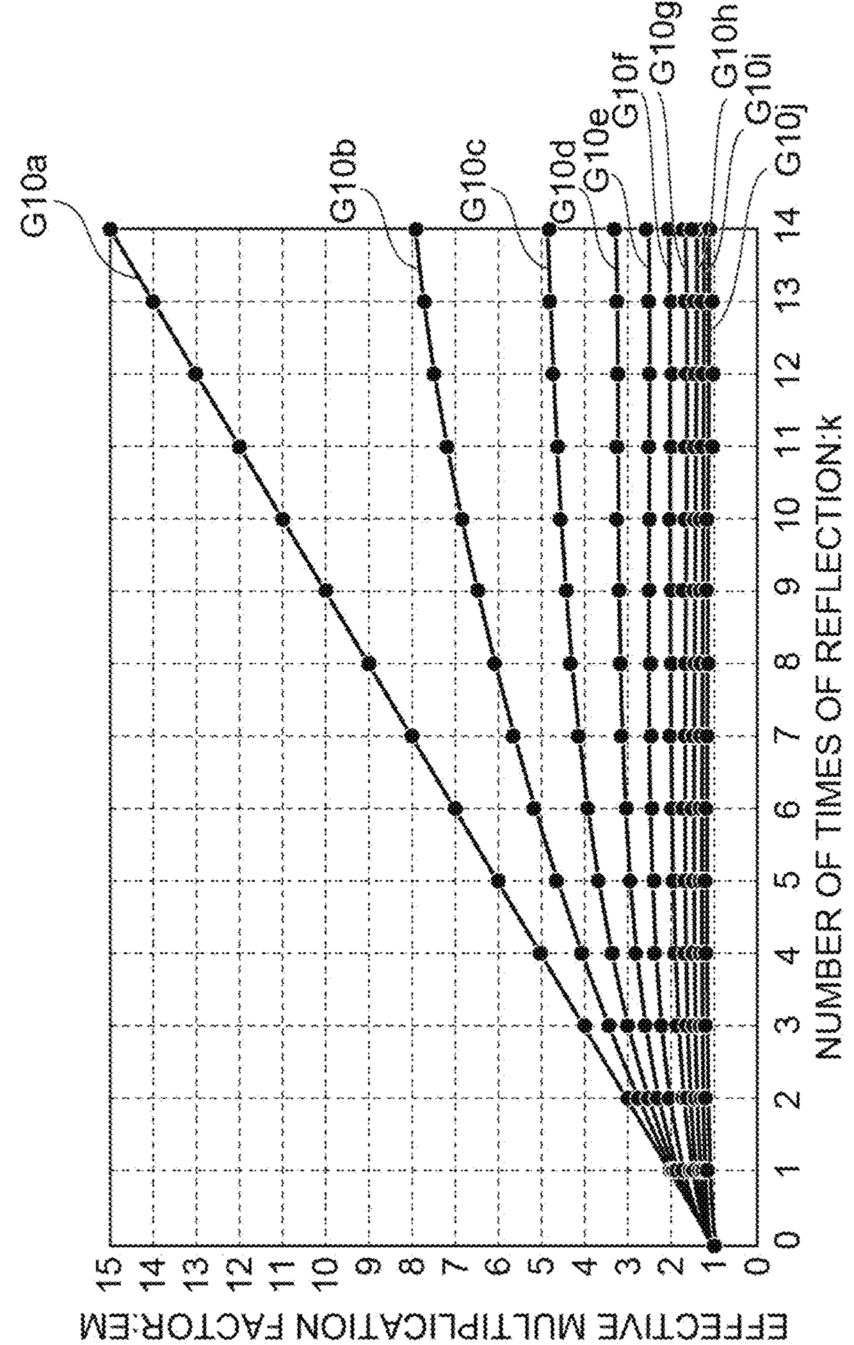
FIG. 10 is a graph showing a relationship between the number of times of reflection and an effective multiplication factor.

$W_0$ (nm): distance between incidence position and DTI 22 of first reflection k (times): number of times of reflection In Expression (19), the second factor of the second member in the right side will be referred to as an effective multiplication factor EM. A relationship between the number k of times of reflection and the effective multiplication factor EM has been confirmed. FIG. 10 shows results of examination. FIG. 10 shows a relationship between the number k of times of reflection and the effective multiplication factor EM. The horizontal axis indicates the number of times of reflection. The vertical axis indicates the effective multiplication factor EM. Specifically, FIG. 10 shows the effective multiplication factors EM in cases in which the number k of times of reflection is one time to 14 times. Correspondence between the graphs G10*a* to G10*j* and the effective multiplication factor EM is as follows.

Graph G10*a*: EM=1.0
Graph G10*b*: EM=0.9
Graph G10*c*: EM=0.8
Graph G10*d*: EM=0.7
Graph G10*e*: EM=0.6
Graph G10*f*: EM=0.5
Graph G10*g*: EM=0.4
Graph G10*h*: EM=0.3
Graph G10*i*: EM=0.2
Graph G10*j*: EM=0.1

Figure 11:
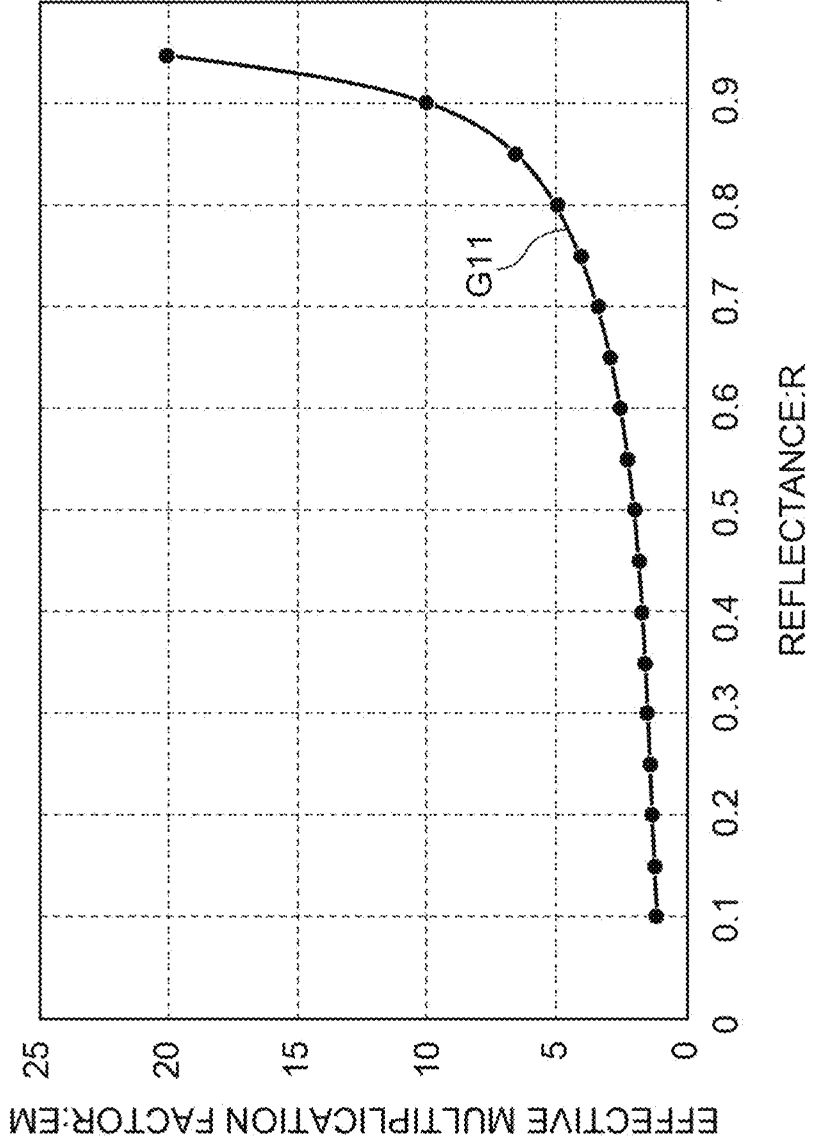
FIG. 11 is a graph showing a relationship between the reflectance and the effective multiplication factor when the number of times of reflection is infinite.

Regarding a case in which the number k of times of reflection is infinite, the relationship between the reflectance R and the effective multiplication factor EM has been confirmed. FIG. 11 shows the results thereof. The horizontal axis indicates the reflectance R. The vertical axis indicates the effective multiplication factor EM. With reference to the graph G11, it can be ascertained that the effective multiplication factor EM remains at a small value regardless of infinite reflection when the reflectance R is small. It can be ascertained that the effective multiplication factor EM drastically increases when the reflectance R exceeds 0.8. According to the results shown in FIG. 11, it can be ascertained that the reflectance R of the DTI 22 is desirably 0.8 or higher.

A constitution of the DTI 22 in which the reflectance R of 0.8 or higher can be realized has been examined. The reflectance R is a reflectance R of incident light from silicon with respect to an embedment material for constituting the DTI 22. A constitution for realizing a desired reflectance R has been examined on the basis of a complex refractive index of the embedment material. Vertical incidence is assumed for simplification. As a result, the reflectance R is obtained by Expression (20).

[Math. 20]

$$R = \left|\frac{N1 - N2}{N1 + N2}\right|^2 = \frac{(n1 - n2)^2 + (k1 - k2)^2}{(n1 + n2)^2 + (k1 + k2)^2} \quad (20)$$

N1: refractive index of silicon
n1: real part of refractive index of silicon
k1: imaginary part of refractive index of silicon
N2: refractive index of embedment material (light reflecting portion 22*b*)
n2: real part of refractive index of embedment material (light reflecting portion 22*b*)
k2: imaginary part of refractive index of embedment material (light reflecting portion 22*b*)

Figure 13:
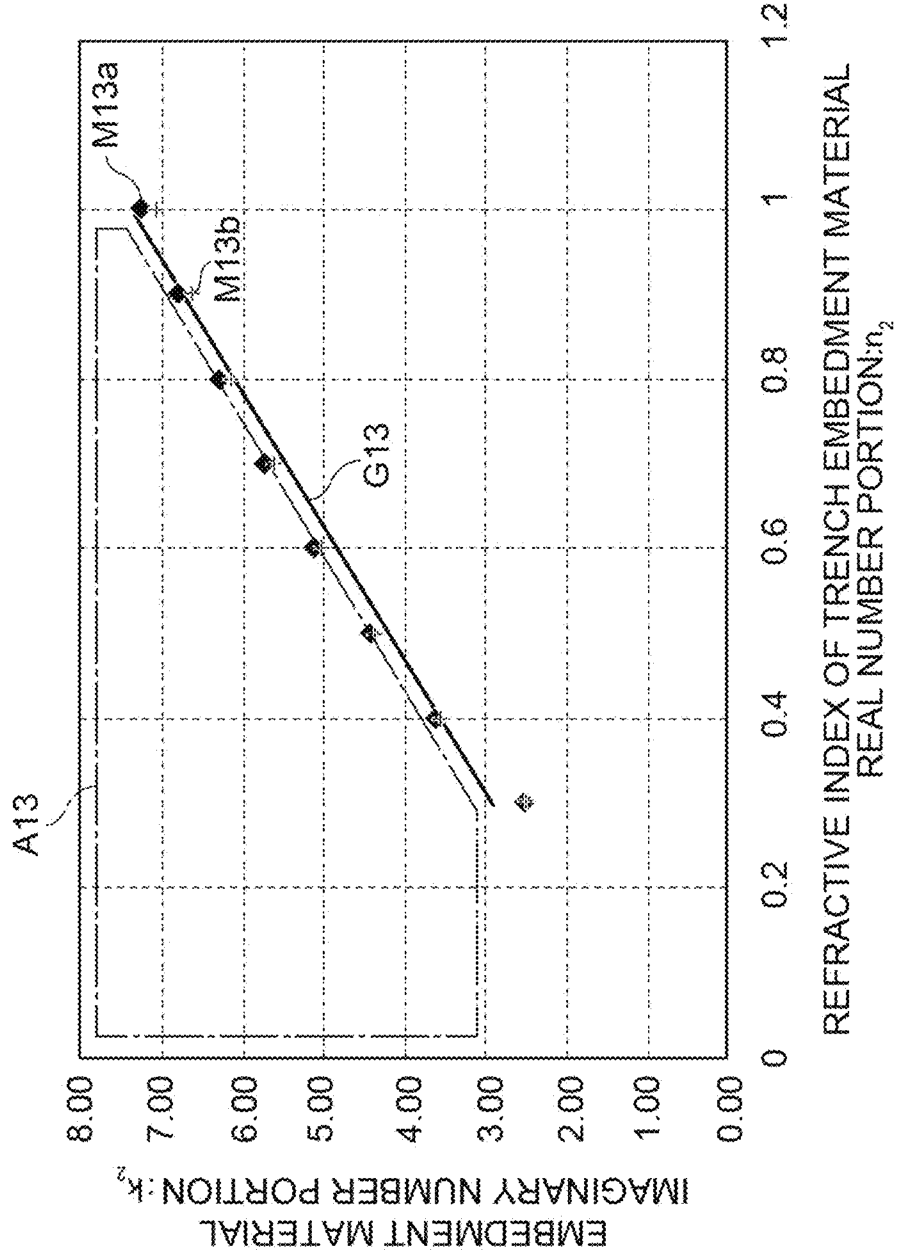
FIG. 13 is a graph showing a relationship between a real part of the refractive index and an imaginary part of the refractive index of an embedment material.

FIG. 12 is a table listing refractive indices of various kinds of materials. The complex refractive indices of silicon shown in FIG. 12 are substituted in Expression (20). In this way, a relational expression between n2 and k2 when R=0.8 can be obtained. FIG. 13 shows the relational expression as the graph G13. The horizontal axis indicates the real number portion n2. The vertical axis indicates the imaginary number portion k2. A rhombic marker M13*a* corresponds to the case in which the wavelength is 800 nm. A cruciform marker M13*b* corresponds to the case in which the wavelength is 1,100 nm. The markers M13*a* and M13*b* almost overlap each other. Further, even the values from the wavelength of 800 nm to the wavelength of 1,100 nm indicate substantially similar tendencies. Namely, the markers M13*a* and M13*b* almost overlap each other. The reflectance is 0.8 or lower in a region A13 on an upper left side based on the markers M13*a* and M13*b*. The graph G13 is a linear approximation of the markers M13*a* and M13*b*. Using the graph G13, a condition for the reflectance R to be 0.8 or higher is indicated by Expression (21).

[Math. 21]

$$k_2 \geq 6.31 n_2 + 1.03 \quad (21)$$

According to FIG. 8, it can be ascertained that the reflectance R of silver and copper is high in a near-infrared region in which the wavelength is 800 nm or longer. In the near-infrared region in which the wavelength is 800 nm or longer, silver and copper are suitable for a material to be embedded in the DTI 22. With regard to the values of the complex refractive indices shown in FIG. 12, silver and copper satisfy Expression (21). Silver or copper are most preferable as a material for constituting the DTI 22. Gold, platinum, and bismuth also satisfy Expression (21). Therefore, gold, platinum, and bismuth are also preferable as a material for constituting the DTI 22.

FIG. 14 is a table listing complex refractive indices, reference sources, the reflectance R in a relationship with respect to silicon, real number portions of a dielectric constant, and imaginary number portions of the dielectric constant of various kinds of materials. These values are values when the wavelength is 940 nm. Based on the reflectance R, materials having the reflectance R of 0.8 or higher are silver, copper, lithium, gold, and bismuth. In regard to material stability, it is preferable to select silver, copper, gold, and bismuth among these.

In addition to the kind of the embedment material, the thickness of the embedment material also affects the optical characteristic of the DTI 22. An optical characteristic indicates a transmittance. The transmittance affects crosstalk. The thickness and the transmittance of the embedment material constituting the DTI 22 are examined. FIG. 15(*a*) is a schematic view of an analysis model for examination. FIG. 15(*b*) shows a relationship between a film thickness and the reflectance R. The horizontal axis indicates the film thickness. The vertical axis indicates the reflectance R. The relationships between the respective graphs and the embedment materials are as follows.

Silver: graph G15*a*
Copper: graph G15*b*
Aluminum: graph G15*c*
Silicon oxide: graph G15*d*
Tungsten: graph G15*e*

The thickness of the embedment material has the same meaning as a groove width of the DTI 22. Crosstalk almost correlates with the transmittance. When crosstalk withstanding normal application is assumed to be 5% or less, the transmittance is set to 5% or less. The thickness of the embedment material need only be equal to or larger than the following values.

Silver: film thickness of 45 nm
Copper: film thickness of 50 nm
Aluminum: film thickness of 35 nm FIG. 15(*c*) shows a relationship between the film thickness and the transmittance. The horizontal axis indicates the film thickness. The vertical axis indicates the transmittance. The relationships between the respective graphs and the embedment materials are as follows.

Silver: graph G15*i*
Copper: graph G15*h*
Aluminum: graph G15*j*
Silicon oxide: graph G15*f*
Tungsten: graph G15*g*

For example, with reference to the graphs G15*a* to G15*e* in FIG. 15(*b*), in the case of aluminum (graph G15*c*), it can be ascertained that the reflectance is not high compared to those of silver (graph G15*a*) and copper (graph G15*b*). With reference to the graph G15*j* in FIG. 15(*c*), it can be ascertained that aluminum has an excellent characteristic such as a low transmittance.

As a result of the examination described above, the kinds of metals which can be employed as an embedment material of the DTI 22, and the widths of the DTI 22 set for the respective kinds of metals can be enumerated as follows. In this specification, "the width of the DTI 22" may be rephrased as the width of the deep trench 22*a*. "The width of the DTI 22" may be rephrased as the width of the light reflecting portion 22*b*.

When the embedment material is silver or a material including silver as a main component, the width of the DTI 22 is 45 nm or wider.

When the embedment material is copper or a material including copper as a main component, the width of the DTI 22 is 50 nm or wider.

When the embedment material is gold or a material including gold as a main component, the width of the DTI 22 is 60 nm or wider.

When the embedment material is platinum or a material including platinum as a main component, the width of the DTI 22 is 30 nm or wider.

When the embedment material is bismuth or a material including bismuth as a main component, the width of the DTI 22 is 70 nm or wider.

When the embedment material is aluminum or a material including aluminum as a main component, the width of the DTI 22 is 35 nm or wider.

The DTI 22 may have a negative charge retention film for preventing a dark current from the trench interface. Aluminum oxide may be used as the negative charge retention film. Silicon nitride may be used as the negative charge retention film. An influence of the negative charge retention film on the reflectance and the transmittance has been examined. In FIGS. 15(*b*) and 15(*c*), the graphs indicated by dotted lines indicate the results when a negative charge retention film is present. As the negative charge retention film, an alumina layer provided between silicon and a metal and having a film thickness of 5 nm is set. In both FIGS. 15(*b*) and 15(*c*), it can be ascertained that there is no meaningful influence on the relationship between the film thickness and the reflectance due to the presence or absence of the negative charge retention film. It can be ascertained that the same also applies to the transmittance. Specifically, it can be ascertained that there is no meaningful influence of the negative charge retention film on the relationship between the film thickness and the transmittance.

The inventors have also examined the DTI 22 from another viewpoint. In discussion of the DTI 22 described above, attention has been paid to the material for constituting the DTI 22. Moreover, the inventors have also paid attention to an interval $W_{PD}$ between the DTIs 22 adjacent to each other. Specifically, light which has diffracted due to a metal plasmon structure is repeatedly reflected by the DTI 22. As a result, light which has diffracted forms an interference field as standing waves. The interval $W_{PD}$ from the first DTI 22 (first isolation wall portion) to the second DTI 22 (second isolation wall portion) satisfies a condition of a constructive interference in standing waves. The efficiency of light absorption can be maximized by setting the interval $W_{PD}$ such that the condition of a constructive interference is satisfied.

Figure 16:
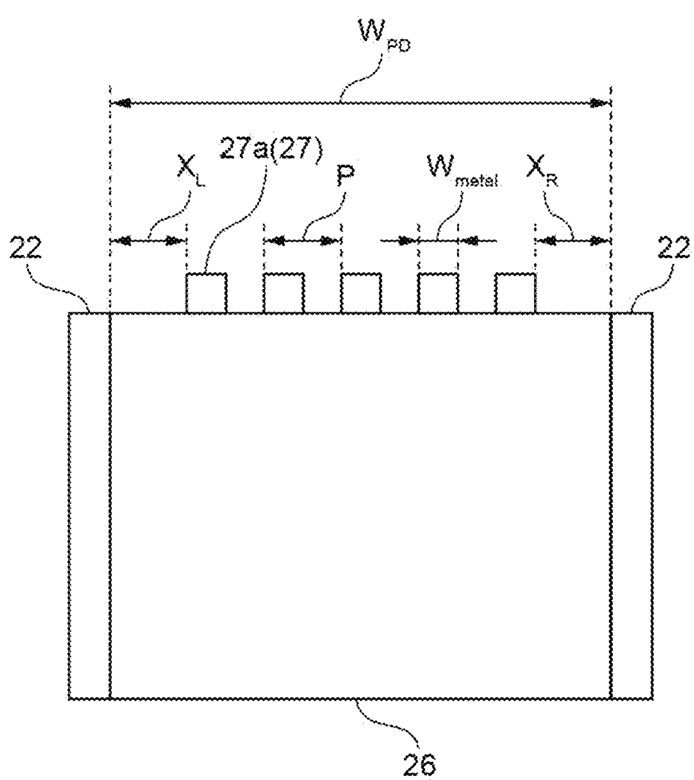
FIG. 16 is a view illustrating various parameters used for calculation obtaining an optimal width.

As illustrated in FIG. 16, the interval $W_{PD}$ from the first DTI 22 to the second DTI 22 is defined. The interval $W_{PD}$ from the first DTI 22 to the second DTI 22 is a width of the photoelectric conversion unit 26 sandwiched between the first DTI 22 and the second DTI 22. The interval $W_{PD}$ is defined by Expression (22).

[Math. 22]

$$W_{PD} = P(M + j - 1) + W_{metal} \pm P/4 \tag{22}$$

$W_{PD}$: distance from light reflecting portion 22*b* of first DTI 22 to light reflecting portion 22*b* of second DTI 22

P: cycle length of plurality of metal structures 27*a*

$W_{metal}$: width of metal structure 27*a*

M: number of metal structures 27*a*, that is, number of cycles of metal structures 27*a* j: 0 or positive integer

A variable $X_L$ and a variable $X_R$ satisfy Expression (23)

[Math. 23]

$$X_L = X_R \tag{23}$$

$X_L$: distance from metal structure 27*a* to first DTI 22

$X_R$: distance from metal structure 27*a* to second DTI 22

When the interval $W_{metal}$ of the metal structures 27*a* is not defined, the interval $W_{PD}$ may be defined by Expression (24).

[Math. 24]

$$W_{PD} = P(M - 1 + j) + 200 \pm P/4(\text{nm}) \tag{24}$$

$W_{PD}$: distance from light reflecting portion 22*b* of first DTI 22 to light reflecting portion 22*b* of second DTI 22

P: cycle length of plurality of metal structures 27*a*

M: number of cycles of plurality of metal structures 27*a*, that is, number of metal structures j: 0 or positive integer The discussion of the interval $W_{PD}$ described above is established when the light scattering unit 27 has cyclic structures. However, in the discussion of the interval $W_{PD}$ described above, it is important to have a structure in which light is scattered and to satisfy the condition of a constructive interference in standing waves. It is not an essential requirement for the light scattering unit 27 to have cyclic structures. The discussion of the interval $W_{PD}$ when the light scattering unit 27 has a non-cyclic structure in which the cycle length P cannot be defined will be described in the section of modification examples.

<Method for Producing Solid-State Imaging Device>

Hereinafter, a method for producing the solid-state imaging device 1 will be described.

A silicon wafer is prepared. Next, constituent elements such as the charge storage unit 33*a*, the photodiode pinning layer 33*b*, the transistors, and the wirings 18 are formed in a part of the silicon wafer which becomes the wiring region 13 side in the solid-state imaging device 1. Through this step, the sensor substrate 12 is formed. Next, the sensor substrate 12 is bonded to the support substrate 11. In this step, the surface on a side having the charge storage unit 33*a* and the like formed thereon is bonded to the support substrate 11. Regarding the support substrate 11, a wafer having a circuit formed therein may be employed. When a wafer having a circuit formed therein is employed as the support substrate 11, the degree of integration can be further increased.

Next, the thickness of the sensor substrate 12 is adjusted. Specifically, the sensor substrate 12 is cut from the light input surface 26*a* of the sensor substrate 12. The thickness of the sensor substrate 12 is 2 μm to 4 μm in the case of normal visible light. In the case for near-infrared light, normally, when the thickness of the sensor substrate 12 is 2 μm to 4 μm, near-infrared light cannot be sufficiently absorbed. According to the constitution of the solid-state imaging device 1, even if the thickness of the sensor substrate 12 is 2 μm to 4 μm, near-infrared light can be sufficiently detected.

Next, the pinning region 36 is formed. Specifically, boron is subjected to ion implantation on the light input surface 26*a* of the sensor substrate 12. The energy of ion implantation is at least 0.2 keV. The energy of ion implantation is 0.2 keV or higher. The energy of ion implantation is 1 keV or lower. After ion implantation, laser annealing for activation is performed. Ion implantation may be performed with an oxide film therebetween. In this case, the peak of the concentration of impurities in the distribution of the concentration of impurities is generated in the interface on the incidence side or in the oxide film. It is desirable that the ion implantation amount be $1\times10^{14}$ $cm^{-3}$ or larger. It is desirable that the ion implantation amount be $3\times10^{15}$ $cm^{-3}$ or smaller. Next, laser annealing is performed after ion implantation. According to laser annealing, annealing can be performed without damaging the transistors and the wirings formed on the wiring region 13 side. When laser annealing is performed, energy of laser annealing is reduced. Namely, when laser annealing is performed, silicon is not melted. By satisfying this condition, a situation in which the concentration of impurities in a melted part becomes uniform can be curbed. By performing laser annealing a plurality of times under a condition of not causing melting, an insufficient state of activation of impurities can be changed to a sufficient state of activation of impurities. The deep trenches 22*a* for preventing crosstalk are formed.

A method for making the DTI 22 from a back surface (incidence surface) side will be described. The method for making the DTI 22 includes an etching step S1 of digging the deep trenches 22*a*, and a step S3 of embedding a metal in the deep trenches 22*a*. A hard mask 101 is formed on a main surface of a P type base body 100. Next, the deep trenches 22*a* are formed. The deep trenches 22*a* are formed by alternately performing an anisotropic etching step and a step of forming a side wall protection film a plurality of times. (refer to FIG. 17(*a*)). According to such steps, large deep trenches 22*a* having a large aspect ratio (a ratio of the width to the depth of the DTI 22) can be formed.

Next, as illustrated in FIG. 17(*b*), a film of alumina ($Al_2O_3$) of approximately 5 nm is formed on inner surfaces of the deep trenches 22*a* (step S2). A film of alumina ($Al_2O_3$) is a negative charge retention film 52. The hard mask 101 is removed. Next, a film is formed. Atomic layer deposition (ALD) may be used for forming a film. According to the step using ALD, a uniform film can be formed with respect to the deep trenches 22*a* having a large aspect ratio. The negative charge retention film 52 of the DTI 22 and the negative charge retention film on the back surface side (not illustrated) may be formed in the same step. According to the negative charge retention film 52, the positive holes are accumulated in the interfaces of the deep trenches 22*a*. As a result, occurrence of a dark current from the interface level is curbed.

Next, as illustrated in FIG. 17(*c*), a material which will become the light reflecting portions 22*b* is disposed in the deep trenches 22*a*. In the step S3, the atomic layer deposition method may be used. The relationship between an embedment material and source gas (precursor) is as follows.

When the embedment material is silver, source gas including silver is used. Regarding source gas including silver, "triethylphosphine (6,6,7,7,8,8,8-heptafluoro-2,2-dimethyl-3,5-octanedionate) silver(I)" may be used.

When the embedment material is copper, source gas including copper is used. Regarding source gas including copper, the following gas may be used.

"Bis(2,2,6,6-tetramethyl-3,5-heptanedionate) copper(II)" ($Cu(thd)_2$, (thd=2,2,6,6-tetramethyl-3,5-heptanedionate, $Cu(OCC(CH_3)_3CHCOC(CH_3)_3)_2$))

"Bis(6,6,7,7,8,8,8-heptafluoro-2,2-dimethyl-3,5-octanedionate) copper(II)" ($Cu(OCC(CH_3)_3CHCOCF_2CF_2CF_3)_2$))

When the embedment material is gold, source gas including gold is used. Regarding source gas including gold, the following gas may be used.

Trimethyl(trimethylphosphine) gold(III), $Me_3AuPMe_3$ (Me=Methyl))

When the embedment material is aluminum, source gas including aluminum is used. Regarding source gas including aluminum, the following gas may be used.

Trimethyl aluminum ($Al(CH_3)_3$, TMA

Tris(2,2,6,6-tetramethyl-3,5 3,5-heptanedionate) aluminum ($Al(C_{11}H_{19}O_2)_3$, $Al(DPM)_3$)

Triethyl aluminum ($Al(C_2H_5)_3$, TEA)

When the embedment material is bismuth, source gas including bismuth is used. Regarding source gas including bismuth, the following gas may be used.

Triphenyl bismuth (triphenyl bismuth$(Ph)_3$ (Ph=phenyl)).

Tris(2,2,6,6-tetramethyl-3,5-heptanedionate) bismuth (2,2,6,6-tetramethyl-3,5-heptanedionate(III) Bi(Bi $(TMHD)_3$))

Bis(acetato-O)triphenyl bismuth (bis(acetato-O)triphenyl bismuth ($Ph_3Bi(Oac)_2$, $(CH_3CO_2)_2Bi(C_6H_5)_3$)) (also refer to the following chemical formula)

Tris(2-methoxyphenyl) bismuthine ($(CH_3OC_6H_4)_3Bi$))

Tri(tert-butyloxy) bismuth (tri-tert-butoxy bismuth(III), tri(tert-butyloxy) bismuth)

Tris(1,1,2-trimethylpropyloxy) bismuth

Tris(1,1-diisopropyl-2-methylpropyloxy) bismuth

When the embedment material is platinum, source gas including platinum is used. Regarding source gas including platinum, the following gas may be used.

"Trimethyl(methylcyclopentadienyl) platinum(IV) ($C_5H_4CH_3Pt(CH_3)_3$)

In the foregoing source gas, the number of carbon atoms in the hydrocarbon group need only be 1 or larger. Regarding other source gas, $M(C_5H_5)_2$ or $(CH_3C_5H_4)M(CH_3)_3$ may be used.

Next, the embedment materials deposited outside the deep trenches 22*a* are removed by chemical mechanical polishing (CMP).

Next, as illustrated in FIG. 17(*d*), a protective film 53 is formed (step S4). According to the protective film 53, corrosion of silver or copper embedded in the deep trenches 22*a* can be curbed. The protective film 53 may be formed of alumina. The negative charge retention film 52 may also serve as the protective film 53. The protective film 53 may be provided separately from the negative charge retention film 52.

Next, after the deep trenches are formed, the light scattering unit 27 is formed.

The color filter 16 and the micro-lens 17 are formed on the light scattering unit 27. The solid-state imaging device 1 can be obtained through the foregoing steps.

<Operational Effects>

In the solid-state imaging device 1, the incident light L1 is diffracted by the light scattering unit 27 including the plurality of metal structures 27*a*. Diffraction of light by the light scattering unit 27 including the plurality of metal structures 27*a* is caused by a plasmon phenomenon. Generation of diffracted light can be controlled by the cycle length P defining disposition of the plurality of metal structures 27*a*. Therefore, as indicated in Expression (25), a desired scattering angle $\theta_d$ can be obtained. As a result, the optical path length L determined from a wavelength $\lambda$ of the incident light L1 and light absorption characteristics of the photoelectric conversion unit 26 can be secured. Therefore, it is possible to further enhance the efficiency of photoelectric conversion of near-infrared light.

[Math. 25]

$$\theta_d = \sin^{-1}(\ell \cdot \lambda / n \cdot P) \tag{25}$$

In the solid-state imaging device 1 having a constitution satisfying Expression (26), the proportion of zero-order diffracted light traveling straight forward in a thickness direction of the photoelectric conversion unit 26 decreases. The proportion of diffracted light of an order traveling forward in an oblique direction with respect to the thickness direction of the photoelectric conversion unit 26 increases. As a result, the quantity of diffracted light and the propagation distance in the photoelectric conversion unit 26 can be in a desired form. Therefore, it is possible to further enhance the efficiency of photoelectric conversion of near-infrared light.

[Math. 26]

$$\sin^{-1}\left(\frac{\ell \cdot \lambda}{n \cdot P}\right) < 90^\circ \tag{26}$$

The DTI 22 formed of a metal satisfying Expression (27) can favorably reflect diffracted light. As a result, it is possible to further enhance the efficiency of photoelectric conversion of near-infrared light.

[Math. 27]

$$k_2 \geq 6.31 n_2 + 1.03 \tag{27}$$

A metal has unique optical characteristics in the near-infrared region. In other words, a metal has a unique complex refractive index in the near-infrared region. Therefore, selection of a metal for forming the light reflecting portion 22*b* is important. When the light scattering unit 27 is not present, the angle of the incident light L1 does not change significantly. The incidence angle with respect to a side surface of the DTI 22 increases. As a result, total reflection may occur in some cases. Therefore, there is a probability that the reflectance R will increase. When the light scattering unit 27 is present, the incidence angle with respect to the side surface of the DTI 22 may decrease. According to Expression (26), the DTI 22 formed of a metal suitable for the near-infrared region can be constituted. As a result, the DTI 22 can have a high reflectance R. The DTI 22 can also have a low transmittance. Furthermore, the DTI 22 can also be miniaturized.

Hereinabove, an embodiment of the present invention has been described. The solid-state imaging device of the present invention is not limited to the foregoing embodiment.

(Modification Example: Optimal Trench Interval in Non-Cyclic Structure)

The interval $W_{PD}$ of the DTIs 22 when the light scattering unit 27 has a non-cyclic structure will be described. When a silicon light-receiving surface has a pyramidal shape, a triangular prism structure, or a random uneven structure, it can be said that the light scattering unit 27 has a non-cyclic structure. When the light scattering unit 27 has a non-cyclic structure, the structure is not specified by a variable such as a cycle length P. The interval $W_{PD}$ is defined using an interference condition of being an integer multiple of the propagation wavelength inside the photoelectric conversion unit 26. According to this definition, the cycle length P and the number M of cycles are not necessary. The definition is in a form in which an offset range is added to the integer multiple of the propagation wavelength.

The interval $W_{PD}$ of the DTIs 22 when the light scattering unit 27 has a non-cyclic structure can be defined by Expression (28).

[Math. 28]

$$W_{PD} = \frac{2\pi}{n_{Si} \times k_0 \times \sin\theta_d} \times m + 200 \pm \frac{\pi}{2 \times n_{Si} \times k_0 \times \sin\theta_d} (\text{units: nm}) \tag{28}$$

$W_{PD}$: distance from light reflecting portion 22*b* of the first DTI 22 to light reflecting portion 22*b* of second DTI 22

$n_{Si}$: real part of refractive index of photoelectric conversion unit 26 (silicon)

Figure 18:
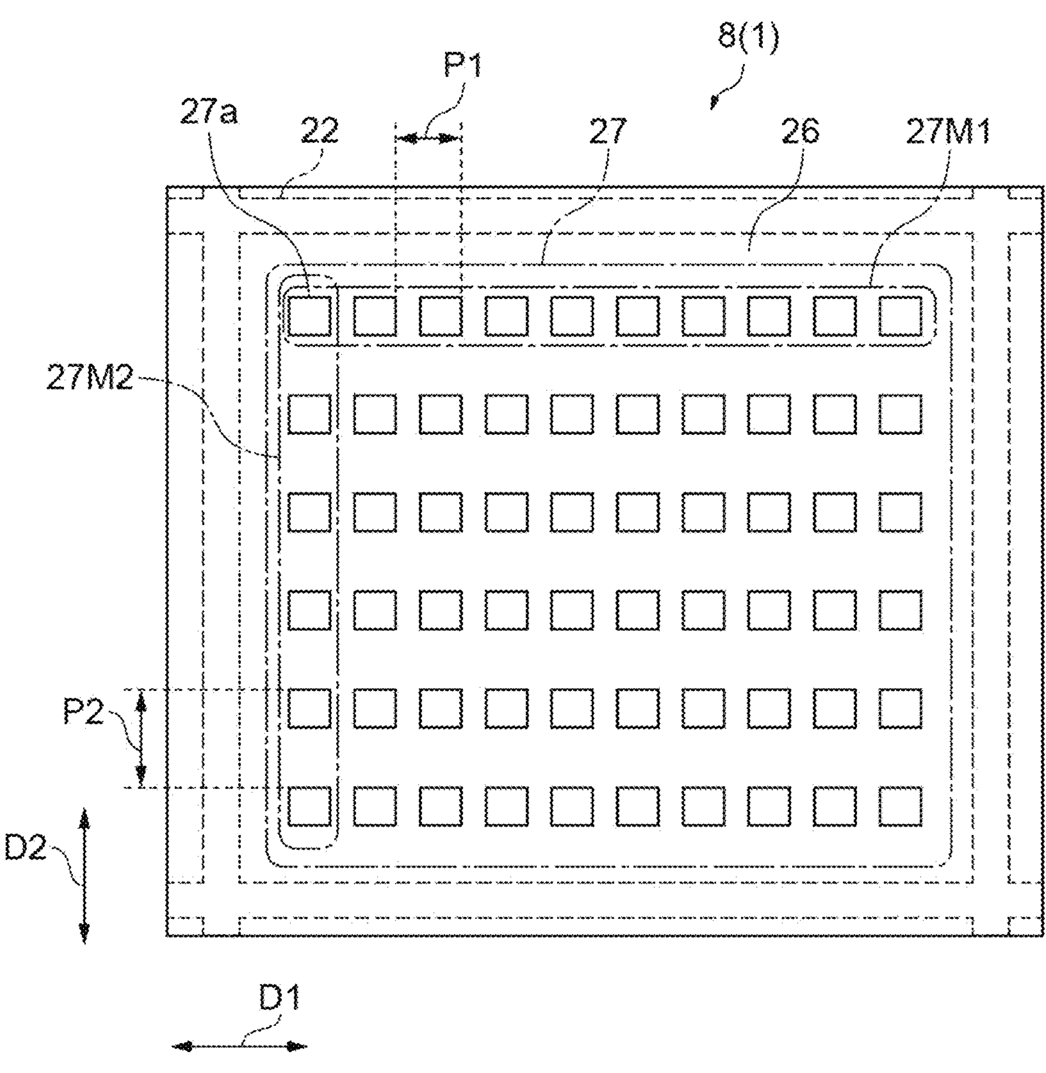
FIG. 18 is a view illustrating the light scattering unit included in a solid-state imaging device of Modification Example.

$k_0$: wavenumber of incident light $\theta_d$: scattering angle m: natural number As illustrated in FIG. 18, the light scattering unit 27 may include first cyclic structures 27M1 and second cyclic structures 27M2.

The first cyclic structures 27M1 each include a plurality of metal structures 27*a*. The metal structures 27*a* are disposed at equal intervals in a first direction D1. Disposition of the metal structures 27*a* is defined by a first cycle length P1. The first cycle length P1 may be determined on the basis of the wavelength λ of the incident light L1. The first cycle length P1 may be determined on the basis of the scattering angle $\theta_d$.

The second cyclic structures 27M2 each include a plurality of metal structures 27*a*. The metal structures 27*a* may be the metal structures 27*a* constituting the first cyclic structures 27M1. The metal structures 27*a* may be different metal structures 27*a*. The light scattering unit 27 in FIG. 18 shows a case in which the metal structures 27*a* constituting the second cyclic structures 27M2 are shared by the metal structures 27*a* constituting the first cyclic structures 27M1.

The metal structures 27*a* are disposed at equal intervals in a second direction D2. The second direction D2 is inclined with respect to the first direction D1. The second direction D2 is not parallel to the first direction D1. In the example illustrated in FIG. 18, the second direction D2 is orthogonal to the first direction D1. Disposition of the metal structures 27*a* is defined by a second cycle length P2. The second cycle length P2 may be determined on the basis of the wavelength λ of the incident light L1. The second cycle length P2 may be determined on the basis of the scattering angle $\theta_d$. The second cycle length P2 differs from the first cycle length P1. For example, the wavelength λ of the incident light L1 targeted by the second cyclic structures 27M2 and the wavelength λ of the incident light L1 targeted by the first cyclic structures 27M1 can differ. A second scattering angle $\theta_d$ by the second cyclic structures 27M2 can differ from a first scattering angle $\theta_d$ by the first cyclic structures 27M1.

Figure 19:
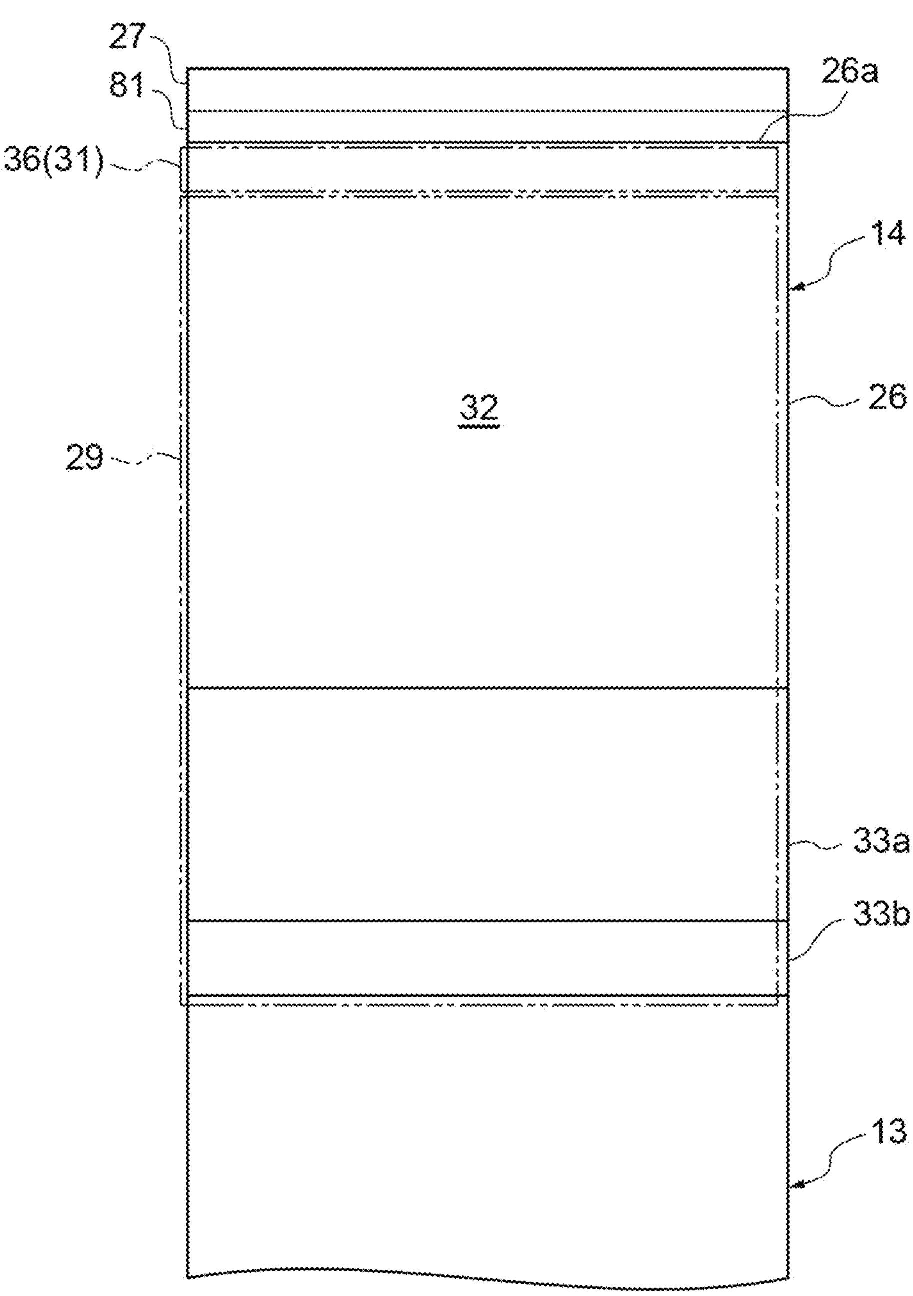
FIG. 19 is a view illustrating the solid-state imaging device including a negative charge retention film.

As illustrated in FIG. 19, a solid-state imaging device 1A may include a charge retention film 81. The charge retention film 81 is provided between the light scattering unit 27 and the photoelectric conversion unit 26.

In this specification, an elemental technology for enhancing the efficiency of photoelectric conversion of a solid-state imaging device has been described. First, the elemental technology for enhancing the efficiency of photoelectric conversion is a technology for obtaining a large scattering angle $\theta_d$ in the light scattering unit 27. Second, it is a technology for obtaining a large reflectance R in the DTI 22. Third, it is a technology for forming standing waves in the photoelectric conversion unit 26. The first elemental technology utilizes diffracted light generated due to plasmons by fine metal structures. The second elemental technology selects an optimal metal material constituting the DTI 22. The third elemental technology optimizes the interval $W_{PD}$ of the DTIs 22. In other words, the third elemental technology optimizes the width of the photoelectric conversion unit 26. A solid-state imaging device provided with all of the first elemental technology, the second elemental technology, and the third elemental technology can achieve the best efficiency of photoelectric conversion. If a solid-state imaging device is provided with at least one of the three elemental technologies, the effect of enhancing the efficiency of photoelectric conversion can be obtained.

Solid-state imaging devices targeted by the present invention on the basis of the three elemental technologies will be enumerated.

A solid-state imaging device according to a first aspect is provided with all of the first elemental technology, the second elemental technology, and the third elemental technology. This solid-state imaging device is that which has been described in the embodiment.

A solid-state imaging device according to a second aspect is provided with the first elemental technology and the second elemental technology. An arbitrary value may be employed for the interval $W_{PD}$ of the DTIs 22 related to the third elemental technology.

A solid-state imaging device according to a third aspect is provided with the first elemental technology and the third elemental technology. An arbitrary material may be employed as the material of the DTI 22 related to the second elemental technology.

A solid-state imaging device according to a fourth aspect is provided with the first elemental technology. An arbitrary material may be employed as the material of the DTI 22 related to the second elemental technology. An arbitrary value may be employed for the interval $W_{PD}$ of the DTIs 22 related to the third elemental technology.

A solid-state imaging device according to a fifth aspect is provided with the second elemental technology and the third elemental technology. The light scattering unit related to the first elemental technology may not generate scattered light caused by plasmons. A solid-state imaging device having a cyclic structure as the light scattering unit may be employed as the solid-state imaging device of the fifth aspect. For example, as illustrated in FIG. 20(*a*), a solid-state imaging device 1B may employ a scattering layer having a pyramidal shape or a scattering layer with a triangular prism array as a light scattering unit 27B.

A solid-state imaging device according to a sixth aspect is provided with the second elemental technology. The light scattering unit related to the first elemental technology may not generate scattered light caused by plasmons. A solid-state imaging device having a cyclic structure as the light scattering unit may be employed as the solid-state imaging device of the sixth aspect. For example, a scattering layer having a pyramidal shape or a scattering layer with a triangular prism array may be employed as the light scattering unit. An arbitrary value may be employed for the interval $W_{PD}$ of the DTIs 22 related to the third elemental technology.

A solid-state imaging device according to a seventh aspect is provided with the third elemental technology. The light scattering unit related to the first elemental technology may not generate scattered light caused by plasmons. A solid-state imaging device having a cyclic structure as the light scattering unit may be employed as the solid-state imaging device of the seventh aspect. For example, a scattering layer having a pyramidal shape may be employed as the light scattering unit. Namely, an arbitrary material may be employed as the material of the DTI 22 related to the second elemental technology.

A solid-state imaging device according to an eighth aspect is provided with the second elemental technology and the third elemental technology. The light scattering unit related to the first elemental technology may not generate scattered light caused by plasmons. As illustrated in FIG. 20(*b*), a solid-state imaging device having a non-cyclic structure as a light scattering unit 27C may be employed as a solid-state imaging device 1C of the eighth aspect. For example, a scattering layer having a randomly uneven shape may be employed as the light scattering unit.

A solid-state imaging device according to a ninth aspect is provided with the second elemental technology. The light scattering unit related to the first elemental technology may not generate scattered light caused by plasmons. A solid-state imaging device having a non-cyclic structure as the light scattering unit may be employed as the solid-state imaging device of the ninth aspect. For example, a scattering layer having a randomly uneven shape may be employed as the light scattering unit. An arbitrary value may be employed for the interval $W_{PD}$ of the DTIs 22 related to the third elemental technology.

A solid-state imaging device according to a tenth aspect is provided with the third elemental technology. The light scattering unit related to the first elemental technology may not generate scattered light caused by plasmons. A solid-state imaging device having a non-cyclic structure as the light scattering unit may be employed as the solid-state imaging device of the tenth aspect. For example, a scattering layer having a randomly uneven shape may be employed as the light scattering unit. Namely, an arbitrary material may be employed as the material of the DTI 22 related to the second elemental technology.

Characteristics in a case of employing a scattering layer having a pyramidal shape or a scattering layer of an isosceles triangle prism as a light scattering structure were examined. In the examination, as illustrated in FIG. 21(*a*), a case in which light was incident on silicon from a silicon oxide film was assumed. The reference sign L1 indicates incident light. The reference sign LA indicates refracted light (scattered light). The reference sign LB indicates reflected light. The reference sign $\delta$ indicates an incidence angle. The reference sign $\theta 2$ indicates a refraction angle. The reference sign $\alpha$ indicates an inclination angle of an incidence surface. The reference sign $\theta_d$ indicates a scattering angle. The scattering angle $\theta_d$ is the sum of the refraction angle and the inclination angle $\alpha$ of the incidence surface. In the first examination, characteristics in a case in which the number of times of reflection was one time were obtained. In the second examination, characteristics in a case in which the number of times of reflection was three times were obtained.

Hereinafter, results of several examinations performed for the solid-state imaging device will be described.

(First Examination)

FIG. 21(*b*) shows results of the first examination. The horizontal axis indicates the inclination angle $\alpha$ of the incidence surface. The inclination angle $\alpha$ of the incidence surface corresponds to inclination of one surface forming inclination of a pyramidal surface or random unevenness constituting a light scattering unit 27S. A first vertical axis indicates the reflectance R (graph G21*a*). A second vertical axis indicates the scattering angle $\theta_d$ (graph G21*b*). The reflectance R is indicated as an average value of S-polarized light and P-polarized light. The wavelength λ of light was 940 nm.

According to the graph G21*b*, it can be ascertained that the scattering angle $\theta_d$ is proportional to the inclination angle α of the incidence surface. According to the graph G21*a*, it can be ascertained that the reflectance R drastically increases when the inclination angle α of the incidence surface is larger than 50 degrees. If an allowable value of the reflectance R is 0.3, the inclination angle α of the incidence surface in a case in which the reflectance R is 0.3 is 73 degrees. The scattering angle $\theta_d$ in a case in which the reflectance R is 0.3 is 50 degrees. As the scattering angle $\theta_d$ increases, the optical path length L can be lengthened. Therefore, from the viewpoint of light absorption, it is preferable to set a large scattering angle $\theta_d$. According to a condition for increasing the scattering angle $\theta_d$, the reflectance R increases. Therefore, it can be ascertained that light incident on the photoelectric conversion unit 26 is reduced in the first place.

(Second Examination)

Characteristics in a case of employing an isosceles triangle prism array were calculated. FIGS. 22(*a*) to 22(*d*), 23(*a*) to 23(*d*), and 24(*a*) schematically illustrate courses of light. In each diagram, the inclination angle α of the incidence surface differs as enumerated below. The reference sign L1 indicates incident light. The reference sign LA indicates refracted light (scattered light). The reference sign LB indicates reflected light. The reference sign LA2 indicates second refracted light. The reference sign LB2 indicates second reflected light.

FIG. 22(*a*): 60 degrees<inclination angle α

FIG. 22(*b*): inclination angle α=60 degrees

FIG. 22(*c*): 54 degrees<inclination angle α<60 degrees

FIG. 22(*d*): inclination angle α=54 degrees

FIG. 23(*a*): 45 degrees<inclination angle α<54 degrees

FIG. 23(*b*): inclination angle α=45 degrees

FIG. 23(*c*): 30 degrees<inclination angle α<45 degrees

FIG. 23(*d*): inclination angle α=30 degrees

FIG. 24(*a*): 0 degrees<inclination angle α<30 degrees

According to FIG. 22(*a*), in the case in which the inclination angle α is larger than 60 degrees, it can be ascertained that incidence always occurs two times or three times. Regarding the second incidence angle δ, δ=180−3α is established. Namely, it is negative. Regarding a third incidence angle ε, ε=360−5α is established.

According to FIG. 22(*b*), in the case in which the inclination angle α is equal to 60 degrees, it can be ascertained that incidence always occurs two times. It is also ascertained that third incidence on the triangular prism occurs. Regarding the second incidence angle δ, δ=180−3α=0 degrees is established. Regarding the third incidence angle ε, ε=360−5α=60 degrees is established.

According to FIG. 22(*c*), in the case in which the inclination angle α is larger than 54 degrees and smaller than 60 degrees, it can be ascertained that third incidence occurs in accordance with the incidence position. Regarding the second incidence angle δ, δ=180−3α is established. Regarding the third incidence angle ε, ε=360−5α is established.

According to FIG. 22(*d*), in the case in which the inclination angle α is equal to 54 degrees, it can be ascertained that incidence always occurs two times. Regarding the second incidence angle δ, δ=180−3α=18 degrees is established. The second reflected light LB2 is parallel to the triangular prism surface. It is the limit of the third incidence.

According to FIG. 23(*a*), in the case in which the inclination angle α is larger than 45 degrees and smaller than 54 degrees, it can be ascertained that the third incidence does not occur depending on the incidence position. Regarding the second incidence angle δ, δ=180−3α is established.

According to FIG. 23(*b*), in the case in which the inclination angle α is equal to 45 degrees, it can be ascertained that there is second incidence. Regarding the second incidence angle δ, δ=45 degrees is established.

According to FIG. 23(*c*), in the case in which the inclination angle α is larger than 30 degrees and smaller than 45 degrees, it can be ascertained that there is the second incidence depending on the incidence position. Regarding the second incidence angle δ, δ=180−3α is established. A limit position ($X_C$) where the second incidence occurs is defined by Expression (29).

[Math. 29]

$$\frac{X_C}{L} = \frac{\tan\alpha + \tan 2\alpha - 1}{\tan\alpha + \tan 2\alpha - 1} \tag{29}$$

According to FIG. 23(*d*), in the case in which the inclination angle α is equal to 30 degrees, it can be ascertained that the second incidence does not occur.

According to FIG. 24(*a*), in the case in which the inclination angle α is larger than 0 degrees and smaller than 30 degrees as well, it can be ascertained that the second incidence does not occur.

FIG. 24(*b*) shows examination results. The horizontal axis indicates the inclination angle α of the incidence surface. The inclination angle α of the incidence surface corresponds to inclination of the pyramidal surface or inclination of one surface forming random unevenness. The first vertical axis indicates the reflectance R (graph G24*a*). The second vertical axis indicates the scattering angle $\theta_d$ (graph G24*b*). The reflectance R is the average value of S-polarized light and P-polarized light. The wavelength of light was 940 nm.

In FIG. 24(*b*), the range R24*a* indicates a range of the inclination angle α at which the number of times of incidence is one time. The range R24*b* indicates a range of the inclination angle α at which the number of times of incidence on the triangular prism in accordance with the incidence position becomes two times. The range R24*c* indicates a range of the inclination angle α at which the number of times of incidence becomes two times. The range R24*d* indicates a range of the inclination angle α at which the number of times of incidence on the triangular prism in accordance with the incidence position becomes three times. The range R24*e* indicates a range of the inclination angle α at which the number of times of incidence becomes three times.

According to the graph G24*b*, it can be ascertained that the scattering angle $\theta_d$ is almost proportional to the inclination angle α of the incidence surface. The characteristics of the scattering angle $\theta_d$ exhibited substantially the same tendency regardless of the number of times of reflection considered in analysis. The characteristics of the reflectance R exhibited a different tendency by the number of times of reflection considered in analysis. In analysis considering three times of reflection, it can be ascertained that there is a range in which the reflectance R is reduced even when the inclination angle α of the incidence surface is large. It can be ascertained that the light scattering unit having a triangular prism shape and the light scattering unit having a pyramidal shape cannot have a large scattering angle.

(Third Examination)

FIGS. 25(*a*) and 25(*b*) show results of simulation of a diffraction mode utilizing plasmons in a solid-state imaging device which does not include the DTI 22. Regarding an analysis model, a structure in which 23 silver gratings were formed on a silicon substrate with a silicon oxide film of 2 nm therebetween was set. The cycle of the silver gratings was set to 265 nm. The width of the silver gratings was set to 230 nm. The height of the silver gratings was set to 180 nm. The wavelength of light was set to 940 nm.

FIG. 25(*a*) is a contour diagram showing a distribution of an electric field strength. More specifically, FIG. 25(*a*) shows a distribution of the square of the absolute value of the electric field strength. The scattering angle $\theta_d$ obtained by substituting a grating cycle of 265 nm in Expression (30) is 80.6 degrees. It can be ascertained that the value of the scattering angle $\theta_d$ obtained from Expression (30) coincides with the scattering angle $\theta_d$ appearing in the simulation results.

[Math. 30]

$$\theta_d = \sin^{-1}(\ell \cdot \lambda / n \cdot P) \tag{30}$$

FIG. 25(*b*) is a pie chart showing destinations of the incident light L1. When the incident light L1 is assumed to be 100%, it can be ascertained that the respective proportions are as follows.

Zero-order reflected light (G25*a*): 7.7%
Scattered reflected light (G25*b*): 3.5%
Zero-order transmitted light (G25*c*): 30.1%
Scattered transmitted light (G25*d*): 49.5%
Light absorbed into silver (G25*e*): 3.2%
Light absorbed into silicon (G25*f*): 6.1%

Absorption in silicon occurs when the silicon thickness is 3 μm. According to this result, it can be ascertained that the following conditions can be satisfied.

Reflectance: 11.2%
Zero-order transmitted light: 30.1%
Proportion of scattering: 49.5%
Main scattering angle: 80.6 degrees The foregoing conditions are more favorable values than when a scattering layer having a pyramidal shape or a scattering layer having a randomly uneven shape is employed as the light scattering unit.

(Fourth Examination)

FIGS. 26(*a*) and 26(*b*) show results of simulation of the diffraction mode utilizing plasmons in a solid-state imaging device including the DTI 22. Regarding an analysis model, a structure in which 23 silver gratings were formed on the silicon substrate with a silicon oxide film of 2 nm therebetween was set. The cycle of the silver gratings was set to 265 nm. The width of the silver gratings was set to 230 nm. The height of the silver gratings was set to 180 nm. The wavelength of light was set to 940 nm.

FIG. 26(*a*) is a contour diagram showing a distribution of the electric field strength. More specifically, FIG. 26(*a*) shows a distribution of the square of the absolute value of the electric field strength.

FIG. 26(*b*) is a pie chart showing destination of the incident light L1. When the incident light L1 is assumed to be 100%, it can be ascertained that the respective proportions are as follows.

Zero-order reflected light (G26*a*): 6.3%
Scattered reflected light (G26*b*): 5.9%
Transmitted light (G26*c*): 60.7%
Light absorbed into trench (G26*d*): 2.2%
Light absorbed into silver (G26*e*): 3.8%
Light absorbed into silicon (G26*f*): 21.1%

In FIG. 26(*b*), the component of "scattered transmitted light" shown in FIG. 25(*b*) is included in transmitted light (G26*c*). Transmitted light (G25*c*) indicates the total of the proportions of zero-order transmitted light and scattered transmitted light. In this examination, the proportion of the component of "light absorbed into silicon" is higher than the examination results described above. When the DTI 22 is included, the proportion of the component of "light absorbed into silicon" can be increased. In FIG. 26(*b*), the amount corresponding to the increase in "light absorbed into silicon" is a part of the component of scattered light.

By including the DTI 22, scattered transmitted light is repeatedly propagated in the photoelectric conversion unit 26 due to reflection of the DTI 22. As a result, the amount of absorbed light increases. In propagation due to reflection of the DTI 22, all light is not absorbed. Unabsorbed light is treated as transmitted light. It is included in transmitted light (G26*c*).

(Fifth Examination)

Figure 27:
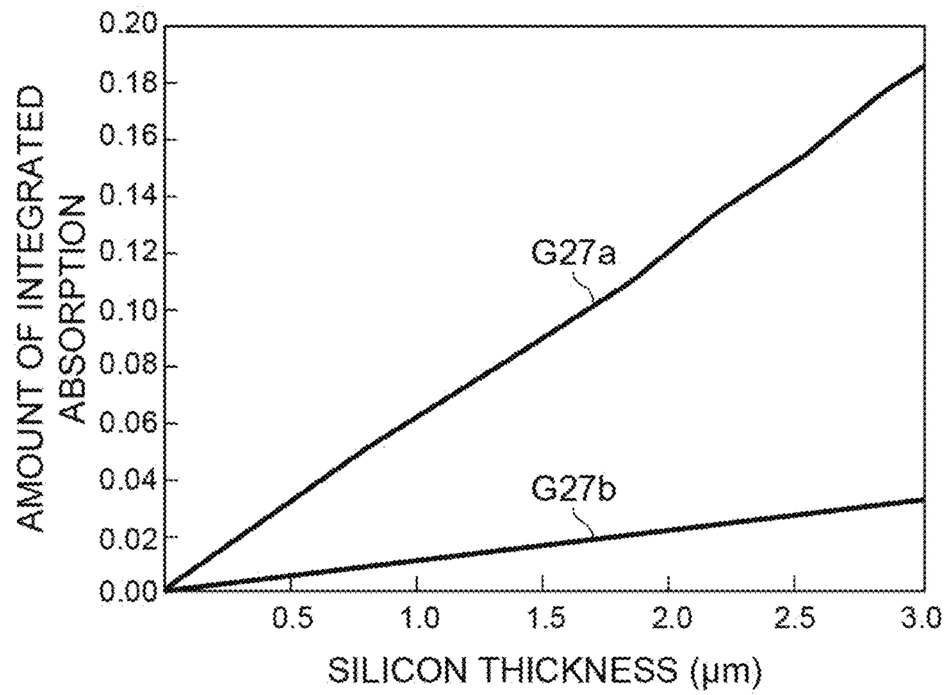
FIG. 27 is a graph showing a relationship between a silicon thickness and an amount of integrated absorption.
Figure 28:
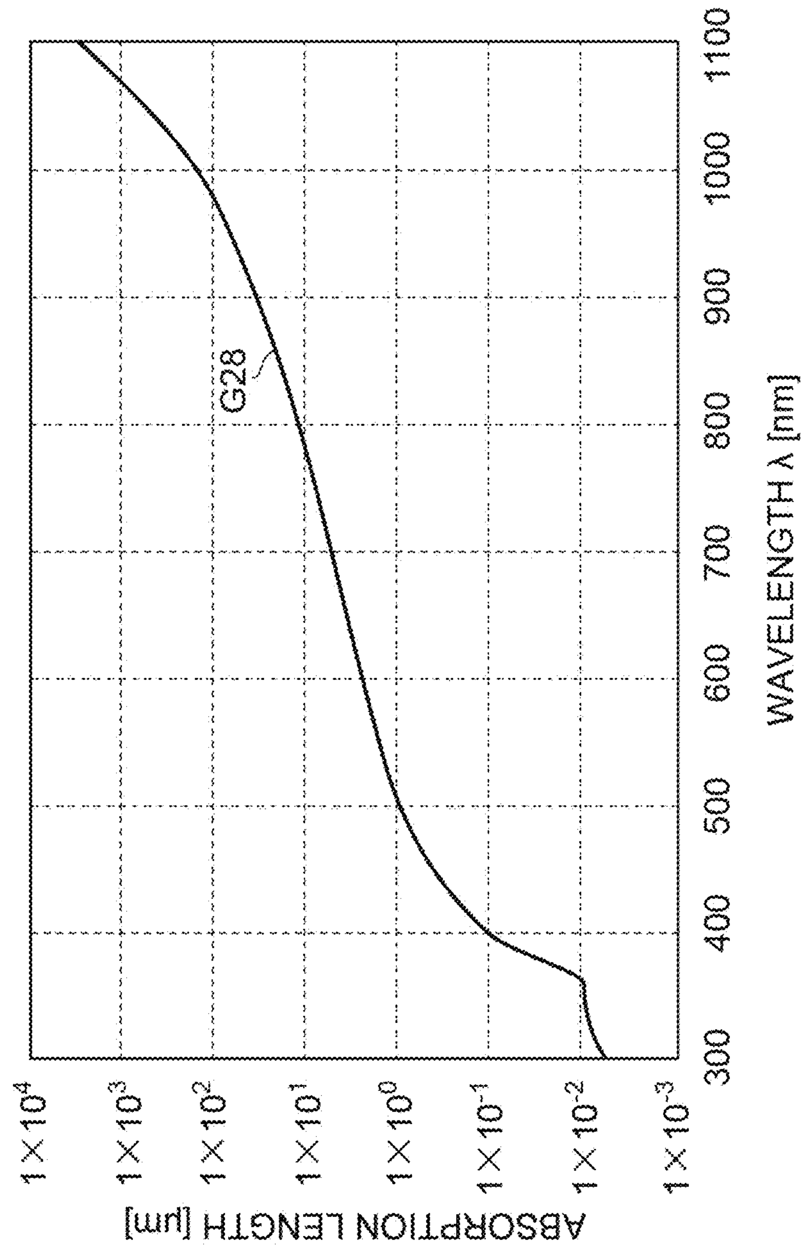
FIG. 28 is a graph showing an optical characteristic of silicon.
Figure 29:
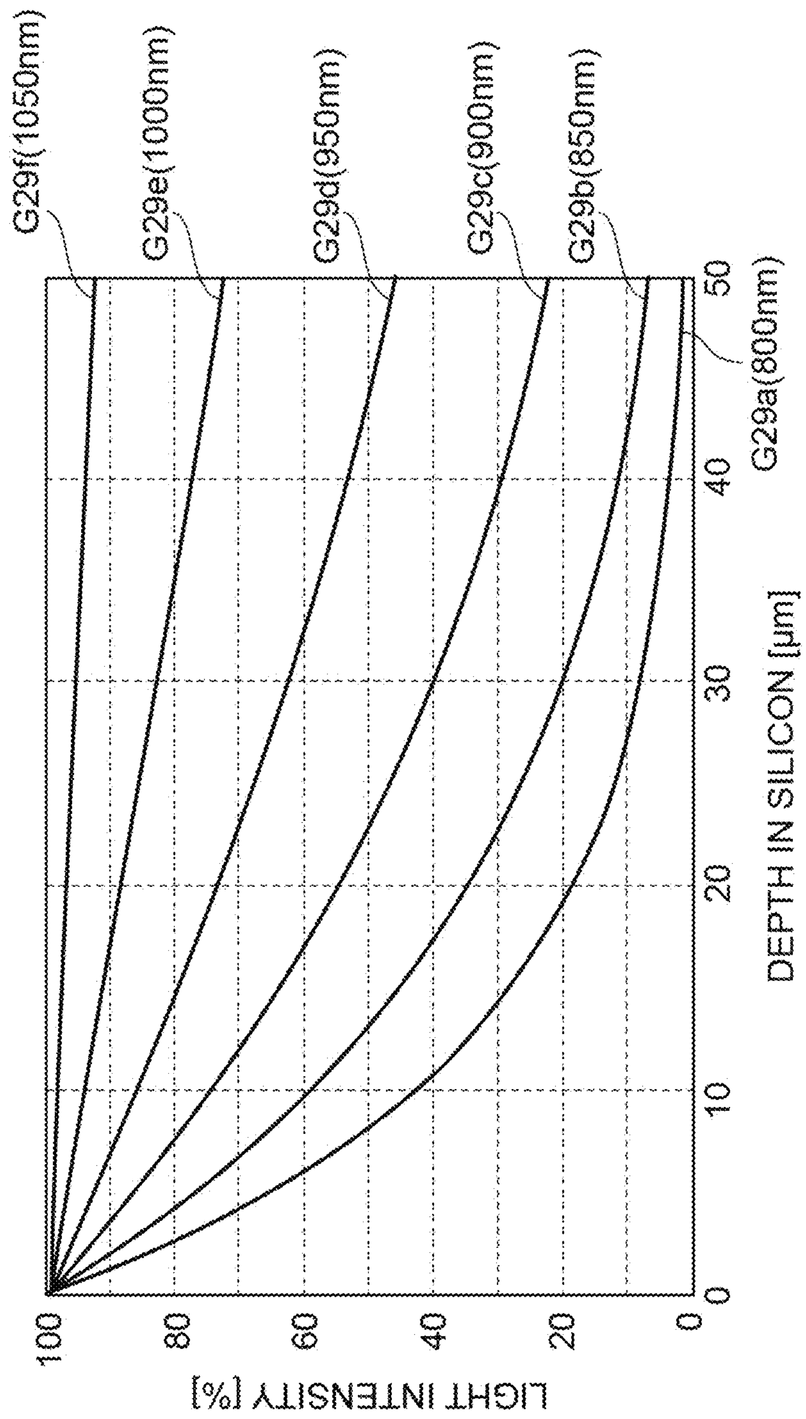
FIG. 29 is a graph showing attenuation of light intensities.

In FIG. 27, regarding a relationship between the silicon thickness and the amount of integrated absorption, a case including a plasmonic structure (graph G27*a*) and a case not including it (graph G27*b*) are compared to each other. The horizontal axis indicates the depth of silicon from the incidence surface. The vertical axis indicates the integrated absorption amount ratio. In other words, the vertical axis indicates the amount of integrated absorption. According to the graphs G27*a* and G27*b*, it can be ascertained that the amount of integrated absorption of the solid-state imaging device including a plasmonic structure can be larger than the amount of integrated absorption of the solid-state imaging device not including a plasmonic structure.

(Fifth Calculation Example)

Incidentally, FIG. 2 of Patent Literature 4 (Japanese Unexamined Patent Publication No. 2020-13909) illustrates a cross section of a pixel included in a back-illuminated CMOS image sensor. FIG. 2 illustrates a light blocking member. The light blocking member is formed using a wiring layer. In Patent Literature 4, regarding a material of the light blocking member, a metal wiring of copper or aluminum is described as an example. In addition, Patent Literature 4 discloses that polysilicon or an oxide film may be adopted as a material of the light blocking member in addition to a metal material. Moreover, Patent Literature 4 discloses that infrared light is caused to be incident on a semiconductor substrate again by the light blocking member reflecting the infrared light which has been transmitted through the semiconductor substrate without being subjected to photoelectric conversion in the semiconductor substrate. Namely, the light blocking member also exhibits a function of reflection in addition to light blocking. However, Patent Literature 4 does not specifically disclose a cross-sectional shape of the light blocking member. Moreover, Patent Literature 4 does not disclose that the light blocking member scatters reflected light and does not disclose items related to the angle of reflected light either.

As described in the fourth examination, the solid-state imaging device 1 of the first embodiment includes metal structures generating diffracted light caused by plasmons, and trenches. According to the pie chart in FIG. 26(*b*), the ratio of light G26*f* absorbed into silicon in the solid-state imaging device 1 of the first embodiment was 21.1%. On the other hand, according to the pie chart in FIG. 26(*b*), the ratio of transmitted light G26*c* of the solid-state imaging device 1 of the first embodiment was 60.7%. In the fourth examination, reflection of light generated in a wiring unit side interface 26*b* of the photoelectric conversion unit 26 (refer to FIG. 33) was not taken into consideration.

Hence, in the fifth examination, reflection of light generated in the wiring unit side interface 26*b* of the photoelectric conversion unit 26 was taken into consideration. The analysis model used in the fifth examination includes the wiring region 13. The wiring region 13 includes the wirings 18, the vias 19, and the like. However, in the fifth examination, it is sufficient to simulate reflection of light generated in the wiring unit side interface 26*b*. Therefore, the analysis model does not include the wirings 18 and the vias 19.

In the fifth examination, similar to the fourth examination, the distribution of the electric field strength was obtained by calculation. The numerical values used in calculation were the same as the numerical values used in calculation of the fourth examination. Namely, regarding an analysis model, a structure in which 23 silver gratings were formed on a silicon substrate with a silicon oxide film of 2 nm therebetween was set. The cycle of the silver gratings was set to 265 nm. The width of the silver gratings was set to 230 nm. The height of the silver gratings was set to 180 nm. The wavelength of light was set to 940 nm.

Figure 30:
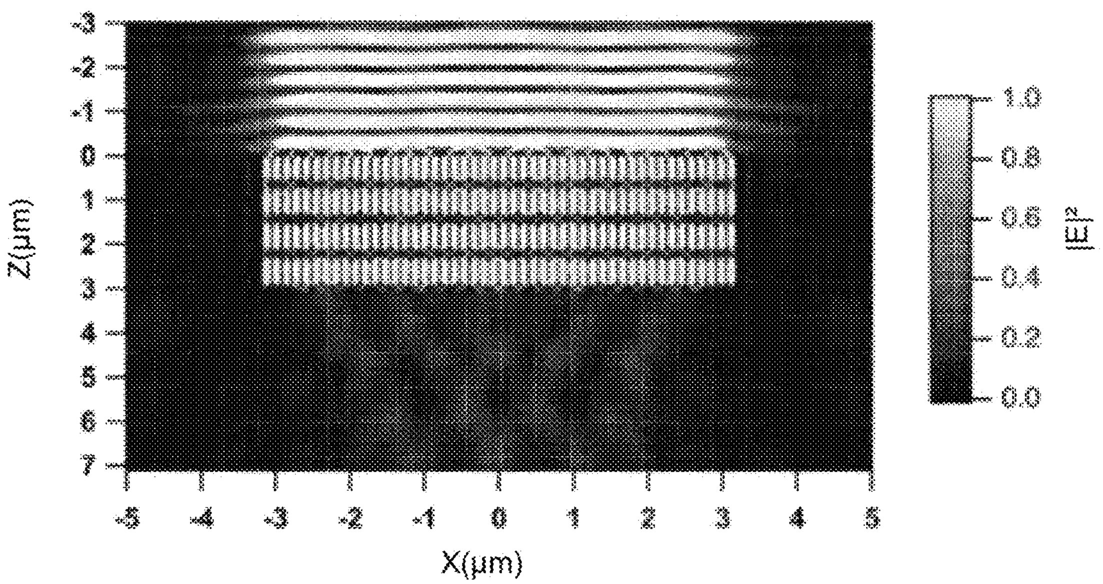
FIG. 30(*a*) is a contour diagram showing a distribution of an electric field strength that is a result of a fifth examination.

FIG. 30(*a*) is a contour diagram showing a distribution of the electric field strength. More specifically, FIG. 30(*a*) shows a distribution of the square of the absolute value of the electric field strength. With reference to FIG. 30(*a*), standing waves could also be confirmed in a depth direction of the photoelectric conversion unit 26. These standing waves were generated due to interference between light which has been incident from the light input surface 26*a* and light reflected from the wiring unit side interface 26*b*.

FIG. 30(*b*) is a table listing results of a fifth examination, a sixth examination, a seventh examination, and an eighth examination. According to the results of the fifth examination, when the incident light L1 is assumed to be 100%, it can be ascertained that the respective proportions are as follows. Due to a calculation error, even if all the numerical values of the proportions are added together, the numerical values do not match 100%.

Zero-order reflected light: 43.6%
Scattered reflected light: 6.1%
Transmitted light: 19.1%
Light absorbed into trench: 5.2%
Light absorbed into silver: 4.0%
Light absorbed into silicon: 26.6%
Total: 104.6%

The numerical values of the fourth examination and the numerical values of the fifth examination are compared to each other.

Regarding transmitted light, results indicating that the fifth examination was more advantageous than the fourth examination were obtained. Specifically, transmitted light of the fourth examination was 60.7%. On the other hand, transmitted light of the fifth examination was 19.1%. Namely, the proportion of transmitted light could be significantly reduced due to reflection.

Regarding light absorbed into silicon as well, results indicating that the fifth examination was more advantageous than the fourth examination were obtained. Specifically, light absorbed into silicon of the fourth examination was 21.1%. On the other hand, light absorbed into silicon of the fifth examination was 26.6%. Namely, the proportion of light absorbed into silicon could be increased due to reflection.

However, regarding zero-order reflected light, results indicating that the fifth examination was more disadvantageous than the fourth examination were obtained. Specifically, zero-order reflected light of the fourth examination was 6.3%. On the other hand, zero-order reflected light of the fifth examination was 43.6%. Namely, it can be ascertained that the proportion of zero-order reflected light increases due to reflection.

Figure 31:
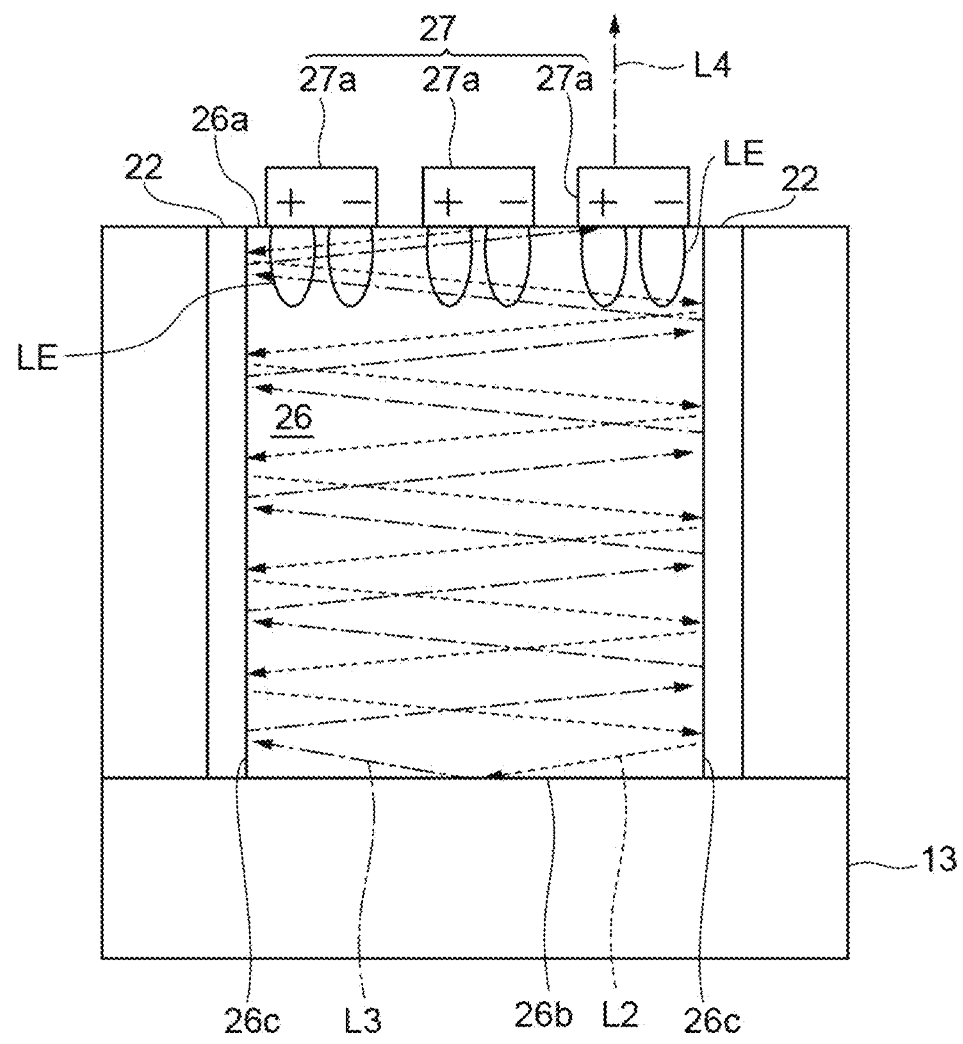
FIG. 31 is a view simply illustrating an analysis model used in the fifth examination.

FIG. 31 is a view simply illustrating an analysis model used in the fifth examination. The alternate long and short dash line in FIG. 31 indicates light L3 reflected by the wiring unit side interface 26*b* of the photoelectric conversion unit 26. The light L3 is further reflected by the DTI 22. In this reflection, the incidence angle of the light L3 with respect to the DTI 22 is the same as the incidence angle of the absorbed light L2 diffracted by the light scattering unit 27 with respect to the DTI 22. The light L3 is directed toward the light input surface 26*a* while being repeatedly reflected in the DTI 22. While it travels toward the light input surface 26*a*, a part of the light L3 is absorbed by the photoelectric conversion unit 26.

Here, it is assumed that a pair of DTIs 22 are parallel to each other and an extending direction of the DTIs 22 is perpendicular to the light input surface 26*a*. Moreover, it is assumed that the wiring unit side interface 26*b* is parallel to the light input surface 26*a* and is perpendicular to the extending direction of the DTIs 22. According to these assumptions, the incidence angle of the light L3 with respect to the light input surface 26*a* is the same as the light scattering unit 27 is generated the angle of the light L2. If the light L3 is incident on the light input surface 26*a* at the same angle as the angle of the light L2, the incident light L3 is emitted as light L4 to the outside of the photoelectric conversion unit 26 in a zero-degree direction due to operation of the light scattering unit 27. As a result, it is conceivable that the ratio of zero-order reflected light has significantly increased.

In summary, the following two points have become clear through the fifth examination.

First, it can be ascertained that reflection of the wiring unit side interface 26*b* reduces the proportion of transmitted light and increases the proportion of light absorbed into silicon. Namely, since reflection of the wiring unit side interface 26*b* contributes to increase in proportion of light absorbed into silicon, it can be ascertained that it is useful for improvement in efficiency of photoelectric conversion of near-infrared light.

Second, it can also be ascertained that reflection of the wiring unit side interface 26*b* increases the light L3 emitted to the outside of a photoelectric conversion layer $\mathbf{40}_1$. Here, the inventors have paid attention to the fact that the efficiency of photoelectric conversion of near-infrared light can be further improved if the light L3 emitted to the outside of the photoelectric conversion layer $\mathbf{40}_1$ can be reduced. In other words, in order to further increase the ratio of light absorbed into silicon, the inventors have come up with the fact that the efficiency of photoelectric conversion can be further improved if light emitted to the outside of the photoelectric conversion unit 26 can be reduced.

Namely, if the light L3 is incident on the light scattering unit 27 from the photoelectric conversion unit 26 side at the same angle as the diffraction angle of the light L2 diffracted by the light scattering unit 27, the light L3 is emitted as the light L4 to the outside of the photoelectric conversion unit 26 at the same angle as the incidence angle of the original incident light. Hence, the reflection angle of the light L3 is changed when the light L2 is reflected by the wiring unit side interface 26*b*. As a result, the light L4 emitted to the outside of the photoelectric conversion unit 26 formed of silicon can be reduced.

For example, regarding a constitution for changing the reflection angle of the light L3, a constitution for changing the reflection angle of the light L3 in the wiring unit side interface 26*b* to an angle different from the incidence angle may be provided. A solid-state imaging device having such a constitution will be described as a second embodiment. Moreover, regarding a constitution for changing the reflection angle of the light L3, a scattering structure may be provided in the wiring unit side interface 26*b*. A solid-state imaging device having such a constitution will be described as a third embodiment.

Second Embodiment

FIG. 32(*a*) is a cross-sectional view illustrating a structure of a solid-state imaging device $\mathbf{1}_1$ of the second embodiment. FIG. 32(*b*) is a perspective view illustrating a wiring layer side interface $\mathbf{41}_1$ of the photoelectric conversion layer $\mathbf{40}_1$ included in the solid-state imaging device $\mathbf{1}_1$.

The solid-state imaging device $\mathbf{1}_1$ has an incidence side insulating layer 60, the photoelectric conversion layer $\mathbf{40}_1$, and a wiring layer $\mathbf{50}_1$.

For example, the incidence side insulating layer 60 is constituted using silicon oxide ($SiO_2$). The incidence side insulating layer 60 has an incidence side insulating layer main surface 61 and an incidence side insulating layer back surface 62. The incidence side insulating layer main surface 61 receives light. Namely, the incidence side insulating layer main surface 61 is a light input surface of the solid-state imaging device $\mathbf{1}_1$. The incidence side insulating layer back surface 62 comes into contact with the photoelectric conversion layer $\mathbf{40}_1$. The light scattering unit 27 is embedded in the incidence side insulating layer 60. Details of the light scattering unit 27 is the same as the light scattering unit 27 of the first embodiment.

The photoelectric conversion layer $\mathbf{40}_1$ is constituted mainly using silicon (Si). Details of the photoelectric conversion layer $\mathbf{40}_1$ is almost the same as the photoelectric conversion layer $\mathbf{40}_1$ of the first embodiment. In the photoelectric conversion layer $\mathbf{40}_1$ of the second embodiment, description of constitutions which are the same as those of the photoelectric conversion layer $\mathbf{40}_1$ of the first embodiment will be omitted, and constitutions different from those of the photoelectric conversion layer $\mathbf{40}_1$ of the first embodiment will be described in detail.

The photoelectric conversion layer $\mathbf{40}_1$ has the wiring layer side interface $\mathbf{41}_1$ (a photoelectric conversion back surface, a second photoelectric conversion interface), an insulating layer side interface 42 (a photoelectric conversion main surface, a first photoelectric conversion interface), and a DTI side interface 43. The insulating layer side interface 42 of the photoelectric conversion layer $\mathbf{40}_1$ comes into contact with the incidence side insulating layer back surface 62 of the incidence side insulating layer 60. The light scattering unit 27 is provided in the insulating layer side interface 42. The wiring layer side interface $\mathbf{41}_1$ comes into contact with the wiring layer $\mathbf{50}_1$. A distance from the insulating layer side interface 42 to the wiring layer side interface $\mathbf{41}_1$ is 3 μm as an example. In other words, the distance from the insulating layer side interface 42 to the wiring layer side interface $\mathbf{41}_1$ is the thickness of the photoelectric conversion layer $\mathbf{40}_1$.

The DTIs 22 are provided in the photoelectric conversion layer $\mathbf{40}_1$. Details of the DTIs 22 of the second embodiment are the same as the DTIs 22 of the first embodiment. The DTI side interface 43 of the photoelectric conversion layer $\mathbf{40}_1$ comes into contact with DTI side surfaces 221 of the DTIs 22.

For example, the wiring layer $\mathbf{50}_1$ is constituted using silicon oxide ($SiO_2$). Details of the wiring layer $\mathbf{50}_1$ of the second embodiment is almost the same as the wiring layer $\mathbf{50}_1$ of the first embodiment. In the wiring layer $\mathbf{50}_1$ of the second embodiment, description of constitutions which are the same as those of the wiring layer $\mathbf{50}_1$ of the first embodiment will be omitted, and constitutions which have not been described in the first embodiment will be described in detail.

The wiring layer $\mathbf{50}_1$ has a wiring layer main surface $\mathbf{51}_1$. The wiring layer main surface $\mathbf{51}_1$ comes into contact with the wiring layer side interface $\mathbf{41}_1$ of the photoelectric conversion layer $\mathbf{40}_1$.

Here, characteristic constitutions of the solid-state imaging device $\mathbf{1}_1$ of the second embodiment will be described in detail. In the solid-state imaging device $\mathbf{1}_1$ of the second embodiment, the shape of the wiring layer side interface $\mathbf{41}_1$ differs from the shape of the wiring unit side interface 26*b* of the first embodiment.

As illustrated in FIG. 31, the wiring unit side interface 26*b* of the photoelectric conversion unit 26 of the solid-state imaging device 1 of the first embodiment is a flat surface. Moreover, the wiring unit side interface 26*b* is orthogonal to the thickness direction of the photoelectric conversion unit 26. In other words, the wiring unit side interface 26*b* is orthogonal to a DTI side interface 26*c*.

As illustrated in FIG. 32(*a*), the wiring layer side interface $\mathbf{41}_1$ of the solid-state imaging device $\mathbf{1}_1$ of the second embodiment includes a first interface portion $\mathbf{41}a_1$ and a second interface portion $\mathbf{41}b_1$. The first interface portion $\mathbf{41}a_1$ comes into contact with a first main surface portion $\mathbf{51}a_1$ of the wiring layer main surface $\mathbf{51}_1$. The second interface portion $\mathbf{41}b_1$ comes into contact with a second main surface portion $\mathbf{51}b_1$ of the wiring layer main surface $\mathbf{51}_1$. Each of the first interface portion $\mathbf{41}a_1$ and the second interface portion $\mathbf{41}b_1$ is a flat surface. On the other hand, the first interface portion $\mathbf{41}a_1$ and the second interface portion $\mathbf{41}b_1$ are not orthogonal to the thickness direction of the photoelectric conversion layer $\mathbf{40}_1$. In other words, the first interface portion $\mathbf{41}a_1$ and the second interface portion $\mathbf{41}b_1$ are inclined surfaces inclined with respect to the thickness direction of the photoelectric conversion layer $\mathbf{40}_1$. For example, an imaginary surface K connecting lower ends of the DTIs 22 is defined. Based on the imaginary surface K, the angle of the first interface portion $\mathbf{41}a_1$ based on the imaginary surface K is 5 degrees. Similarly, the angle of the second interface portion $\mathbf{41}b_1$ based on the imaginary surface K is also 5 degrees. The angle of the first interface portion $\mathbf{41}a_1$ may be the same as or may be different from the second interface portion $\mathbf{41}b_1$.

A ridgeline $\mathbf{41}c_1$ that is a boundary between the first interface portion $\mathbf{41}a_1$ and the second interface portion $\mathbf{41}b_1$ is almost at the center of the width of the photoelectric conversion layer $\mathbf{40}_1$. The width of the photoelectric conversion layer $\mathbf{40}_1$ is a distance from one DTI side interface 43 to another DTI side interface 43. It can also be said that the width of the photoelectric conversion layer $\mathbf{40}_1$ is a distance from one DTI 22 to another DTI 22. Moreover, the ridgeline $\mathbf{41}c_1$ is positioned on a side of the wiring layer $\mathbf{50}_1$ from lower end surfaces of the DTIs 22. In other words, the ridgeline 41$c_1$ is positioned on the outward side between the pair of DTIs 22. Namely, the wiring layer side interface 41$_1$ of the photoelectric conversion layer 40$_1$ protrudes toward the wiring layer 50$_1$.

In a cross section of the photoelectric conversion layer 40$_1$, a cross-sectional region $A_1$ constituted by the imaginary surface K, the first interface portion 41$a_1$, and the second interface portion 41$b_1$ can be referred to as "a light direction changing unit 30$_1$". The first interface portion 41$a_1$ and the second interface portion 41$b_1$ can also be referred to as a surface of the light direction changing unit 30$_1$. The solid-state imaging device 1 of the first embodiment illustrated in FIG. 31 does not include a part corresponding to the light direction changing unit 30$_1$ included in the solid-state imaging device 1$_1$ of the second embodiment. Namely, the light direction changing unit 30$_1$ can also be referred to as a part which differs from the photoelectric conversion unit 26 of the solid-state imaging device 1 of the first embodiment in the photoelectric conversion layer 40$_1$.

FIG. 32(*b*) is a perspective view of the wiring layer side interface 41$_1$ of the photoelectric conversion layer 40$_1$. As illustrated in FIG. 32(*b*), the wiring layer side interface 41$_1$ of the photoelectric conversion layer 40$_1$ is a swept body obtained by sweeping the cross-sectional region $A_1$ along a predetermined axis X.

Figure 33:
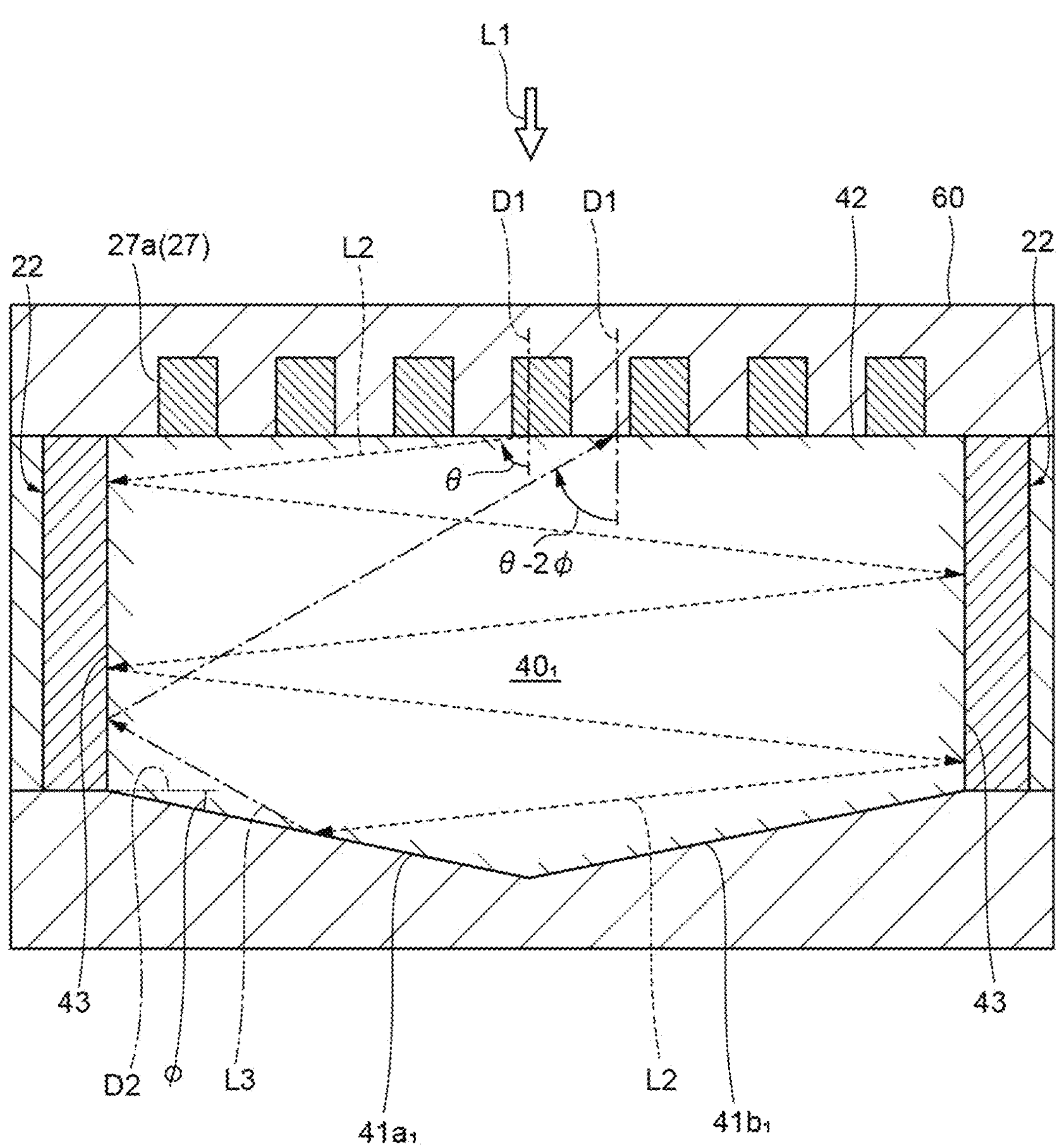
FIG. 33 is a view schematically illustrating a situation in which light travels forward inside a photoelectric conversion layer of a solid-state imaging device $\mathbf{1}_1$ of the second embodiment.

FIG. 33 schematically illustrates a situation in which light travels forward inside the photoelectric conversion layer 40$_1$ of the solid-state imaging device 1$_1$ of the second embodiment. The light scattering unit 27 receives the light L1 and emits the light L2. A traveling direction of the light L2 is at an angle (θ) with a normal direction of the insulating layer side interface 42 as a reference axis D1. The light L2 is reflected in the DTI side interface 43. At this time, the incidence angle of the light L2 with respect to the DTI side interface 43 is (90−θ) degrees. Similarly, the reflection angle is (90−θ) degrees. The light L2 arrives at the wiring layer side interface 41$_1$ through a plurality of times of reflection in the DTI side interface 43. An angle (ϕ) of the wiring layer side interface 41$_1$ is defined based on an axis D2 orthogonal to the reference axis D. In this way, the incidence angle of the light L2 with respect to the wiring layer side interface 41$_1$ is (θ−ϕ) degrees.

Here, the wiring unit side interface 26*b* of the first embodiment is a flat surface. Namely, ϕ is 0 degrees. On the other hand, the wiring layer side interface 41$_1$ of the second embodiment is an inclined surface. For example, ϕ is 5 degrees. Therefore, it can be said that the incidence angle with respect to the wiring layer side interface 41$_1$ of the second embodiment has been changed by ϕ degrees with respect to the incidence angle to the wiring unit side interface 26*b* of the first embodiment. As a result, the incidence angle when the light L3 is incident on the light scattering unit 27 again becomes (θθ−2ϕ) degrees. Namely, an incidence angle (θ−2ϕ) when the light L3 is incident on the light scattering unit 27 differs from the angle (θ) of the light L2. As a result, since the situation of diffraction in the light scattering unit 27 differs from the case of incidence, emission of the light L3 to the outside from the photoelectric conversion layer 40$_1$ is curbed.

(Sixth Examination)

In the sixth examination, regarding the solid-state imaging device 1$_1$ of the second embodiment, a distribution of the electric field strength was obtained in a manner similar to that of the fifth examination. The numerical values used in calculation were as follows.

Angle of wiring unit side interface 41$_1$:5 degrees

Size of pixel: 6.5 μm

Thickness of photoelectric conversion layer 40$_1$:3 μm

Thickness of wiring layer: 4.1 μm

The thickness of the photoelectric conversion layer 40$_1$ and the thickness of the wiring layer 50$_1$ are values of parts in the vicinity of the DTIs 22.

Figure 34:
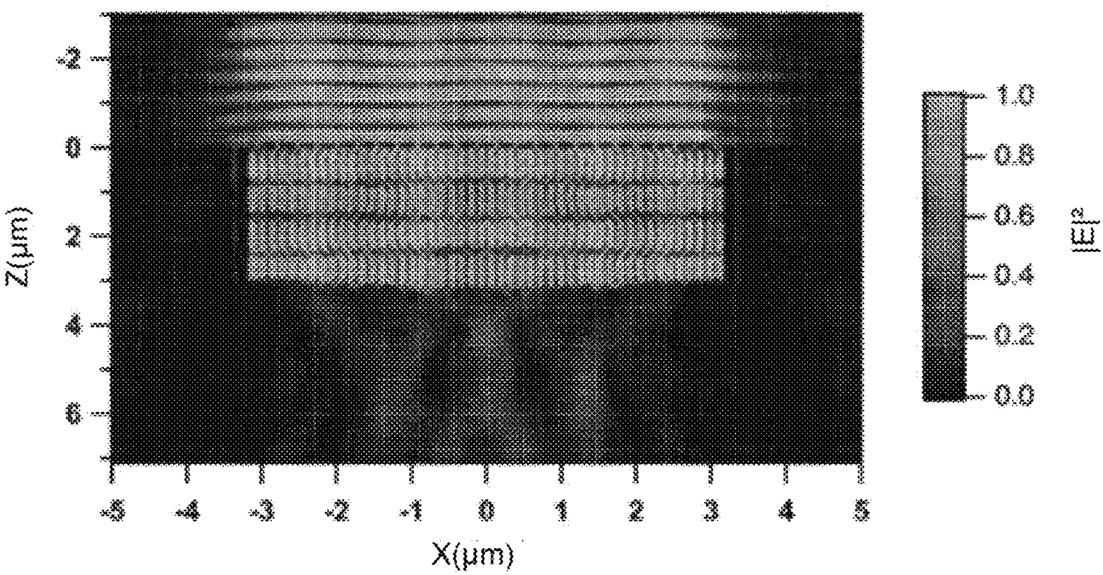
FIG. 34 is a contour diagram showing a distribution of the electric field strength that is a result of the sixth examination.

FIG. 34 is a contour diagram showing a distribution of the electric field strength. More specifically, FIG. 34 shows a distribution of the square of the absolute value of the electric field strength. With reference to FIG. 34, similar to the results of the fifth examination (FIG. 30(*a*)), standing waves could also be confirmed in the depth direction of the photoelectric conversion unit 26. In detailed comparison, it can be ascertained that standing waves of the sixth examination are further disturbed than standing waves of the fifth examination. It is conceivable that this disturbance of standing waves is caused by change of the reflection angle due to the inclined wiring unit side interface 41$_1$.

According to the results of the sixth examination shown in FIG. 30(*b*), when the incident light L1 is assumed to be 100%, it can be ascertained that the respective proportions are as follows.

Zero-order reflected light: 33.8%

Scattered reflected light: 6.5%

Transmitted light: 14.5%

Light absorbed into trench: 7.2%

Light absorbed into silver: 2.9%

Light absorbed into silicon: 38.1%

Total: 103.0%

The numerical values of the fifth examination and the numerical values of the sixth examination are compared to each other.

Regarding zero-order reflected light, results indicating that the sixth examination was more advantageous than the fifth examination were obtained. Specifically, zero-order reflected light of the fifth examination was 43.6%. On the other hand, zero-order reflected light of the sixth examination was 33.8%. Namely, the proportion of zero-order reflected light could be reduced by causing the wiring unit side interface 41$_1$ to be inclined.

Regarding transmitted light as well, results indicating that the sixth examination was more advantageous than the fifth examination were obtained. Specifically, transmitted light of the fifth examination was 19.1%. On the other hand, transmitted light of the sixth examination was 14.5%. Namely, the proportion of zero-order reflected light could be reduced by causing the wiring unit side interface 41$_1$ to be inclined.

Regarding light absorbed into silicon as well, results indicating that the sixth examination was more advantageous than the fifth examination were obtained. Specifically, light absorbed into silicon of the fifth examination was 26.6%. On the other hand, light absorbed into silicon of the sixth examination was 38.1%. Namely, the proportion of light absorbed into silicon could be increased by causing the wiring unit side interface 41$_1$ to be inclined.

Therefore, it can be ascertained that emission of light from the photoelectric conversion layer 40$_1$ is curbed by causing the wiring unit side interface 41$_1$ to be inclined. As a result, it can be ascertained that the efficiency of photoelectric conversion of near-infrared light can be further improved.

Modification Examples of Second Embodiment

In the solid-state imaging device 1$_1$ of the second embodiment, the direction of the light L3 whose direction is changed is based on the direction of the light L2 before the direction is changed. Such a constitution is so-called mirror surface reflection. The light direction changing unit 30$_1$ need only have a shape causing mirror surface reflection and is not limited to the shape included in the solid-state imaging device 1$_1$ of the second embodiment.

Modification Examples 1, 2, and 3 of the second embodiment are examples of the wiring layer side interface constituted of a flat surface.

Modification Example 1 of Second Embodiment

FIG. 35(*a*) is a cross-sectional view illustrating a structure of a solid-state imaging device 1$_2$ of Modification Example 1 of the second embodiment. FIG. 35(*b*) is a perspective view illustrating a wiring layer side interface 41$_2$ of a photoelectric conversion layer 40$_2$ included in the solid-state imaging device 1$_2$. A light direction changing unit 30$_2$ may have a quadrangular pyramidal shape. One side of this quadrangular pyramid may be the same as the interval of the DTIs 22. The wiring layer side interface 41$_2$ includes a first interface portion 41$a_2$, a second interface portion 41$b_2$, a third interface portion 41$c_2$, and a fourth interface portion 41$d_2$. The first interface portion 41$a_2$ comes into contact with a first main surface portion 51$a_2$ on a wiring layer main surface 51$_2$. The second interface portion 41$b_2$ comes into contact with a second main surface portion 51$b_2$ on the wiring layer main surface 51$_2$. The third interface portion 41$c_2$ comes into contact with a third main surface portion on the wiring layer main surface 51$_2$. The fourth interface portion 41$d_2$ comes into contact with a fourth main surface portion on the wiring layer main surface 51$_2$. An apex 41$p_2$ is positioned on a wiring layer 50$_2$ side from the imaginary surface K. The apex 41$p_2$ is positioned on the outward side between the pair of DTIs 22. Namely, the light direction changing unit 30$_2$ has a projection shape.

Modification Example 2 of Second Embodiment

FIG. 36(*a*) is a cross-sectional view illustrating a structure of a solid-state imaging device 1$_3$ of Modification Example 2 of the second embodiment. FIG. 36(*b*) is a perspective view illustrating a wiring layer side interface 41$_3$ of a photoelectric conversion layer 40$_3$ included in the solid-state imaging device 1$_3$. A light direction changing unit 30$_3$ is hollow with respect to the imaginary surface K. The light direction changing unit 30$_1$ of the second embodiment is a protrusion portion, whereas the light direction changing unit 30$_3$ is a hollow portion. The light direction changing unit 30$_3$ includes a first interface portion 41$a_3$ and a second interface portion 41$b_3$. The first interface portion 41$a_3$ comes into contact with a first main surface portion 51$a_3$ on a wiring layer main surface 51$_3$. The second interface portion 41$b_3$ comes into contact with a second main surface portion 51$b_3$ on the wiring layer main surface 51$_3$. A ridgeline 41$c_3$ is positioned between the pair of DTIs 22.

Modification Example 3 of Second Embodiment

FIG. 37(*a*) is a cross-sectional view illustrating a structure of a solid-state imaging device 1$_4$ of Modification Example 3 of the second embodiment. FIG. 37(*b*) is a perspective view illustrating a wiring layer side interface 41$_4$ of a photoelectric conversion layer 40$_4$ included in the solid-state imaging device 1$_4$. A light direction changing unit 30$_4$ may have a quadrangular pyramidal shape. The light direction changing unit 30$_2$ of Modification Example 1 of the second embodiment is a protrusion portion, whereas the light direction changing unit 30$_4$ of Modification Example 3 of the second embodiment is a hollow portion. The wiring layer side interface 41$_4$ of the photoelectric conversion layer 40$_4$ includes a first interface portion 41$a_4$, a second interface portion 41$b_4$, a third interface portion 41$c_4$, and a fourth interface portion 41$d_4$. The first interface portion 41$a_4$ comes into contact with a first main surface portion 51$a_4$ on a wiring layer main surface 51$_4$. The second interface portion 41$b_4$ comes into contact with a second main surface portion 51$b_4$ on the wiring layer main surface 51$_4$. The third interface portion 41$c_4$ comes into contact with the third main surface portion on the wiring layer main surface 51$_4$. The fourth interface portion 41$d_4$ comes into contact with the fourth main surface portion on the wiring layer main surface 51$_4$. An apex 41$p_4$ is positioned between the pair of DTIs 22. Namely, the light direction changing unit 30$_4$ is a hollow portion.

The wiring layer side interface 41$_1$ and the like of the second embodiment described above are constituted of several flat surfaces. The wiring layer side interface may include a part that is a curved surface. Modification Examples 4, 5, 6, and 7 of the second embodiment are examples of a wiring layer side interface including a part that is a curved surface.

Modification Example 4 of Second Embodiment

FIG. 38(*a*) is a cross-sectional view illustrating a structure of a solid-state imaging device 1$_5$ of Modification Example 4 of the second embodiment. FIG. 38(*b*) is a perspective view illustrating a wiring layer side interface 41$_5$ of a photoelectric conversion layer 40$_5$ included in the solid-state imaging device 1$_5$. A cross section of the wiring layer side interface 41$_5$ of the photoelectric conversion layer 40$_5$ may have an oval shape. A region $A_5$ surrounded by the imaginary surface K and a curved surface 41$s_5$ corresponds to a light direction changing unit 30$_5$. The curved surface 41$s_5$ protrudes from the imaginary surface K toward a wiring layer 50$_5$. The curved surface 41$s_5$ comes into contact with a curved surface 51$s_5$ of a wiring layer main surface 51$_5$. The curved surface 41$s_5$ extends from one DTI side interface 43 to another DTI side interface 43. Namely, in the wiring layer side interface 41$_5$, a part between the DTI side interfaces 43 includes no flat surface. The shape of the curved surface 41$s_5$ is not particularly limited. For example, a curve appearing in a cross section of the curved surface 41$s_5$ may be a quadratic curve such as an oval, a hyperbola, or a parabola. The wiring layer side interface 41$_5$ of the photoelectric conversion layer 40$_5$ is a swept body obtained by sweeping the cross-sectional region $A_5$ surrounded by a line included in the imaginary surface K and a curve included in the curved surface 41$s_5$ along the predetermined axis X.

Modification Example 5 of Second Embodiment

FIG. 39(*a*) is a cross-sectional view illustrating a structure of a solid-state imaging device 1$_6$ of Modification Example 5 of the second embodiment. FIG. 39(*b*) is a perspective view illustrating a wiring layer side interface 41$_6$ of a photoelectric conversion layer 40$_6$ included in the solid-state imaging device 1$_6$. A cross section of the wiring layer side interface 41$_6$ of the photoelectric conversion layer 40$_6$ includes a part having an oval shape. The light direction changing unit 30$_5$ of Modification Example 4 of the second embodiment (refer to FIG. 38(*b*)) was a swept body obtained by sweeping the cross-sectional region $A_5$ in a direction of the predetermined axis X. A light direction changing unit 30$_6$ of Modification Example 5 of the second embodiment is a rotor obtained by rotating a cross-sectional region $A_6$ about a predetermined axis Z. For example, the light direction changing unit 30$_6$ has a shape of a convex lens. The light direction changing unit 30$_6$ includes a curved surface 41$s_6$. The curved surface 41$s_6$ comes into contact with a curved surface 51$s_6$ on a wiring layer main surface 51$_6$. The light direction changing unit 30$_6$ protrudes toward a wiring layer 50$_6$ side.

Modification Example 6 of Second Embodiment

FIG. 40(*a*) is a cross-sectional view illustrating a structure of a solid-state imaging device 1$_7$ of Modification Example 6 of the second embodiment. FIG. 40(*b*) is a perspective view illustrating a wiring layer side interface 41$_7$ of a photoelectric conversion layer 40$_7$ included in the solid-state imaging device 1$_7$. A light direction changing unit 30$_7$ is hollow with respect to the imaginary surface K. Namely, the light direction changing unit 30$_5$ of Modification Example 4 of the second embodiment is a protrusion portion (FIG. 38(*b*)), whereas the light direction changing unit 30$_7$ is a hollow portion. The light direction changing unit 30$_7$ includes a curved surface 41$s_7$. The curved surface 41$_7$ that is a surface of the light direction changing unit 30$_7$ is a swept surface obtained by sweeping a cross-sectional region $A_7$ in a direction of the predetermined axis X. The curved surface 41$s_7$ comes into contact with a curved surface 51$s_7$ on a wiring layer main surface 51$_7$. The curved surface 41$s_7$ is positioned between the pair of DTIs 22.

Modification Example 7 of Second Embodiment

FIG. 41(*a*) is a cross-sectional view illustrating a structure of a solid-state imaging device 1$_8$ of Modification Example 7 of the second embodiment. FIG. 41(*b*) is a perspective view illustrating a wiring layer side interface 41$_8$ of a photoelectric conversion layer 40$_8$ included in the solid-state imaging device 1$_8$. A light direction changing unit 30$_8$ is hollow with respect to the imaginary surface K. A curved surface 41$s_8$ that is a surface of the light direction changing unit 30$_8$ is a rotated surface obtained by rotating a cross-sectional region $A_8$ about the predetermined axis Z. For example, the light direction changing unit 308 has a shape of a concave lens. The curved surface 41$s_8$ comes into contact with a curved surface 51$s_8$ on a wiring layer main surface 51$_8$. The curved surface 41$s_7$ is positioned between the pair of DTIs 22.

It has already been described that a scattering structure may be provided in a wiring layer side interface as a constitution for changing the reflection angle of the light L3. A solid-state imaging device in which a structure for scattering light is provided in the wiring layer side interface will be described as the third embodiment.

Third Embodiment

FIG. 42(*a*) is a cross-sectional view illustrating a structure of a solid-state imaging device 1$_9$ of the third embodiment. FIG. 42(*b*) is a perspective view illustrating a wiring layer side interface 41$_9$ of a photoelectric conversion layer 40$_9$ included in the solid-state imaging device 1$_9$.

The wiring layer side interface 41$_9$ has an interface recessed portion 41$a_9$ and an interface flat portion 41$b_9$. The interface flat portion 41$b_9$ is orthogonal to the DTI side interface 43. The interface recessed portion 41$a_9$ is hollower than the interface flat portion 41$b_9$. The interface recessed portion 41$a_9$ is provided between the pair of DTIs 22. A distance from the interface recessed portion 41$a_9$ to one DTI 22 is almost the same as a distance from the interface recessed portion 41$a_9$ to another DTI 22. The interface recessed portion 41$a_9$ is provided almost at the center of the wiring layer side interface 41$_9$ surrounded by the DTIs 22.

The depth of the interface recessed portion 41$a_9$ can be defined based on the interface flat portion 41$b_9$. The depth of the interface recessed portion 41$a_9$ is a distance from the interface flat portion 41$b_9$ to a recessed portion bottom surface 41$t_9$ of the interface recessed portion 41$a_9$. A wiring layer projecting portion 51$t_9$ protruding from a wiring layer main surface 51$_9$ of a wiring layer 50$_9$ is disposed in the interface recessed portion 41$a_9$. An upper surface of the wiring layer projecting portion 51$t_9$ comes into contact with the recessed portion bottom surface 41$t_9$ of the interface recessed portion 41$a_9$. Therefore, the depth of the interface recessed portion 41$a_9$ is the same as the height of the wiring layer projecting portion 51$t_9$.

The depth of the interface recessed portion 41$a_9$ is determined on the basis of the wavelength of the light L2. For example, the depth of the interface recessed portion 41$a_9$ is longer than 10% of the wavelength (λ) of the light L2. This definition can also be referred to as the lower limit for the depth of the interface recessed portion 41$a_9$. Moreover, for example, the depth of the interface recessed portion 41$a_9$ is shorter than five times the wavelength (λ) of the light L2. This definition can also be referred to as the upper limit for the depth of the interface recessed portion 41$a_9$.

The aforementioned wavelength (λ) of the light L2 is a value based on the refractive index of the photoelectric conversion layer 40$_9$. For example, it is assumed that the refractive index of the light L2 in a vacuum state is 940 nm. A main material of the photoelectric conversion layer 40$_9$ is silicon. The real part of the refractive index of silicon is 3.59. Therefore, the wavelength of the light L2 in silicon is 262 nm.

The depth of the interface recessed portion 41$a_9$ may be equal to or longer than 1/10 of 262 nm, for example. The depth of the interface recessed portion 41$a_9$ may be shorter than five times 262 nm, for example. As an example, the depth of the interface recessed portion 41$a_9$ may be 405 nm. In this case, the depth of the interface recessed portion 41$a_9$ (405 nm) is approximately 1.55 times the wavelength (262 nm). The width of the interface recessed portion 41$a_9$ may be 285 nm as an example.

In a plan view of the metal structures 27$a$ of the light scattering unit 27 and the interface recessed portion 41$a_9$, the interface recessed portion 41$a_9$ in its entirety may overlap the metal structure 27$a$. A part of the interface recessed portion 41$a_9$ may overlap the metal structure 27$a$, and other parts may not overlap the metal structure 27$a$. In other words, other parts of the interface recessed portion 41$a_9$ may overlap a gap between the metal structures 27$a$ adjacent to each other. Moreover, the interface recessed portion 41$a_9$ in its entirety may not overlap the metal structure 27$a$. In other words, the interface recessed portion 41$a_9$ in its entirety may overlap a gap between the metal structures 27$a$ adjacent to each other.

Figure 43:
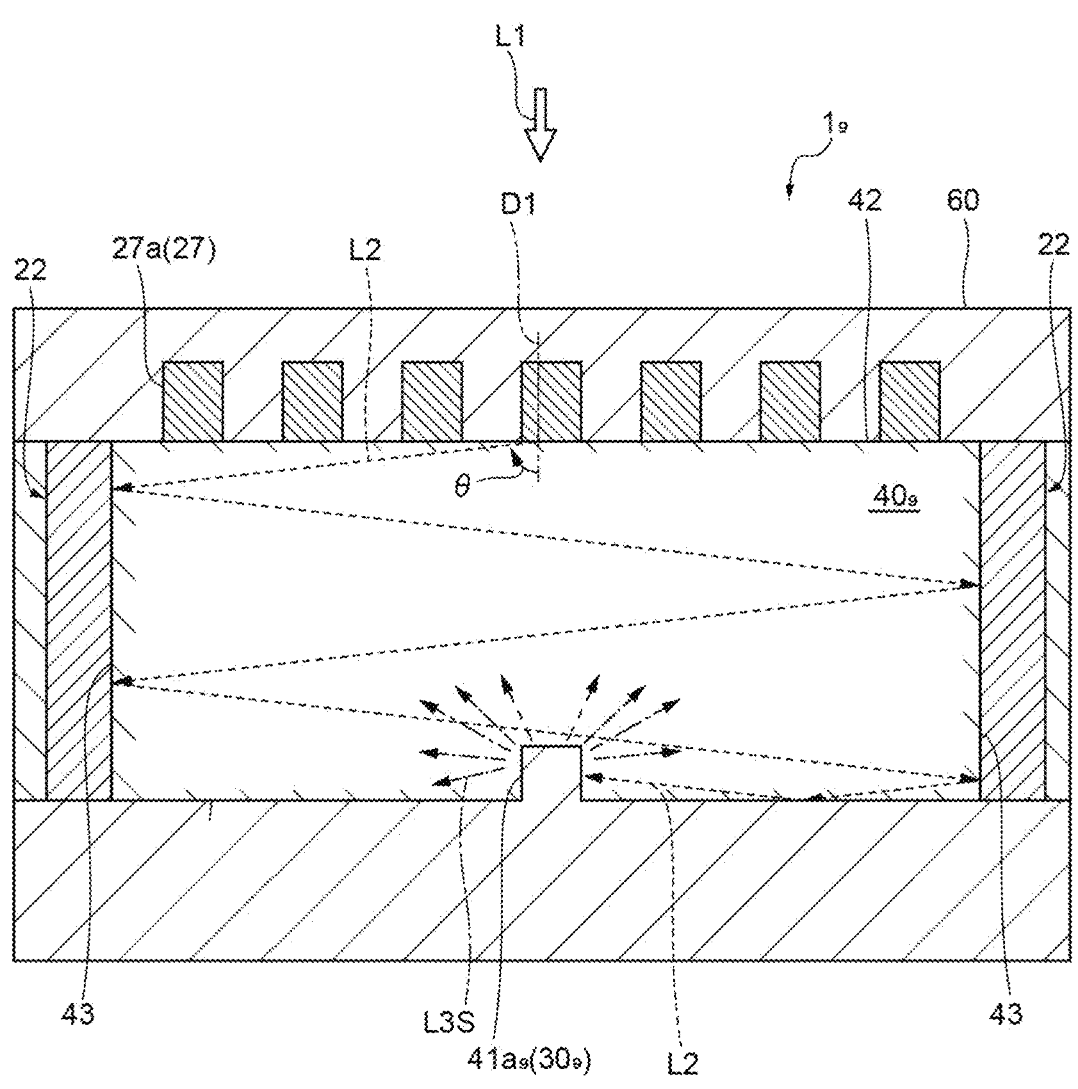
FIG. 43 is a view schematically illustrating a situation in which light travels forward inside a photoelectric conversion layer $\mathbf{40}_9$ of a solid-state imaging device $\mathbf{1}_9$ of the third embodiment.

FIG. 43 schematically illustrates a situation in which light travels forward inside the photoelectric conversion layer 40$_9$ of the solid-state imaging device 1$_9$ of the third embodiment. The light scattering unit 27 receives the light L1 and emits the light L2. The traveling direction of the light L2 is at the angle (θ) with the normal direction of the insulating layer side interface 42 as the reference axis D1. The light L2 is incident on the interface recessed portion 41$a_9$ of the wiring layer side interface $41_9$ through a plurality of times of reflection in the DTI side interface 43.

The interface recessed portion $41a_9$ having the light L2 incident thereon emits scattered light L3S. The direction of the light L3S is distributed around the interface recessed portion $41a_9$. Due to this scattering, the traveling direction of light is changed. Therefore, the interface recessed portion $41a_9$ is a light direction changer. The light L3S incident on the light scattering unit 27 again includes a component incident on the light scattering unit 27 at an incidence angle different from the angle (θ) of the light L2. As a result, since the situation of diffraction in the light scattering unit 27 differs from the case of incidence, emission of the light L3S from the photoelectric conversion layer $40_9$ to the outside is curbed.

Therefore, the interface recessed portion $41a_9$ can also be referred to as a light scattering body. The solid-state imaging device $1_9$ of the third embodiment has the light scattering unit 27 provided in the insulating layer side interface 42, and a scattering body that is the interface recessed portion $41a_9$ provided in the wiring layer side interface $41_9$. Namely, the solid-state imaging device $1_9$ of the third embodiment has a function of scattering two rays of light. Scattering exhibited by the light scattering unit 27 increases the incidence angle with respect to the photoelectric conversion layer $40_9$. When light traveling forward in the photoelectric conversion layer $40_9$ is incident on the light scattering unit 27 again, scattering exhibited by the interface recessed portion $41a_9$ causes the incidence angle thereof to differ from the diffraction angle.

Modification Examples of Third Embodiment

The light direction changing unit $30_1$ need only have a shape causing scattering of light and is not limited to the shape of the solid-state imaging device $1_9$ of the third embodiment.

Modification Example 1 of Third Embodiment

FIG. 44(*a*) is a cross-sectional view illustrating a structure of a solid-state imaging device $1_{10}$ of Modification Example 1 of the third embodiment. FIG. 44(*b*) is a perspective view illustrating a wiring layer side interface $41_{10}$ of a photoelectric conversion layer $40_{10}$ included in the solid-state imaging device $1_{10}$. A plurality of interface recessed portions $41a_{10}$ may be provided in the wiring layer side interface $41_{10}$. The plurality of interface recessed portions $41a_{10}$ constitute a light direction changing unit $30_{10}$. The shape of the single interface recessed portion $41a_{10}$ may be the same as that of the interface recessed portion $41a_9$ of the third embodiment. The plurality of interface recessed portions $41a_{10}$ are provided in a direction of an X axis. The plurality of interface recessed portions $41a_{10}$ are provided in a direction of a Y axis orthogonal to the X axis. Namely, the plurality of interface recessed portions $41a_{10}$ are disposed in a grating shape. The intervals between the interface recessed portions $41a_{10}$ may be the same as each other. Namely, the plurality of interface recessed portions $41a_{10}$ may be regularly disposed. In addition, the intervals between the interface recessed portions $41a_{10}$ may differ from each other. Namely, the plurality of interface recessed portions $41a_{10}$ may be irregularly disposed.

Modification Example 2 of Third Embodiment

FIG. 45(*a*) is a cross-sectional view illustrating a structure of a solid-state imaging device $1_1$ of Modification Example 2 of the third embodiment. FIG. 45(*b*) is a perspective view illustrating a wiring layer side interface $41_{11}$ of a photoelectric conversion layer $40_{11}$ included in the solid-state imaging device $1_{11}$. The solid-state imaging device $1_{11}$ of Modification Example 2 of the third embodiment has one interface recessed portion $41a_{11}$. The one interface recessed portion $41a_{11}$ constitutes a light direction changing unit $30_{11}$. For example, the interface recessed portion $41a_9$ of the third embodiment had a square shape in a plan view. On the other hand, the interface recessed portion $41a_{11}$ of Modification Example 2 of the third embodiment has a rectangular shape in a plan view. Namely, the interface recessed portion $41a_{11}$ has a stripe shape. Furthermore, the length of long sides is longer than the length of short sides. The interface recessed portion $41a_{11}$ may extend from one DTI 22 to another DTI 22. The depth of the interface recessed portion $41a_{11}$ may be the same as that of the interface recessed portion $41a_9$ of the third embodiment.

(Seventh Examination)

In the seventh examination, effects of the structure of the solid-state imaging device $1_{11}$ of Modification Example 2 were confirmed. In the interface recessed portion $41a_{11}$ that is a light direction changer, the depth was set to 405 nm, and the width was set to 285 nm. According to the results of the seventh examination shown in FIG. 30(*b*), when the light L1 is assumed to be 100%, it can be ascertained that the respective proportions are as follows.

Zero-order reflected light: 10.2%

Scattered reflected light: 4.7%

Transmitted light: 20.2%

Light absorbed into trench: 8.9%

Light absorbed into silver: 12.1%

Light absorbed into silicon: 42.1%

Total: 98.1%

The numerical values of the fifth examination and the numerical values of the seventh examination are compared to each other.

Regarding zero-order reflected light, results indicating that the seventh examination was more advantageous than the fifth examination were obtained. Specifically, zero-order reflected light of the fifth examination was 43.6%. On the other hand, zero-order reflected light of the seventh examination was 10.2%. Namely, the proportion of zero-order reflected light could be reduced by providing the interface recessed portion $41a_{11}$ that is a scattering body.

Regarding light absorbed into silicon, results indicating that the seventh examination was more advantageous than the fifth examination were obtained. Specifically, light absorbed into silicon of the fifth examination was 26.6%. On the other hand, light absorbed into silicon of the seventh examination was 42.0%. Namely, the proportion of light absorbed into silicon could be increased by providing the interface recessed portion $41a_{11}$ that is a scattering body.

Regarding transmitted light, no meaningful difference appeared between the results of the fifth examination and the results of the seventh examination.

As a result of comparison between the fifth examination and the seventh examination, according to the interface recessed portion $41a_{11}$ that is a light scattering body, it can be ascertained that light can be emitted at an angle different from the reflection angle in the case of the wiring unit side interface 26*b* that is a flat surface.

Modification Example 3 of Third Embodiment

FIG. 46(*a*) is a cross-sectional view illustrating a structure of a solid-state imaging device $1_{12}$ of Modification Example 3 of the third embodiment. FIG. 46(*b*) is a perspective view illustrating a wiring layer side interface $\mathbf{41}_{12}$ of a photoelectric conversion layer $\mathbf{40}_{12}$ included in the solid-state imaging device $\mathbf{1}_{12}$. The solid-state imaging device $\mathbf{1}_{12}$ of Modification Example 3 of the third embodiment has a plurality of interface recessed portions $\mathbf{41}a_{12}$. The plurality of interface recessed portions $\mathbf{41}a_{12}$ constitute a light direction changing unit $\mathbf{30}_{12}$. The shape of the single interface recessed portion $\mathbf{41}a_{12}$ may be the same as that of the interface recessed portion $\mathbf{41}a_{11}$ of Modification Example 2 of the third embodiment. The plurality of interface recessed portions $\mathbf{41}a_{12}$ are provided away from each other in a second direction orthogonal to a first direction in which the interface recessed portions $\mathbf{41}a_{12}$ extend.

(Eighth Examination)

In the eighth examination, effects of the structure of the solid-state imaging device $\mathbf{1}_{12}$ of Modification Example 3 were confirmed. In the interface recessed portions $\mathbf{41}a_{12}$ that is a light direction changer, the depth was set to 405 nm, and the width was set to 285 nm. The number of interface recessed portions $\mathbf{41}a_{12}$ was 23. According to the results of the eighth examination shown in FIG. 30(*b*), when the incident light L1 is assumed to be 100%, it can be ascertained that the respective proportions are as follows.

Zero-order reflected light: 27.6%
Scattered reflected light: 3.4%
Transmitted light: 17.5%
Light absorbed into trench: 7.0%
Light absorbed into silver: 12.3%
Light absorbed into silicon: 30.8%
Total: 98.6%

The numerical values of the fifth examination and the numerical values of the eighth examination are compared to each other.

Regarding zero-order reflected light, results indicating that the seventh examination was more advantageous than the fifth examination were obtained. Specifically, zero-order reflected light of the fifth examination was 43.6%. On the other hand, zero-order reflected light of the eighth examination was 27.7%. Namely, the proportion of zero-order reflected light could be reduced by providing the interface recessed portions $\mathbf{41}a_{12}$ that are scattering bodies.

Regarding transmitted light, results indicating that the eighth examination was more advantageous than the fifth examination were obtained. Specifically, transmitted light of the fifth examination was 19.1%. On the other hand, transmitted light of the eighth examination was 17.5%. Namely, the proportion of transmitted light could be reduced by providing the interface recessed portions $\mathbf{41}a_{12}$ that are scattering bodies.

Regarding light absorbed into silicon, results indicating that the eighth examination was more advantageous than the fifth examination were obtained. Specifically, light absorbed into silicon of the fifth examination was 26.6%. On the other hand, light absorbed into silicon of the eighth examination was 30.8%. Namely, the proportion of light absorbed into silicon could be increased by providing the interface recessed portions $\mathbf{41}a_{12}$ that are scattering bodies.

Modification Example 4 of Third Embodiment

FIG. 47(*a*) is a cross-sectional view illustrating a structure of a solid-state imaging device $\mathbf{1}_{13}$ of Modification Example 4 of the third embodiment. FIG. 47(*b*) is a perspective view illustrating a wiring layer side interface $\mathbf{41}_{13}$ of a photoelectric conversion layer $\mathbf{40}_{13}$ included in the solid-state imaging device $\mathbf{1}_{13}$. The interface recessed portion $\mathbf{41}a_{9}$ of the third embodiment had a rectangular parallelepiped shape. The shape of the interface recessed portion is not limited to a rectangular parallelepiped. For example, an interface recessed portion $\mathbf{41}a_{13}$ of Modification Example 4 of the third embodiment has a quadrangular pyramidal shape. When the interface recessed portion $\mathbf{41}a_{13}$ has a quadrangular pyramidal shape, the interface recessed portion $\mathbf{41}a_{13}$ has a triangular cross-sectional shape. The solid-state imaging device $\mathbf{1}_{13}$ of Modification Example 4 of the third embodiment has one interface recessed portion $\mathbf{41}a_{13}$. The one interface recessed portion $\mathbf{41}a_{13}$ constitutes a light direction changing unit $\mathbf{30}_{13}$. Similar to the interface recessed portion $\mathbf{41}a_{9}$, the interface recessed portion $\mathbf{41}a_{13}$ is provided almost at the center of a region surrounded by the DTIs 22. In addition, the depth of the interface recessed portion $\mathbf{41}a_{13}$ may be the same as the width of the interface recessed portion $\mathbf{41}a_{9}$. The length of the interface recessed portion $\mathbf{41}a_{13}$ on a bottom side may also be the same as the width of the interface recessed portion $\mathbf{41}a_{9}$.

Modification Example 5 of Third Embodiment

FIG. 48(*a*) is a cross-sectional view illustrating a structure of a solid-state imaging device $\mathbf{1}_{14}$ of Modification Example 5 of the third embodiment. FIG. 48(*b*) is a perspective view illustrating a wiring layer side interface $\mathbf{41}_{14}$ of a photoelectric conversion layer $\mathbf{40}_{14}$ included in the solid-state imaging device $\mathbf{1}_{14}$. A plurality of interface recessed portions $\mathbf{41}a_{14}$ may be provided in the wiring layer side interface $\mathbf{41}_{14}$. The plurality of interface recessed portions $\mathbf{41}a_{14}$ constitute a light direction changing unit $\mathbf{30}_{14}$. The shape of the single interface recessed portion $\mathbf{41}a_{14}$ may be the same as that of the interface recessed portion $\mathbf{41}a_{12}$ of Modification Example 3 of the third embodiment. The plurality of interface recessed portions $\mathbf{41}a_{14}$ are provided in a direction of the X axis. The plurality of interface recessed portions $\mathbf{41}a_{14}$ are provided in a direction of the Y axis. Namely, the plurality of interface recessed portions $\mathbf{41}a_{14}$ are disposed in a grating shape.

Modification Example 6 of Third Embodiment

FIG. 49(*a*) is a cross-sectional view illustrating a structure of a solid-state imaging device $\mathbf{1}_{15}$ of Modification Example 6 of the third embodiment. FIG. 49(*b*) is a perspective view illustrating a wiring layer side interface $\mathbf{41}_{15}$ of a photoelectric conversion layer $\mathbf{40}_{15}$ included in the solid-state imaging device $\mathbf{1}_{15}$. The solid-state imaging device $\mathbf{1}_{15}$ has one interface recessed portion $\mathbf{41}a_{15}$. The one interface recessed portion $\mathbf{41}a_{15}$ constitutes a light direction changing unit $\mathbf{30}_{15}$. The interface recessed portion $\mathbf{41}a_{15}$ of the solid-state imaging device $\mathbf{1}_{15}$ has a triangular stripe cross-sectional shape. Similar to the interface recessed portion $\mathbf{41}a_{11}$ of Modification Example 2 of the third embodiment, the interface recessed portion $\mathbf{41}a_{15}$ may also extend from one DTI 22 to another DTI 22.

Modification Example 7 of Third Embodiment

FIG. 50(*a*) is a cross-sectional view illustrating a structure of a solid-state imaging device $\mathbf{1}_{16}$ of Modification Example 7 of the third embodiment. FIG. 50(*b*) is a perspective view illustrating a wiring layer side interface $\mathbf{41}_{16}$ of a photoelectric conversion layer $\mathbf{40}_{16}$ included in the solid-state imaging device $\mathbf{1}_{16}$. A plurality of interface recessed portions $\mathbf{41}a_{16}$ may be provided in the wiring layer side interface $\mathbf{41}_{16}$. The plurality of interface recessed portions $\mathbf{41}a_{16}$ constitute a light direction changing unit $\mathbf{30}_{16}$. The shape of the single interface recessed portion $\mathbf{41}a_{16}$ may be the same as that of the interface recessed portion $\mathbf{41}a_{15}$ of Modification Example 6 of the third embodiment. The plurality of interface recessed portions $\mathbf{41}a_{16}$ are provided away from each other in a different direction orthogonal to a direction in which the interface recessed portions $\mathbf{41}a_{16}$ extend.

Modification Example 8 of Third Embodiment

FIG. 51(*a*) is a cross-sectional view illustrating a structure of a solid-state imaging device $\mathbf{1}_{17}$ of Modification Example 8 of the third embodiment. FIG. 51(*b*) is a perspective view illustrating a wiring layer side interface $\mathbf{41}_{17}$ of a photoelectric conversion layer $\mathbf{40}_{17}$ included in the solid-state imaging device $\mathbf{1}_{17}$. The interface recessed portion $\mathbf{41}a_{9}$ of the third embodiment had a rectangular parallelepiped shape. The shape of the interface recessed portion is not limited to a rectangular parallelepiped. For example, an interface recessed portion $\mathbf{41}a_{17}$ of Modification Example 8 of the third embodiment has a shape including a curved surface. When the interface recessed portion $\mathbf{41}a_{17}$ has a curved surface shape, the interface recessed portion $\mathbf{41}a_{17}$ has a cross-sectional shape including an arc. For example, the cross-sectional shape of the interface recessed portion $\mathbf{41}a_{17}$ is a part of an oval. The solid-state imaging device $\mathbf{1}_{17}$ of Modification Example 8 of the third embodiment has one interface recessed portion $\mathbf{41}a_{17}$. The one interface recessed portion $\mathbf{41}a_{17}$ constitutes a light direction changing unit $\mathbf{30}_{17}$. Similar to the interface recessed portion $\mathbf{41}a_{9}$, the interface recessed portion $\mathbf{41}a_{17}$ is provided almost at the center of a region surrounded by the DTIs 22. In addition, the depth of the interface recessed portion $\mathbf{41}a_{17}$ may be the same as the depth of the interface recessed portion $\mathbf{41}a_{9}$. The diameter of the interface recessed portion $\mathbf{41}a_{17}$ may also be the same as the width of the interface recessed portion $\mathbf{41}a_{9}$.

Modification Example 9 of Third Embodiment

FIG. 52(*a*) is a cross-sectional view illustrating a structure of a solid-state imaging device $\mathbf{1}_{18}$ of Modification Example 9 of the third embodiment. FIG. 52(*b*) is a perspective view illustrating a wiring layer side interface $\mathbf{41}_{18}$ of a photoelectric conversion layer $\mathbf{40}_{18}$ included in the solid-state imaging device $\mathbf{1}_{18}$. A plurality of interface recessed portions $\mathbf{41}a_{18}$ may be provided in the wiring layer side interface $\mathbf{41}_{18}$. The plurality of interface recessed portions $\mathbf{41}a_{18}$ constitute a light direction changing unit $\mathbf{30}_{18}$. The shape of the single interface recessed portion $\mathbf{41}a_{18}$ may be the same as that of the interface recessed portion $\mathbf{41}a_{16}$ of Modification Example 8 of the third embodiment. The plurality of interface recessed portions $\mathbf{41}a_{18}$ are provided in a direction of the X axis. The plurality of interface recessed portions $\mathbf{41}a_{18}$ are provided in a direction of the Y axis. Namely, the plurality of interface recessed portions $\mathbf{41}a_{18}$ are disposed in a grating shape.

Modification Example 10 of Third Embodiment

FIG. 53(*a*) is a cross-sectional view illustrating a structure of a solid-state imaging device $\mathbf{1}_{19}$ of Modification Example 10 of the third embodiment. FIG. 53(*b*) is a perspective view illustrating a wiring layer side interface $\mathbf{41}_{19}$ of a photoelectric conversion layer $\mathbf{40}_{19}$ included in the solid-state imaging device $\mathbf{1}_{19}$. The solid-state imaging device $\mathbf{1}_{19}$ has one interface recessed portion $\mathbf{41}a_{19}$. The one interface recessed portion $\mathbf{41}a_{19}$ constitutes a light direction changing unit $\mathbf{30}_{19}$. The interface recessed portion $\mathbf{41}a_{19}$ of the solid-state imaging device $\mathbf{1}_{19}$ has an oval cross-sectional shape. The interface recessed portion $\mathbf{41}a_{19}$ corresponds to a surface of a swept body extending in a predetermined direction. The interface recessed portion $\mathbf{41}a_{19}$ has a stripe shape. The interface recessed portion $\mathbf{41}a_{19}$ may also extend from one DTI 22 to another DTI 22.

Modification Example 11 of Third Embodiment

FIG. 54(*a*) is a cross-sectional view illustrating a structure of a solid-state imaging device $\mathbf{1}_{20}$ of Modification Example 11 of the third embodiment. FIG. 54(*b*) is a perspective view illustrating a wiring layer side interface $\mathbf{41}_{20}$ of a photoelectric conversion layer $\mathbf{40}_{20}$ included in the solid-state imaging device $\mathbf{1}_{20}$. A plurality of interface recessed portion $\mathbf{41}a_{20}$ may be provided in the wiring layer side interface $\mathbf{41}_{20}$. The plurality of interface recessed portions $\mathbf{41}a_{20}$ constitute a light direction changing unit $\mathbf{30}_{20}$. The shape of the single interface recessed portion $\mathbf{41}a_{20}$ may be the same as that of the interface recessed portion $\mathbf{41}a_{19}$ of Modification Example 10 of the third embodiment. The plurality of interface recessed portions $\mathbf{41}a_{20}$ are provided away from each other in a different direction orthogonal to a direction in which the interface recessed portion $\mathbf{41}a_{20}$ extend.

A light direction changing unit $\mathbf{30}_{9}$ and the like of the third embodiment were recessed portions hollower than the interface flat portion $\mathbf{41}b_{9}$. The light direction changing unit that is a light scattering body may be a projecting portion protruding beyond the interface flat portion $\mathbf{41}b_{9}$. Hereinafter, examples in which the light direction changing unit is a projecting portion will be described as Modification Examples 12 to 23 of the third embodiment.

Modification Example 12 of Third Embodiment

FIG. 55(*a*) is a cross-sectional view illustrating a structure of a solid-state imaging device $\mathbf{1}_{21}$ of Modification Example 12 of the third embodiment. FIG. 55(*b*) is a perspective view illustrating a wiring layer side interface $\mathbf{41}_{21}$ of a photoelectric conversion layer $\mathbf{40}_{21}$ included in the solid-state imaging device $\mathbf{1}_{21}$. The wiring layer side interface $\mathbf{41}_{21}$ has an interface projecting portion $\mathbf{41}a_{21}$ and an interface flat portion $\mathbf{41}b_{21}$. The solid-state imaging device $\mathbf{1}_{21}$ has one interface projecting portion $\mathbf{41}a_{21}$. The one interface projecting portion $\mathbf{41}a_{21}$ constitutes a light direction changing unit $\mathbf{30}_{21}$. The interface projecting portion $\mathbf{41}a_{21}$ protrudes to a wiring layer $\mathbf{50}_{21}$ side. The interface projecting portion $\mathbf{41}a_{21}$ is disposed in a wiring layer recessed portion $\mathbf{51}t_{21}$ hollow from a wiring layer main surface $\mathbf{51}_{21}$ of the wiring layer $\mathbf{50}_{21}$. Similar to the interface recessed portion $\mathbf{41}a_{9}$, the interface projecting portion $\mathbf{41}a_{21}$ is provided almost at the center of a region surrounded by the DTIs 22. The height of the interface projecting portion $\mathbf{41}a_{21}$ may be the same as that of the interface recessed portion $\mathbf{41}a_{9}$. The width of the interface projecting portion $\mathbf{41}a_{21}$ may also be the same as that of the interface recessed portion $\mathbf{41}a_{9}$.

Modification Example 13 of Third Embodiment

FIG. 56(*a*) is a cross-sectional view illustrating a structure of a solid-state imaging device $\mathbf{1}_{22}$ of Modification Example 13 of the third embodiment. FIG. 56(*b*) is a perspective view illustrating a wiring layer side interface $\mathbf{41}_{22}$ of a photoelectric conversion layer $\mathbf{40}_{22}$ included in the solid-state imaging device $\mathbf{1}_{22}$. The solid-state imaging device $\mathbf{1}_{22}$ of Modification Example 13 of the third embodiment has a plurality of interface projecting portions $41a_{22}$. The plurality of interface projecting portions $41a_{22}$ constitute a light direction changing unit $30_{22}$. The shape of the single interface projecting portion $41a_{22}$ may be the same as that of the interface projecting portion $41a_{21}$ of Modification Example 12 of the third embodiment. The plurality of interface projecting portions $41a_{22}$ are provided in a direction of the X axis. The plurality of interface projecting portions $41a_{22}$ are provided in a direction of the Y axis orthogonal to the X axis. Namely, the plurality of interface projecting portions $41a_{22}$ are disposed in a grating shape. The intervals of the interface projecting portions $41a_{22}$ may be the same as each other. Namely, the plurality of interface projecting portions $41a_{22}$ may be regularly disposed. In addition, the intervals of the interface projecting portions $41a_{22}$ may differ from each other. Namely, the plurality of interface projecting portions $41a_{22}$ may be irregularly disposed.

Modification Example 14 of Third Embodiment

FIG. 57(*a*) is a cross-sectional view illustrating a structure of a solid-state imaging device $1_{23}$ of Modification Example 14 of the third embodiment. FIG. 57(*b*) is a perspective view illustrating a wiring layer side interface $41_{23}$ of a photoelectric conversion layer $40_{23}$ included in the solid-state imaging device $1_{23}$. The solid-state imaging device $1_{23}$ of Modification Example 14 of the third embodiment has one interface projecting portion $41a_{23}$. The one interface projecting portion $41a_{23}$ constitutes a light direction changing unit $30_{23}$. The interface projecting portion $41a_{23}$ of Modification Example 14 of the third embodiment has a rectangular shape in a plan view. Namely, the interface projecting portion $41a_{23}$ has a stripe shape. The interface projecting portion $41a_{23}$ may extend from one DTI 22 to another DTI 22.

Modification Example 15 of Third Embodiment

FIG. 58(*a*) is a cross-sectional view illustrating a structure of a solid-state imaging device $1_{24}$ of Modification Example 15 of the third embodiment. FIG. 58(*b*) is a perspective view illustrating a wiring layer side interface $41_{24}$ of a photoelectric conversion layer $40_{24}$ included in the solid-state imaging device $1_{24}$. The solid-state imaging device $1_{24}$ of Modification Example 15 of the third embodiment has a plurality of interface projecting portions $41a_{24}$. The plurality of interface projecting portions $41a_{24}$ constitute a light direction changing unit $30_{24}$. The shape of the single interface projecting portion $41a_{24}$ may be the same as that of the interface projecting portion $41a_{23}$ of Modification Example 14 of the third embodiment. The plurality of interface projecting portions $41a_{24}$ are provided away from each other in the second direction orthogonal to the first direction in which the interface projecting portions $41a_{24}$ extend.

Modification Example 16 of Third Embodiment

FIG. 59(*a*) is a cross-sectional view illustrating a structure of a solid-state imaging device $1_{25}$ of Modification Example 16 of the third embodiment. FIG. 59(*b*) is a perspective view illustrating a wiring layer side interface $41_{25}$ of a photoelectric conversion layer $40_{25}$ included in the solid-state imaging device $1_{25}$. The interface projecting portion $41a_{21}$ of Modification Example 12 of the third embodiment had a rectangular parallelepiped shape. The shape of the interface projecting portion is not limited to a rectangular parallelepiped. For example, an interface projecting portion $41a_{25}$ of Modification Example 16 of the third embodiment has a quadrangular pyramidal shape. When the interface projecting portion $41a_{25}$ has a quadrangular pyramidal shape, the interface projecting portion $41a_{25}$ has a triangular cross-sectional shape. The solid-state imaging device $1_{25}$ of Modification Example 16 of the third embodiment has one interface projecting portion $41a_{25}$. The one interface projecting portion $41a_{25}$ constitutes a light direction changing unit $30_{25}$. The interface projecting portion $41a_{25}$ is provided almost at the center of a region surrounded by the DTIs 22.

Modification Example 17 of Third Embodiment

FIG. 60(*a*) is a cross-sectional view illustrating a structure of a solid-state imaging device $1_{26}$ of Modification Example 17 of the third embodiment. FIG. 60(*b*) is a perspective view illustrating a wiring layer side interface $41_{26}$ of a photoelectric conversion layer $40_{26}$ included in the solid-state imaging device $1_{26}$. The solid-state imaging device $1_{26}$ of Modification Example 17 of the third embodiment has a plurality of interface projecting portions $41a_{26}$. The plurality of interface projecting portions $41a_{26}$ constitute a light direction changing unit $30_{26}$. The shape of the single interface projecting portion $41a_{26}$ may be the same as that of the interface projecting portion $41a_{25}$ of Modification Example 16 of the third embodiment. The plurality of interface projecting portions $41a_{26}$ are provided in a direction of the X axis. The plurality of interface projecting portions $41a_{26}$ are provided in a direction of the Y axis orthogonal to the X axis. Namely, the plurality of interface projecting portions $41a_{26}$ are disposed in a grating shape. The intervals of the interface projecting portions $41a_{26}$ may be the same as each other. Namely, the plurality of interface projecting portions $41a_{26}$ may be regularly disposed. In addition, the intervals of the interface projecting portions $41a_{26}$ may differ from each other. Namely, the plurality of interface projecting portions $41a_{26}$ may be irregularly disposed.

Modification Example 18 of Third Embodiment

FIG. 61(*a*) is a cross-sectional view illustrating a structure of a solid-state imaging device $1_{27}$ of Modification Example 18 of the third embodiment. FIG. 61(*b*) is a perspective view illustrating a wiring layer side interface $41_{27}$ of a photoelectric conversion layer $40_{27}$ included in the solid-state imaging device $1_{27}$. The solid-state imaging device $1_{27}$ has one interface projecting portion $41a_{27}$. The one interface projecting portion $41a_{27}$ constitutes a light direction changing unit $30_{27}$. The interface projecting portion $41a_{27}$ of the solid-state imaging device $1_{27}$ has an oval cross-sectional shape. The interface projecting portion $41a_{27}$ has a stripe shape extending in a predetermined direction. The interface projecting portion $41a_{27}$ may also extend from one DTI 22 to another DTI 22.

Modification Example 19 of Third Embodiment

FIG. 62(*a*) is a cross-sectional view illustrating a structure of a solid-state imaging device $1_{28}$ of Modification Example 19 of the third embodiment. FIG. 62(*b*) is a perspective view illustrating a wiring layer side interface $41_{28}$ of a photoelectric conversion layer $40_{28}$ included in the solid-state imaging device $1_{28}$. A plurality of interface projecting portion $41a_{28}$ may be provided in the wiring layer side interface $41_{28}$. The plurality of interface projecting portions $41a_{28}$ constitute a light direction changing unit $30_{28}$. The shape of the single interface projecting portion $41a_{28}$ may be the same as that of the interface projecting portion $41a_{27}$ of Modification Example 18 of the third embodiment. The plurality of interface projecting portions 41$a_{28}$ are provided away from each other in a different direction orthogonal to a direction in which the interface projecting portions 41$a_{28}$ extend.

Modification Example 20 of Third Embodiment

FIG. 63(*a*) is a cross-sectional view illustrating a structure of a solid-state imaging device 1$_{29}$ of Modification Example 20 of the third embodiment. FIG. 63(*b*) is a perspective view illustrating a wiring layer side interface 41$_{29}$ of a photoelectric conversion layer 40$_{29}$ included in the solid-state imaging device 1$_{29}$. The shape of the interface recessed portion is not limited to a rectangular parallelepiped. For example, an interface projecting portion 41$a_{29}$ of Modification Example 20 of the third embodiment has a shape including a curved surface. When the interface projecting portion 41$a_{29}$ has a shape including a curved surface, for example, the cross-sectional shape of the interface projecting portion 41$a_{29}$ is a part of an oval. The solid-state imaging device 1$_{29}$ of Modification Example 20 of the third embodiment has one interface projecting portion 41$a_{29}$. The one interface projecting portion 41$a_{29}$ constitutes a light direction changing unit 30$_{29}$. The interface projecting portion 41$a_{29}$ is provided almost at the center of a region surrounded by the DTIs 22. In addition, the height of the interface projecting portion 41$a_{29}$ may be the same as the depth of the interface projecting portion 41$a_{21}$. The diameter of the interface projecting portion 41$a_{29}$ may also be the same as the width of the interface projecting portion 41$a_{21}$.

Modification Example 21 of Third Embodiment

FIG. 64(*a*) is a cross-sectional view illustrating a structure of a solid-state imaging device 1$_{30}$ of Modification Example 21 of the third embodiment. FIG. 64(*b*) is a perspective view illustrating a wiring layer side interface 41$_{30}$ of a photoelectric conversion layer 40$_{30}$ included in the solid-state imaging device 1$_{30}$. The solid-state imaging device 1$_{30}$ of Modification Example 21 of the third embodiment has a plurality of interface projecting portions 41$a_{30}$. The plurality of interface projecting portions 41$a_{30}$ constitute a light direction changing unit 30$_{30}$. The shape of the single interface projecting portion 41$a_{30}$ may be the same as that of the interface projecting portion 41$a_{29}$ of Modification Example 20 of the third embodiment. The plurality of interface projecting portions 41$a_{30}$ are provided in a direction of the X axis. The plurality of interface projecting portions 41$a_{30}$ are provided in a direction of the Y axis orthogonal to the X axis. Namely, the plurality of interface projecting portions 41$a_{30}$ are disposed in a grating shape. The intervals of the interface projecting portions 41$a_{30}$ may be the same as each other. Namely, the plurality of interface projecting portions 41$a_{30}$ may be regularly disposed. In addition, the intervals of the interface projecting portions 41$a_{30}$ may differ from each other. Namely, the plurality of interface projecting portions 41$a_{30}$ may be irregularly disposed.

Modification Example 22 of Third Embodiment

FIG. 65(*a*) is a cross-sectional view illustrating a structure of a solid-state imaging device 1$_{31}$ of Modification Example 22 of the third embodiment. FIG. 65(*b*) is a perspective view illustrating a wiring layer side interface 41$_{31}$ of a photoelectric conversion layer 40$_{31}$ included in the solid-state imaging device 1$_{31}$. The solid-state imaging device 1$_{31}$ of Modification Example 22 of the third embodiment has one interface projecting portion 41$a_{31}$. The one interface projecting portion 41$a_{31}$ constitutes a light direction changing unit 30$_{31}$. The interface projecting portion 41$a_{31}$ of Modification Example 22 of the third embodiment has a rectangular shape in a plan view. Namely, the interface projecting portion 41$a_{31}$ has a stripe shape. The interface projecting portion 41$a_{31}$ may extend from one DTI 22 to another DTI 22.

Modification Example 23 of Third Embodiment

FIG. 66(*a*) is a cross-sectional view illustrating a structure of a solid-state imaging device 1$_{32}$ of Modification Example 23 of the third embodiment. FIG. 66(*b*) is a perspective view illustrating a wiring layer side interface 41$_{32}$ of a photoelectric conversion layer 40$_{32}$ included in the solid-state imaging device 1$_{32}$. The solid-state imaging device 1$_{32}$ of Modification Example 23 of the third embodiment has a plurality of interface projecting portions 41$a_{32}$. The plurality of interface projecting portions 41$a_{32}$ constitute a light direction changing unit 30$_{32}$. The shape of the single interface projecting portion 41$a_{32}$ may be the same as that of the interface projecting portion 41$a_{31}$ of Modification Example 22 of the third embodiment. The plurality of interface projecting portions 41$a_{32}$ are provided away from each other in the second direction orthogonal to the first direction in which the interface projecting portions 41$a_{32}$ extend.

Other Modification Examples

The solid-state imaging device 1$_1$ of the second embodiment and the solid-state imaging devices 1$_2$ to 1$_8$ of the modification examples of the second embodiment include the light scattering unit 27 generating diffracted light caused by plasmons. Similarly, the solid-state imaging device 1$_9$ of the third embodiment and the solid-state imaging devices 1$_{10}$ to 1$_{32}$ of Modification Examples 1 to 23 also include the light scattering unit 27 generating diffracted light caused by plasmons. The light scattering unit 27 may be changed to another element. The light scattering unit may have a pyramidal structure in which fine unevenness is formed on a light incidence surface.

A solid-state imaging device 1A$_1$ illustrated in FIG. 67(*a*) is a modification example of the solid-state imaging device 1$_1$ of the second embodiment and the solid-state imaging device 1$_2$ of the modification example. The solid-state imaging device 1A$_1$ has a pyramidal structure 70 as the light scattering unit.

A solid-state imaging device 1A$_3$ illustrated in FIG. 67(*b*) is an alternative modification example of the solid-state imaging devices 1$_3$ and 1$_4$ of the modification examples of the second embodiment. A solid-state imaging device 1A$_3$ has the pyramidal structure 70 as the light scattering unit.

A solid-state imaging device 1A$_5$ illustrated in FIG. 67(*c*) is an alternative modification example of the solid-state imaging devices 1$_5$ and 1$_6$ of the modification examples of the second embodiment. The solid-state imaging device 1A$_5$ has the pyramidal structure 70 as the light scattering unit.

A solid-state imaging device 1A$_7$ illustrated in FIG. 67(*d*) is an alternative modification example of the solid-state imaging devices 1$_7$ and 1$_8$ of the modification examples of the second embodiment. The solid-state imaging device 1A$_7$ has the pyramidal structure 70 as the light scattering unit.

A solid-state imaging device 1A$_9$ illustrated in FIG. 68(*a*) is an alternative modification example of the solid-state imaging device 1$_9$ of the third embodiment and the solid-state imaging device 1$_{11}$ of the modification example. The solid-state imaging device $1A_9$ has the pyramidal structure 70 as the light scattering unit.

A solid-state imaging device $1A_{10}$ illustrated in FIG. 68(*b*) is an alternative modification example of the solid-state imaging devices $1_{10}$ and $1_{12}$ of the modification examples of the third embodiment. The solid-state imaging device $1A_{10}$ has the pyramidal structure 70 as the light scattering unit.

A solid-state imaging device $1A_{13}$ illustrated in FIG. 68(*c*) is an alternative modification example of the solid-state imaging devices $1_{13}$ and $1_{15}$ of the modification examples of the third embodiment. The solid-state imaging device $1A_{13}$ has the pyramidal structure 70 as the light scattering unit.

A solid-state imaging device $1A_{14}$ illustrated in FIG. 68(*d*) is an alternative modification example of the solid-state imaging devices $1_{14}$ and $1_{16}$ of the modification examples of the third embodiment. The solid-state imaging device $1A_{14}$ has the pyramidal structure 70 as the light scattering unit.

A solid-state imaging device $1A_{17}$ illustrated in FIG. 68(*e*) is an alternative modification example of the solid-state imaging devices $1_{17}$ and $1_{19}$ of the modification examples of the third embodiment. The solid-state imaging device $1A_{17}$ has the pyramidal structure 70 as the light scattering unit.

A solid-state imaging device $1A_{18}$ illustrated in FIG. 68(*f*) is an alternative modification example of the solid-state imaging devices $1_{18}$ and $1_{20}$ of the modification examples of the third embodiment. The solid-state imaging device $1A_{18}$ has the pyramidal structure 70 as the light scattering unit.

Figure 69:
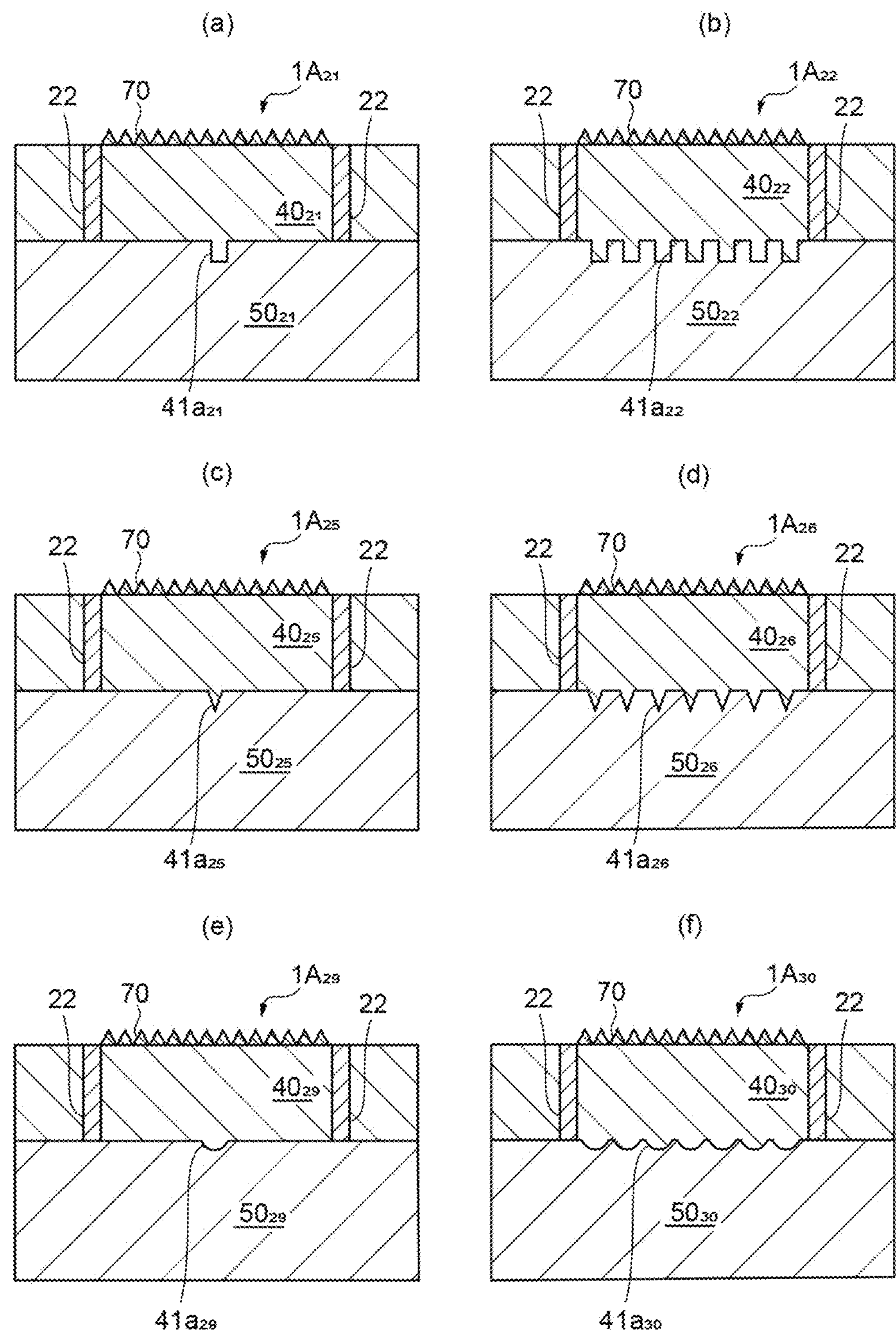
FIGS. 69(*a*), 69(*b*), 69(*c*), 69(*d*), 69(*e*), and 69(*f*) are cross-sectional views illustrating alternative modification examples of the solid-state imaging device of the third embodiment.

A solid-state imaging device $1A_{21}$ illustrated in FIG. 69(*a*) is an alternative modification example of the solid-state imaging devices $1_{21}$ and $1_{23}$ of the modification examples of the third embodiment. The solid-state imaging device $1A_{21}$ has the pyramidal structure 70 as the light scattering unit.

A solid-state imaging device $1A_{22}$ illustrated in FIG. 69(*b*) is an alternative modification example of the solid-state imaging devices $1_{22}$ and $1_{24}$ of the modification examples of the third embodiment. The solid-state imaging device $1A_{22}$ has the pyramidal structure 70 as the light scattering unit.

A solid-state imaging device $1A_{25}$ illustrated in FIG. 69(*c*) is an alternative modification example of the solid-state imaging devices $1_{25}$ and $1_{27}$ of the modification examples of the third embodiment. The solid-state imaging device $1A_{25}$ has the pyramidal structure 70 as the light scattering unit.

A solid-state imaging device $1A_{26}$ illustrated in FIG. 69(*d*) is an alternative modification example of the solid-state imaging devices $1_{26}$ and $1_{28}$ of the modification examples of the third embodiment. The solid-state imaging device $1A_{26}$ has the pyramidal structure 70 as the light scattering unit.

A solid-state imaging device $1A_{29}$ illustrated in FIG. 69(*e*) is an alternative modification example of the solid-state imaging devices $1_{29}$ and $1_{31}$ of the modification examples of the third embodiment. The solid-state imaging device $1A_{29}$ has the pyramidal structure 70 as the light scattering unit.

A solid-state imaging device $1A_{30}$ illustrated in FIG. 69(*f*) is an alternative modification example of the solid-state imaging devices $1_{30}$ and $1_{32}$ of the modification examples of the third embodiment. The solid-state imaging device $1A_{30}$ has the pyramidal structure 70 as the light scattering unit.

FIG. 70(*a*) illustrates a solid-state imaging device $1_{33}$ of an alternative modification example of the third embodiment. In addition to a constitution similar to that of the solid-state imaging device $1_9$ of the third embodiment, the solid-state imaging device $1_{33}$ further has a reflection film 55 embedded in a wiring layer $50_{13}$. In the solid-state imaging device $1_{33}$, in addition to an effect of scattering by a light direction changing unit $30_{33}$, an effect of reflection by the reflection film 55 can also be achieved. According to the reflection film 55, transmitted light can be reduced.

Fourth Embodiment

FIG. 70(*b*) is a cross-sectional view illustrating a structure of a solid-state imaging device of a fourth embodiment. In the solid-state imaging device $1_1$ of the second embodiment, the light direction changing unit $30_1$ is provided in the wiring layer side interface $41_1$. Since the incidence angle with respect to the light scattering unit 27 need only differ from the diffraction angle, a constitution of changing the direction of light need only be provided on a path of light in the photoelectric conversion unit. For example, as illustrated in FIG. 70(*b*), a light direction changing unit $30_{34}$ may be provided in a DTI side interface $43_{34}$. The DTI side interface $43_{34}$ may be an inclined surface as in the second embodiment. In addition, a light scattering body 44 may be provided in a DTI side interface $43_{35}$ as in the third embodiment.

REFERENCE SIGNS LIST

- 1 Solid-state imaging device
- 2 Pixel unit
- 3 Pixel control unit
- 4 Signal processing unit
- 8 Pixel
- 22 DTI
- 26 Photoelectric conversion unit
- 26*a* Light input surface
- 27 Light scattering unit
- L1 Incident light
- L2 Absorbed light
- $30_1$ Light direction changing unit
- $41_1$ Wiring layer side interface (photoelectric conversion back surface)
- $41a_{10}$ Interface recessed portion (light direction changer)
- $41a_{21}$ Interface projecting portion (light direction changer)

The invention claimed is:

1. A solid-state imaging device including a plurality of pixels, wherein each of the pixels includes a light scattering unit receiving incident light and generating absorbed light including scattered light, and a photoelectric conversion unit receiving the absorbed light from a light input surface and generating a signal voltage corresponding to the received absorbed light, and the light scattering unit includes a plurality of metal structures disposed with a predetermined cycle length and generates, as the scattered light, diffracted light of propagating light caused by plasmons not in locally enhanced field mode corresponding to the incident light, the cycle length of the plurality of metal structures is a variable P, a real part of a refractive index of the photoelectric conversion unit is a variable n, a wavelength of the incident light is a variable λ, an order l is 1 or 2, and the variable P, the variable n, the variable λ, and the order l satisfy Expression (1),

[Math. 1]

$$\sin^{-1}\left(\frac{1\cdot\lambda}{n\cdot P}\right) < 90°. \tag{1}$$

2. The solid-state imaging device according to claim 1, wherein the plurality of metal structures constitute first cyclic structures in a first direction, and second cyclic structures in a second direction intersecting the first direction.

3. The solid-state imaging device according to claim 2, wherein a cycle length of the first cyclic structures differs from a cycle length of the second cyclic structures.

4. The solid-state imaging device according to claim 1, further comprising:

a charge retention film disposed between the light scattering unit and the photoelectric conversion unit.

5. The solid-state imaging device according to claim 1, further comprising:

a first isolation wall portion provided between the pixels adjacent to each other, wherein the first isolation wall portion includes a trench and a light reflecting portion embedded in the trench, and the light reflecting portion is formed of bismuth or a material including bismuth as a main component.

6. The solid-state imaging device according to claim 1, further comprising:

a first isolation wall portion provided between the pixels adjacent to each other, wherein the first isolation wall portion includes a trench and a light reflecting portion embedded in the trench, a width of the trench is 45 nm or wider, and the light reflecting portion is formed of silver or a material including silver as a main component.

7. The solid-state imaging device according to claim 1, further comprising:

a first isolation wall portion provided between the pixels adjacent to each other, wherein the first isolation wall portion includes a trench and a light reflecting portion embedded in the trench, a width of the trench is 50 nm or wider, and the light reflecting portion is formed of copper or a material including copper as a main component.

8. The solid-state imaging device according to claim 1, further comprising:

a first isolation wall portion provided between the pixels adjacent to each other, wherein the first isolation wall portion includes a trench and a light reflecting portion embedded in the trench, a width of the trench is 60 nm or wider, and the light reflecting portion is formed of gold or a material including gold as a main component.

9. The solid-state imaging device according to claim 1, further comprising:

a first isolation wall portion provided between the pixels adjacent to each other, wherein the first isolation wall portion includes a trench and a light reflecting portion embedded in the trench, a width of the trench is 30 nm or wider, and the light reflecting portion is formed of platinum or a material including platinum as a main component.

10. The solid-state imaging device according to claim 5, wherein a width of the trench is 70 nm or wider.

11. The solid-state imaging device according to claim 1 further comprising:

a first isolation wall portion provided between the pixels adjacent to each other, wherein the first isolation wall portion includes a trench and a light reflecting portion embedded in the trench, a width of the trench is 35 nm or wider, and the light reflecting portion is formed of aluminum or a material including aluminum as a main component.

12. The solid-state imaging device according to claim 1, further comprising:

a first isolation wall portion provided between the pixels adjacent to each other and including a trench and a light reflecting portion embedded in the trench; and a second isolation wall portion adjacent to the first isolation wall portion with the photoelectric conversion unit sandwiched therebetween and including a trench and a light reflecting portion embedded in the trench, wherein a distance from the light reflecting portion of the first isolation wall portion to the light reflecting portion of the second isolation wall portion is a variable $W_{PD}$, the cycle length of the plurality of metal structures is a variable P, the number of cycles of the plurality of metal structures is a variable M, a width of each of the plurality of metal structures is a variable $W_{metal}$, a variable j is zero or a positive integer, and the variable $W_{PD}$, the variable P, and the variable $W_{metal}$ satisfy Expression (2),

[Math 2]

$$W_{PD} = P(M + j - 1) + W_{metal} \pm P/4. \tag{2}$$

13. The solid-state imaging device according to claim 12, wherein when a distance from the plurality of metal structures to the light reflecting portion of the first isolation wall portion is a variable $X_L$ and a distance from the plurality of metal structures to the light reflecting portion of the second isolation wall portion is a variable $X_R$, the variable $X_L$ and the variable $X_R$ are equivalent to each other.

14. The solid-state imaging device according to claim 1, further comprising:

a first isolation wall portion provided between the pixels adjacent to each other and including a trench and a light reflecting portion embedded in the trench; and a second isolation wall portion adjacent to the first isolation wall portion with the photoelectric conversion unit sandwiched therebetween and including a trench and a light reflecting portion embedded in the trench, wherein a distance from the light reflecting portion of the first isolation wall portion to the light reflecting portion of the second isolation wall portion is a variable $W_{PD}$, the cycle length of the plurality of metal structures is a variable P, the number of cycles of the plurality of metal structures is a variable M, a variable j is zero or a positive integer, and the variable $W_{PD}$, the variable P, and the variable M satisfy Expression (3),

[Math 3]

$$W_{PD} = P(M - 1 + j) + 200 + P/4(\text{units: nm}). \tag{3}$$

15. The solid-state imaging device according to claim 1, wherein the photoelectric conversion unit includes a photoelectric conversion main surface including the light input surface, and a photoelectric conversion back surface on a side opposite to the photoelectric conversion main surface, a light direction changing unit changing a traveling direction of the absorbed light is provided on the photoelectric conversion back surface, and the light direction changing unit changes the traveling direction of the absorbed light such that an angle of the absorbed light based on a reference axis after the traveling direction has been changed differs from an angle of the absorbed light based on the reference axis before the traveling direction is changed, contacts the photoelectric conversion back surface directly, and includes only one light direction changer protruding based on the photoelectric conversion back surface that is a flat surface or hollow based on the photoelectric conversion back surface that is the flat surface.

16. The solid-state imaging device according to claim 1 further comprising:

a first isolation wall portion provided between the pixels adjacent to each other and including a trench and a light reflecting portion embedded in the trench; and a second isolation wall portion adjacent to the first isolation wall portion with the photoelectric conversion unit sandwiched therebetween and including a trench and a light reflecting portion embedded in the trench, wherein a distance from the light reflecting portion of the first isolation wall portion to the light reflecting portion of the second isolation wall portion is a variable $W_{PD}$, the cycle length of the plurality of metal structures is a variable P, the number of cycles of the plurality of metal structures is a variable M, the variable j is zero or a positive integer, and the variable $W_{PD}$, the variable P, and the variable M satisfy Expression (5),

[Math. 5]

$$P(M + j - 1) + W_{metal} - P/4 \leqq W_{PD} \leqq P(M + j - 1) + W_{metal} + P/4. \tag{5}$$

17. The solid-state imaging device according to claim 1 further comprising:

a first isolation wall portion provided between the pixels adjacent to each other and including a trench and a light reflecting portion embedded in the trench; and a second isolation wall portion adjacent to the first isolation wall portion with the photoelectric conversion unit sandwiched therebetween and including a trench and a light reflecting portion embedded in the trench, wherein a distance from the light reflecting portion of the first isolation wall portion to the light reflecting portion of the second isolation wall portion is a variable $W_{PD}$, the cycle length of the plurality of metal structures is a variable P, the number of cycles of the plurality of metal structures is a variable M, the variable j is zero or a positive integer, and the variable $W_{PD}$, the variable P, and the variable M satisfy Expression (6),

[Math. 6]

$$P(M - 1 + j) + 200 - P/4 \leqq W_{PD} \leqq P(M - 1 + j) + 200 + P/4(\text{units: nm}). \tag{6}$$

* * * * *